United States Patent [19]

Rostoker et al.

[11] Patent Number: 5,808,330
[45] Date of Patent: *Sep. 15, 1998

[54] POLYDIRECTIONAL NON-ORTHOGINAL THREE LAYER INTERCONNECT ARCHITECTURE

[75] Inventors: Michael D. Rostoker, Boulder Creek; James S. Koford, Mountain View; Ranko Scepanovic, San Jose; Edwin R. Jones; Gobi R. Padmanahben, both of Sunnyvale; Ashok K. Kapoor, Palo Alto, all of Calif.; Valeriv B. Kudryavtsev, Moscow, Russian Federation; Alexander E. Andreev, Moskovskata Oblast, Russian Federation; Stanislav V. Aleshin; Alexander S. Podkolzin, both of Moscow, Russian Federation

[73] Assignee: LSI Logic Corporation, Milpitas, Calif.

[ * ] Notice: The term of this patent shall not extend beyond the expiration date of Pat. No. 5,578,840.

[21] Appl. No.: 517,441

[22] Filed: Aug. 21, 1995

Related U.S. Application Data

[63] Continuation-in-part of Ser. No. 333,367, Nov. 2, 1994, Pat. No. 5,578,840.

[51] Int. Cl.$^6$ .......................... H01L 29/41; H01L 27/088; H01L 27/118
[52] U.S. Cl. .......................... 257/208; 257/204; 257/207; 257/211; 257/758; 437/180; 437/189
[58] Field of Search ..................... 257/204, 207, 257/210, 211, 758, 776, 927, 208; 437/180, 189

[56] References Cited

U.S. PATENT DOCUMENTS 4,673,966  6/1987  Shimoyama ..................... 257/210

(List continued on next page.)

FOREIGN PATENT DOCUMENTS 4-23348  1/1992  Japan ..................... 257/776

OTHER PUBLICATIONS

N. Sherwanti, S. Bhengarde and A. Panyam, *Routing in the Third Dimension*, (1995).

(List continued on next page.)

*Primary Examiner*—Jerome Jackson
*Attorney, Agent, or Firm*—Mitchell, Silberberg & Knupp LLP

[57] ABSTRACT

A cell architecture using hexagonal shaped cells is disclosed. The architecture is not limited to hexagonal shaped cells. Cells may be defined by clusters of two or more hexagons, by triangles, by parallelograms, and by other polygons enabling a variety of cell shapes to be accommodated. Polydirectional non-orthogonal three layer metal routing is disclosed. The architecture may be combined with the tri-directional routing for a particularly advantageous design. In the tri-directional routing arraingement, electrical conductors for interconnecting terminals of microelectronic cells of an integrated circuit preferrably extend in three directions that are angularly displaced from each other by 60°. The conductors that extend in the three directions are preferrably formed in three different layers. A method of minimizing wire length in a semiconductor device is disclosed. A method of minimizing intermetal capacitance in a semiconductor device is disclosed. A novel device called a "tri-ister" is disclosed. Triangular devices are disclosed, including triangular NAND gates, triangular AND gates, and triangular OR gates. A triangular op amp and triode are disclosed. A triangular sense amplifier is disclosed. A DRAM memory array and an SRAM memory array, based upon triangular or parallelogram shaped cells, are disclosed, including a method of interconnecting such arrays. A programmable variable drive transistor is disclosed. CAD algorithms and methods are disclosed for designing and making semiconductor devices, which are particularly applicable to the disclosed architecture and tri-directional three metal layer routing.

12 Claims, 87 Drawing Sheets

U.S. PATENT DOCUMENTS

| | | | |
|---|---|---|---|
| 4,918,614 | 4/1990 | Modarres et al. | 364/490 |
| 4,990,462 | 2/1991 | Sliwa | 257/730 |
| 5,095,343 | 3/1992 | Klodzinski et al. | 357/23.4 |
| 5,130,767 | 7/1992 | Lidow et al. | 357/23.4 |
| 5,222,030 | 6/1993 | Dangelo et al. | 364/489 |
| 5,300,815 | 4/1994 | Rostoker | 257/786 |
| 5,323,036 | 6/1994 | Neilson et al. | 257/287 |
| 5,329,157 | 7/1994 | Rostoker | 257/666 |
| 5,341,024 | 8/1994 | Rostoker | 257/620 |
| 5,358,886 | 10/1994 | Yee et al. | 437/49 |
| 5,399,898 | 3/1995 | Rostoker | 257/499 |

OTHER PUBLICATIONS

Sherwani, N., Algorithms For VLSI Physical Design Automation, Kluwer Academic Publishers, 1993.

Sechen, Carl, et al., "Timberwolf 3.2 A New Standard Cell Placement & Global Routing Package", IEEE 23rd Designed Automation Conference, Paper 26.1, pp. 432–439.

Chaudhuri, P., "Routing Multi–Layer Boards on Steiner Metric", IEEE International Symposium on Circuits and Systems Proceedings, (19800 pp. 961–964.

Sarrafzadeh, M., et al., "Hierarchical Steiner Tree Construction in Uniform Orientations", IEEE Transactions on Computer–Aided Design, vol. II, No. 9 (Sep. 1992).

Katsadas, E., et al., "A Multi–Layer Router Utilizing Over–Cell Areas", IEEE Proceedings of 27th Design Automation Conference (1990) pp. 704–708.

Bertsekas, D., "Auction Algorithms for Network Flow Problems: A Tutorial Introduction", Computational Optimization and Appliations, (1992) pp. 7–66.

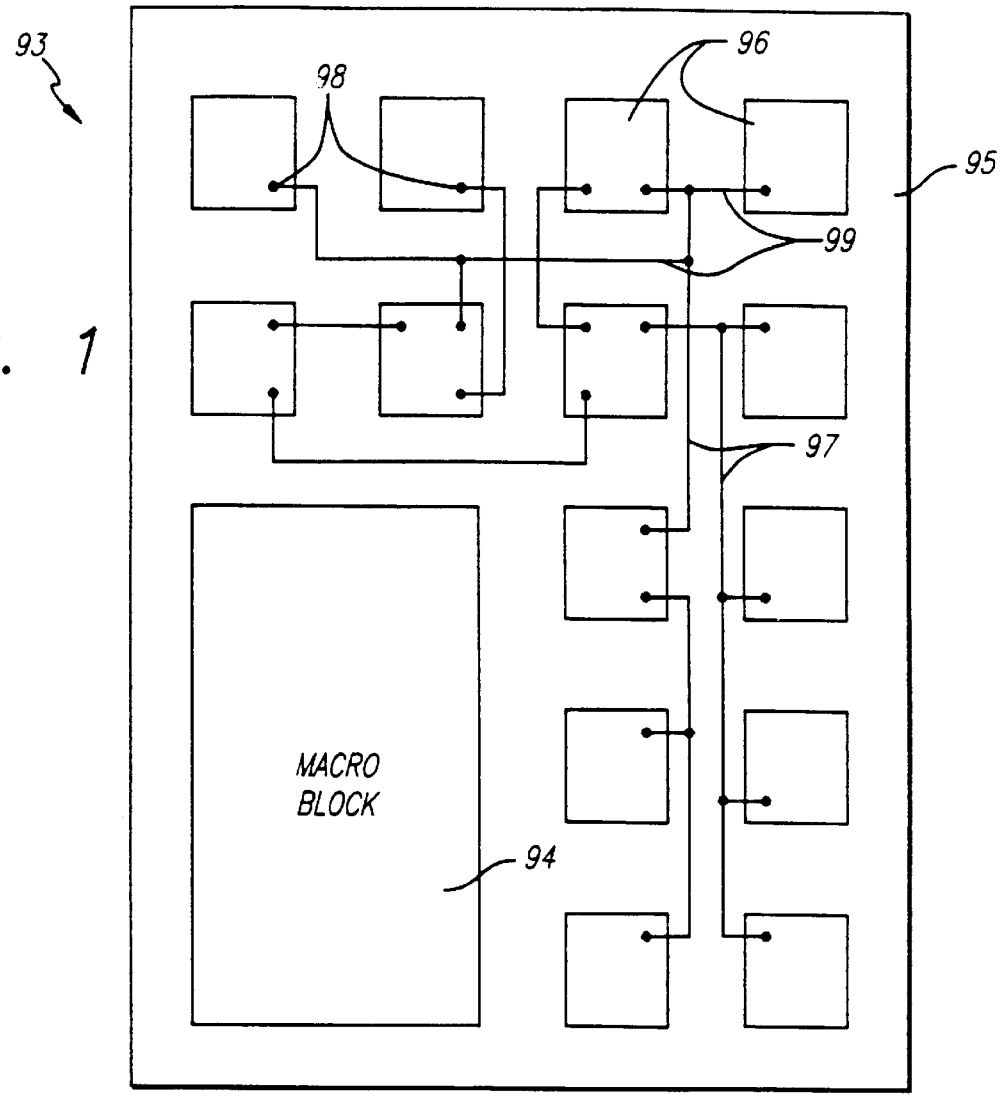
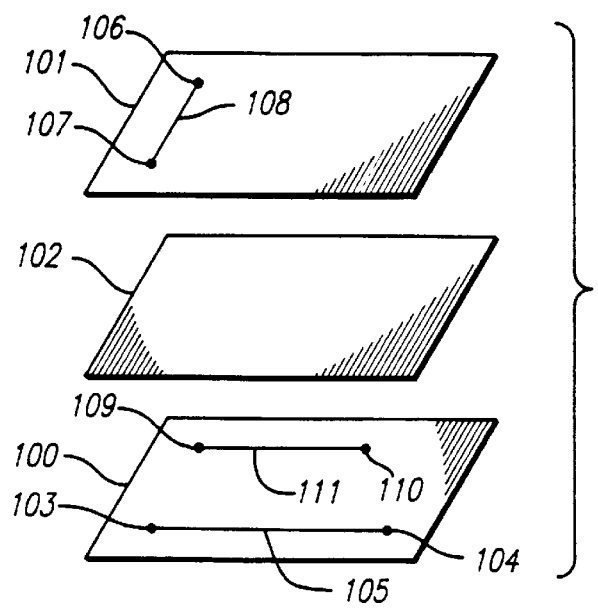

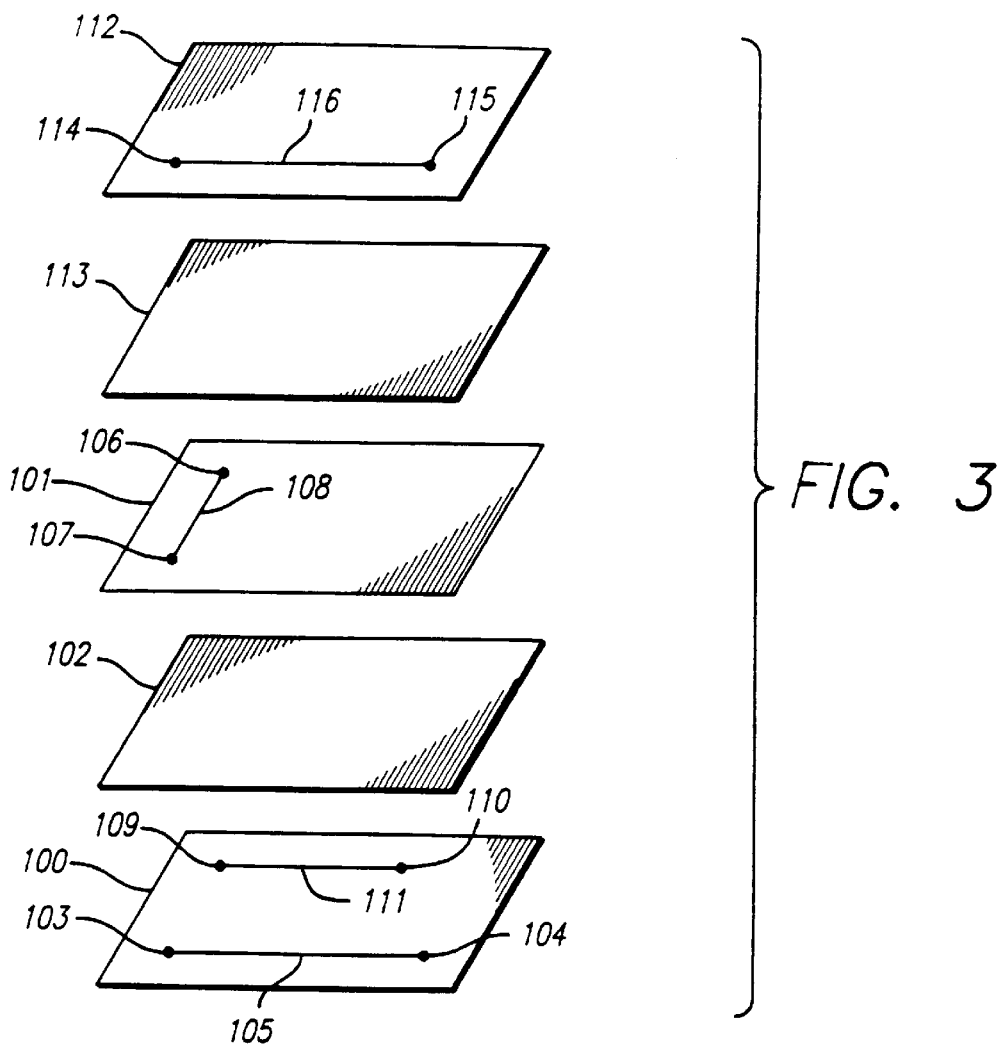
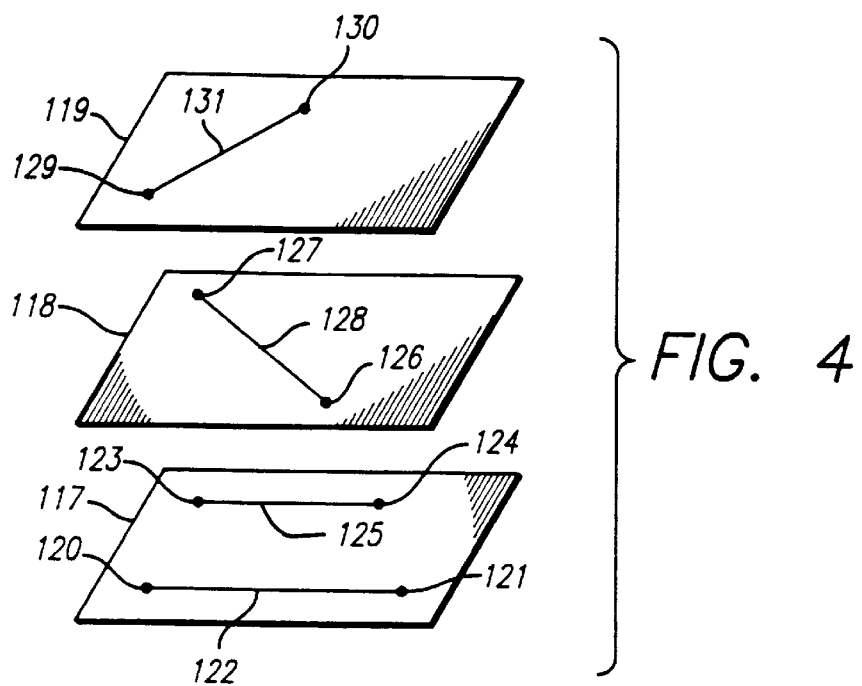

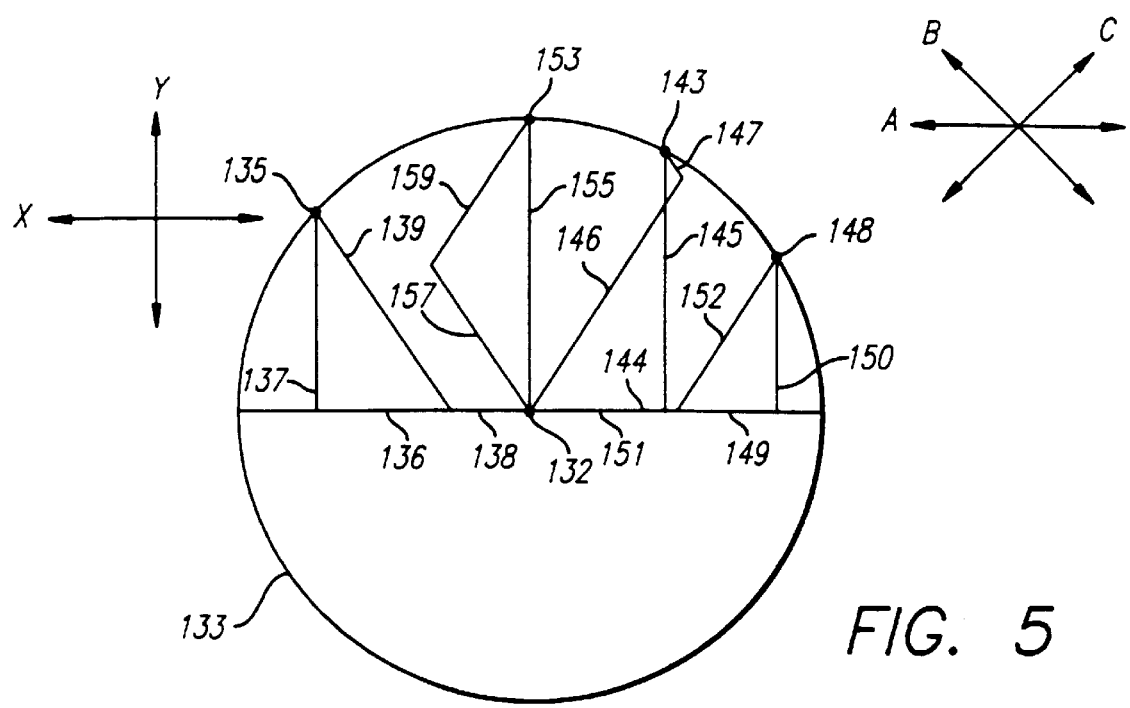
FIG. 5
FIG. 6
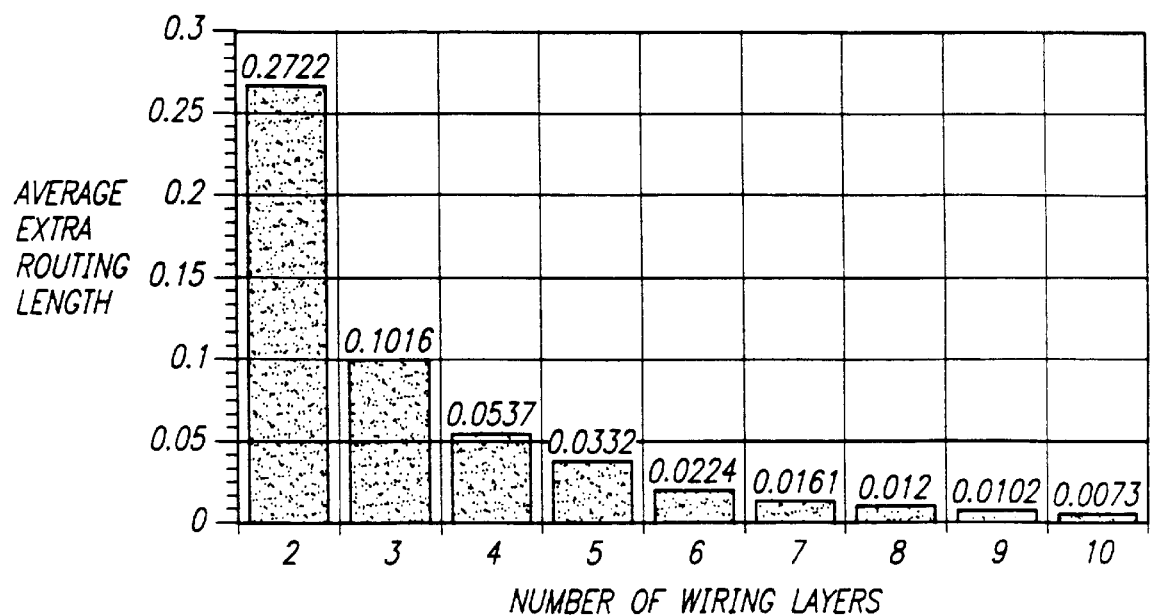

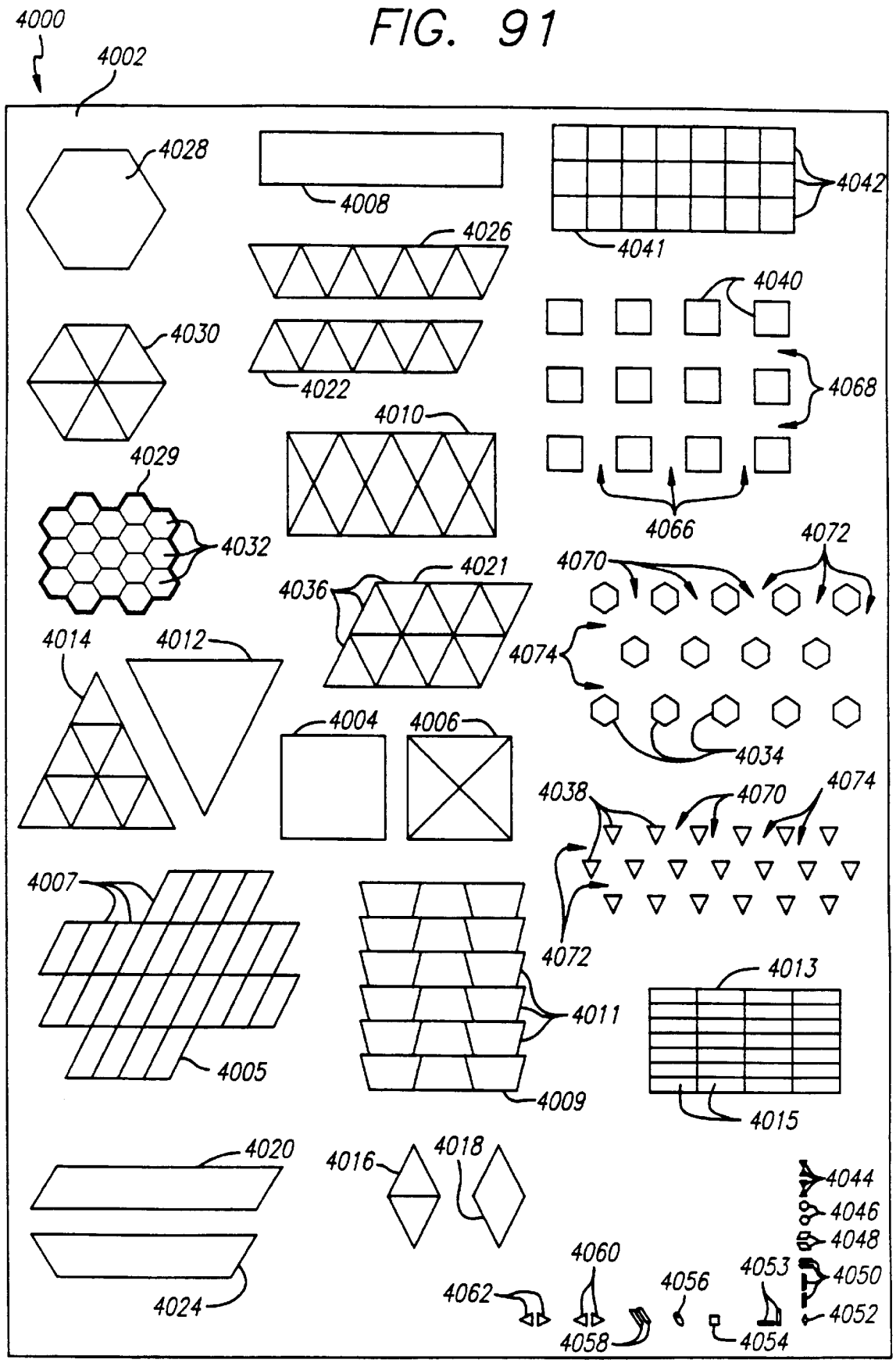

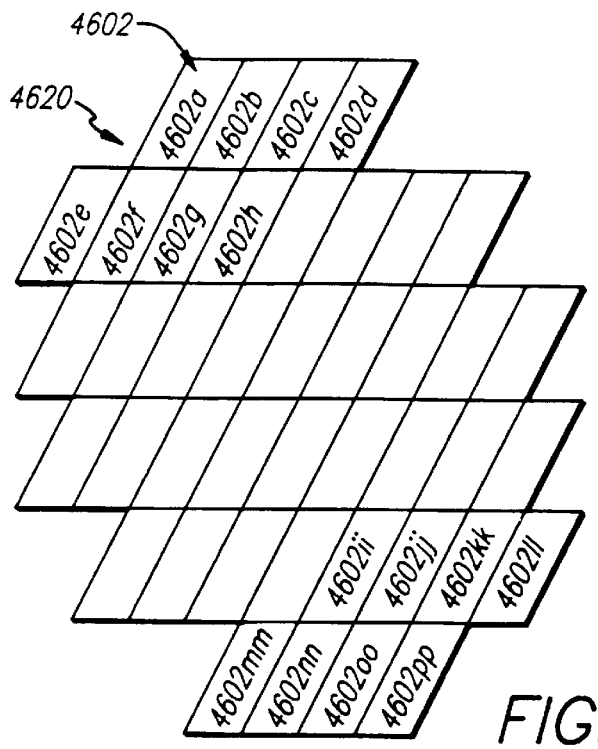
FIG. 96A
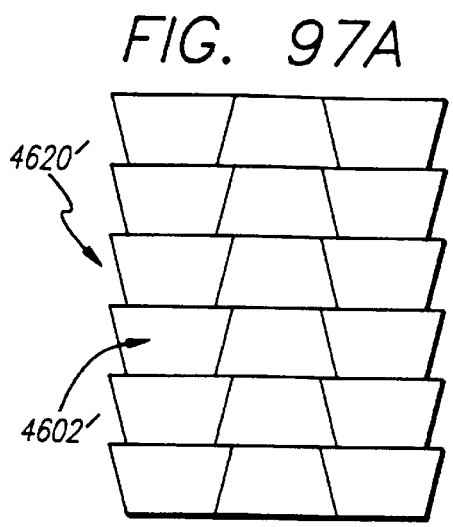
FIG. 97A
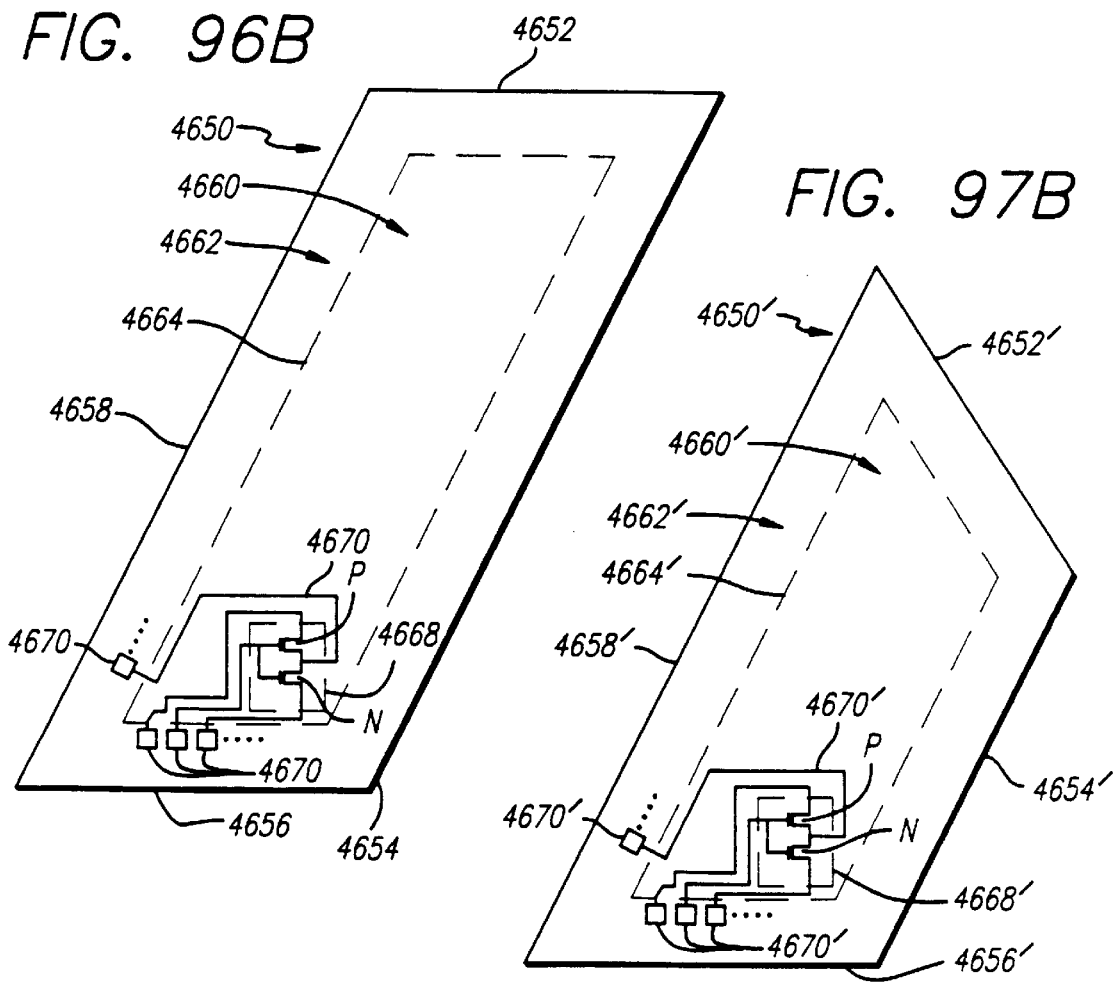
FIG. 96B
FIG. 97B

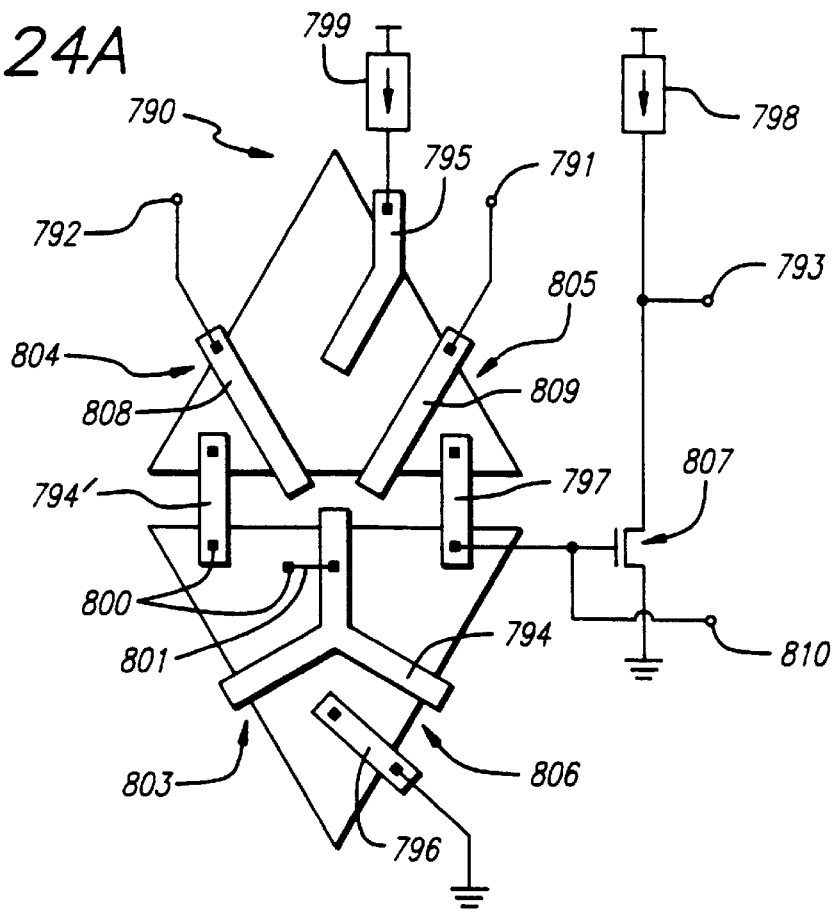
FIG. 124A
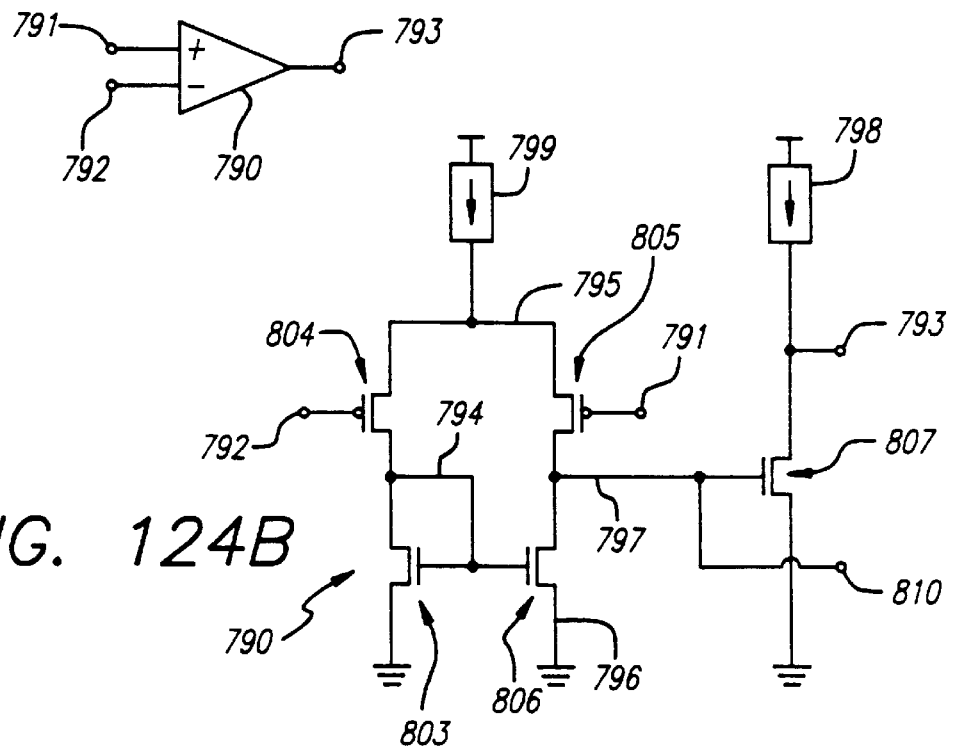
FIG. 124C
FIG. 124B

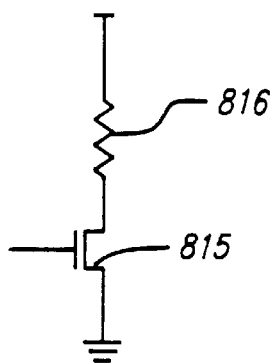
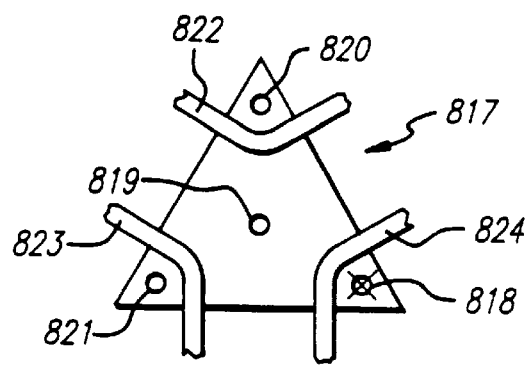
FIG. 125
FIG. 126
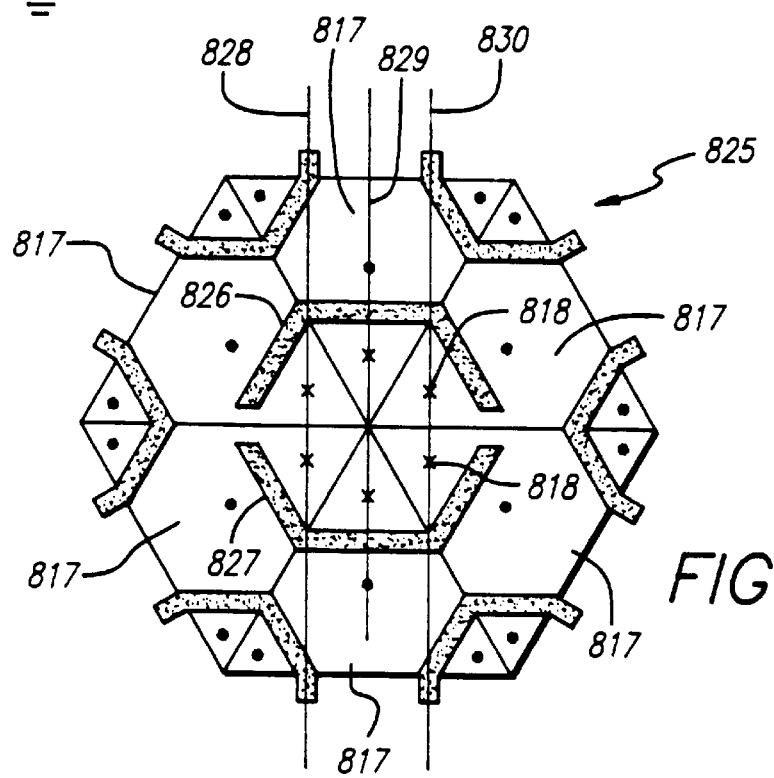
FIG. 127
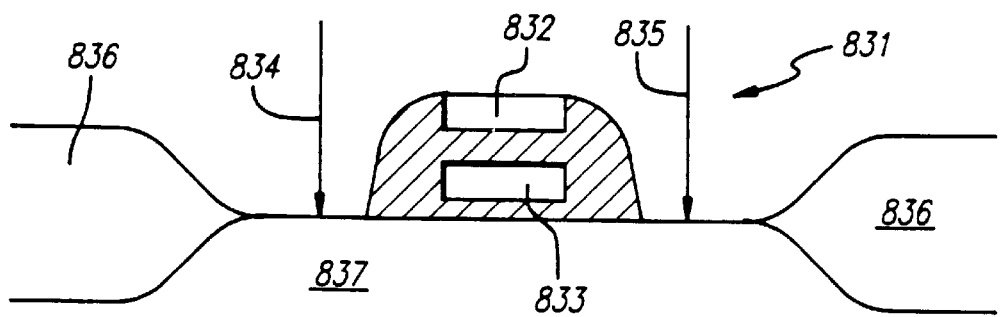
FIG. 128

POLYDIRECTIONAL NON-ORTHOGINAL THREE LAYER INTERCONNECT ARCHITECTURE

I. CROSS-REFERENCE TO RELATED APPLICATIONS

This application is a continuation-in-part of application Ser. No. 08/333,367, now U.S. Pat. No. 5,578,840 filed Nov. 2, 1994, by Ranko Scepanovic, et al., entitled "MICROELECTRONIC INTEGRATED CIRCUIT STRUCTURE AND METHOD USING THREE DIRECTIONAL INTERCONNECT ROUTING BASED ON HEXAGONAL GEOMETRY," the entire disclosure of which is incorporated herein reference.

II. FIELD OF THE INVENTION

This specification discloses a plurality of inventions relating generally to the art of microelectronic integrated circuits and electronic systems incorporating such circuits, and the disclosed subject matter may be specifically applied to microelectronic semiconductor integrated circuit structures and methods of designing and manufacturing semiconductor devices.

III. BACKGROUND OF THE DISCLOSURE

The fabrication of semiconductor devices has progressed significantly over the last four decades. Semiconductor chips incorporating over a million transistors are possible. However, the development of technologies such as interactive high-definition television, personal global communications systems, virtual reality applications, real-life graphics animation, and other scientific and industrial applications, will demand higher speed, more functionality, and further advances in very large scale integration technology. The demand for more functionality will require an increase in the number of transistors that need to be integrated on a chip. This will require shrinking the area required to fabricate interconnected transistors, or will require larger die sizes, or both. As the feature size decreases, and the area required to fabricate transistors decreases, the resulting increased density of devices will require an increasing number of interconnections within a chip, or interconnections between chips in a multi-chip design.

Transistors or gates typically make up a circuit cell. Each cell of an integrated circuit includes a plurality of points, sometimes referred to as pins or terminals, each of which must be connected to pins of other cells by an electrical interconnect wire network or net. Cells may comprise individual logic gates, or more preferably may each comprise a plurality of logic gates or transistors that are interconnected to form functional blocks. It is desirable to attempt to optimize a design so that the total wirelength and interconnect congestion are minimized.

As the number of transistors on a single chip becomes very large, gains made in reducing the feature size brought on by advances in fabrication technology may be offset by the increased area required for interconnection. As the number of interconnections increase, the amount of real estate on the semiconductor die occupied by interconnections could become relatively large unless steps are taken to improve conventional layout techniques.

It is desirable to achieve minimum area layouts for very large scale integration circuits, because minimum area layouts typically deliver optimum performance and provide the most economical implementation of a circuit. It is therefore desirable to have an architecture that will minimize the area occupied by the active part of the circuit. For example, an architecture that will tile well may provide advantages in minimizing the area occupied by the active part of the circuit. It is also desirable to have an architecture that will minimize the area occupied by the passive part of the circuit, i.e., the interconnection. This may be achieved by an architecture that provides better routing options. Ultimately, the theoretical lower limit on minimizing the area occupied by the interconnections is a zero-routing footprint chip.

In the early days of large scale integration, only a single layer of metal was available for routing, and polysilicon (polycrystalline silicon) and a single such metal layer were used to complete the interconnections. The first metal layer may be referred to as the "metal 1" layer or "M1" layer. As semiconductor fabrication processes improved, a second metal layer was added. The second metal layer may be referred to as the "metal 2" layer or "M2" layer. A rectangular approach to routing was used to determine the location of interconnections. Fabrication processes have now been developed which provide three or four metal layers. Fabrication processes which provide five or more metal layers are also being developed. Conductors can be formed in layers that are electrically insulated from the cells and extend over the cells, in what is sometimes referred to as over-the-cell routing. With three or four metal layers available for routing, it may be possible to approach a chip containing no area set aside exclusively for routing (i.e., a zero-routing footprint chip) if over-the-cell routing is utilized.

The performance of a chip depends on the maximum wire length of the interconnection metal used. For better performance, it is desirable to minimize the maximum wire length. As the feature size is made smaller, the delay per unit length of interconnection increases. According to one reference, a 7 micron NMOS technology may have a per unit resistance of 21 ohms per centimeter; and by comparison, a 0.35 micron CMOS technology may have a per unit resistance of 2440 ohms per centimeter. See N. Sherwani, S. Bhingarde & A. Panyam, *Routing in the Third Dimension*, at 8 (1995), the entirety of which is incorporated herein by reference.

The performance of a chip is bound by the time required for computation by the logic devices and the time required for the data communication. In the past, the time required for data communication was typically insignificant compared to the time required for computation, and could be neglected. In the past three decades, there has been a significant improvement in the average speed of computation time per gate. Now, the interconnection delays are on the order of gate delays and as a result, have become significant and can no longer be ignored. Interconnect delays are an increasing percentage of path delay.

When two points are interconnected by metal, a connection is formed which may be referred to as a wire. When two wires in the same metal layer run parallel to each other, parasitic capacitances may be significant and "crosstalk" may occur between signals on those wires. The metal 1 layer is typically separated from the metal 2 layer by a dielectric. When only two metal layers were used, a rectangular or rectilinear approach to routing provided metal 1 wires at 90 degrees relative to metal 2 wires, and this gave satisfactory results in many instances. However, a rectangular approach to routing when three metal layers are available has provided metal 3 wires parallel to metal 1 wires, and these metal layers are separated by layers of dielectric. This has resulted in unsatisfactory capacitance and "crosstalk" in many instances. With four metal layers, metal layers M1 and M3 may have parallel wires, and metal layers M2 and M4 may have parallel wires. Significant performance degradation may result. In the past, efforts to increase the number of metal layers in an attempt to approach a zero-routing footprint chip have resulted in offsetting performance degradation due to unsatisfactory capacitance and "crosstalk" from parallel wires located in different metal layers.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

Typically, the layout is then checked to ensure that it meets all of the design requirements. The result is a set of design files in a particular unambiguous representation known as an intermediate form that describes the layout. The design files are then converted into pattern generator files that are used to produce patterns by an optical or electron beam pattern generator that are called masks.

During fabrication, these masks are used to pattern a silicon wafer using a sequence of photolithographic steps. This component formation requires very exacting details about geometric patterns and separation between them. These details are expressed by a complex set of design rules. The process of converting the specifications of an electrical circuit into a layout is called the physical design. It is an extremely tedious and an error-prone process because of the tight tolerance requirements, the complexity of the design rules, and the minuteness of the individual components.

Currently, the geometric feature size of a component may be as small as on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

As stated above, each microelectronic circuit cell includes a plurality of pins or terminals, each of which must be connected to pins of other cells by a respective electrical interconnect wire network or net. A goal of the optimization process is to determine a cell placement such that all of the required interconnects can be made, and the total wirelength and interconnect congestion are minimized. A goal of routing is to minimize the total wirelength of the interconnects, and also to minimize routing congestion. Achievement of this goal is restricted using conventional rectilinear routing because diagonal connections are not possible. Rarely are points to be connected located in positions relative to each other such that a single straight wire segment can be used to interconnect the points. Typically, a series of wire segments extending in orthogonal directions have been used to interconnect points. A diagonal path between two terminals is shorter than two rectilinear orthogonal paths that would be required to accomplish the same connection. Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

Conventional memory arrays such as DRAMs and SRAMs have been density limited by the metal pitch, which has become a limiting feature inhibiting further shrinkage of the size of the layout. In a conventional two layer memory array, the bit lines and the select lines normally run on the same level of metal. As a result, as memory layouts are made smaller and smaller, the bit lines and the select lines become closely packed. Wiring congestion, crosstalk, and parasitic capacitance are problems limiting the performance and size of conventional memory arrays.

In the case of a DRAM cell, in particular, the line capacitance can be a problem when it becomes large relative to the storage capacitance of the cell storage devices. A DRAM memory circuit can only tolerate a certain ratio of line capacitance to storage capacitance. Conventional designs are limited in the available options to deal with this problem. Attempts have been made to adjust the ratio of storage capacitance to line capacitance by increasing the storage capacitance. However, increasing the cell size tends to increase the size of the layout on a die, and limits the amount of circuitry that can be laid out on a given size die, and may inflict performance penalties. Large amounts of storage capacitance may slow the speed of a memory array. Large amounts of capacitance take longer to charge and discharge because larger capacitance has larger RC time constants. This slows the operation of the memory circuit. The speed of microprocessors and other circuits has become so fast that memory accesses can be a significant limitation upon the performance of a system where access speeds measured in nanoseconds are considered to be slow. Thus, increased capacitance can be a problem with high performance memory circuits.

As illustrated in FIG. 1, a conventional microelectronic integrated circuit 93 comprises a substrate 95 on which a large number of semiconductor devices are formed. These devices include large functional macroblocks such as indicated at 94 which may be central processing units, input-output devices or the like. Many designers have a cell library consisting of standardized cells that perform desired logical operations, and which may be combined with other cells to form an integrated circuit having the desired functionality. A typical integrated circuit further comprises a large number of smaller devices such as logic gates 96 which are arranged in a generally rectangular pattern in the areas of the substrate 95 that are not occupied by macroblocks.

The logic gates 96 have terminals 98 to provide interconnections to other gates 96 on the substrate 95. Interconnections are made via vertical electrical conductors 97 and horizontal electrical conductors 99 that extend between the terminals 98 of the gates 96 in such a manner as to achieve the interconnections required by the netlist of the integrated circuit 93. It will be noted that only a few of the elements 96, 98, 97 and 99 are designated by reference numerals for clarity of illustration.

In conventional integrated circuit design, the electrical conductors 97 and 99 are formed in vertical and horizontal routing channels (not designated) in a rectilinear (Manhattan) pattern. Thus, only two directions for interconnect rouging are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effect.

Other patents exist which contain incidental references to hexagonal structures, but do not disclose the hexagonal architecture of the present invention. For example, U.S. Pat. No. 5,323,036 purports to disclose a power FET transistor that has gate segments arranged in a hexagonal lattice pattern in an effort to reduce channel resistance. U.S. Pat. No. 5,323,036 does not teach or suggest providing three metal layers in a hexagonal architecture as provided by the present invention. Significantly, that patent does not even recognize the problem of minimizing interconnection wire lengths and interlayer capacitance or "crosstalk."

U.S. Pat. No. 5,095,343 purports to disclose a VDMOS device having P-type regions forming PN junctions that intersect the surface of the wafer in a closed path forming a hexagon along the plane of the surface. Each source region is stated to be opposite the space between two source regions in the adjacent body region. This is said to provide each cell with a plurality of spaced channel regions. According to this patent, the disclosed VDMOS device has a reduced power density at which zero temperature coefficient occurs so that the device allegedly can tolerate a given power dissipation for a longer time before damage occurs. U.S. Pat. No. 5,095,343 may teach away from over-the-cell routing; the patent describes a metal connection to the gate electrode, and states that the gate bond pad overlies an area of the surface of the wafer that does not contain source/body cells. This patent does not teach or suggest providing three metal layers in a hexagonal architecture preferably employing over-the-cell routing, and does not recognize the problem of minimizing interconnection wire lengths and interlayer capacitance or "crosstalk."

U.S. Pat. No. 5,130,767 purports to disclose a high power MOSFET transistor that has a plurality of closely packed polygonal sources spaced from one another on one surface of a semiconductor wafer. The patent states that the polygonal source regions are preferably hexagonal in shape. A single drain electrode is formed on the opposite surface of the semiconductor wafer. An elongated gate electrode is formed on the first surface of the wafer and it crosses a plurality of the polygonal sources. When a suitable control voltage is applied to the gate, annular channels around the polygonal sources become conductive to permit majority carrier conduction from the source regions through the wafer to the drain electrode on the opposite surface of the wafer. U.S. Pat. No. 5,130,767 does not teach or suggest providing three metal layers in a hexagonal architecture, and does not recognize the problem of minimizing interconnection wire lengths and interlayer "crosstalk."

While in the past satisfactory results were obtained using rectangular architectures employing two layers of metal, those old techniques will not suffice for many new designs incorporating millions of transistors. As very large scale integration designs advance, and attempts are made to place more and more transistors on the same area of a semiconductor chip, improved architectures are needed to provide minimal area designs and better performance. The techniques and architectures used in the past leave considerable room for improvement.

IV. SUMMARY OF THE INVENTIONS

Several inventions are disclosed herein. In the course of the description that follows, the discussion may at various times refer to "the present invention." Such a reference is not intended to imply that only one invention is disclosed, but may refer in context to the particular subject matter then being described by way of example and without limitation of the scope of all of the inventions that are disclosed through out the present specification.

For example, a cell architecture using hexagonal shaped cells is disclosed. The architecture is not limited to hexagonal shaped cells. Cells may be defined by clusters of two or more hexagons, by triangles, by parallelograms, and by other polygons enabling a variety of cell shapes to be accommodated. Polydirectional non-orthogonal three layer metal routing is disclosed. The architecture may be combined with the tri-directional routing for a particularly advantageous design. A method of minimizing wire length in a semiconductor device is disclosed. A method of minimizing intermetal capacitance in a semiconductor device is disclosed. A novel device called a "tri-ister" is disclosed. Triangular devices are disclosed, including triangular NAND gates, triangular AND gates, and triangular OR gates. A triangular op amp and triode are disclosed. A triangular sense amplifier is disclosed. A DRAM memory array and an SRAM memory array, based upon triangular or parallelogram shaped cells, are disclosed, including a method of interconnecting such arrays. A programmable variable drive transistor is disclosed. CAD algorithms and methods are disclosed for designing and making semiconductor devices, which are particularly applicable to the disclosed architecture and tri-directional three metal layer routing.

In accordance with one aspect of the present invention, three layers of metal provide electrical conductors for interconnection which extend in three directions that are angularly displaced from each other by 60 degrees, which is sometimes referred to as a tri-directional or hexagonal routing system. This is the preferred embodiment of the polydirectional non-orthogonal three layer metal routing invention. On average, the three direction routing system according to one aspect of the present invention using three metal layers for interconnect will result in a total interconnect wire length that is shorter than the total interconnect wire length required using a conventional two metal layer rectangular routing system. This tri-directional routing can be used in connection with conventional rectangular cells, or it may be advantageously used in conjunction with triangular, hexagonal, diamond, parallelogram shaped cells, as well as any other arbitrary shaped cell.

The three routing directions provided by the present invention substantially reduce the total wirelength interconnect congestion of an integrated circuit. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

In accordance with another aspect of the present invention, a programmable design of a substrate having a plurality of partially prefabricated transistors, sometimes referred to as incohate transistors, which may be finally constructed to have a range of desired sizes, drive currents, or delays, where transistors are fabricated from a triangular transistor design and the location of the gate electrodes may be adjusted during final fabrication.

One embodiment includes a microelectronic integrated circuit that may advantageously utilize the three direction routing arrangement described herein. A triangular device design includes a semiconductor substrate, and a plurality of microelectronic devices that are formed on the substrate in a closely packed triangular arrangement that maximizes the space utilization of the circuit.

Each device has a periphery defined by a large triangle, and includes an active area formed within the periphery. First and second terminals are formed in the active area adjacent to two vertices of the triangle respectively, and first to third gates are formed between the first and second terminals.

The gates have contacts formed outside the active area adjacent to a side of the triangle between the two vertices. The first and second terminals, and the gates are preferrably connected using the three direction (or tri-direction) hexagonal routing arrangement, although rectilinear routing may also be used.

The power supply connections to the central terminal and the first to third terminals, the conductivity type (NMOS or PMOS), and the addition of a pull-up or a pull-down resistor may be selected for each device to provide a desired AND, NAND, OR or NOR function. A third terminal can be formed between two of the gates and used as an output terminal to provide an AND/OR logic function.

In accordance with another aspect of the present invention, an integrated circuit includes a semiconductor substrate, and a plurality of CMOS microelectronic devices formed on the substrate. Each device includes a triangular ANY element of a first conductivity type (PMOS or NMOS), and a triangular ALL element of a second conductivity type (NMOS or PMOS), the ANY and ALL elements each having a plurality of inputs and an output that are electrically interconnected respectively.

The ANY element is basically an OR element, and the ALL element is basically an AND element. However, the power supply connections and the selection of conductivity type (NMOS or PMOS) for the ANY and ALL elements can be varied to provide the device as having a desired NAND, AND, NOR or OR configuration, in which the ANY element acts as a pull-up and the ALL element acts as a pull-down, or vice-versa.

A triangular OR gate device is provided in accordance with one aspect of the present invention. First to third gates are formed between the first to third terminals, respectively, and the central terminal, and have contacts formed outside the active area adjacent to the edges of the triangle. The central and first to third terminals, and the gates are preferrably connected using the three direction hexagonal routing arrangement.

The power supply connections to the central terminal and the first to third terminals, the conductivity type (NMOS or PMOS), and the addition of a pull-up or a pull-down resistor is selected for an illustrated triangular device to provide a desired OR function. One or two of the first to third terminals, rather than the central terminal, can be used for output to provide an AND/OR logic function.

Conductors that extend in the three directions can be formed in three different layers, or alternatively the conductors that extend in two or three of the directions can be formed in a single layer as long as they do not cross. The conductors can be formed in layers that are electrically insulated from the cells and extend over the cells, or can extend through hexagons between cells. Conductors may be provided that extend in three directions that form an acute angle relative to each other. In another alternative form of the invention, additional conductors can be added that extend in a direction perpendicular to one of the other three directions.

Cells can have serrated edges defined by edges of hexagons such that adjacent cells fit together exactly, providing a closely packed arrangement of cells on the substrate with effective utilization of space. Cells can be defined by clusters of two or more hexagons, enabling a variety of cell shapes to be accommodated. Sets of cells having the same functionality and different shapes may be provided.

These and other features and advantages of the present inventions will be apparent to those skilled in the art from the following detailed description, taken together with the accompanying drawings, in which like reference numerals refer to like items.

V. BRIEF DESCRIPTION OF THE DRAWINGS

FIG. 1 is a diagram illustrating a prior a integrated circuit.

FIG. 2 is an exploded schematic diagram illustrating two layers of metal.

FIG. 3 is an exploded schematic diagram illustrating three layers of metal.

FIG. 4 is an exploded schematic diagram illustrating three layers of metal, where the layers of metal provide electrical conductors for interconnection which extend in three directions that are angularly displaced from each other by 60 degrees.

FIG. 5 is a diagram illustrating examples of unit circle routing length for a rectangular routing system having two directions ("X" and "Y") as compared to a hexagonal routing system having three directions ("A," "B" and "C").

FIG. 6 is a bar graph depicting average extra unit circle routing length vs. the number of wiring layers, using a direct radial connection (i.e., unity) as a basis for comparison.

FIG. 91 illustrates an exemplary integrated circuit chip.

FIG. 96A shows a block structure composed of parallelogram sub-blocks.

FIG. 96B shows an exemplar parallelogram block or sub-block.

FIG. 97A shows a block structure composed of rhomboidal blocks.

FIG. 97B shows a detailed schematic of an electronic circuit for an exemplar rhomboidal block or sub-block which could represent any one of the sub-blocks shown in FIG. 97A.

FIG. 124A shows one example of a partial layout for an operational amplifier.

FIG. 124B shows a schematic diagram of an equivalent circuit for the structure depicted in FIG. 124A.

FIG. 124C shows a layout of an operational amplifier.

FIG. 125 shows a schematic diagram of a field programmable device.

FIG. 126 shows a top view of a layout for a field programmable device.

FIG. 127 shows an example of a hexagonal cell comprising six of the structures shown in FIG. 126 arrainged in an array.

FIG. 128 illustrates a cross-sectional view of one embodiment of an E²PROM type field programmable device.

VI. DETAILED DESCRIPTION OF CERTAIN PREFERRED EMBODIMENTS OF THE INVENTIONS

Figure 7:
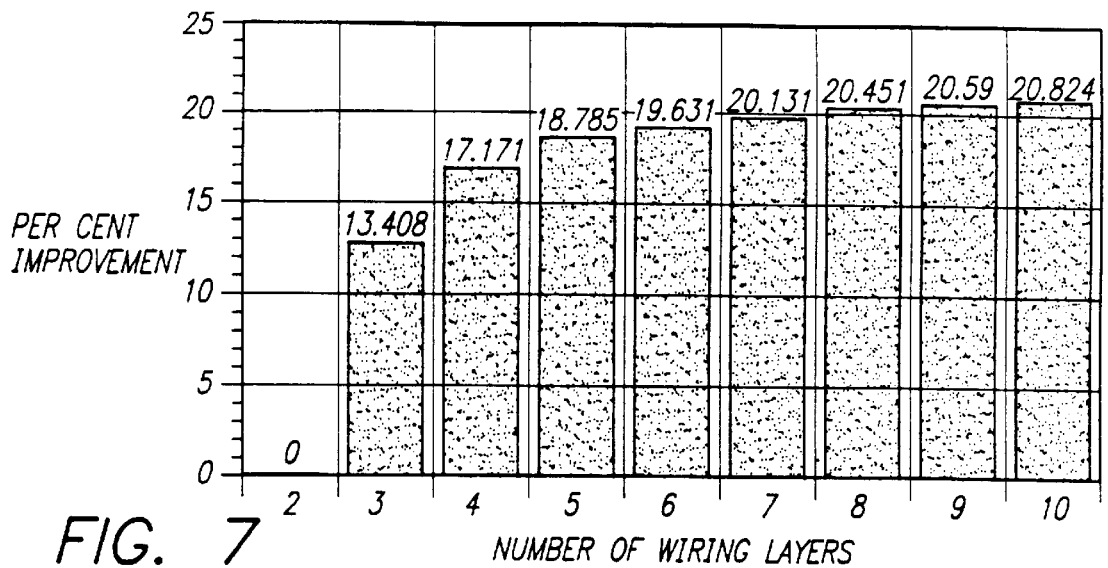
FIG. 7 is a bar graph depicting percent improvement in average extra unit circle routing length vs. the number of wiring layers using two wiring layers as the basis of comparison.

In FIG. 2, two conventional layers of metal are shown schematically. This is an exploded diagram separating the individual layers for clarity. A first metal (M1) layer 100 is shown separated from a second metal (M2) layer 101 by a dielectric layer 102. A conventional rectangular routing arrangement is illustrated. The first metal layer 100 provides for electrical connections in a direction that is angularly displaced 90 degrees from electrical connections provided by the second metal layer 101. For example, in the M1 layer 100, a point 103 is connected to a point 104 by a metal wire 105. In the M2 layer 101, a point 106 is connected to a point 107 by a metal wire 108. The wire 105 is angularly displaced 90 degrees from the wire 108; in other words, the wire 105 in the M1 layer 100 is perpendicular to wire 108 in the M2 layer 101. Wires in the same layer will be parallel to each other. For example, point 109 in the M1 metal layer 100 is connected to point 110 by a wire 111. The wire 111 is parallel to the wire 105 in the same M1 metal layer 100, and is perpendicular to the wire 108 in the M2 metal layer 101.

Using conventional interconnection such as that shown in FIG. 2, the device capacity of a die may be directly limited by the interconnection. Interconnection is a large factor in die processing costs. Interconnection can be a significant factor in chip yield. Therefore, better interconnection designs can offer significant advantages.

A better interconnection design is shown in FIG. 3, where three layers of metal are shown schematically. As was the case with FIG. 2, this is also an exploded diagram showing the individual layers separated for clarity. The first metal (M1) layer 100 is shown separated from the second metal (M2) layer 101 by the dielectric layer 102. A third metal (M3) layer 112 is shown separated from the second metal (M2) layer 101 by a dielectric layer 113. A conventional rectangular routing arrangement is illustrated. The first metal layer 100 provides for electrical connections in a direction that is angularly displaced 90 degrees from electrical connections provided by the second metal layer 101. As described with reference to FIG. 2, a point 103 in the M1 layer 100 is connected to a point 104 by a metal wire 105. In the M2 layer 101, a point 106 is connected to a point 107 by a metal wire 108. The wire 105 is angularly displaced 90 degrees from the wire 108. Wires in the same layer are parallel to each other. As described with reference to FIG. 2, point 109 in the M1 metal layer 100 is connected to point 110 by the wire 111. The wire 111 is parallel to the wire 105 in the same M1 metal layer 100, and is perpendicular to the wire 108 in the M2 metal layer 101.

The third metal layer 112 provides for electrical connections in a direction that is angularly displaced 90 degrees from electrical connections provided by the second metal layer 101. A point 114 in the M3 layer 112 is connected to a point 115 by a metal wire 116. The wire 116 is perpendicular to the wire 108 in the M2 metal layer 101. However, the third metal layer 112 provides for electrical connections in a direction that are parallel to electrical connections provided by the first metal layer 100. In other words, the first metal layer 100 provides for electrical connections in a direction that is angularly displaced 0 degrees from electrical connections provided by the third metal layer 112. This is a worst case orientation for parasitic capacitance and crosstalk. Problems with parasitic capacitance may be accentuated by the parallel orientation of the wires 116 in the M3 metal layer 112 with wires 105 in the M1 metal layer 100.

FIG. 4 shows three layers of metal schematically, with the metal routing directions separated by 60 degree angles. As was the case with FIG. 2, this is also an exploded diagram showing the individual layers separated for clarity, but has been simplified by omitting dielectric layers. A first metal (M1) layer 117, a second metal (M2) layer 118, and a third metal (M3) layer 118 are provided. The first metal (M1) layer 117 is separated from the second metal (M2) layer 118 by a dielectric layer (not shown), and the second metal (M2) layer 118 is separated from the third metal layer (M3) 119 by a dielectric layer (not shown).

Minimizing Total Wire Length Using Tri-Directional Routine

In accordance with the present invention, the three layers of metal 117, 118, 119 provide electrical conductors for interconnection which extend in three directions that are angularly displaced from each other by 60 degrees. For example, in the M1 metal layer 117, a point 120 is connected to a point 121 by a wire 122, and a point 123 is connected to a point 124 by a wire 125. In the M2 metal layer 118, a point 126 is connected to a point 127 by a wire 128. In the M3 metal layer 119, a point 129 is connected to a point 130 by a wire 131. The wires 122 and 125 in the M1 metal layer 117 are angularly displaced from wire 128 in the M2 metal layer 118 by 60 degrees. The wires 122 and 125 in the M1 metal layer 117 are also angularly displaced from wire 131 in the M3 metal layer 119 by 60 degrees. And the wire 128 in the M2 metal layer 118 is angularly displaced from the wire 131 in the M3 metal layer 119 by 60 degrees.

The three degrees of freedom provided by the three layers of metal 117, 118, and 119 should result in shorter total interconnection wire lengths. This may be better appreciated by considering a unit circle routing length in connection with FIG. 5. If we consider the case of an arbitrary first point 132 selected for the sake of discussion which must be connected to a second point. For purposes of discussion, the second point may be located at any arbitrary location relative to the first point 132, which results in the first and second points being located at an angle with respect to each other. For this discussion, the relative angle is of particular interest, so it will suffice if the second point is considered to be located anywhere on a unit circle 133.

In FIG. 5, the conventional rectangular routing system uses two wiring directions, shown as direction "X" and direction "Y" represented in the upper left of the Figure. The hexagonal routing system uses three wiring directions, shown as direction "A," direction "B," and direction "C" represented in the upper right of FIG. 5. For simplicity, direction "A" is oriented the same as direction "X." If every point on the unit circle 133 is considered, and the length of wire required to connect the points using conventional rectangular routing compared with hexagonal routing is calculated, the average length of total interconnect wire required to connect points which are located arbitrarily with respect to each other may be computed.

For example, if the point 132 must be connected to a point 135 using conventional rectangular routing, a wire 136 in the "X" direction combined with a wire 137 in the "Y" direction must be used to make the connection. However, if the point 132 must be connected to the point 135 using hexagonal routing, a wire 138 in the "A" direction combined with a wire 139 in the "B" direction may be used to make the connection. The length of the wire 138 plus the length of the wire 139 is shorter than the length of the wire 136 plus the length of the wire 137.

Similarly, if the point 132 must be connected to a point 143 using conventional rectangular routing, a wire 144 in the "X" direction combined with a wire 145 in the "Y" direction must be used to make the connection. Using hexagonal routing, if the point 132 must be connected to the point 143, a wire 146 in the "C" direction combined with a wire 147 in the "B" direction may be used to make the connection. The length of the wire 146 plus the length of the wire 147 is shorter than the length of the wire 144 plus the length of the wire 145. In the example of the connection of point 132 with a point 148 shown in FIG. 5, the length of wire 149 and wire 150 using conventional rectangular routing is longer than the length of wire 151 and wire 152 using hexagonal routing.

Some exception points do exist such as point 153 where the connection using rectangular routing only requires a single wire 155 in the "Y" direction. In this special case, the wire 155 is shorter than the wires 157 and 159 required in the illustrated hexagonal routing system.

On average, the hexagonal routing system using three metal layers for interconnect will result in a total interconnect wire length that is shorter than the total interconnect wire length required using a conventional two metal layer rectangular routing system. This is shown in FIG. 6. FIG. 6 is a bar graph depicting average extra unit circle routing length vs. the number of wiring layers, using a direct radial connection (i.e., unity) as a basis for comparison. An average extra unit circle routing length may be computed for the points located on a unit circle. The two metal layer example described above would have an average extra unit circle routing of about 0.27. The three metal layer example described above would have an average extra unit circle routing of only about 0.10. The percent improvement in average unit circle length over a conventional two metal layer rectangular routing system is shown in FIG. 7. The three metal layer example described above would have a 13.4% improvement in the average extra unit circle routing as compared to a conventional two metal layer rectangular routing system.

Increasing the number of metal layers to four or more provides a diminishing rate of return. This can be seen from FIG. 6 and FIG. 7. Four metal layers has an average extra unit circle routing length of about 0.05, which is about a 17.2% improvement over a conventional two metal layer rectangular routing system. Five metal layers has an average extra unit circle routing length of about 0.03, which is about an 18.8% improvement over a conventional two metal layer rectangular routing system. Thus, only about 1.6 percentage points of improvement are achieved by going from four metal layers to five metal layers. FIG. 7 shows that only about 0.2 percentage points of improvement are realized in going from nine metal layers to ten metal layers.

Figure 8:
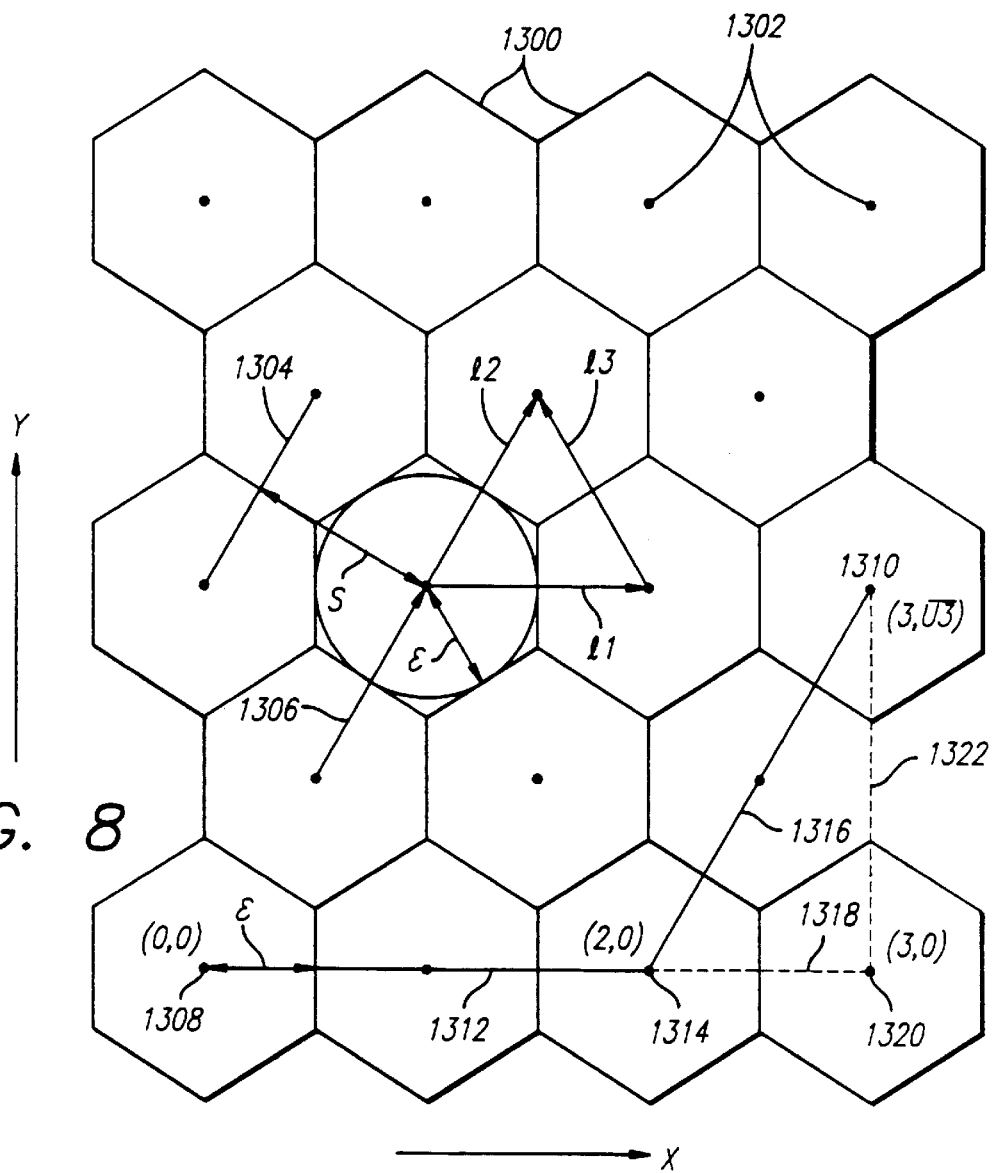
FIG. 8 is a diagram illustrating three direction routing for interconnecting example devices based on hexagonal geometry in accordance with the present invention.

An example of a geometry for a three directional routing arrangement for interconnecting hexagonal cells fabricated on a semiconductor substrate is illustrated in FIG. 8. For purposes of comparison, an orthogonal coordinate system is shown having an "x" axis and a "y" axis. A closely packed pattern of small hexagon shaped cells 1300 is superimposed on the coordinate system, with the centers of the hexagons 1300 being designated as terminal points 1302.

For the purpose of the present disclosure, the term "closely packed" is construed to mean that the hexagons 1300 are formed in a contiguous arrangement with adjacent hexagons 1300 sharing common sides as illustrated, with substantially no spaces being provided between adjacent hexagons 1300. Devices based on the present hexagonal architecture may be formed on the substrate in a closely packed arrangement, with each device covering a number of the small hexagons 1300. Application of the described routing arrangement is not limited to hexagonal devices. The hexagonal routing for interconnections described herein may also be used with rectangular devices.

In accordance with the invention, the centers of the hexagons 1300 as indicated at 1302 may represent interconnect points for terminals of the illustrated devices. Electrical conductors for interconnecting the points 1302 may extend in three directions that make angles of 60° relative to each other.

The conductors that extend in the three directions are preferably formed in three different layers, with conductors in one direction being formed on one and only one of the three layers of metal. Alternatively, conductors that extend in two or three of the directions can be formed in a single layer as long as they do not cross.

As illustrated in FIG. 8, a direction $e_1$ extends parallel to the "x" axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 8, they form an equilateral triangle. For convenience, the notation $e_1$, $e_2$ and $e_3$ is used to denote the vectors that extend in the respective routing directions as well as the directions themselves. The radius of the circles that are inscribed by the hexagons 1300 is designated as $\epsilon$.

The vectors $e_1$, $e_2$ and $e_3$ can be defined using the following notation $$e_1 = (1,0),\ e_2 = [(\tfrac{1}{2}),\ (\sqrt{3}/2)],\ e_3 = e_1 - e_2$$

A geometric structure in accordance with the present invention can also be defined using set theory. A set $SIX(\alpha, \epsilon)$ of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set $SIX(\alpha, \tfrac{1}{2})$ for all a from the set SU intersect only on the edges of the hexagons and partition the plane into the closely packed arrangement that is illustrated in this example. Circles inscribed in these hexagons are also densely packed.

As further illustrated in FIG. 8, the perpendicular distance "S" between two adjacent conductors extending in the direction $e_2$, such as conductors 1304 and 1306, is equal to $S = \sqrt{3}/2 = 0.87$ measured in X-Y coordinates, or $S = \sqrt{3}\epsilon = 1.78\epsilon$. The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is typically substantially less than with conventional rectilinear routing. As illustrated in FIG. 8, terminal points 1308 and 1310 to be interconnected are located at (x,y) coordinates (0,0) and $(3, \sqrt{3})$, respectively.

Using the present routing arrangement, the points 1308 and 1310 can be connected by a first conductor 1312 extending in the direction $e_1$ from the point 1310 to a point 1314 at coordinates (2,0), and a second conductor 1316 extending from the point 1314 in the direction $e_2$ to the point 1310. The length of each of the conductors 1312 and 1314 is two, and the total connection length is four.

Using the conventional rectilinear routing method, connection between the points 1308 and 1310 also requires the conductor 1312 from the point 1308 to the point 1314. However, rather than the diagonal conductor 1316, the conventional method requires two conductors, a conductor 1318 from the point 1314 to a point 1320 at coordinates (3,0), and a conductor 1322 from the point 1320 to the point 1310.

The combined length of the conductors 1312 and 1318 is three, whereas the length of the conductor 1322 is $\sqrt{3}$. The total length of the conventional rectilinear interconnect path is therefore $3 + \sqrt{3} = 4.73$. The path length using a conventional rectilinear routing method between the points 1308 and 1310 is therefore 18.3% longer than the path length using the tri-directional or hexagonal routing arrangement described herein.

A reduction of 13% to 18% in pathlength is approximately an average reduction that may be attained in many circuits using the present hexagonal routing arrangement and three metal layers, although individual cases can vary from this value. However, the distance between any two points using rectilinear routing typically will not be shorter than that using the present hexagonal routing. On average, compared to a conventional rectilinear routing arrangement, the total length of interconnect wiring should be shorter using a hexagonal routing arrangement as described herein.

While the tri-directional routing (sometimes referred to as "hexagonal routing") is described herein in connection with a hexagonal cell layout on a semiconductor substrate, such as the example illustrated in FIG. 8, the tri-directional routing may be advantageously used in connection with rectangular cells, as well as any other cell architecture. The tri-directional routing invention disclosed herein is not limited to hexagonal cells. The advantages of the tri-directional routing described herein are applicable to rectangular shaped cells, hexagonal shaped cells, triangular shaped cells, diamond shaped cells, square shaped cells, parallelogram shaped cells, trapezoidal shaped cells, any of the blocks shown in FIG. 91, polygonal shaped cells, irregular shaped cells, and any other type of cell. The tri-directional routing can be used independently of the particular underlying layout or architecture.

Figure 9:
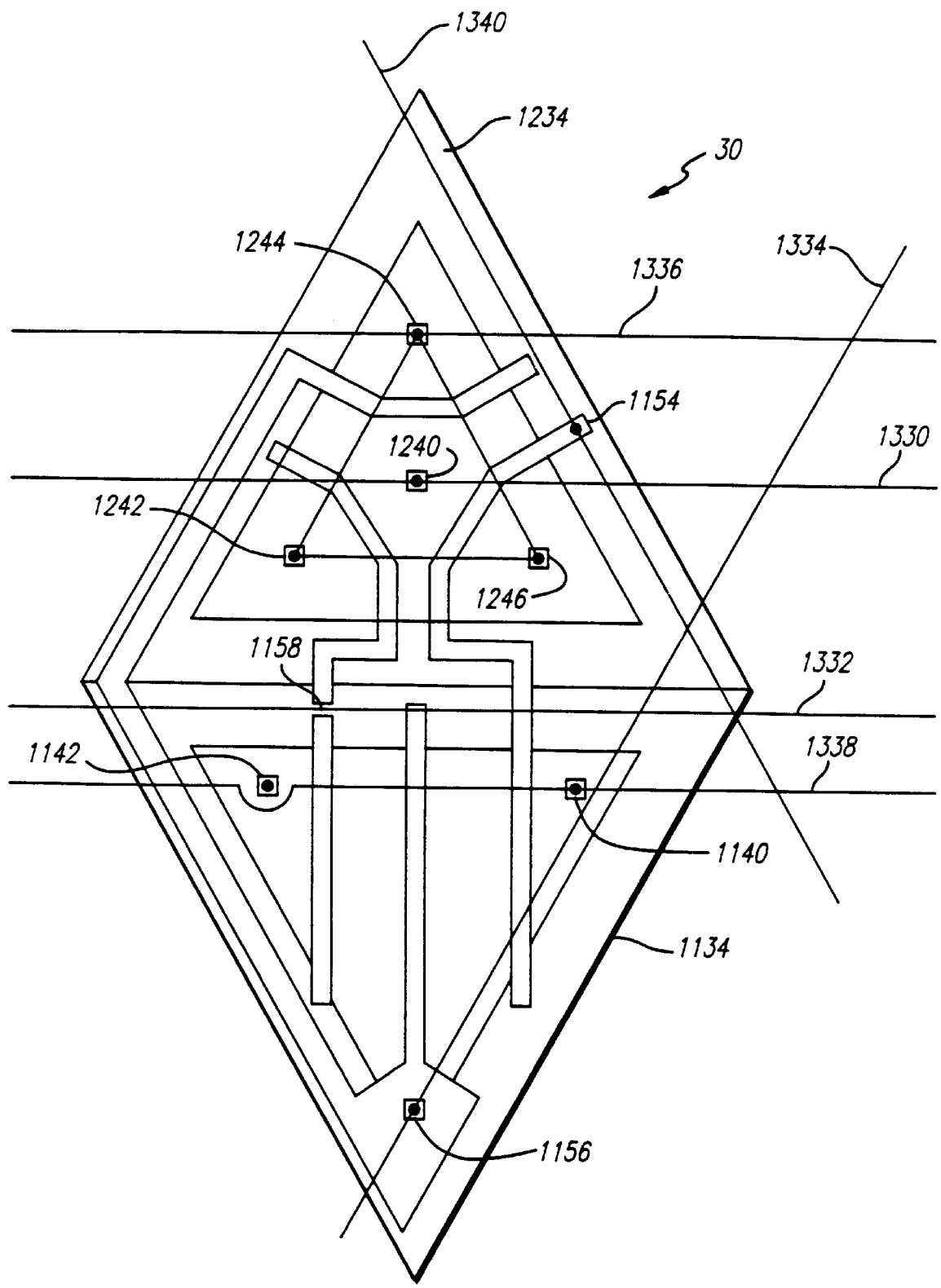
FIG. 9 is a diagram illustrating one example device which is connected using the three direction routing of FIG. 8.

An example of a semiconductor device 30 that is interconnected using the hexagonal routing arrangement of FIG. 8 is illustrated in FIG. 9. It will be understood that the particular interconnect directions shown in the drawing are selected arbitrarily for illustrative purposes, and are not in any way limitative of the scope of the invention. In general, any of the wiring directions can be utilized to interconnect any of the elements of the illustrated device 30.

In the illustrated example shown in FIG. 9, the terminals 1242, 1244, 1246 and 1142 are interconnected internally. Conductors 1330, 1336 and 1338 which extend in the $e_1$ direction are provided for connection of the terminals 1240, 1244 and 1140 respectively. Conductors 1332, 1334 and 1340 which extend in the directions $e_1$, $e_2$ and $e_3$ are provided for connection of the terminals 1158, 1156 and 1154 respectively. The conductors 1332, 1334 and 1340, which carry input signals in this example, are preferably formed in different conductor layers.

Figure 10:
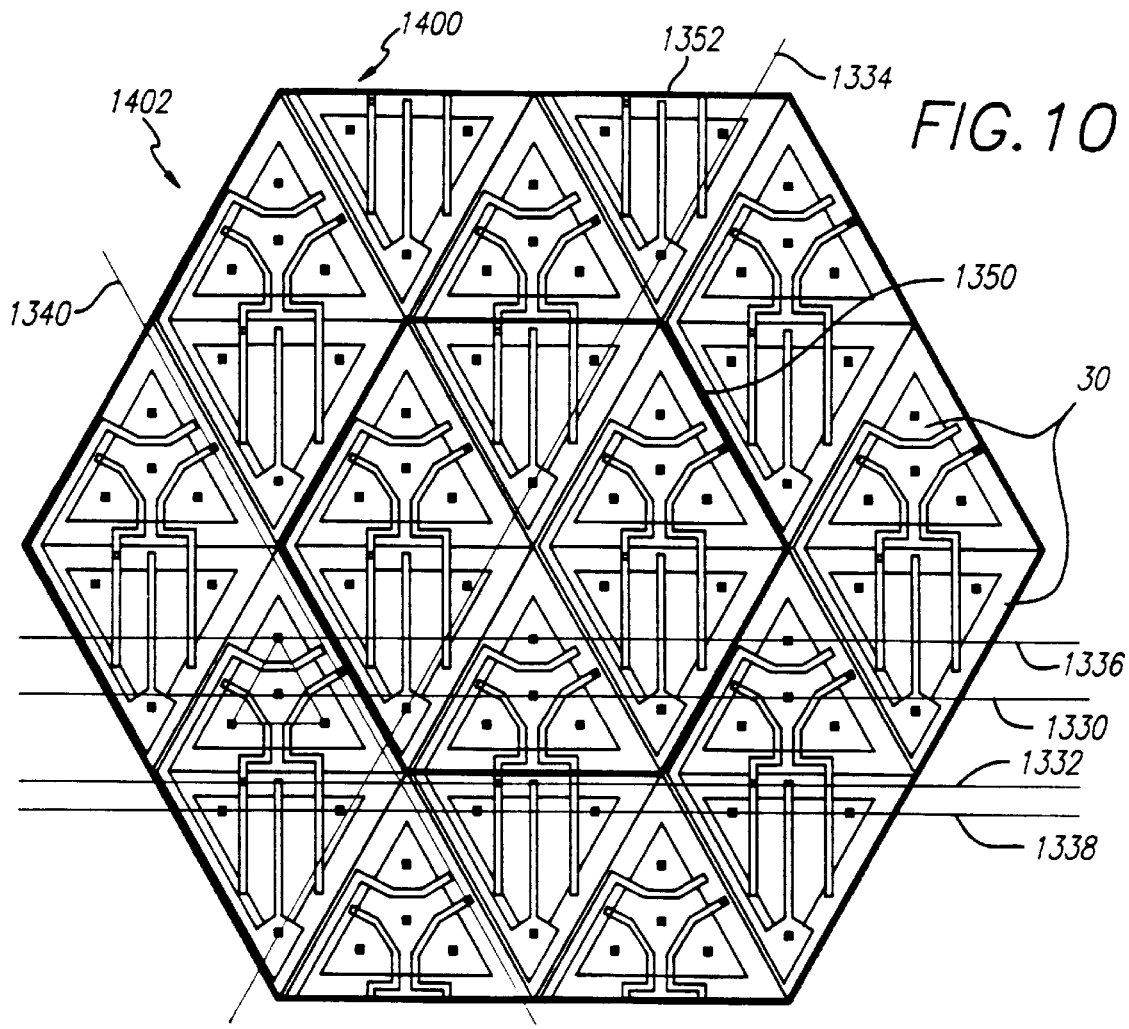
FIG. 10 is a diagram illustrating an example of an integrated circuit including a plurality of devices in a closely packed triangular arrangement.

FIG. 10 illustrates a microelectronic integrated circuit 1400 according to the present invention comprising a semiconductor substrate 1402 on which a plurality of devices 30 are formed in a closely packed triangular arrangement. Further shown are a few illustrative examples of interconnection of the devices using the conductors 1330 to 1340 that extend in the three directions $e_1$, $e_2$ and $e_3$.

It will be noted that six closely packed elements 1134 and 1234 define a hexagonal shape having a periphery 1350, and that twenty four closely packed elements 1134 and 1234 define a larger hexagonal shape having a periphery 1352. This relationship can be used within the scope of the invention to provide unit cells having hexagonal shapes defined by closely packed triangles, with internal structures similar to or different from those which are explicitly described and illustrated.

It will be understood from the above description that the illustrated device geometry and three direction interconnect arrangement substantially reduce the total wirelength interconnect congestion of the integrated circuit by providing three routing directions, rather than two. The routing directions include, relative to a first direction, two diagonal directions that typically provide shorter interconnect paths than conventional rectilinear routing.

Reducing Intermetal Capacitance

Figure 107:
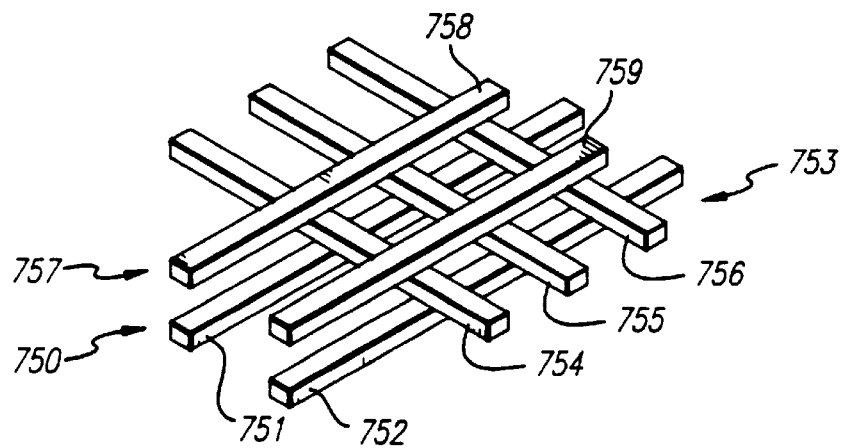
FIG. 107 is a perspective view of a schematic illustration of a conventional rectilinear routing design.

FIG. 107 is a perspective view of a schematic illustration of a conventional rectilinear routing design. The wires or conductors 751 and 752 in the first metal layer 750 shown in this example are parallel to the wires or conductors 758 and 759 in the third metal layer 757. The potential for intermetal capacitance is increased by the parallel orientation of the metal wires. The illustrated wires 754, 755 and 756 are in the second metal layer 753.

Figure 108:
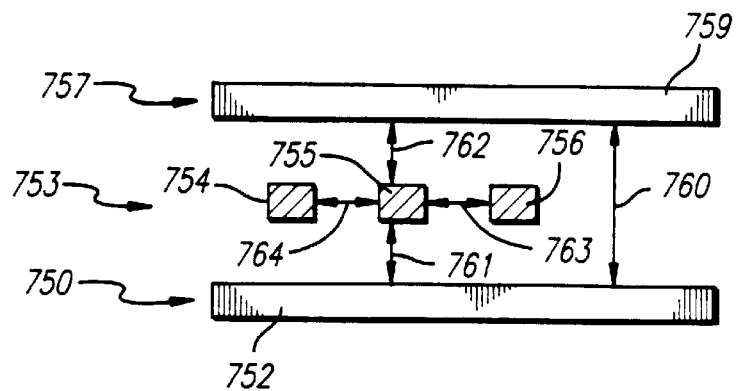
FIG. 108 shows a cross sectional view of the metal wires shown in FIG. 107.

FIG. 108 shows a cross sectional view of the metal wires shown in FIG. 107. Intermetal capacitance may occur between wires 759 and 752, as indicated generally by reference numeral 760. If the intermetal capacitance results in a signal being induced in conductor 759 in response to a signal or pulse flowing through conductor 752 (or vice versa), this is referred to as crosstalk, and is highly undesirable in most circuits. Intermetal capacitance may also occur between wire 755 in the second metal layer 753, and wires 752 (in the first metal layer 750) and 759 (in the third metal layer), as indicated generally by reference numerals 761 and 762. In addition, intermetal capacitance may occur between wires 755, 754 and 756 in the same metal layer 753, as indicated generally by reference numerals 763 and 764.

Crosstalk occurs when a signal or pulse through conductor 755 induces a signal in an adjacent conductor 754 or 756. If the level of the induced signal in conductor 754 or 756 is relatively low, the induced signal may not have an adverse effect upon the operation of the circuit. Typical threshold voltages have conventionally been about 0.8 volts, or even 0.5 volts. If the induced signal level exceeds the threshold voltage of a device connected to the conductor in which the signal is induced, it may cause the device to erroneously switch states or turn on. Depending upon the device, the resultant consequences can be anything from a glitch to a devastating crash. The current trend is toward lower operating voltages. Lower operating voltages have certain advantages, such as reduced power consumption and lower heat dissipation. As the operating voltage is further reduced, the threshold voltages of the transistors or other devices used in an implementation of the circuit will typically be lower. Threshold voltages of 0.2 volts may become common. Lower threshold voltages may exacerbate the adverse consequences of crosstalk and induced voltages due to intermetal capacitance.

Figure 109:
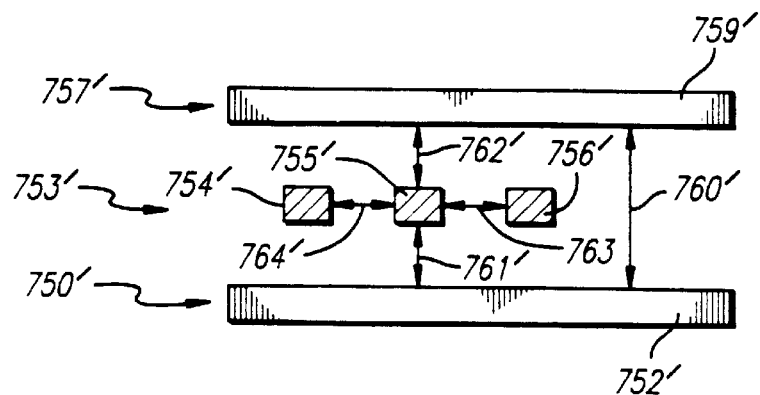
FIG. 109 shows another example of a cross sectional view of metal wires in a conventional rectilinear routing design.

In some designs, the intermetal capacitance and crosstalk between conductors 755, 754 and 756 in the same metal layer 753 may be a significant concern, especially where the wires 755, 754 and 756 run parallel to each other. Such an example is shown in the cross sectional view of FIG. 109, wherein prime reference numerals represent like structures having similar non-prime reference numerals. Intermetal capacitance is typically greater when conductors are closer to each other. Conductor 755' is much closer to adjacent conductors 754' and 756' (see 764' and 763', respectively), than to conductors 759' and 752' (see 762' and 761', respectively). The relative distance 760' in this example between parallel conductors 752' and 759' in the first and third metal layers 750' and 757', respectively, is relatively large as compared to the distance 763' and 764' between adjacent parallel conductors 754', 755' and 756' in the same metal layer 753'. However, if tri-directional routing is used, two or three directions may be used in the same metal layer to reduce the extent to which wires in the same metal layer run parallel to each other. In some designs, this may only be necessary for some of the wires carrying certain signals, where other conductors (carrying ground or $V_{DD}$, for example) may be fabricated having parallel wires without significant adverse consequences.

Using the tri-directional routing described herein, the number of conductors that extend parallel to each other may be reduced as compared to a conventional rectilinear routing design. In a three metal layer example, the angles between conductors in different layers are sufficiently large (preferably 60 degrees) that significant parasitic capacitance between layers may be avoided, and parallel conductors in different metal layers may be avoided. The tri-directional routing described herein reduces parasitic capacitance that is common in conventional rectilinear routing.

As will be described in detail below, the conductors that extend in the three directions can be formed in three different layers, or alternatively the conductors that extend in two or three of the directions can be formed in a single layer as long as they do not cross. Either alternative may be used to reduce intermetal capacitance.

Figure 110:
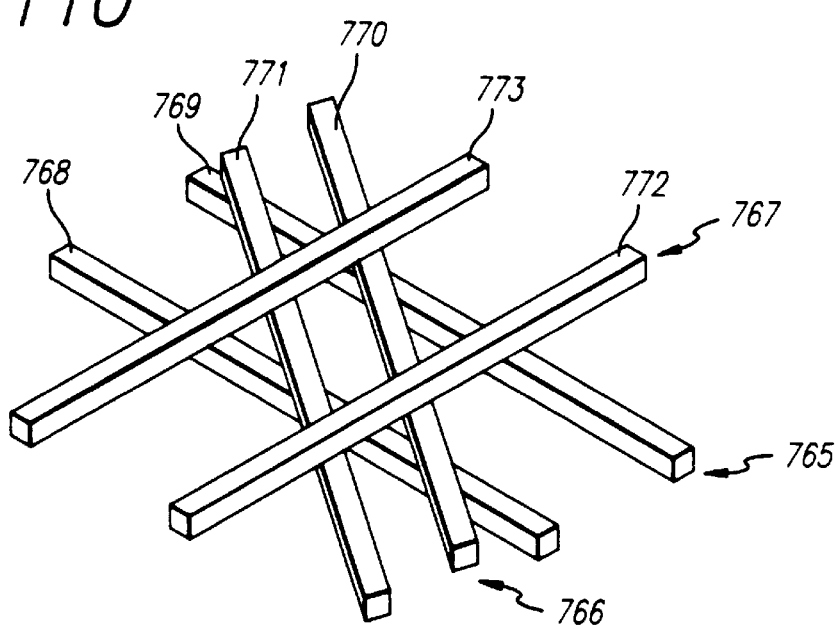
FIG. 110 is a perspective view of a schematic illustration of a tri-directional routing example.

The first alternative is illustrated in FIG. 110, which is a perspective view of a schematic illustration of a tri-directional routing example. In this example, wires 768 and 769 in the first metal layer 765 all extend in the same direction. Wires 770 and 771 in the second metal layer 766 all extend in the same direction, but it is a direction that is angularly displaced relative to the direction of the wires 768 and 769 in the first metal layer 765 by an angle of about 60 degrees. Wires 772 and 773 in the third metal layer 767 all extend in the same direction, but it is a direction that is angularly displaced relative to the direction of the wires 768 and 769 in the first metal layer 765 by an angle of about 60 degrees, and it is a direction that is also angularly displaced relative to the direction of the wires 770 and 771 in the second metal layer 766 by an angle of about 60 degrees. This alternative may be simpler to design, or suitable CAD tools for this alternative may be easier to implement.

Figure 28:
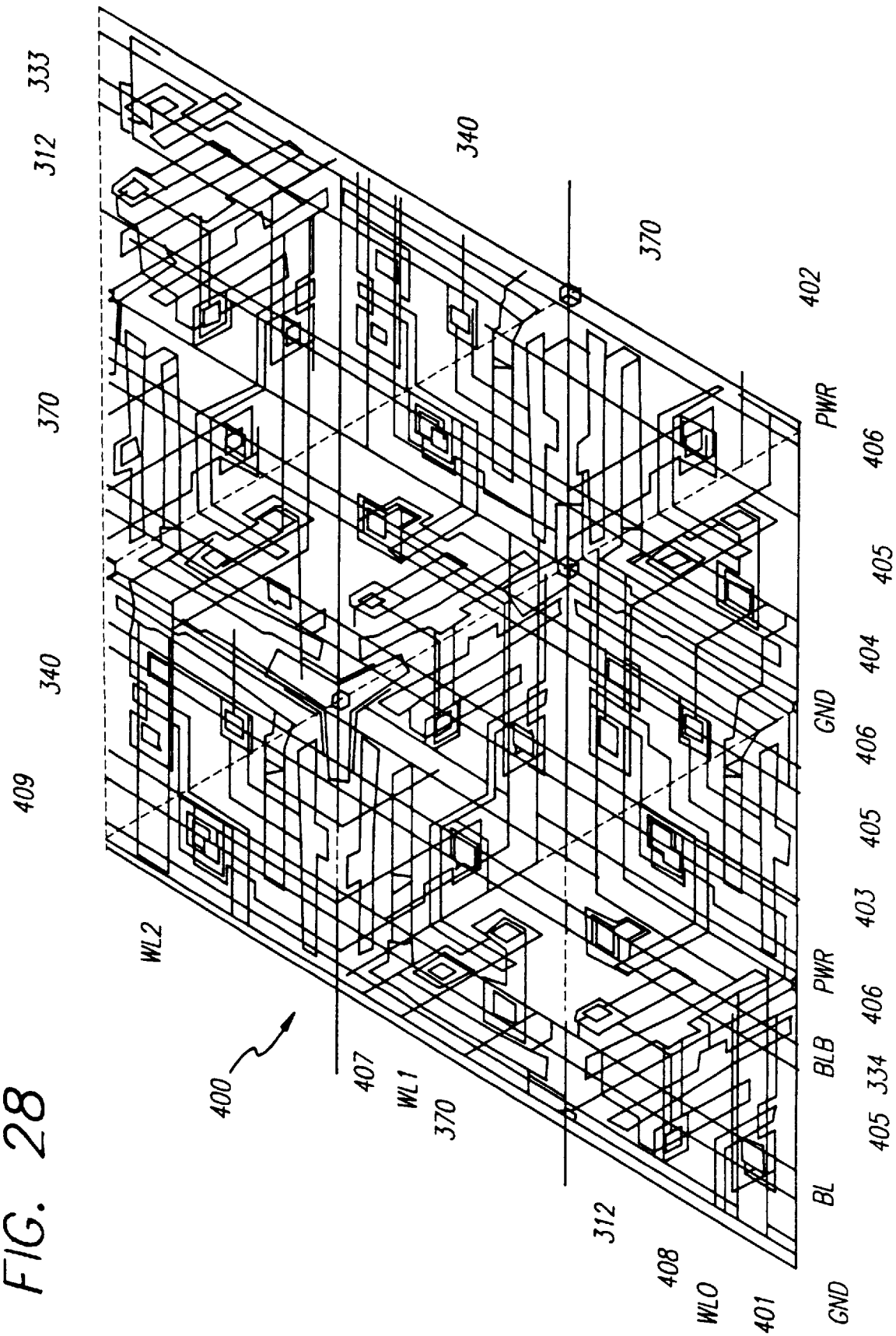
FIG. 28 depicts a layout of a plurality of triangular shaped structures comprising the three types of double triangular shaped cells shown in FIG. 25, FIG. 26, and FIG. 27, forming a larger diamond shaped megafunction cell.

FIG. 28 illustrates an example of the second alternative where each metal conductor 407, 408 and 408 has certain portions of the conductor extending in each of three different directions, all in the same metal layer. In this example, the conductors 407, 408 and 409 represent address lines in a memory array 400. The conductors 407, 408 and 409 do not cross each other at any point in the illustrated layout. The illustrated memory array 400 is described in more detail elsewhere. A similar example is shown in FIG. 111.

Figure 111:
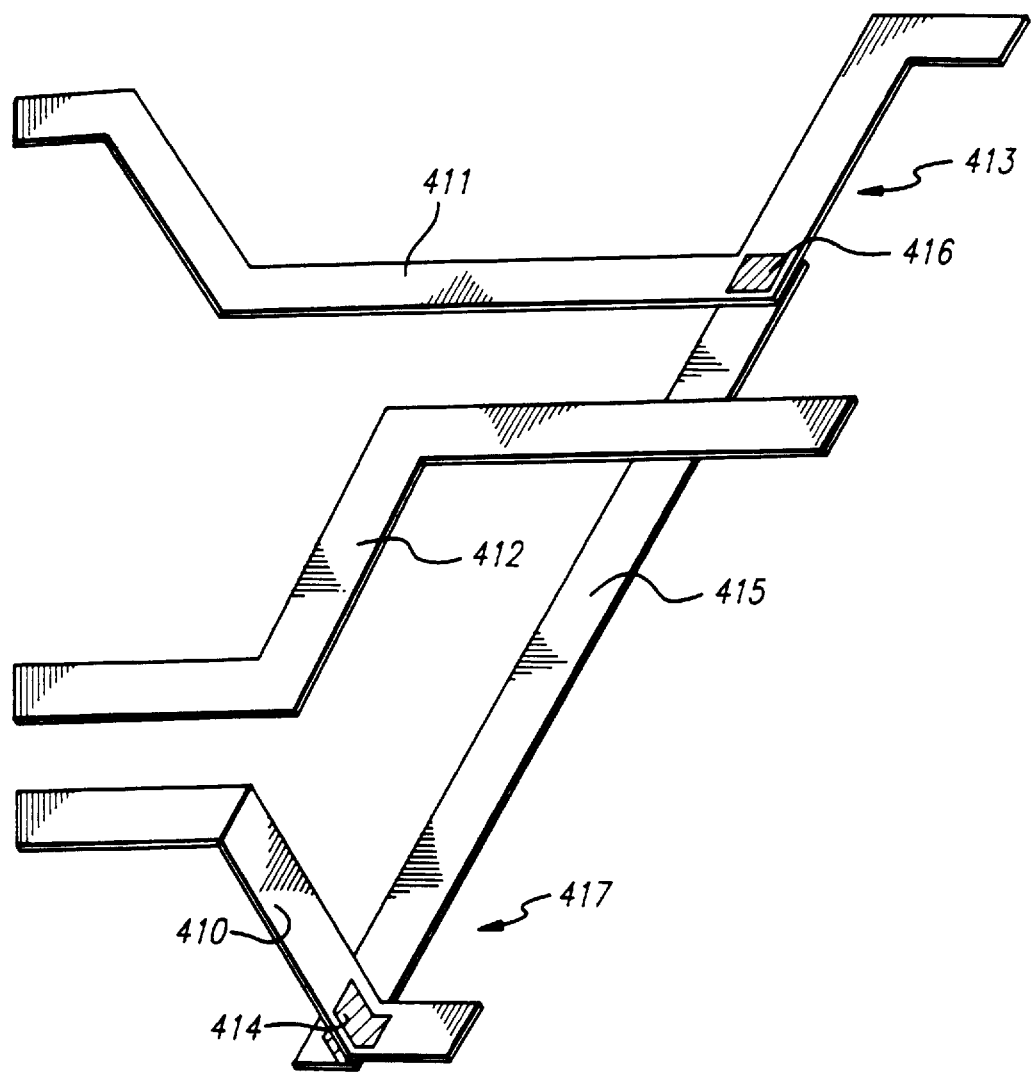
FIG. 111 is a perspective drawing illustrating a jumper connector fabricated in the second metal layer to make an electrical connection between two conductors in the third metal layer.

Referring to FIG. 111, if it is necessary to make a connection between a first wire 410 and a second wire 411 that must cross a third metal conductor 412 in the same metal layer 413, vias 414 and 416 may be fabricated to establish electrical connection with a jumper conductor 415 fabricated in another metal layer 417. In this example, a first via 414 establishes an electrical connection between the first conductor 410 and the jumper conductor 415. The first conductor 410 is fabricated in the third metal layer 413. The jumper conductor 415 is fabricated in the second metal layer 417. A second via 416 is fabricated to establish an electrical connection between the second conductor 411 and the jumper conductor 415.

In FIG. 4, the metal conductor 131 in the third metal layer 119 is angularly displaced from the metal conductor 128 in the second metal layer 118 by about 60 degrees, and is also angularly displaced from the metal conductor 122 in the first metal layer 117 by about 60 degrees. In this illustrated example, where metal conductors in each metal layer run in a single direction in that layer, no parallel wires will exist between layers.

Parasitic and intermetal capacitance can be a problem in memory arrays. In a conventional two metal layer memory array, the bit lines and the select lines are normally fabricated in the same layer of metal. As memory layouts are made smaller and smaller, the bit lines and the select lines become closely packed. In addition to other adverse consequences, this increases problems related to parasitic capacitance and crosstalk, which may limit the performance and size of a memory array.

As explained more fully below, in the case of a DRAM cell, the line capacitance can be a problem when it becomes large relative to the storage capacitance of the cell storage devices. A DRAM array can only tolerate a certain ratio of line capacitance to storage capacitance. The only way to favorably adjust the ratio of storage capacitance to line capacitance in some conventional designs was to increase the storage capacitance. The only practical way to increase the storage capacitance was to increase the size of the cell. This had an adverse effect upon cell density, and became a limiting factor on how much a conventional memory array could shrink in size. In addition, the amount of storage capacitance can become large enough to slow the speed of a memory array.

By routing select lines in a first metal layer, and bit lines in a second metal layer, and power interconnect on a third metal layer, intermetal and line to line capacitance in a memory array is reduced. In addition, crosstalk is reduced.

The advantages of the tri-directional interconnect system may be applied to reduce the intermetal capacitance in memory arrays, such as DRAM arrays, SRAM arrays, EPROM arrays, PROM arrays, ROM arrays, E²PROM arrays, and flash EPROM arrays. However, the tri-directional routing reduces intermetal capacitance in any circuit arraingement, and is not limited to memory arrays.

Thus, a method of reducing intermetal capacitance in a microelectronic device may include the steps of fabricating a first layer of interconnect 765 having conductors extending in a first direction, fabricating a second layer of interconnect 766 having conductors extending in a second direction that is non-orthogonally angularly displaced from the first direction, and fabricating a third layer of interconnect 767 having conductors extending in a third direction that is non-orthogonally angularly displaced from the first direction, and that is non-orthogonally angularly displaced from the second direction. The angular displacement between the first direction and the second direction is preferrably between about 50 degrees and about 70 degrees, and is more preferrably about 60 degrees. The angular displacement between the first direction and the third direction is preferrably between about 50 degrees and about 70 degrees, and is more preferrably about 60 degrees. The angular displacement between the second direction and the third direction is preferrably between about 50 degrees and about 70 degrees, and is more preferrably about 60 degrees.

Hexagonal Cells

Transistors or cells in the shape of hexagons, triangles, and diamonds tile well together, thus making efficient use of the surface space available on a semiconductor wafer and wasting as little real estate as possible. This may be better understood with reference to FIG. 11.

Figure 11:
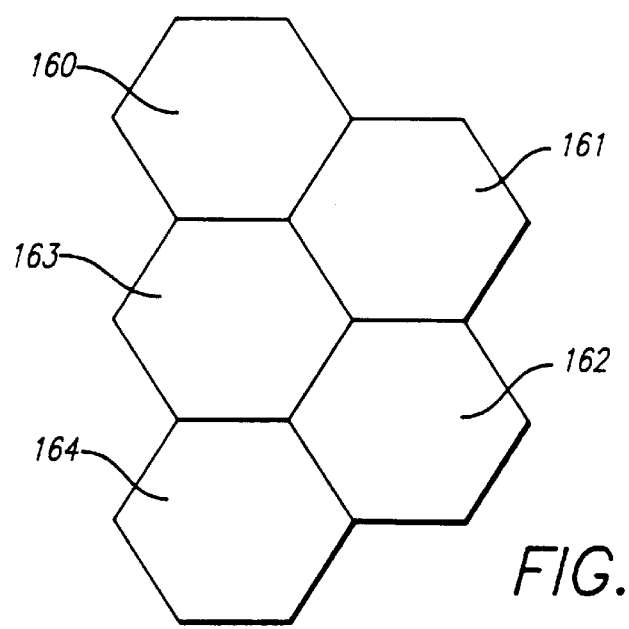
FIG. 11 depicts a layout of hexagonal shaped cells on a semiconductor substrate.

FIG. 11 shows a plurality of closely packed hex shaped cells 160, 161, 162, 163 and 164 laid out on the surface of a wafer. Hex shaped cell 163 shares a common side with immediately adjacent hex shaped cell 160. Hex shaped cell 163 also shares a common side with immediately adjacent hex shaped cell 161. Similarly, hex shaped cell 163 shares a common side with immediately adjacent hex shaped cells 162 and 164, respectively. Cells in this shape tile well together so that no space on the surface of the wafer is wasted.

Figure 12:
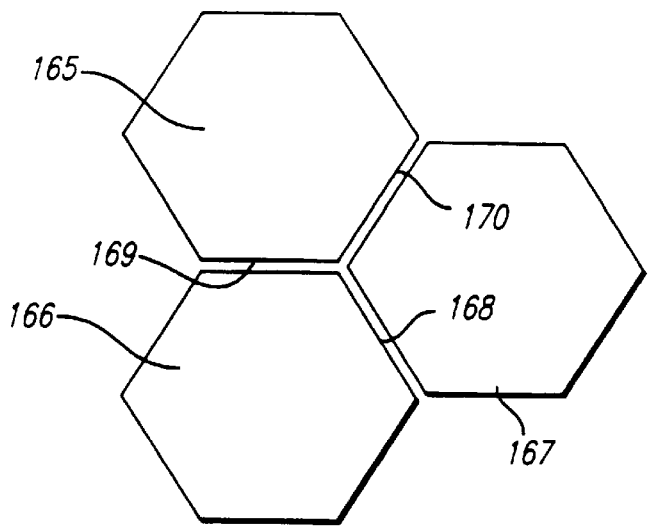
FIG. 12 depicts a layout of hexagonal shaped cells on a semiconductor substrate having channels provided between cells to provide room for routing.

If desired, hex shaped cells 165, 166 and 167 may be laid out as shown in FIG. 12. For example, a channel 168 is formed between hex shaped cell 166 and hex shaped cell 167. Similarly, a channel 169 is formed between cells 166 and 165. And a channel 170 is formed between cells 167 and 165. In some instances, a channel 169 or 168 may be desirable to allow room for interconnect. In instances where such channels 168, 169 and 170 are desired, the hex shaped cells 165, 166 and 167 will still tile well together with little or no wasted space.

Figure 13:
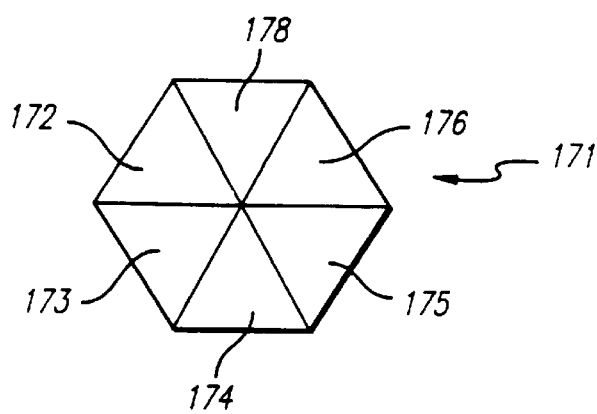
FIG. 13 depicts a layout of a hexagonal shaped cell on a semiconductor substrate comprising six triangular shaped cells.

Triangular shaped devices may tile well in the hexagonal architecture according to the present invention. FIG. 13 shows an example of a hex shaped cell 171. The hex shaped cell 171 is comprises six triangular shaped cells 172, 173, 174, 175, 176, 177 and 178. The cell 172 may be a triangular shaped device 172, or the cell 172 may be a group of devices or gates laid out in the form of a triangle 172. It will be apparent that triangular shaped cells 172, 173, 174, 175, 176, 177 and 178 which are laid out as shown in FIG. 13 will tile together as shown in FIG. 11 or FIG. 12. Any, or all, of the hex shaped cells 160, 161, 162, 163 and 164 shown in FIG. 11 may be fashioned from six triangular shaped cells 172, 173, 174, 175, 176, 177 and 178 as shown in FIG. 13. Similarly, the hex shaped cells 165, 166, and 167 shown in FIG. 12 may be formed by laying out six triangular shaped cells 172, 173, 174, 175, 176, 177 and 178 as shown in FIG. 13.

Programmable Devices Having Variable Gain Or Delay Characteristics

Figure 14:
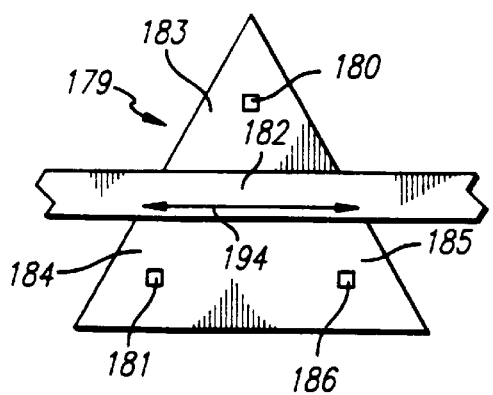
FIG. 14 is a top view of a triangular shaped transistor on a semiconductor substrate.

FIG. 14 illustrates a triangular shaped cell 179 that is particularly advantageous. The triangular shaped cell 179 may be configured in a number of ways, as will be explained more fully below. In one example, the triangular shaped cell 179 may be configured as a transistor 179 having a doped region 183 forming a source and a doped region 184 forming a drain. Polysilicon 182 may be deposited as shown in FIG. 14 over a suitable gate oxide (not shown). Of course, the gate oxide may be grown on the substrate in the illustrated region of the transistor 179, and a gate electrode 182 formed comprising suitably doped polysilicon. Manufacturing steps for fabricating such structure is known to those skilled in the art. A first contact 180 may be formed for the source to facilitate interconnection of the transistor 179 to other devices. Similarly, a second contact 181 may be formed to permit interconnection of the drain 184 of the transistor 179.

The gate 182 may be located in a different position relative to the source 183 and drain 184 to fabricate a transistor 179 providing a higher or lower drive current. This is a programmable design in that a transistor having a range of desired drive currents may be fabricated from this triangular transistor 179 design by changing the location of the gate 182.

Figure 15:
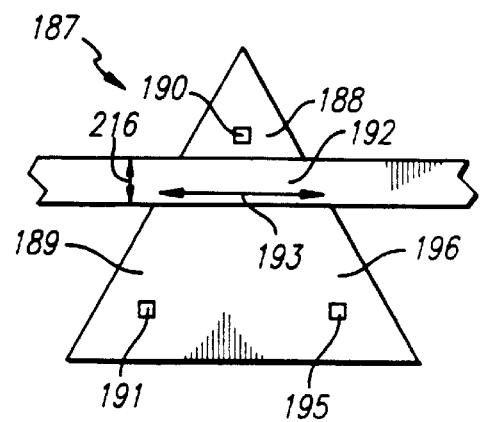
FIG. 15 is a top view of an alternative embodiment of a triangular shaped transistor on a semiconductor substrate.

The programmability of this design may be better appreciated by comparing the transistor 187 shown in FIG. 15. The transistor 187 has a source 188 and a drain 189. A first contact 190 for the source and second contact 191 for the drain are provided. In the example illustrated in FIG. 15, a gate 192 is formed by the polysilicon 192. The channel width 193 of the gate 192 is smaller than the channel width 194 shown in FIG. 14. The smaller channel width 193 of the transistor 187 shown in FIG. 15 will result in a lower drive current for a given voltage on the gate 192 as compared with the transistor 179 shown in FIG. 14.

Figure 16:
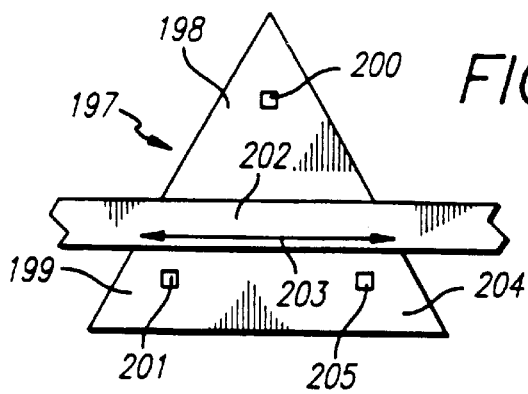
FIG. 16 is a top view of another alternative embodiment of a triangular shaped transistor on a semiconductor substrate.

The transistor 197 shown in FIG. 16 has a source 198 and a drain 199. A first contact 200 for the source and second contact 201 for the drain may be provided for interconnection. In the example illustrated in FIG. 16, a gate 202 is formed by the polysilicon 202. The channel width 203 of the gate 202 is larger than the channel width 194 shown in FIG. 14. The larger channel width 203 of the transistor 197 shown in FIG. 16 will result in a higher drive current for a given voltage on the gate 202 as compared with the transistor 179 shown in FIG. 14. If the depth of the channel is the same, then the drive current for a transistor 197 with a channel width 203 three times the size of a second transistor 187 should be three times greater.

Alternatively, the delay of devices may be similarly programmed. For a given fixed current, a transistor 197 with a larger channel width 203 as shown in FIG. 16 will have a longer delay than a transistor 187 with a smaller channel width 193 as shown in FIG. 15.

The gate electrode 192 shown in FIG. 15 has a width 216. If the width 216 is made larger, the transistor 187 will be slower. If the width 216 is made smaller, the transistor 187 will be faster. Thus, the speed of the transistors 187 may be programmed during the final fabrication steps to provide any desired speed within a possible range which may be needed in a circuit by adjusting the width 216 of the gate electrode 192.

In addition, the thickness of the gate can be changed to reduce (or increase) the current. This is illustrated in FIGS. 20C and 20D. The thicker gate electrode 266 as compared to the gate electrode 267 shown in FIG. 20C results in less current through the respective transistors.

The triagular transistor 179 described herein provides a programmable design that permits partial prefabrication of a substrate having the structure shown in FIG. 14 except that no gates 182 (or source/drain regions) are formed. The wells and isolation structures of the transistors are made in advance, to thereby make inchoate transistor structures. This may provide an especially quick method for implementing custom circuit designs in silicon using such partially prefabricated substrates. A substrate having such partially fabricated inchoate transistors 179 may be made in advance, and then used to build any desired circuit by laying down gates 182, forming source/drain regions, and interconnecting the transistors 179. The gates 182 may be laid down as shown in FIG. 14, FIG. 15, or FIG. 16, depending on the size of the transistors that are needed to construct the desired circuit. For examples if a large transistor is needed at a given point in the circuit, a "large" transistor like the transistor 197 shown in FIG. 16 may be fabricated by placing the gate electrode as shown. Different size transistors may be needed at different points in the desired circuit, and it will be appreciated that some transistors may be constructed as shown in FIG. 14, some as shown in FIG. 15, and some as shown in FIG. 16. An advantage of this arrangement is that all transistor structures are the same size. "Larger" transistors actually occupy the same amount of real estate; the transistors are fabricated as "large" transistors simply by locating the gate electrode in the appropriate location relative to the triangular structure. Of course, the arrangements shown in FIG. 14, FIG. 15 and FIG. 16 are not the only possible examples. These embodiments are illustrative only, and variations in the illustrated examples are also possible.

Referring to FIG. 14, two transistors 179 may be simultaneously fabricated from the illustrated arrangement. A second drain 185 is provided having a common source 183. The second drain 185 is provided with a third contact 186 for interconnection. The second transistor 179 has a common gate 182.

Similarly, the transistor 187 shown in FIG. 15 may have a second transistor having a common source 188, common gate 192, and a drain 196 with a third contact 195. The transistor 197 shown in FIG. 16 may also have a second transistor having a common source 198, common gate 202, and a drain 204 with a third contact 205.

It will be understood that the terms "source" and "drain" as applied to field effect transistors merely define opposite ends of a channel region which is controlled by a voltage applied to a gate. The source and drain are interchangeable in that current may flow into either one and out of the other. Therefore, the terms "source" and "drain", and the relative polarities of voltages applied thereto, which may be described in the examples illustrated in the present specification, are arbitrary and reversible within the scope of the invention, and are not to be considered as limiting the invention to one or the other of the possible configurations of polarities.

Field Programmable Gate Array

FIG. 125 shows a schematic diagram of a field programmable device suitable for use in a gate array or the like. A transistor 815 may have the equivalent of a "fuse" 816, so that if the fuse 816 is broken (by programming the array devices in the field) the transistor 815 is rendered inoperative. FIG. 126 shows a layout of a field programmable device 817. The programmable fuse is represented by the terminal 818. The device 817 shown in FIG. 126 has three potential transistors with a common source/drain 819. Gate electrodes 822, 823 and 824 are formed by polysilicon layers. A source/drain terminal 821 and a source/drain terminal 820 are also shown.

FIG. 127 shows an example of a hexagonal cell 825 comprising six of the structures shown in FIG. 126 arranged in an array. The devices are programmed by selecting either column line 828, or column line 829, or column line 830. This action potentially selects two programmable devices in each column. The device to be programmed is finally selected by turning on either common gate 826, or common gate 827. Because each common gate 826 or 827 only potentially selects only one programmable device in each column, a device to be programmed may be uniquely selected by selecting the desired column 828, 829, or 830, and by selecting the desired row 826 or 827.

FIG. 128 illustrates a cross-sectional view of one embodiment of a field programmable E$^2$PROM 831. A gate 832 is provided, and a floating gate 833 is included to permit the device 831 to be programmed. Source 834 and drain 835 connections are shown schematically. Of course, field oxide regions 836 are form in a manner known in the art. By using a high programming voltage, a selected device can be programmed by injecting charge from the substrate 837, causing charges to tunnel through to and build up on the floating gate 833 in a manner known in the art. A device 831 may be deprogrammed by sucking the charge from the floating gate 833 in a manner known in the art.

Hexagonal Cells Comprising Triangular Devices

Figure 17:
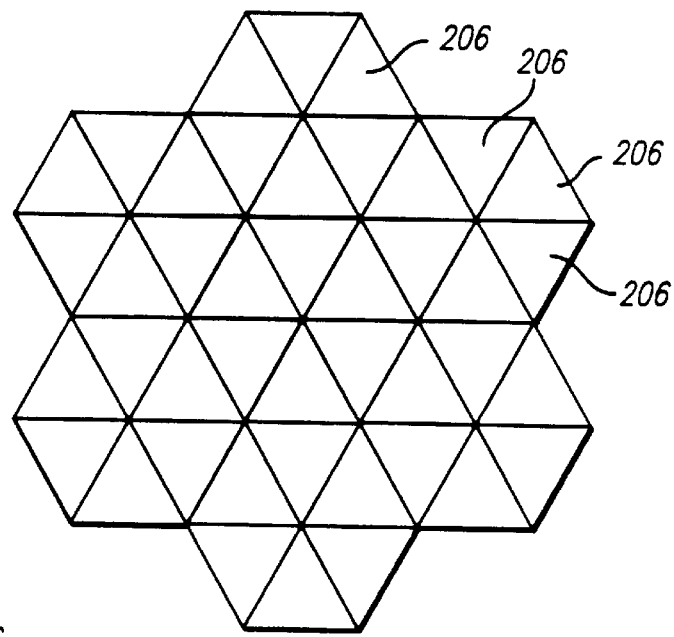
FIG. 17 depicts a layout of a plurality of hexagonal shaped cells on a semiconductor substrate each comprising six triangular shaped cells.

Referring to FIG. 17, triangular cells 206 such as the transistors 179 shown in FIG. 14 may be fabricated on a semiconductor substrate as shown. The triangular devices 206 may be arranged as hexagons (see FIG. 13) and tile together well as shown in FIG. 17.

Figure 18:
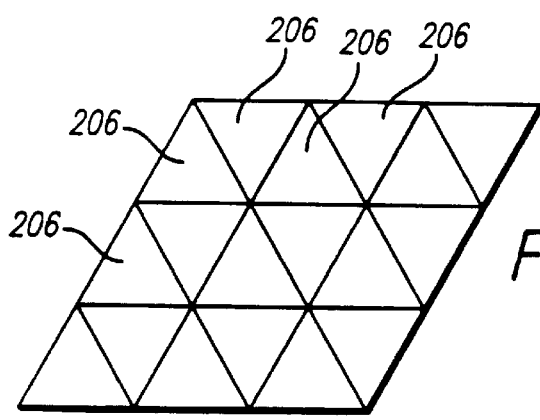
FIG. 18 depicts a layout of triangular shaped cells forming a larger diamond shaped megafunction cell.
Figure 19:
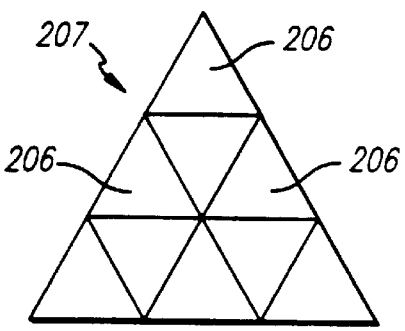
FIG. 19 depicts a layout of triangular shaped cells forming a larger triangular shaped megafunction cell.

Triangular devices 206 tile together well in a diamond shaped configuration as shown in FIG. 18. Triangular devices 206 tile together well in a larger triangle shape or megafunction 207 shown in FIG. 19. Six of the megafunctions 207 may be tiled together as shown in FIG. 13 to form a large hexagonal shaped megafunction. These illustrated groupings show various expansion cells or functions made up of smaller hexagonal or triangular functional blocks. In the architecture according to the present invention, diamond shaped cells as shown in FIG. 18 may tile well with hexagonal shaped cells as shown in FIG. 13 or FIG. 17, and with triangle shaped cells 207 as shown in FIG. 19. The hexagonal architecture according to the present invention may provide the most compact way to partition the available area on a semiconductor substrate.

Although the cells shown in FIG. 17, FIG. 18 and FIG. 19 are shown as closely packed, the cells may alternatively be laid out with channels providing space for routing interconnections, such as the channels 168, 169, 170 shown in FIG. 12.

Tri-ister Structure

Figure 20:
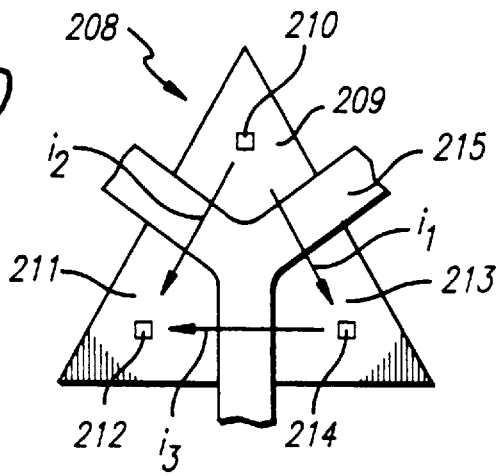
FIG. 20 is a top view of an embodiment of a triangular shaped structure referred to as a tri-ister comprising three transistors on a semiconductor substrate.

An alternative embodiment of a triangular structure 208, which may be referred to as a tri-ister, is depicted in FIG. 20. In this example, three transistors may be formed in a single triangular shaped cell 208. A common gate electrode 215 divides the structure 208 into a doped region 209 having a contact 210 that may be a source. A doped region 211 having an electrode contact 212 may be a drain. A doped region 213 having an electrode contact 214 may be a second drain. A first transistor may have a source 209 and drain 213. A second transistor may have a source 209 and drain 211. The region 213 may function as a source relative to region 211, forming a third transistor having a source 213 and drain 211.

Figure 112:
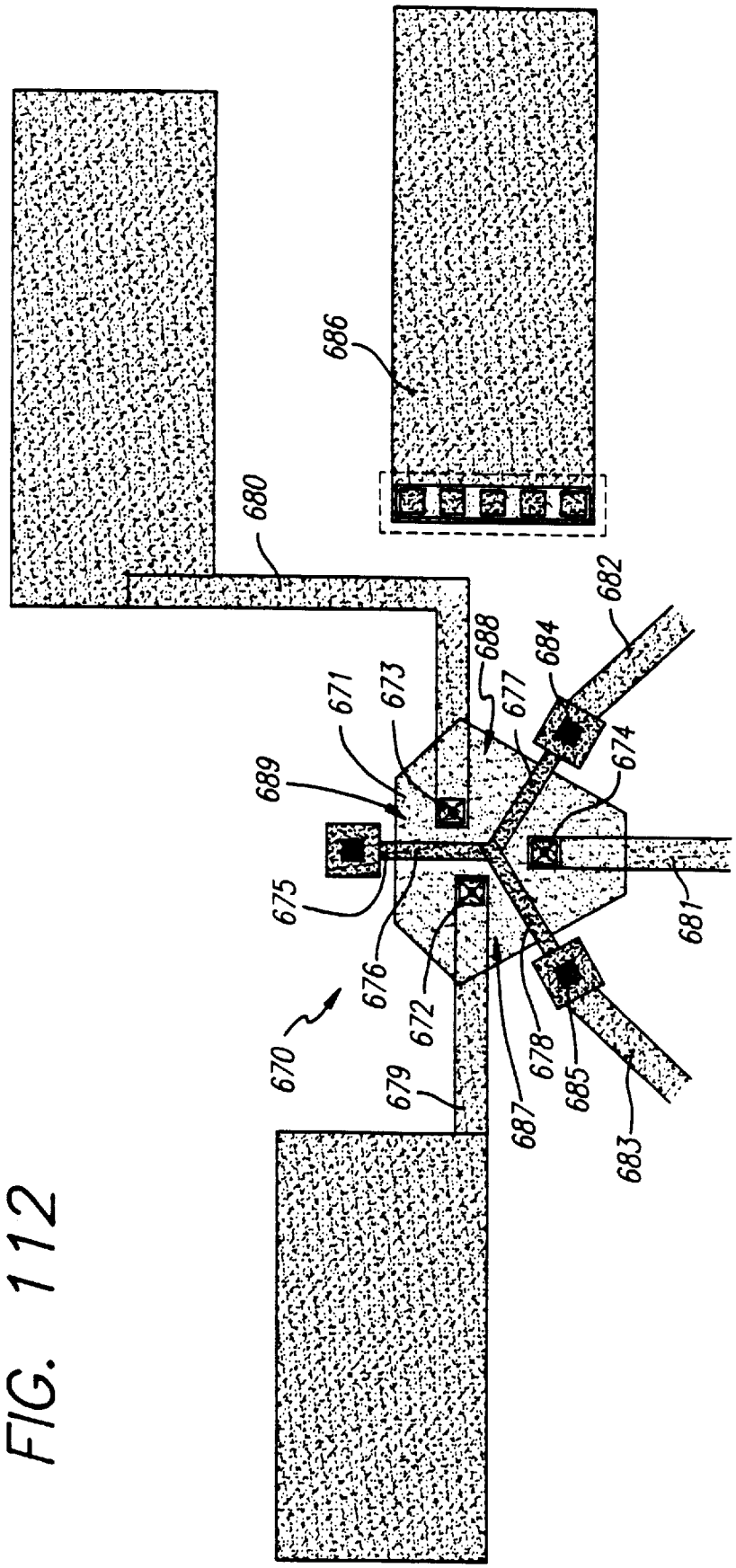
FIG. 112 illustrates a top view of an example of a layout for a tri-ister structure.

An example of a layout of a tri-ister 670 is shown in FIG. 112. A doped region 671 may be a P-well or an N-well, depending upon whether the tri-ister 670 is a PMOS or NMOS device. A first source/drain terminal 673 provides electrical connection to interconnect 680, which in this case is connected to a voltage $V_{DS1}$. A second source/drain terminal 674 provides electrical connection to interconnect 681, which is connected to a voltage $V_{SS}$. And a third source/drain terminal 672 provides electrical connection to interconnect 679, which in this case is connected to a voltage $V_{DS2}$. The terminals 672, 673 and 674 may comprise vias to electrically connect the doped region 671 with a metal layer.

Polysilicon 675 is used to form a first gate electrode 677, a second gate electrode 678, and a third gate electrode 676. The gate electrodes 676, 677, and 678 comprise a common gate electrode in the illustrated example. A first or main transistor 688 is formed by the source 673, drain 674, and gate 677. A second transistor 687 is formed by the source 672, drain 674, and gate 678. A third transistor 689 is formed by the source/drain terminal 672, the source/drain terminal 673, and the gate 676.

A terminal or via 684 provides electrical connection to interconnect 682 in order to facilitate connection of other circuit components to the gate electrode 677. A terminal or via 685 provides electrical connection to interconnect 683 in order to facilitate electrical connection of other circuit components to the gate electrode 678. A P-well 686 is also shown in this particular example. The P-well 686 is preferably connected to the voltage $V_{SS}$.

Figure 113:
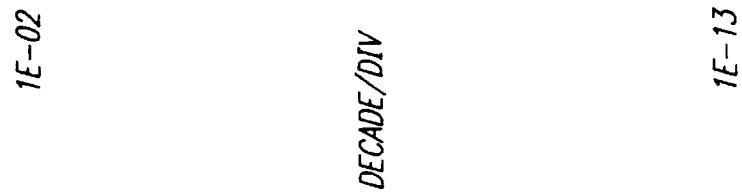
FIG. 113 is a graph showing a main transistor voltage-current curves for the tri-ister shown in FIG. 112.

An example of an NMOS tri-ister structure 670 may be constructed in accordance with one aspect of the present invention as illustrated in FIG. 112. Voltage curves, current curves, and transistor characteristics may be determined for the main transistor 688 formed by the source 673, drain 674, and gate 677. Measurements were made from the first terminal 673, which was at the voltage $V_{DS1}$, to the second terminal 674, which was at the voltage $V_{SS}$. The voltage $V_{DS2}$ applied between the third terminal 672 and the second terminal 674 was used as the controller voltage. The main transistor 688 voltage-current curves controlled by voltage $V_{DS2}$ are shown in FIG. 113. Table 1 shows the range of the variables which were used to generate the curves shown in FIG. 113. The start value, stop value, and step size for each variable voltage is given in volts. The values of the constant voltages are set forth in volts. In Table 1, "VG1" is the gate voltage, "VDS2" is the voltage $V_{DS2}$, "VDS1" is the voltage $V_{DS1}$, and "VB" is the voltage $V_{SS}$. Both the subthreshold slope and the threshold voltage $V_T$ are basically independent of the voltage $V_{DS2}$.

However, the drive current is dependent upon the voltage $V_{DS2}$. In addition, the effective channel width of the main transistor 688 can be controlled by the voltage $V_{DS2}$. That is, by varying the voltage $V_{DS2}$, the main transistor 688 can be controlled to behave as if it is either (a) a transistor that has a certain channel width W, or (b) a transistor that has a certain channel width 2 W that is twice as wide, even though the physical dimensions of the transistor 688 are not actually changed. This is referred to as changing the "effective channel width." In this example, the effective channel width of the main transistor may be electronically switched from W to 2 W by changing the voltage $V_{DS2}$. Thus, in a tri-ister structure 670 according to one aspect of the present invention, the effective channel width of a first transistor 688 formed by a first source/drain terminal 673, gate 677, and a second source/drain terminal 674 may be dynamically switched to double it (or conversely half it) using a control voltage $V_{DS2}$ between a third source/drain terminal 672 and the second source/drain terminal 674. The tri-ister 670 comprises a transistor 688 having dynamically adjustable transistor characteristics. The drive current of the first transistor 688 is dependent upon, and thus may be changed by, the voltage $V_{DS2}$.

Figure 114:
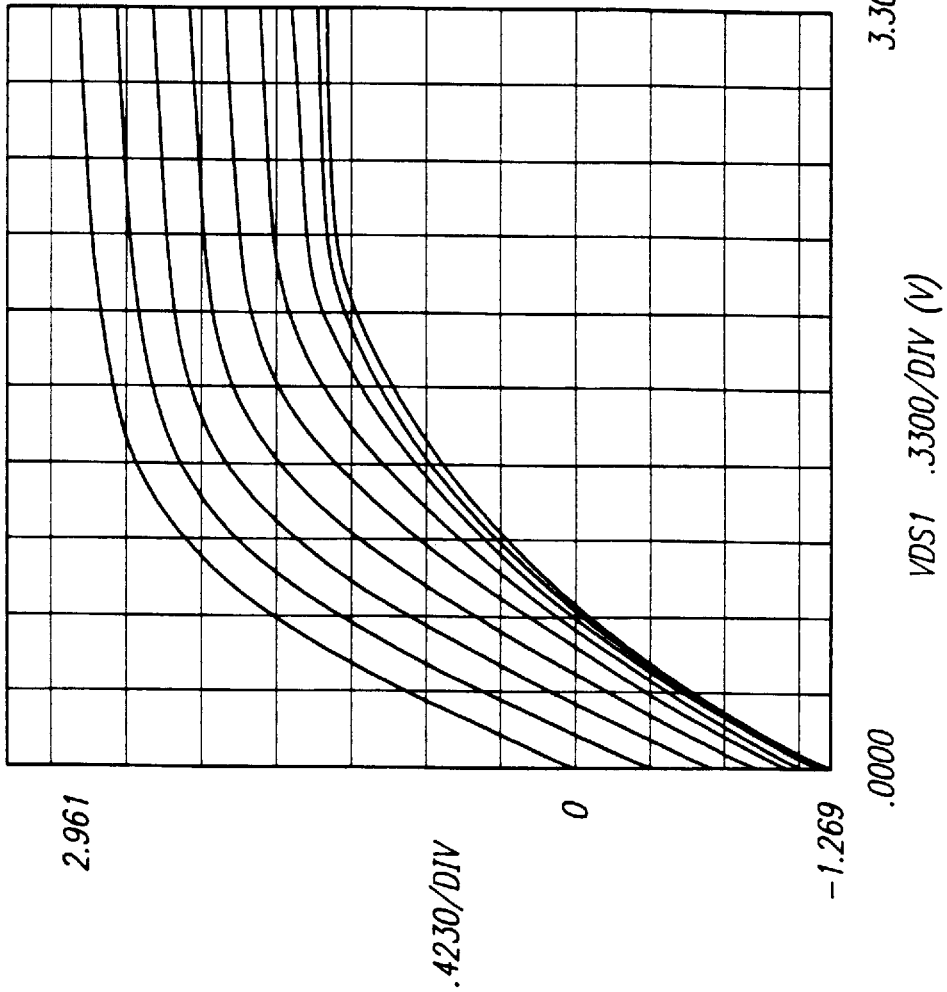
FIG. 114 is a graph showing transistor characteristics for the main transistor of the tri-ister shown in FIG. 112.

FIG. 114 shows the main transistor 688 drain-to-source current vs. the source-drain voltage, controlled by the voltage $V_{DS2}$. In this example, the gate voltage applied to the gate electrode 677 was about 3.3 volts. These curves show the effective channel width switching which is possible in accordance with one aspect of the present invention. For example, when the voltage $V_{DS2}$=3.3 volts and the voltage $V_{DS1}$=0 volts, the drain-to-source current for the main transistor 688 is 1.4 mA. This current is doubled when the voltage $V_{DS2}$=0 volts and the voltage $V_{DS1}$=3.3 volts, i.e., the drain-to-source current for the main transistor 688 is 2.8 mA. Those skilled in the art will appreciate that this indicates that the effective channel width is switching between W and 2 W in this example.

Table 2 shows the range of the variables which were used to generate the curves shown in FIG. 114. The start value, stop value, and step size for each variable voltage is given in volts. The values of the constant voltages are set forth in volts. In Table 2, "VG1" is the gate voltage, "VDS2" is the voltage $V_{DS2}$, "VDS1" is the voltage $V_{DS1}$, and "VB" is the voltage $V_{SS}$.

The transistor characteristics of an example of a PMOS tri-ister 670 are set forth in FIGS. 115, 116, 117, 118 and 119, and the accompanying Tables 3, 4, 5, 6 and 7, respectively. The Tables accompanying each Figure show the range of the variable voltages, and the constant values associated with the curves depicted in each such Figure.

Figure 115:
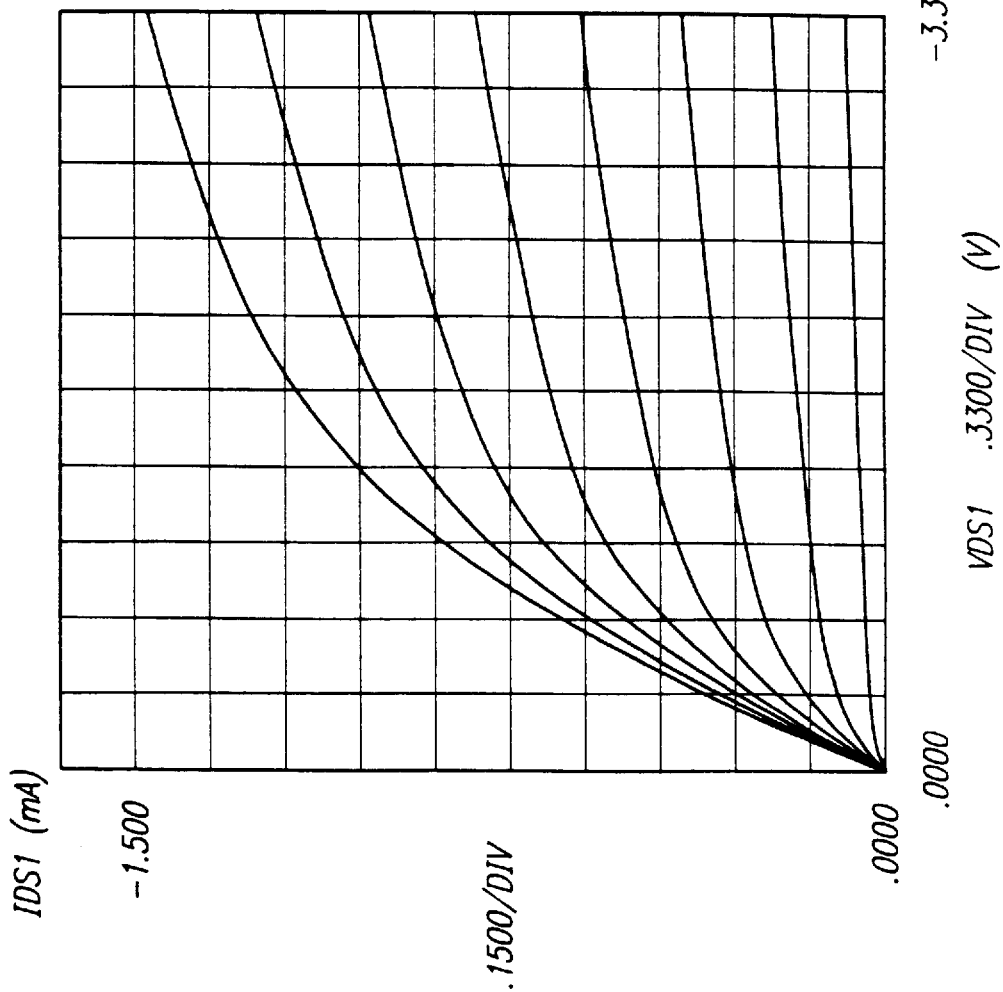
FIG. 115 is a graph showing transistor characteristics for the main transistor of the tri-ister shown in FIG. 112.

FIG. 115 shows the main transistor 688 drain current verses the drain-to-source voltage, controlled by the gate voltage at $V_{DS2}$=0 volts, normal. The accompanying Table 3 shows the range of the variable voltages, and the constant values associated with the curves depicted in FIG. 115.

Figure 116:
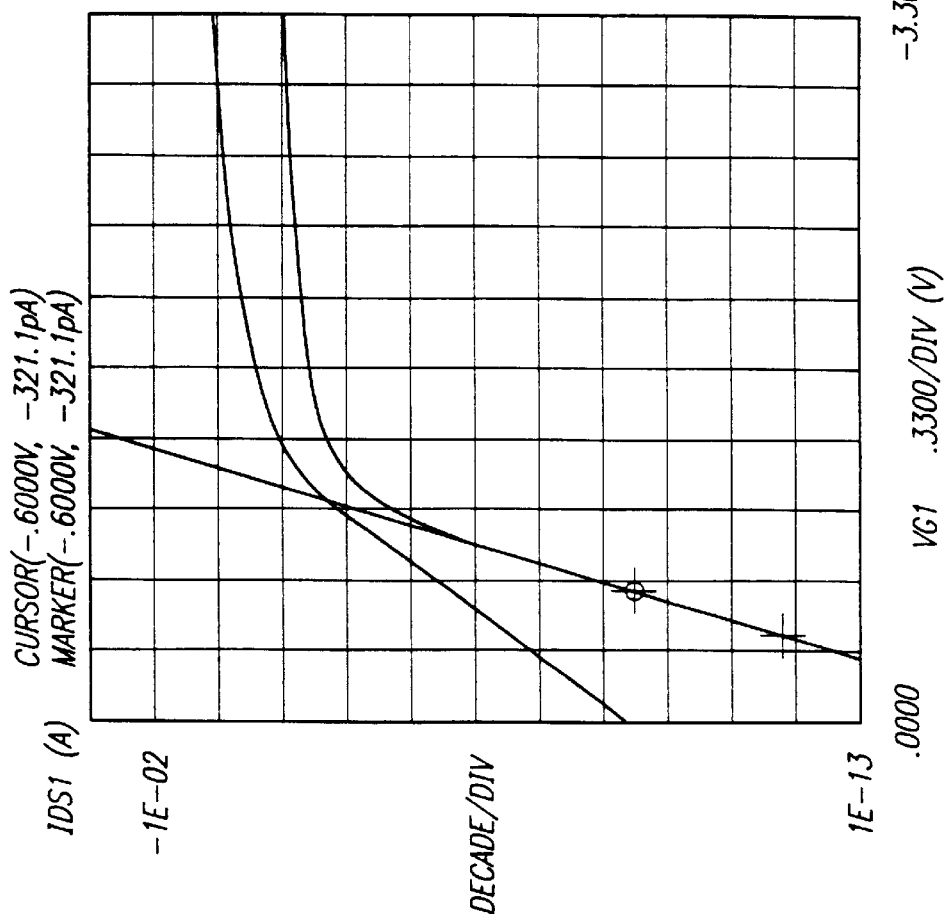
FIG. 116 is a graph showing transistor characteristics for the main transistor of the tri-ister shown in FIG. 112.
Figure 117:
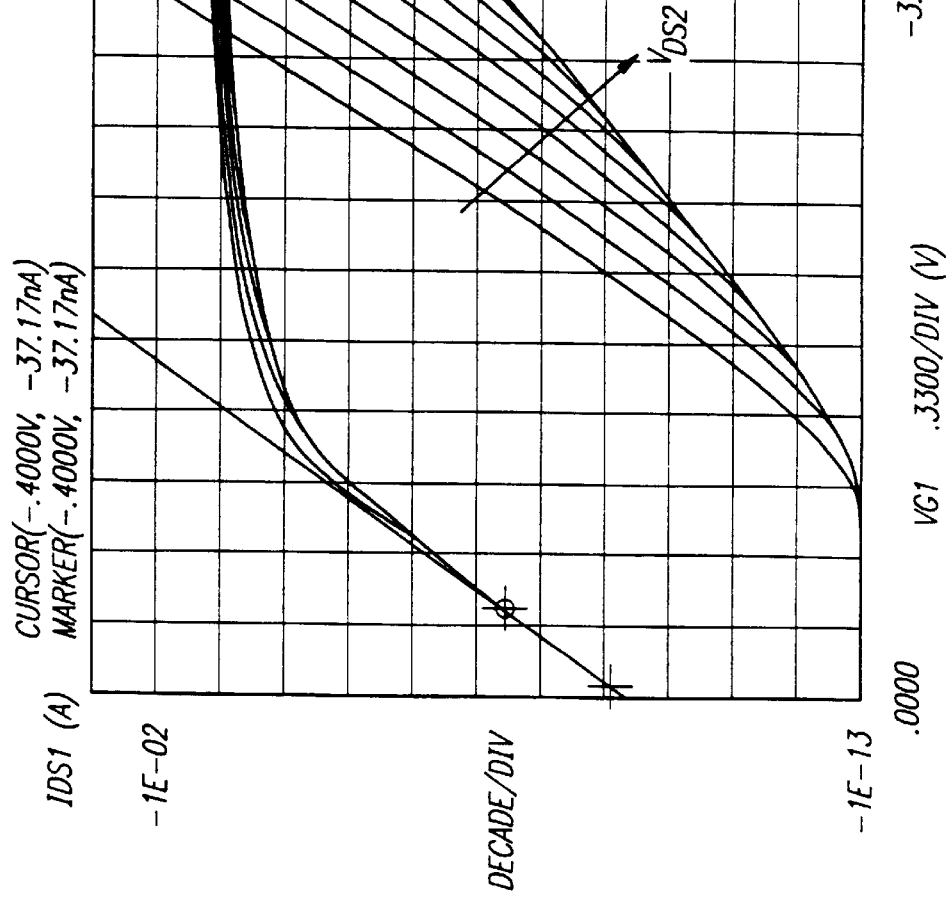
FIG. 117 is a graph showing transistor characteristics for the main transistor of the tri-ister shown in FIG. 112.
Figure 118:
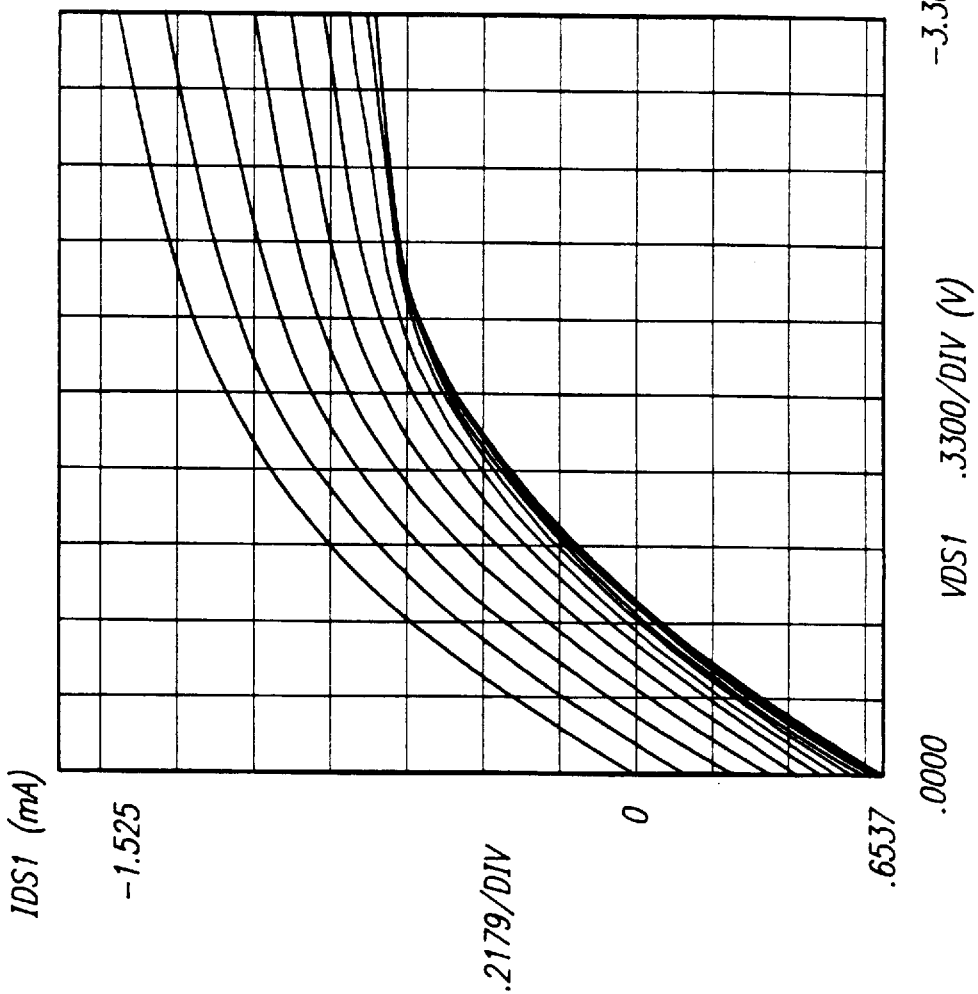
FIG. 118 is a graph showing transistor characteristics for the main transistor of the tri-ister shown in FIG. 112.
Figure 119:
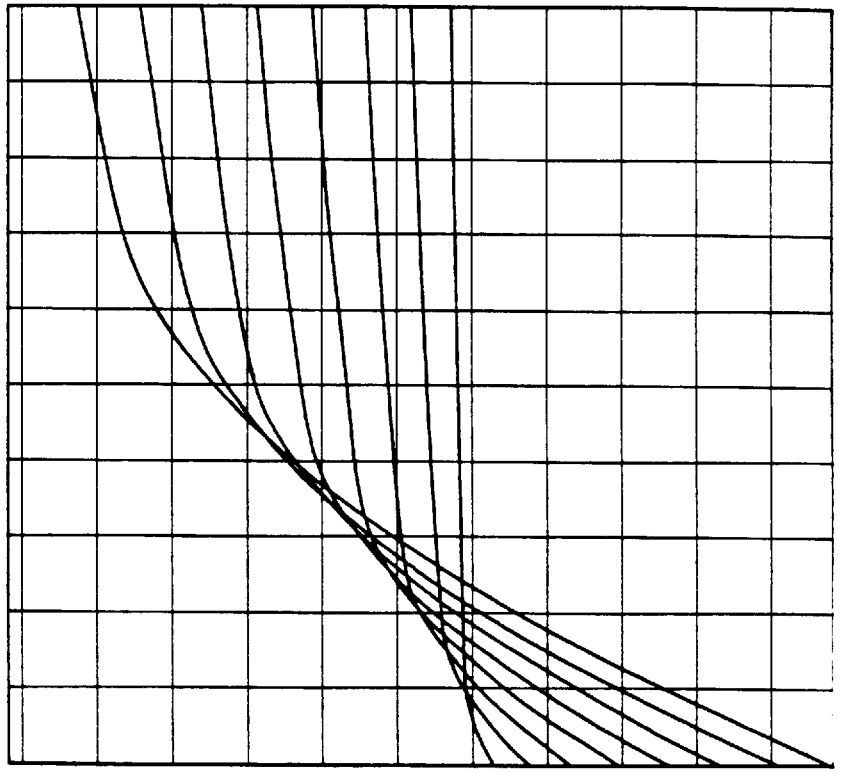
FIG. 119 is a graph showing transistor characteristics for the main transistor of the tri-ister shown in FIG. 112.

FIG. 116, Table 4, and Table 9 show the main transistor 688 subthreshold at $V_{DS2}$=0 volts, normal, 87 mv/dec, and a threshold voltage $V_T$ of approximately -1 volt. FIG. 117, Table 5, and Table 10 show the main transistor 688 current—voltage curves controlled by $V_{DS2}$. Both the subthreshold slope and the threshold voltage $V_T$ are essentially independent of the voltage $V_{DS2}$. However, as discussed above, in this example the current drive is dependent upon the value of the voltage $V_{DS2}$. Thus, the effective channel width may be switched between 2 W and W by changing the voltage $V_{DS2}$. FIG. 118 and Table 6 show the main transistor 688 drain-to-source current verses the drain-to-source voltage at a gate voltage of −3.3 volts, controlled by $V_{DS2}$. When $V_{DS2}$=−3.3 volts, and $V_{DS1}$=0 volts, the drain-to-source current is 0.7 mA, which is half of the drain-to-source current (1.4 mA) when $V_{DS2}$=0 volts and $V_{DS1}$=−3.3 volts. This indicates that the effective channel width is switching from W to 2 W responsive to a change in the voltage $V_{DS2}$. FIG. 119 and Table 7 show the main transistor 688 drain-to-source current verses the voltage $V_{DS1}$ at $V_{DS2}$=−3.3 volts, showing distorted current-voltage curves.

Figure 120:
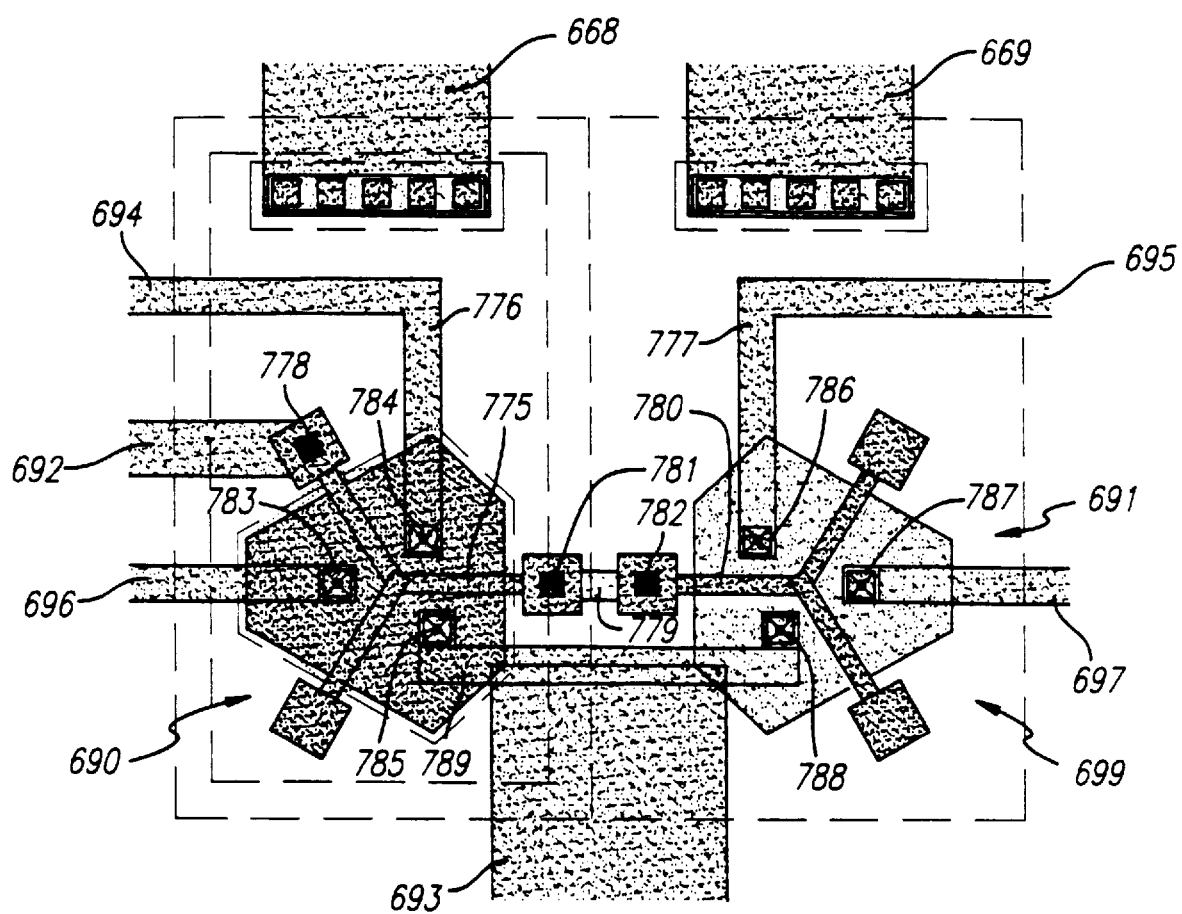
FIG. 120 shows a layout for two tri-isters configured as an inverter circuit.

FIG. 120 shows a layout for two tri-isters 690 and 691 configured as an inverter circuit, which is indicated generally by reference numeral 699. The inverter 699 has an input 692, which in the illustrated example is provided by interconnect 776. The voltage at input 692 is referred to as $V_{IN}$. The inverter 699 has an output 693, which is provided by suitable interconnect. The voltage at output 693 is referred to as $V_{OUT}$. A $V_{DD}$ voltage (sometimes referred to as $V_{S2}$) is applied to interconnect 694. A $V_{SS}$ voltage (sometimes referred to as $V_{S1}$,) is applied to interconnect 695. A voltage referred to as $V_{D1}$ is applied to interconnect 696. A voltage referred to as $V_{D2}$ is applied to interconnect 697. In the illustrated example, the voltage $V_{DD}$ is also applied to an N-well 668, and the $V_{SS}$ voltage is applied to a P-well 669.

The structure of the tri-isters 690 and 691 is similar to the tri-ister illustrated in FIG. 112. The tri-ister 690 has a Y-shaped common gate structure 775, which is electrically connected to the input 692 through a terminal or via 778. The tri-ister 691 also has a Y-shaped common gate 780. The two Y-shaped gates 775 and 780 are electrically connected to each other by interconnect 779 through terminals or vias 781 and 782.

A source/drain terminal 783 of the tri-ister 690 is connected to $V_{D1}$ by interconnect 696. The source/drain terminal 784 of the tri-ister 690 is connected to $V_{DD}$ by interconnect 776. The source/drain terminal 786 of the tri-ister 691 is connected to $V_{SS}$ by interconnect 777. The source/drain terminal 787 of the tri-ister 691 is connected to $V_{D2}$ by interconnect 697. The source/drain terminal 785 of the tri-ister 690 is connected to the source/drain terminal 788 of the tri-ister 691 by interconnect 789, which is also electrically connected to the output 693 and the voltage $V_{OUT}$.

Figure 121:
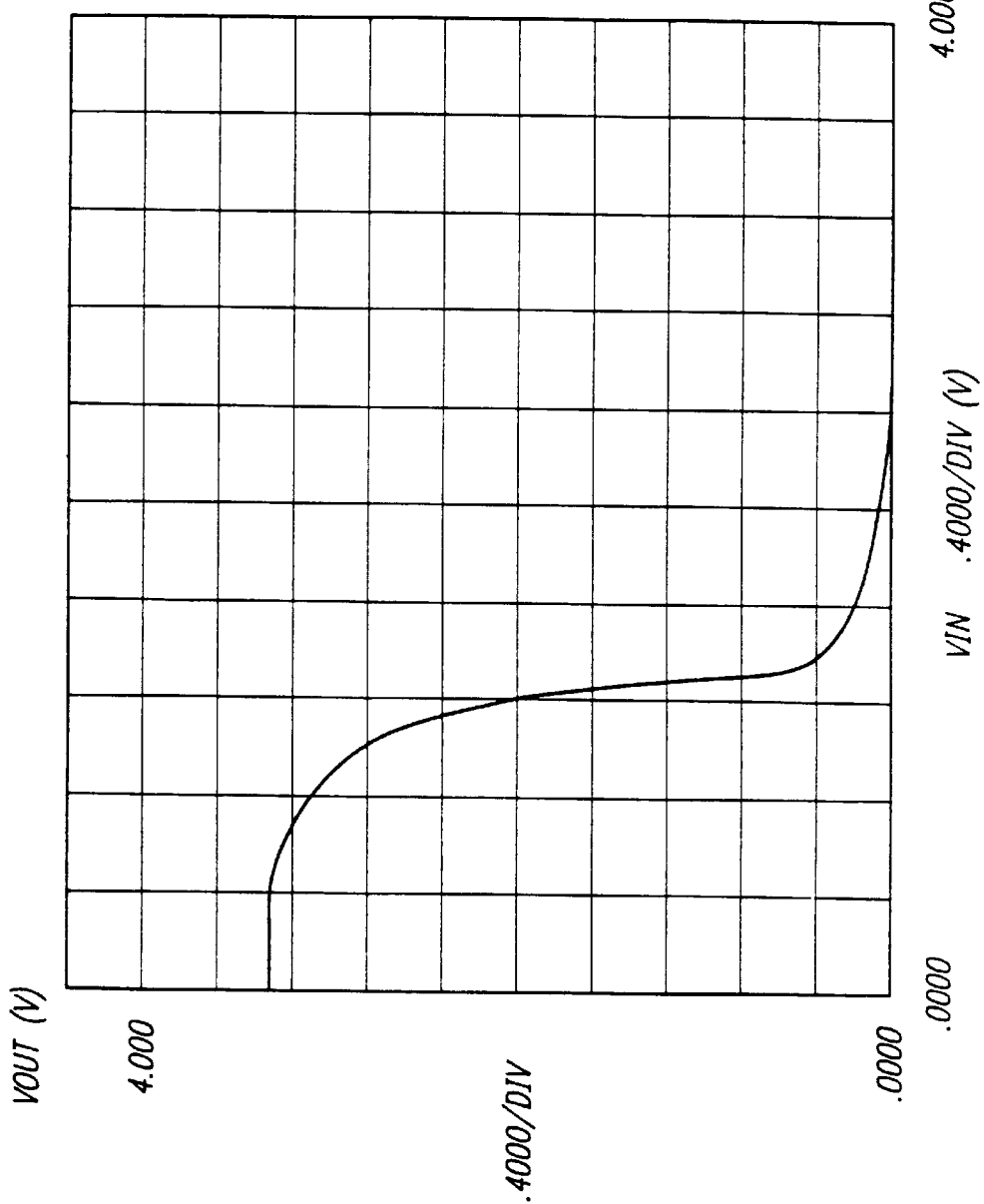
FIG. 121 shows an inverter transfer curve for the structure depicted in FIG. 120 when $V_{D1}$ and $V_{D2}$ are floating.
Figure 122:
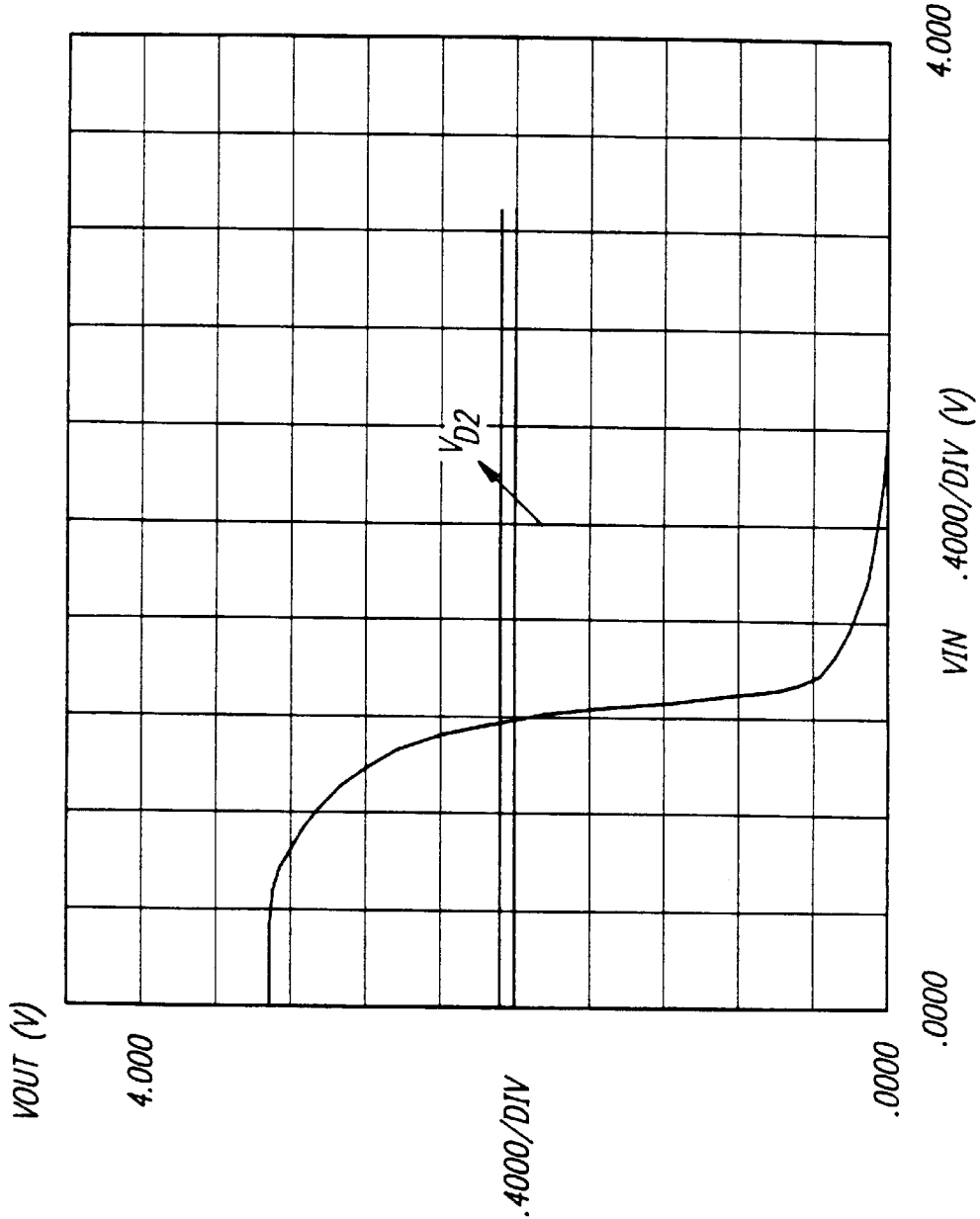
FIG. 122 shows an inverter transfer curve for the structure depicted in FIG. 120 which is controlled by $V_{D2}$.
Figure 123:
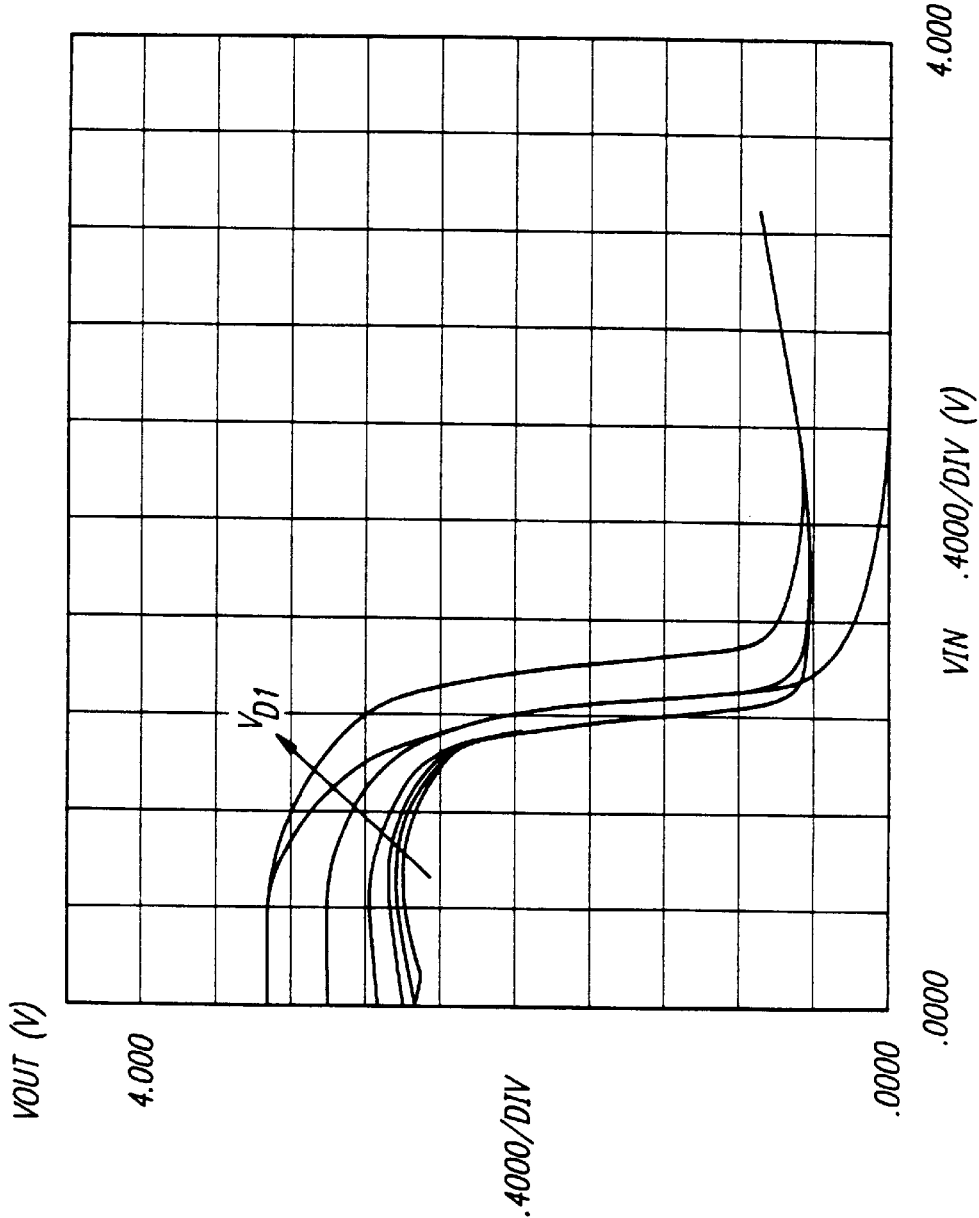
FIG. 123 shows an inverter transfer curve for the structure depicted in FIG. 120 which is controlled by $V_{D1}$.

The operation of the inverter circuit 699 may be understood by those skilled in the art from the information depicted in the graphs of FIGS. 121, 122 and 123, and the associated Tables 11, 12 and 13, respectively, in which $V_{D1}$ and $V_{D2}$ are used as controllers. FIG. 121 shows an inverter transfer curve when $V_{D1}$ and $V_{D2}$ are floating, normal, maximum noise margin, and zero standby dissipation. Table 11 shows the start and stop values, and step size, for the variable $V_{IN}$. $I_{OUT}$ referred to in Table 11 is the current flowing out of the output 693. FIG. 122 shows an inverter transfer curve controlled by $V_{D2}$ when $V_{D1}$=3.3 volts, abnormal. Table 12 shows the start and stop values, and step size, for the variables $V_{IN}$ and $V_{D2}$. FIG. 123 shows an inverter transfer curve controlled by $V_{D1}$ when $VD_2$=3.3 volts, normal, decreasing noise margin, non-zero standby power dissipation. Table 13 shows the start and stop values, and step size, for the variables $V_{IN}$ and $V_{D1}$.

A tri-ister 670, such as the example shown in FIG. 112, has a common gate electrode 675 for the three potential transistors 688, 687 and 689. The common gate electrode 675 is generally fabricated in the shape of the letter "Y." Thus, the Y-shaped gate is a characteristic of a preferred embodiment of a tri-ister. Consequently, a tri-ister may also be referred to as a Y-gate structure or device. The three devices or transistors 688, 687 and 689 may be referred to as potential transistors because it is not necessary for all three devices to be used as transistors, or used at all.

Referring to FIG. 20, if the tri-ister device 208 is biased appropriately, a first current $i_1$ can flow from the source region 209 to the drain region 213. Under a given biasing condition, it is possible to modulate the first current $i_1$ and affect a second current $i_2$ flowing from the source region 209 to the drain region 211. Under certain biasing conditions, the current $i_3$ flowing from region 213 to region 211 may be adjusted to be equal to the current $i_1$ flowing from region 209 to region 213. In this particular example, the net current flowing out of electrode 214 would be zero. This may have advantageous applications which will be apparent to those skilled in the art.

Figure 20A:
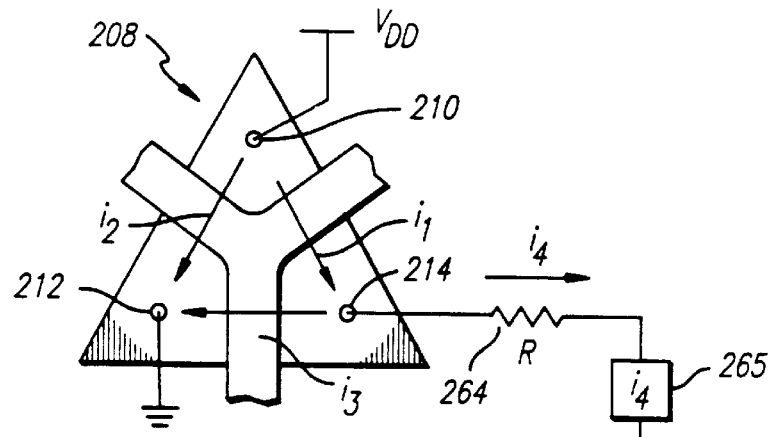
FIG. 20A is a top view of an alternative embodiment of a tri-ister.

FIG. 20A illustrates a configuration where the terminal 214 is connected to a resistor 264, which in turn is connected to a constant current source 265. The current $i_3$ flowing from terminal 214 to terminal 212 will be equal to the current $i_1$ minus the constant current $i_4$. The magnitude of the current $i_3$ will be a function of the magnitude of the current $i_1$, and the direction of flow of the current $i_3$ will depend on whether the magnitude of the current $i_1$ is greater than the value of $i_4$. Therefore, the current $i_1$ may be used to modulate the current $i_3$.

Figure 20B:
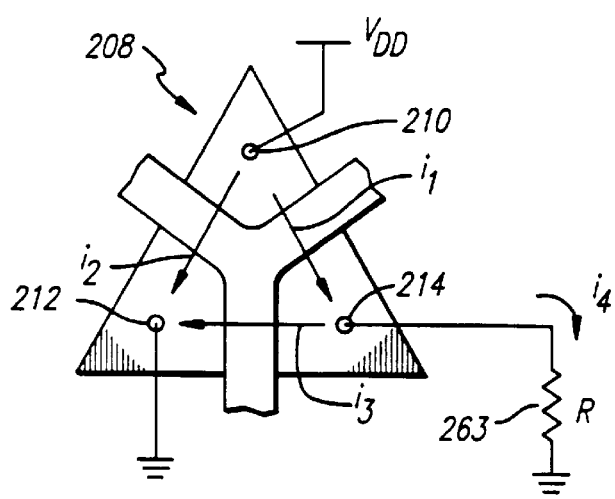
FIG. 20B is a top view of an alternative embodiment of a tri-ister.
Figure 20C:
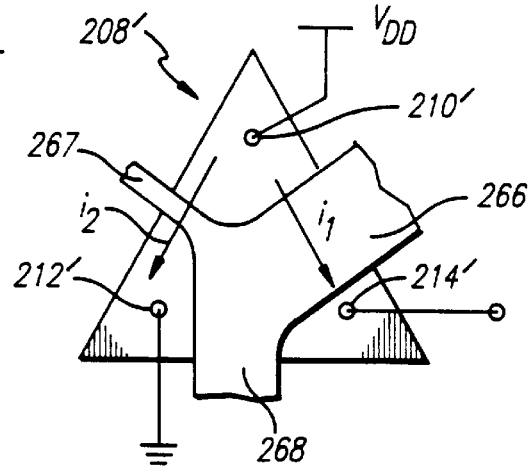
FIG. 20C is a top view of an alternative embodiment of a tri-ister.
Figure 20D:
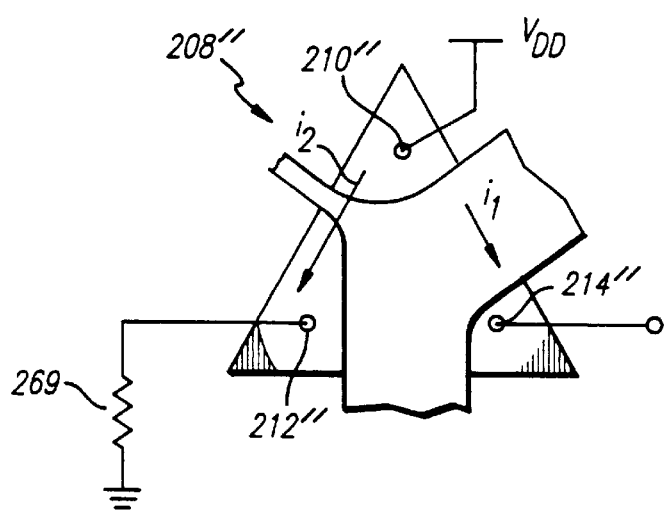
FIG. 20D is a top view of an alternative embodiment of a tri-ister.

Referring to FIG. 20B, in this configuration, the current $i_1$ flowing from terminal 210 to terminal 214 in the tri-ister structure 208 cannot be equal to the current $i_3$ flowing from terminal 214 to terminal 212, because the current $i_4$ flowing from terminal 214 to ground would have to be zero in that case. A resistor R indicated by reference numeral 263 is connected between terminal 214 and ground. If no current flowed through the resistor 263, the voltage drop across the resistor 263 will be zero, and the terminal 214 would tend to float to a voltage approaching $V_{DD}$. Under those circumstances, a current $i_4$ equal to the voltage drop across the resistor 263 times the resistance would begin to flow, and the current $i_4$ could not be zero under those conditions. The current $i_3$ flowing from terminal 214 to terminal 212 would therefore have to be less than the current $i_1$ flowing from terminal 210 to terminal 214.

FIG. 20C depicts an example of a tri-ister 208' in which the gate 266 for the transistor formed between the terminal 210' and the terminal 214' has a wider channel width. This will reduce the current $i_1$ flowing from terminal 210' to terminal 214' all other things being equal. The transistor formed between the terminal 210' and the terminal 212' has a relatively narrow channel 267, thus providing a higher current $i_2$ all other things being equal. In this example, the tri-ister structure 208' may be configured where the current $i_2$ is a multiple of the current $i_1$ for any given gate voltage.

FIG. 20D shows a configuration for a tri-ister structure 208" which is similar to that depicted in FIG. 20C. The terminal 212" is connected to a resistor 269, which is in turn connected to ground. The voltage drop across the resistor 269 will be a function of the net current flowing out of the terminal 212". The relative gate dimensions may be fabricated to achieve certain desired operating characteristics and relative current values.

The tri-ister structure 208 may be used in a configuration as an operational amplifier. The tri-ister structure 208 may also be configured as a triode transistor.

FIG. 124C shows an operational amplifier or op amp 790. The op amp 790 has a first input 791, a second input 792, and an output 793. FIG. 124A shows one example of a partial layout for an op amp 790. FIG. 124B shows a schematic diagram of an equivalent circuit for the structure depicted in FIG. 124A.

Referring to FIG. 124A, a layout for a triangular structure forming PMOS transistors 804 and 805 is shown interconnected with a triangular structure forming NMOS transistors 803 and 806. The source 800 for the transistor 803 is connected by interconnect 801 to a polysilicon layer 794 forming a common gate for two transistors 803 and 806. The transistor 806 has a common drain with transistor 803, and both are connected to ground by interconnect 796. A polysilicon layer 808 forming the gate electrode for transistor 804 is connected to the second input 792. Similarly, a polysilicon layer 809 forming the gate electrode for transistor 805 is connected to the first input 791. The transistor 804 has a common source with the transistor 805, and both are connected by interconnect 795 to a current source 799. The source of the transistor 806 is connected to the drain of the transistor 805 by interconnect 797, and both are connected to the gate of a transistor 807. The drain of the transistor 807 is grounded, and the source is connected to a second current source 798. If desired, a COMP connection may be made at the point indicated by reference numeral 810 in FIGS. 124A and 124B.

Referring to FIG. 20, the tri-ister 208 can operate as a tri-state device. For example, the terminal 212 and the terminal 214 can both be configured as drains. The current will be shared between the transistor formed with source 210/drain 214 and the transistor formed with source 210/drain 212. When one of these two transistors is turned off, or the drain changed to a source, it will double the current to the other transistor. It is possible to change the direction of the current by changing the voltage. Instead of doubling the current, of course, the converse operation could be used to half the current. The three states will then be (1) off, (2) on with current I, and (3) on with current 2I.

Figure 130:
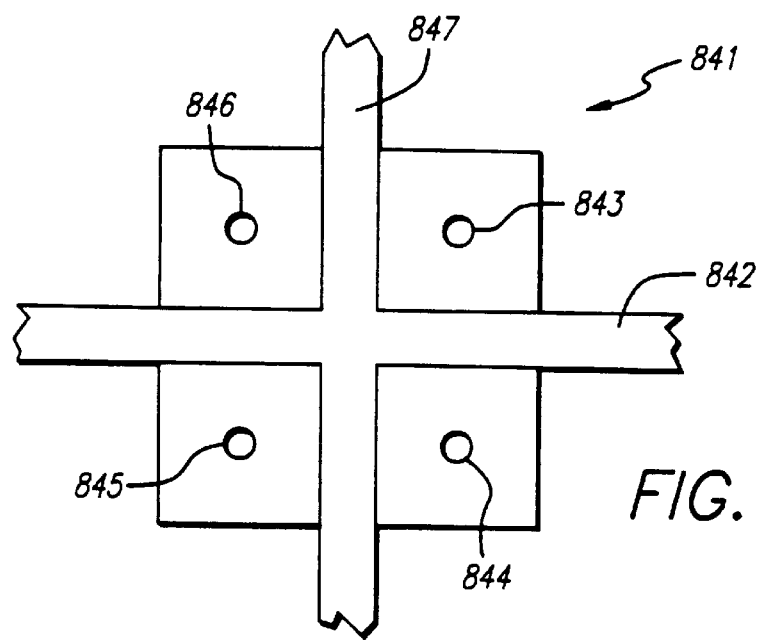
FIG. 130 illustrates a top view of the layout of a quad-ister structure.

Another embodiment of a useful device 841 is shown in FIG. 130. This structure provides four potential transistors, and may be referred to as a quad-ister. A common gate electrode 847 is shown. Source/drain terminals 843, 844, 845 and 846 are also shown.

Memory Cells

A hexagonal architecture may be advantageously applied to the design of a memory circuit, such as an SRAM circuit or a DRAM circuit.

Figure 21:
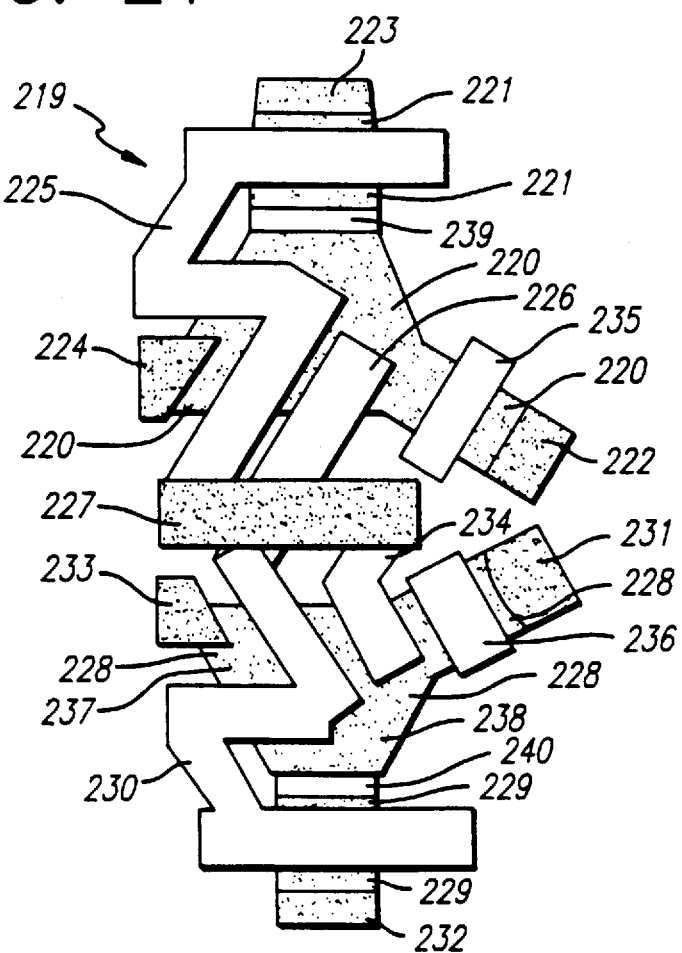
FIG. 21 is a top view of the layout of an SRAM cell on a semiconductor substrate.

For example, FIG. 21 is a top view of an SRAM cell 219. Using ion implantation steps known in the art, an NMOS island or n type diffusion region 220 may be formed in the semiconductor substrate. A PMOS island or p type diffusion region 221 may be formed using ion implantation or doping in a manner known to those skilled in the art. Similarly, an NMOS region 228 and a PMOS region 229 may be formed. Local interconnect 226 may be laid down as shown. Local interconnect 234 is also provided. Polysilicon layers 225, 230, 235 and 236 may be insulated from structure immediately below the polysilicon layers by an intervening layer of oxide (not shown). A metal interconnect 227 provides electrical connection between the polysilicon layer 225 and the local interconnect 234. The local interconnect 234 is electrically connected to the NMOS region 228. The metal interconnect 227 is electrically insulated from the local interconnect 226 and the polysilicon layer 230. Local interconnect 226 provides electrical connection between the NMOS island 220 and the polysilicon layer 230. Metal contacts 223, 222, 224, 233, 231 and 232 are provided to facilitate electrical connections.

In the example illustrated in FIG. 21, the NMOS region 228 forms a source 237 and a drain 238, with the polysilicon 230 operating as a gate electrode. Similarly, source and drain regions are formed on opposite sides of the polysilicon gate electrodes 225, 235, 236 and 230 where they cross NMOS regions 220 and 228 and PMOS regions 221 and 229. Local interconnect 239 provides electrical connection between the NMOS region 220 and PMOS region 221. Local interconnect 240 provides electrical connection between the NMOS region or island 228 and the PMOS region or island 229.

The metal contacts 224 and 233 provide ground connections. $V_{DD}$ voltage is applied to metal contacts 223 and 232. The bit line is connected to the metal contact 222. The metal contact 231 provides electrical connection to the complement of the bit line, sometimes referred to as the "bit bar" line. The polysilicon 235 is electrically connected to the polysilicon 236 (the connection has been omitted for clarity), and both are connected to an address line. This illustrated SRAM cell may provide an advantageous layout for a memory circuit.

An alternative embodiment of the cell layout 219 shown in FIG. 21 may flip the orientation of the lower half of the cell so that the ground connections 224 and 233 are on opposite sides. This may allow for more convenient connections between the top half of the cell 219 and the bottom half.

Figure 22:
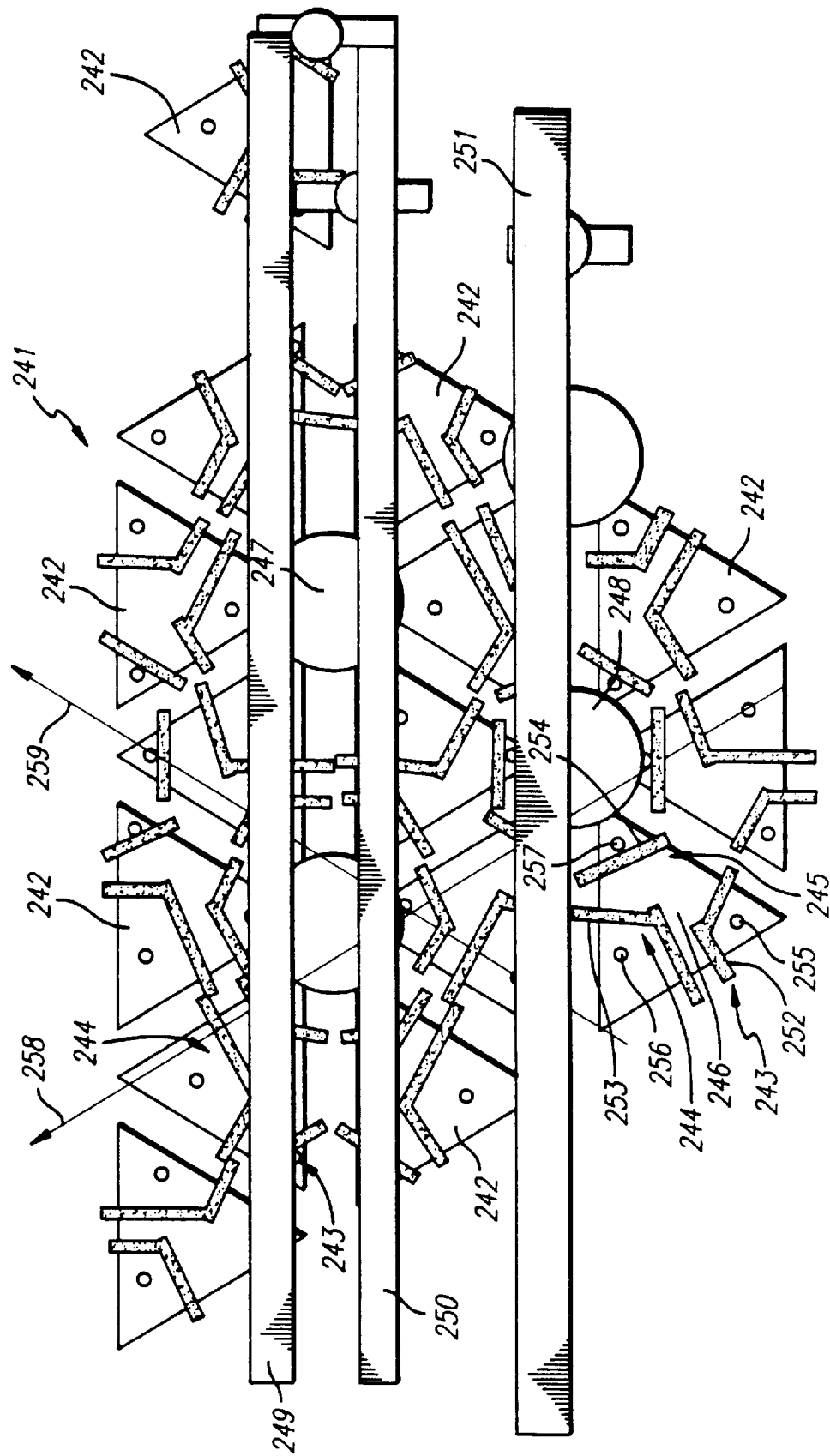
FIG. 22 is a top view of the layout on a semiconductor substrate of an alternative embodiment of a memory circuit comprising a plurality of triangular shaped structures each comprising three transistors.

FIG. 22 shows a top view of another possible layout for a memory circuit 241. The illustrated example may provide a layout having a cell size that is one-half to one-third the size of a conventional prior art layout for the same circuit. The memory circuit 241 illustrated in FIG. 22 comprises a plurality of triangular structures 242. Two triangular structures 241 comprise a diamond shaped cell.

The triangular structures 241 have polysilicon 252, 253 and 254 which form gate electrodes. The gate electrodes 252 will be connected in various ways which are not shown for clarity. The triangular structures 241 also have electrodes 255, 256 and 257 to facilitate electrical connections to source regions.

Most of the triangle structures 242 shown comprise a small PMOS transistor 245 which controls the current. The triangle structures 242 have a larger NMOS transistor 244. The triangle structures 241 also have a third transistor 243 used for addressing. The third transistor 243 is connected to a bit line 249. These three transistors 243, 244 and 245 have a common drain region 246. A ground connection 247 provides a common ground for surrounding triangular structures 242. Metal interconnect connects the data outputs to form a bit line 249. A metal bit bar line 250 provides the logical complement of the bit line. A second bit line 251 is also shown. Although these lines are metal in this example, they need not be; polysilicon could be used for example.

In a preferred embodiment of the circuit shown in FIG. 22, three layer metal routing employing hexagonal architecture is used. The metal bit lines 249 and 251 are shown extending in a first metal layer that is in a direction that is horizontal in FIG. 22. Address lines 258 are fabricated in a second metal layer providing connections in a direction that is angularly displaced sixty degrees from the direction of the bit lines 249 and 251. Power line connections 259 are provided in a third metal layer that is angularly displaced sixty degrees from the direction of the bit lines 249 and 251. The direction of the power line connections 259 are also angularly displaced sixty degrees from the direction of the address lines 258.

Figure 22A:
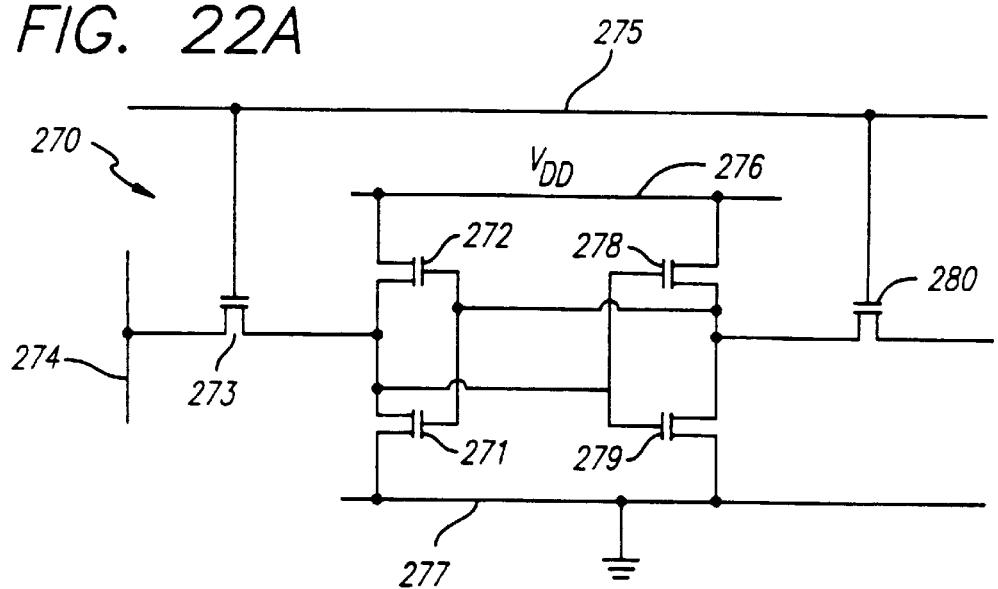
FIG. 22A is a schematic diagram of one cell of the memory circuit illustrated in FIG. 22.

FIG. 22A is a schematic diagram of an equivalent circuit 270 to that implemented with the structure shown in FIG. 22. The NMOS transistor 244 shown in FIG. 22 is shown schematically as transistor 271 in FIG. 22A. The small PMOS transistor 245 shown in FIG. 22 is shown schematically as transistor 272 in FIG. 22A. The transistor 243 shown in FIG. 22 which is used for addressing is shown schematically as transistor 273 in FIG. 22A.

The bit line 249 in FIG. 22 is shown schematically as the bit line 274 in FIG. 22A. The address line 258 in FIG. 22 is shown schematically as the address line 275 in FIG. 22A. The power line 259 in FIG. 22 is shown schematically as the $V_{DD}$ or power line 276 in FIG. 22A. The connection to ground or $V_{SS}$ is shown in FIG. 22A by the reference numeral 277, which corresponds to the ground connection 247 in FIG. 22. As described with reference to FIG. 22, a cell 270 is made up of two triangular structures 242. The second triangular structure 242 will have three corresponding transistors, which are shown schematically in FIG. 22A as transistors 279, 278 and 280.

Sense Amplifier

Figure 23:
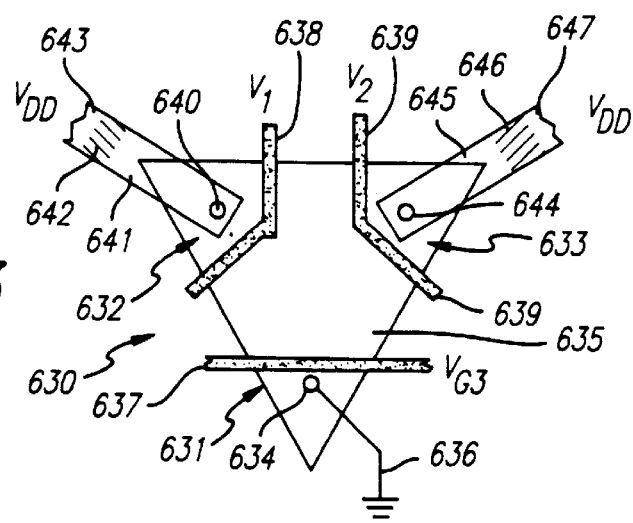
FIG. 23 is a top view of the layout on a semiconductor substrate of an embodiment of a sense amplifier for an SRAM memory circuit comprising a triangular shaped structure comprising three transistors.

FIG. 23 is a top view of the layout of a triangular structure 630 implementing a sense amplifier circuit suitable for use in connection with an SRAM, although the circuit is not necessarily limited to SRAMs. The sense amplifier circuit will operate satisfactorily in connection with the DRAM cell shown in FIGS. 23B and 23C. The sense amplifier circuit includes a first transistor 631, a second transistor 632, and a third transistor 633. The source region 634 of the first transistor 631 is connected to $V_{SS}$ or ground 636, which is shown schematically in FIG. 23. The first transistor 631 has a first gate electrode 637, which is connected to $V_{G3}$. The first, second and third transistors 631, 632 and 633 have a common source/drain region 635. A second gate electrode 638 for the second transistor 632 is connected to $V_1$. A third gate electrode 639 for the third transistor 633 is connected to $V_2$.

The drain 640 of the second transistor 632 is connected to a polysilicon layer 641 which functions as an electrical contact. A first resistor 642 may be formed by providing a region indicated by reference numeral 642 that is not doped. Alternatively the resistor region 642 may be lightly doped as desired to adjust the amount of resistance to a desired value. In this example, the polysilicon layer continues with a doped region 643 that is electrically connected to $V_{DD}$. The resistor 642 may alternatively be formed using a channel region of an FET. Other methods and structures known to those skilled in the art may be utilized to provide the functional equivalent of a resistor 642.

FIG. 23 shows a drain 644 of the third transistor 633 electrically connected to a doped polysilicon layer 645 to provide an electrical connection to a second resistor 646. In the illustrated example, the second resistor 646 comprises a region that is not doped, or is lightly doped, as described above with reference to the first resistor 642. The polysilicon layer continues with a doped region 647 that is electrically connected to $V_{DD}$. As described above, the resistor 646 may be formed using a channel region of an FET, by stretching the island 635, or any other alternative structure known to those skilled in the art for constructing resistors on a semiconductor substrate.

In this example, the contacts 641, 643, 645 and 647 comprise polysilicon. However, the polysilicon layer 641, and the polysilicon layer 643, may be constructed as a metal routing layer. Similarly, the electrical connections established by the polysilicon layers 645 and 647 may be accomplished with metal routing. In this alternative example, over-the-cell routing may be used to route electrical connection 645, 646, and 647 over the gate electrode 639, and to route the electrical connection 641, 642 and 643 over the gate electrode 638. The interconnect 647 and the interconnect 643 may be fabricated as a unitary structure to provide a common $V_{DD}$ connection. The resistors 642 and 646 may be constructed using an alternative approach from the polysilicon described with reference to the illustrated embodiment shown in FIG. 23. The value of the resistors may affect the magnitude or amplification of the sensed voltage. Typically, the amplification factor is multiplied times the difference in the sensed voltages $V_1$ and $V_2$ to determine the output.

Figure 23A:
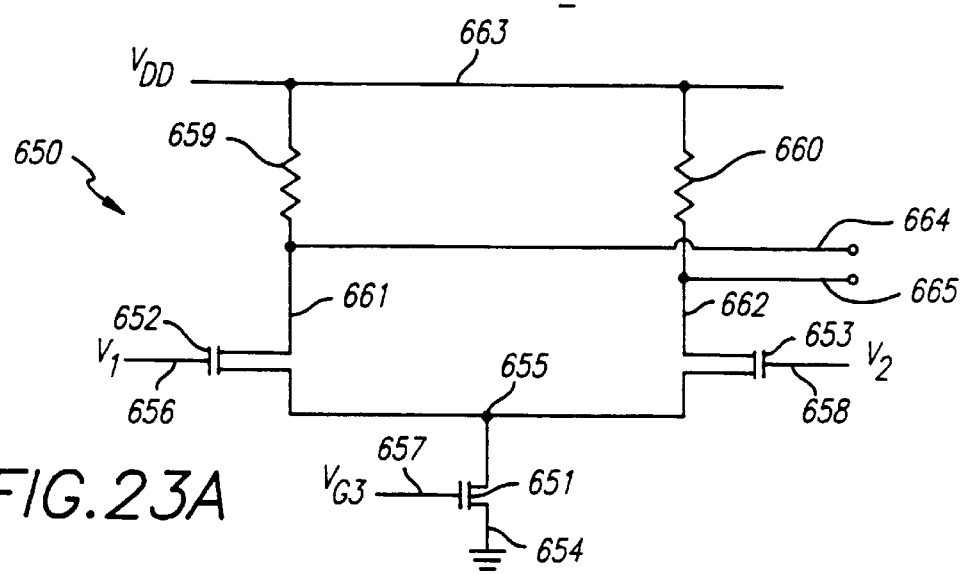
FIG. 23A is a schematic diagram of the sense amplifier illustrated in FIG. 22.

FIG. 23A depicts a schematic diagram of a sense amplifier circuit 650 that corresponds with the sense amplifier circuit 630 implemented with the structure shown in FIG. 23. Referring to FIG. 23A, the sense amplifier circuit 650 includes a first transistor 651, a second transistor 652, and a third transistor 653. Each transistor 651, 652, and 653 has a source, a gate, and a drain, although the source and drain may be interchanged arbitrarily. The source 654 of the first transistor 651 is connected to $V_{SS}$ or ground. The first transistor 651 has a first gate 657 which is connected to $V_{G3}$. The first, second and third transistors 651, 652 and 653 have a common source/drain connection 655. The gate 656 for the second transistor 652 is connected to $V_1$. The gate 658 for the third transistor 653 is connected to $V_2$.

A first resistor 659 is connected between the drain 661 of the second transistor 652 and a $V_{DD}$ line 663. A second resistor 660 is connected between the drain 662 of the third transistor 653 and the $V_{DD}$ line 663.

The bit line of a column of a memory array that is to be read is coupled or switched to either terminal 656 ($V_1$) or to terminal 658 ($V_2$). The circuit is symetrical, so it will operate equally well regardless of which terminal 656 or 658 is used. The other terminal 656 or 658 is connected to a reference voltage. The sense amplifier 650 is turned on by driving voltage $V_{G3}$ on terminal 657 high. This causes transistor 651 to turn on, and energizes the sense amplifier 650. The transistor 651 may be used to turn the amplifier off to conserve power when memory is not being read.

If the terminal 656 is connected to the column being read, the voltage $V_1$ will cause the transistor 652 to conduct if the cell being read is high. When the transistor 652 conducts, current flows from $V_{DD}$ through resistor 659 and through transistor 652. The current will cause a voltage drop to occur across resistor 659. This will drive the output voltage on output terminal 664 low. The difference in the voltages across output terminal 664 and output terminal 665 can be read to determine the logical state of the bit stored in the cell being read. The remaining details of operation of the sense amplifier 650 shown in FIG. 23A should be apparent to those skilled in the art, after having the benefit of the description set forth herein.

A DRAM Cell

Figure 23B:
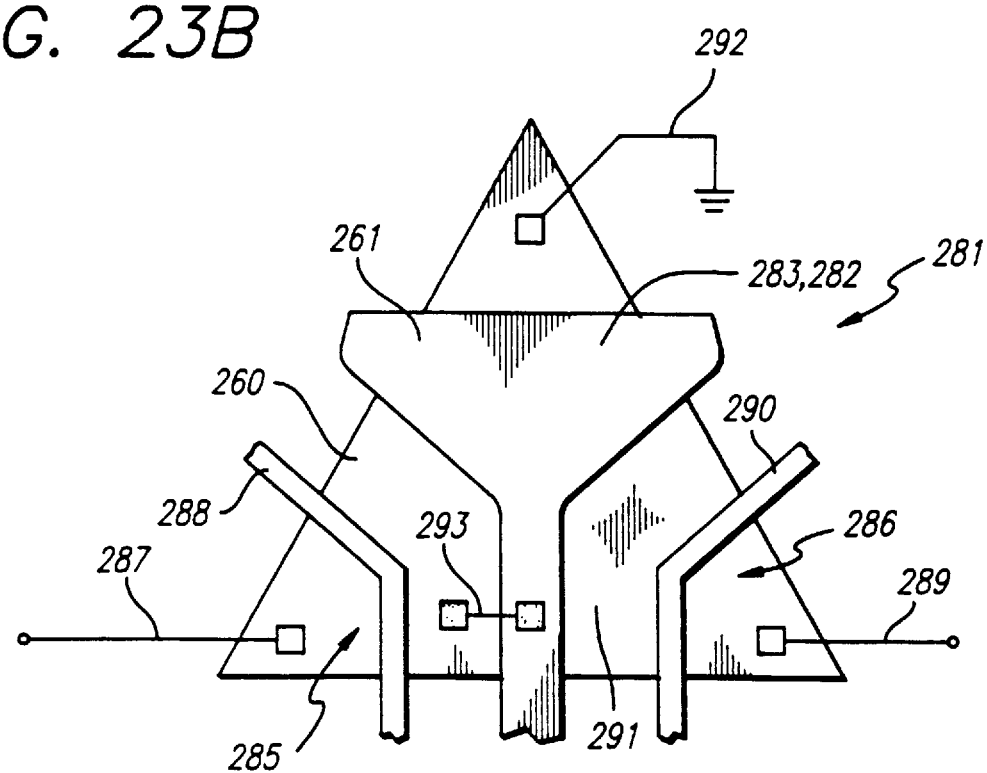
FIG. 23B depicts a layout of a triangular shaped DRAM cell.

FIG. 23B shows a triangular DRAM cell 281 constructed in accordance with one aspect of the present invention. This triangular DRAM cell 281 has separate read select line 290 and write select line 288. The illustrated triangular DRAM cell 281 has a separate read bit line 289 and write bit line 287. The provision of separate read and write input and outputs 289 and 287 greatly facilitates the implementation of separate read/write ports for a memory array constructed using the illustrated DRAM cell 281. This circuit element 281 can be easily configured for multiport memories.

Figure 23C:
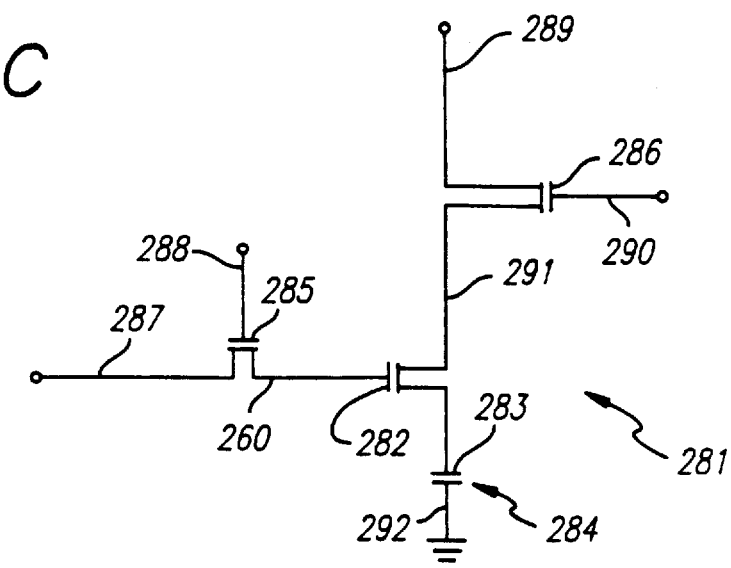
FIG. 23C is a schematic diagram of the equivalent circuit for the triangular DRAM cell shown in FIG. 23B.

FIG. 23C shows the storage element 284, which is implemented with capacitance shown in the equivalent circuit as a capacitor storage device 283, and an associated first transistor 282. The layout depicted in FIG. 23B advantageously uses the gate capacitance of the transistor 282 to provide the necessary storage capacitance 283. In the layout of FIG. 23B, a layer of doped polysilicon forming a Y-shaped capacitor plate gate electrode, with a triangular capacitor plate electrode 261 inversely oriented with respect to the triangular cell 281. The polysilicon 261 serves a dual function as the gate electrode for the first transistor 282 and one plate of the capacitor 283. The doped polisilicon gate is speced from and insulated by the gate dielectric, which provides the dielectric for the capacitor 283.

The gate of the first transistor 282 is connected to the drain 260 of a second transistor 285. In the layout shown in FIG. 23B, this is accomplished using a shorting strap 293. The illustrated embodiment is shown with a short silicide strap 293 that may be fabricated as local interconnect. The drain of the second transistor 285 is connected to the write bit line 287. The gate of the second transistor 285 is connected to the write select line 288. When the signal on the write select line 288 goes high, it turns on the second transistor 285 and drives node 260 high. The signal on the write line 287 will be coupled to the storage cell 284, and will drive the first transistor 282 into conduction if the write signal is high, and will not turn on the first transistor 282 if the write signal 287 is low.

The source of a third transistor 286 is connected to the drain of the first transistor 282. In other words, the first and third transistors 282, 286 have a common source/drain connection 291. The gate of the third transistor 286 is connected to the read select line 290. The drain of the third transistor 286 is connected to the read bit line 289. When the read select line 290 goes high, the third transistor 286 will be driven to conduct, and will couple the read bit line to the storage cell 284. The presence or absence of a charge stored in the capacitor 283 of the storage cell 284 can be sensed. The sense amplifier circuit of FIG. 23A can be used to sense any charge stored in the DRAM cell 281 by coupling the read bit line 289 to the $V_1$ terminal 656.

Figure 129:
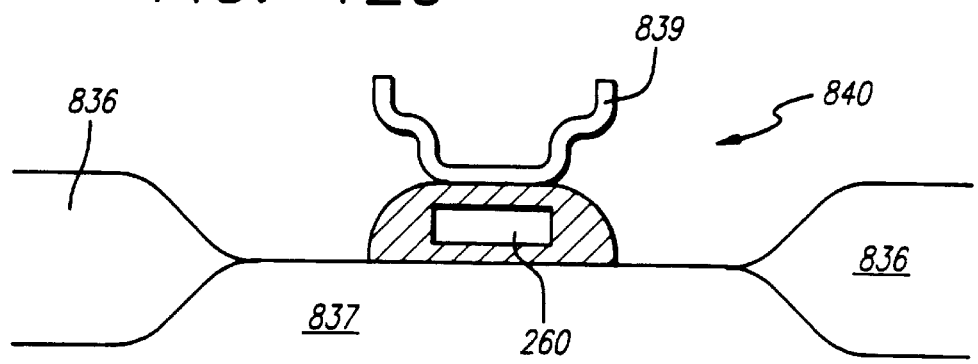
FIG. 129 is a cross-sectional view of an alternative embodiment of a DRAM type field programmable device.

FIG. 129 is a cross-sectional view of an alternative embodiment of a DRAM cell 840, where similar reference numerals refer to like elements. In this example, the DRAM cell uses a fin-type capacitor 839. The capacitive fin 839 may be constructed in accordance with the disclosure set forth in application Ser. No. 08/366,786, filed Dec. 30, 1994, by Abe Yee, entitled METHOD OF MAKING MULTIPLE FIN CAPACITOR.

Memory Array Interconnect Architecture

The interconnection architecture of the present triangular DRAM cell 281 has certain advantages as compared to prior art structures. Although the following description focuses upon the illustrated example of a DRAM array for convenience of explanation, the application of this aspect of the present invention is not limited to DRAM structures. With respect to the present example, conventional memory arrays such as DRAMs and SRAMs are density limited by the metal pitch. The metal interconnect has become a limiting feature inhibiting further shrinkage of the size of the layout.

In a conventional two layer memory array, the bit lines and the select lines normally run on the same level of metal. As a result, as memory layouts are made smaller and smaller, the bit lines and the select lines become closely packed. Wiring congestion, crosstalk, and parasitic capacitance are problems limiting the performance and size of conventional memory arrays. In the case of a DRAM cell, in particular, the line capacitance can be a problem when it becomes large relative to the storage capacitance of the cell storage devices, for example storage capacitor 283 shown in FIG. 23C. An operative design can only tolerate a certain ratio of line capacitance to storage capacitance. Conventional designs are limited in the available options to deal with this problem. The only way to favorably adjust the ratio of storage capacitance to line capacitance was to increase the storage capacitance. The only practical way to increase the storage capacitance was to increase the size of the cell. This had an adverse effect upon cell density, and limits were imposed on how much a conventional memory cell could shrink in size. Conventional memory structures were denied continued enjoyment of the many advantages that normally flow from further reducing the size of microelectronic structures.

In addition to size limitations, conventional DRAM layouts suffered from performance penalties. When designers were forced to increase the capacitance of the cells in order to improve the ratio of storage capacitance to line capacitance, they necessarily ran into limits upon how much that capacitance could be increased. At some point, the amount of storage capacitance can become large enough to slow the speed of a memory array. Large amounts of capacitance take longer to charge and discharge. In a sense amplifier circuit that must be precharged, it is necessary to wait a sufficient amount of time before the circuit designer can be sure that the sensed voltage is valid. If a sense amplifier first reads a conductive cell and therefore discharges, then switches to another column, it may be necessary to wait until the column has enough time to charge. If the column being read has a nonconductive cell, the voltage sensed will gradually rise as the storage capacitance is charged until it rises to a logic "one" level. The larger the amount of capacitance, the larger the RC time constant, and thus, the longer it takes to charge the column. This slows the operation of the memory circuit. The speed of microprocessors and other circuits has become so fast that memory accesses can be a significant limitation upon the performance of the system. Access speeds are measured in nanoseconds. Thus, increased capacitance can be a problem with high performance memory circuits.

The triangular DRAM cell 281 is preferably interconnected using the tri-directional routing arraingement described herein. The triangular DRAM cell 281 described herein allows for good use of three metal layer tri-direction routing. The three layer metal routing layers allow ground connections to be interconnected using the M3 metal layer, for example. The select lines 288 and 290 may be interconnected using the M2 metal layer, and the bit lines 287 and 289 may be implemented using the M1 metal layer. The M3 layer is preferred for the ground connections, but the other two metal layers may be used interchangeably for either the bit lines 287, 289 or the select lines 288, 290, as desired.

By routing select lines in a first metal layer, and bit lines in a second metal layer, and power interconnect on a third metal layer, crosstalk is reduced. Line to line capacitance is reduced. Routing congestion is reduced, permitting further shrinkage of the layout. Reduction in the size of the layout will result in reducing the total length of wire and provide consequential performance improvements.

The advantages of the present DRAM interconnect system are also applicable to an SRAM array described herein in connection with FIGS. 24–28, and the SRAM array described in connection with FIGS. 21–22. This memory interconnect architecture described herein may be advantageously applied to EPROM arrays, PROM arrays, ROM arrays, $E^2$PROM arrays, flash EPROM arrays, and other circuit arraingements where cells are arrainged in a row by column matrix array.

An SRAM Array

FIG. 28 depicts a layout of an SRAM circuit which may be constructed in accordance with the present invention. Portions of the layout are shown separately in FIG. 24, FIG. 25, FIG. 26 and FIG. 27. The interconnect system described above with respect to a DRAM array is equally applicable to the SRAM array described. Of course, a three-by-three array is described for purposes of illustration, but a practical circuit would contain millions of such cells.

Figure 24:
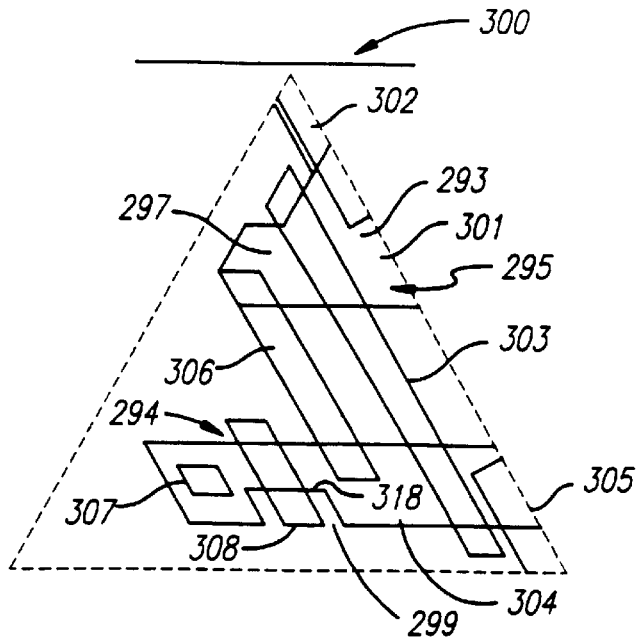
FIG. 24 depicts a layout of one half of a double triangular shaped cell.

Referring to FIG. 24, a triangular structure 300 is depicted, which may also be referred to as a half cell 300. The half cell 300 has a first diffusion region 301. In this example, the first diffusion region 301 is a p diffusion region or PMOS island. A diffusion region 304 is shown in FIG. 24. In this example, the second diffusion region 304 is an n diffusion region or NMOS island. Electrical connection may be made using electrode 307. Polysilicon layers 308 and 303 are shown. Local interconnect 306 provides electrical connection between the region 304 and the region 301. Similarly, local interconnect 302 and local interconnect 305 are shown extending to the edge of the half cell 300 and provide electrical connection with regions (not shown) in adjacent half cells.

A first transistor 294 is formed in the region where the polysilicon 308 crosses the second diffusion region 304. The polysilicon layer 308 forms a gate electrode. An area of the second diffusion region 304 adjacent to the polysilicon gate 308 is the drain region 299 of the transistor 294. A source region 298 of the transistor 294 is formed on the opposite side of the gate electrode 308. The gate electrode 308 extends beyond the boundaries of the diffusion region 304 to provide electrical isolation between the source and drain regions 298 and 299, respectively. This is similarly done for all the transistor structures shown in FIGS. 24–28.

A second transistor 295 is formed in the region where the polysilicon 303 crosses the first diffusion region 301. The polysilicon layer 303 forms a gate electrode for the second transistor 295. An area of the first diffusion region 301 adjacent to the polysilicon gate electrode 303 is a drain region 297 of the transistor 295. A source region 296 of the transistor 295 is formed on the opposite side of the gate electrode 303. Although the transistors formed will not be explicitly described hereafter in every case, those skilled in the art will recognize that transistors are formed where polysilicon layers cross diffusion regions.

Figure 25:
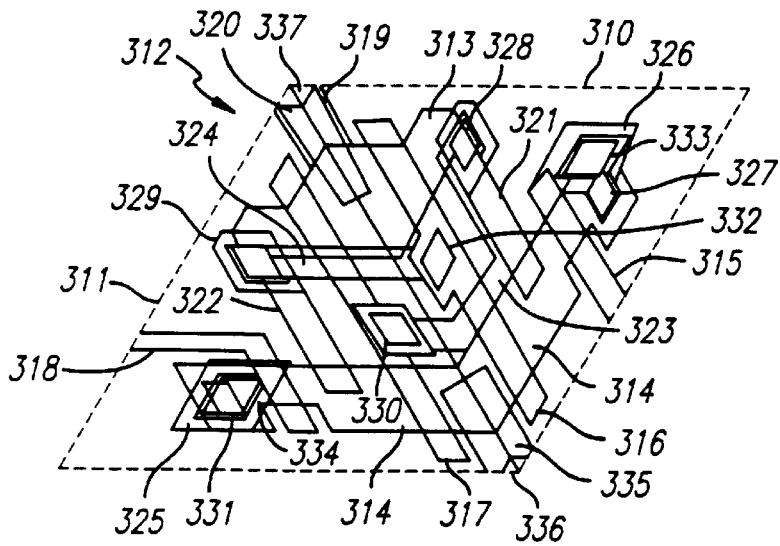
FIG. 25 depicts a layout of two triangular shaped structures forming a double triangular shaped cell.

Referring to FIG. 25, a first triangular structure 310 and a second triangular structure 311 are depicted, which together form a first type of diamond shaped cell 312. A first diffusion region 313 is shown. In this example, the first diffusion region 313 is a p diffusion region. A second diffusion region 314 is shown. In this example, the second diffusion region 314 is an n diffusion region. Polysilicon 315 is formed over the second diffusion region 314 to form a gate electrode. Thus, a transistor is formed in the region where the polysilicon 315 crosses the second diffusion region 314. Polysilicon 316 is formed over the second diffusion region 314 and over the first diffusion region 313. This polysilicon 316 forms a gate electrode. Thus, transistors are formed in the regions where the polysilicon 316 crosses the second diffusion region 314 and where the polysilicon 316 crosses the first diffusion region 313.

Transistors are also formed in the regions where polysilicon 317 crosses the second diffusion region 314 and where the polysilicon 317 crosses the first diffusion region 313. The polysilicon 317 is a common gate electrode 317 for the two transistors that are thus formed. A polysilicon layer 318 is shown extending from the edge of the second triangular shaped structure 312 to a region where it crosses the second diffusion region 314, at which region a transistor is formed. The polysilicon layer 318 provides electrical connection to structure in an adjacent half cell where it extends from the edge of the second triangular shaped half cell 312.

Local interconnect 322 establishes an electrical between the first diffusion region 313 and the second diffusion region 314. Local interconnect 321 similarly establishes an electrical between the first diffusion region 313 and the second diffusion region 314. This area of the second diffusion region 314 is a common drain for two transistors formed (a) where the polysilicon gate electrode 315 crosses the second diffusion region 314, and (b) where the polysilicon gate electrode 316 crosses the second diffusion region 314. Other local interconnects 320 and 335 are shown in FIG. 25 extending to the edge of the cell 312 to provide electrical connections to adjacent cells. Metal 323 is formed to provide interconnection between the first diffusion region 313 and the polysilicon common gate electrode 317.

A contact or via 332 is fabricated to facilitate electrical connection. Similarly, a contact or via 329 is also fabricated to facilitate electrical connection. Electrical connection is provided between the first diffusion region 313 and the common gate electrode 316 by metal 324. More specifically, the metal 324 is formed between contact 332 and contact 329. The contact 329 is electrically connected to local interconnect 322. The contact 332 is electrically connected to the common gate electrode 316.

A contact or via 331 provides electrical connection with the second diffusion region 314. Metal 325 provides electrical connection with the contact 331 to provide an output terminal or via 334 to facilitate electrical connection with other interconnect layers (not shown) which may be fabricated in later manufacturing steps. Metal 326 provides electrical connection between a contact 327 (which is in electrical connection with the second diffusion layer 314) and an output terminal or via 333.

Contacts 336 and 337 are partially shown in FIG. 25. These contacts 336 and 337 are partially located on adjacent cells which are not shown in FIG. 25. A diffusion region 319 of the same type as the second diffusion region 314 is fabricated below the local interconnect 320 and the contact 337 which is partially shown in FIG. 25. A diffusion region of the same type as the first diffusion region 313 is formed below the local interconnect 335 and the contact 336, which is partially shown in FIG. 25.

Figure 26:
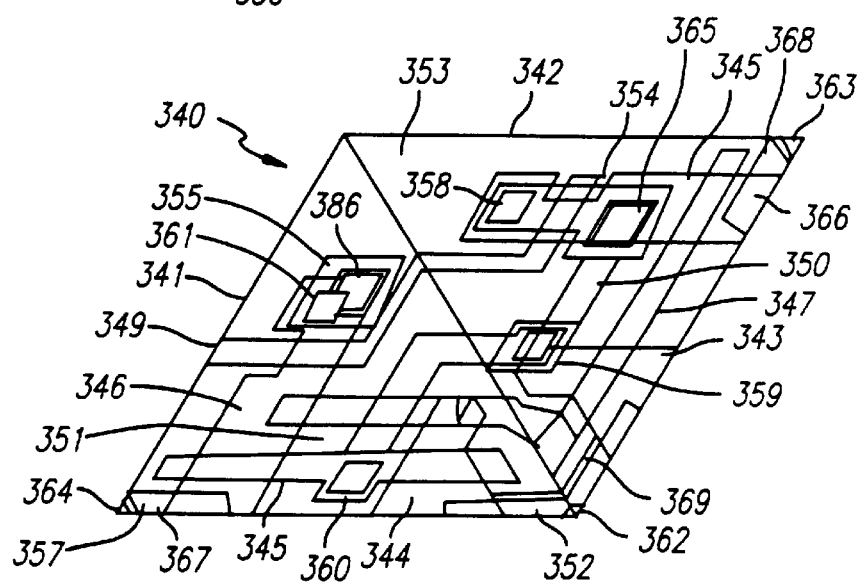
FIG. 26 depicts a layout of two triangular shaped structures forming another type of double triangular shaped cell.

FIG. 26 shows a second type of diamond shaped cell 340 comprising a first half cell 341 and a second half cell 342. A first diffusion region 343 and a second diffusion region 344 are p-type diffusion regions. A third diffusion region 345 and a fourth diffusion region 346 are n-type diffusion regions. Polysilicon 347, 348 and 349 form gate electrodes. As described above, transistors are formed where the polysilicon 347, 348 and 349 cross the diffusion regions 343, 344, 345 and 346.

Local interconnect 350, 351, 352, 357 and 366 is used to make electrical connections with certain parts of the circuit, as shown in FIG. 26. Metal 353 and 354 also make certain electrical connections, and metal 355 forms a terminal 356. Vias 358, 359, 360 and 361 are provided to facilitate electrical connections between layers. Vias 362, 363 and 364 are partially shown in FIG. 26, and extend to adjacent cells (not shown). Terminal 365 is provided to facilitate external connection to the cell 340. A diffusion region 367 is shown below the local interconnect 357. A diffusion region 368 is shown below the local interconnect 366. The diffusion regions 367 and 368 are p-type diffusion regions. A diffusion region 369 is formed below local interconnect 352. The diffusion region 369 is an n-type diffusion region.

Figure 27:
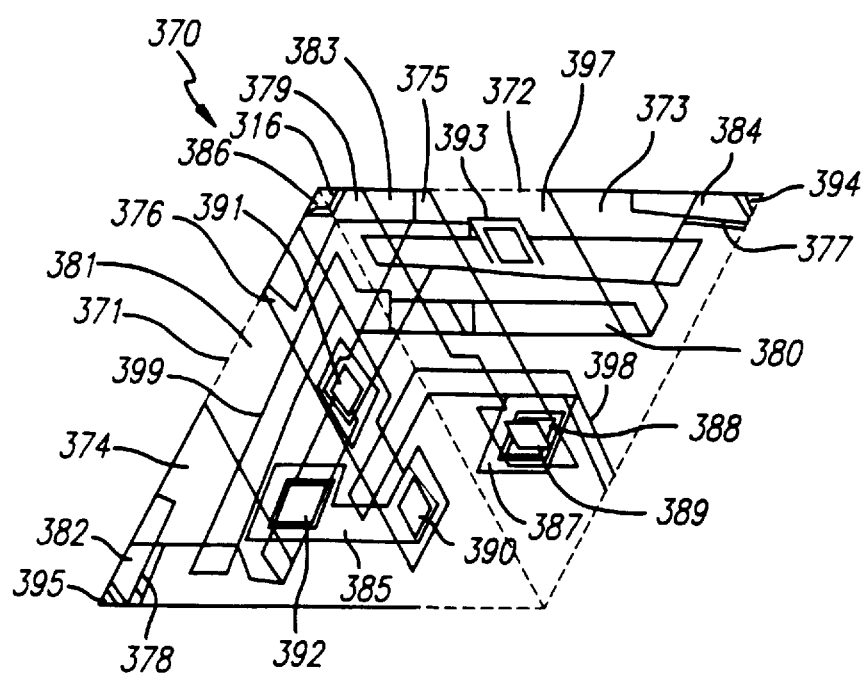
FIG. 27 depicts a layout of two triangular shaped structures forming another type of double triangular shaped cell.

FIG. 27 shows a third type of cell 370. The third type of cell 370 comprises a first half cell 371 and a second half cell 372. A first diffusion region 373 and a second diffusion region 374 are p-type diffusion regions. Additional n-type diffusion regions 377 and 378 are shown. An additional n-type diffusion region 379 is also shown. Polysilicon 397, 398 and 399 form gate electrodes and provide certain interconnections as shown.

Local interconnect 380, 381, 382, 383 and 384 is used to make electrical connections with certain parts of the circuit, as shown in FIG. 27. Local interconnect 382 is formed over the diffusion region 378. Local interconnect 384 is formed over the diffusion region 377. And local interconnect 383 is formed over the diffusion region 379. Metal 385 and 386 also make certain electrical connections, and metal 387 forms a terminal 388. Vias 389, 390, 391 and 393 are provided to facilitate electrical connections between layers. Terminal 392 is provided to facilitate external connection to the cell 340. Vias 394, 395 and 396 are partially shown in FIG. 27, and extend to adjacent cells (not shown).

The three types of cells 312, 340 and 370 are combined to form the memory circuit 400 shown in FIG. 28. In addition, FIG. 28 shows a power line connection 402 and a power connection 403, which comprise metal layer interconnect. Ground connections 401 and 404 comprise metal layer connections. Adjacent cells have common power connections. Common ground connections are also provided for adjacent cells.

A bit line 405 is similarly formed by metal layer interconnect. Terminal 334 provides electrical connection between bit line 405 and associated circuitry of the first type of cell 312. A bit line bar 406 provides the complement of data available on the bit line 405. Terminal 333 provides electrical connection between bit line bar 406 and associated circuitry of the first type of cell 312. A first address line or select line 407 is formed from metal interconnect. A second address line or select line 408 and a third address line 409 are also illustrated.

It will be noted that six closely packed half cells 311, 310, 341, 342, 371, and 372 define a larger parallelogram cell 400, and may also define a hexagonal shape. This relationship can be used within the scope of the invention to provide larger unit cells having parallelogram or hexagonal shapes defined by closely packed triangular shaped half cells 311, 310, 341, 342, 371, and 372, with internal structures similar to or different from those which are explicitly described and illustrated. In such an arrangement, the parallelogram or hexagon unit cells can be considered to be the basic building block.

The SRAM array 400 is shown interconnected using the tri-directional routing arraingement described herein. The illustrated SRAM array 400 described herein allows for good use of three metal layer tri-direction routing. The three layer metal routing layers allow ground connections 401 and 404, power connections 402 and 403, and bit lines 405 and 406, to be interconnected using the M3 metal layer, for example. The address select lines 407, 408 and 409 may be interconnected using the M2 metal layer. Note that in this embodiment, all three routing directions are used in the M2 metal layers. The metal connections described above with respect to FIGS. 24, 25, 26 and 27 may be implemented using the M1 metal layer.

By routing address select lines 407, 408 and 409 in the second metal layer, and bit lines 405 and 406 in the third metal layer, along with the power interconnect 402 and 403, and ground connections 401 and 404, crosstalk is reduced. Line to line capacitance is reduced. The total length of wire is reduced. Routing congestion is reduced, permitting a layout that is compact and that can be squeezed into minimal real estate on a semiconductor die.

Dies

Modern integrated circuits are generally produced by creating several identical integrated circuit dies at individual die sites on a single semiconductor wafer, then scribing (slicing) the wafer to separate the dies from one another. Circuits and active elements on the dies are fabricated while the dies are still together on the wafer by ion implantation, electron beam lithography, plasma etching, mechanical polishing, sputtering, and other steps known to those skilled in the art.

In the present invention, the number of individual dies of a given area that can be laid out on a single semiconductor wafer may be increased in some instances by using hexagonal shaped die, or triangular shaped die, or diamond shaped die. This may reduce the wasted real estate on a wafer, thus increasing the wafer-layout-efficiency. Also, 1,1,1 silicon may be advantageously used in some instances, such as diamond shaped die, because the structure breaks easily or is easier to scribe in certain directions.

CAD For Hexagonal Architecture

Present computer aided design (CAD) systems for the design of electronic circuits, referred to as ECAD or Electronic CAD systems, assist in the design of electronic circuits by providing a user with a set of software tools running on a digital computer with a graphical display device. Typically, five basic software program functions are required for an ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is (are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced. In more advanced systems, the schematic is replaced by a higher-level Hardware Description Language (HDL) and a logic synthesizer creates the netlist. The other steps are basically the same.

The Concurrent Modular Design Environment (CMDE®) produced by LSI Logic Corporation of Milpitas, Calif. is a suite of software tools for computers running the UNIX operating system. CMDE software comprises a schematic editor (LSED®) and a simulator (LDS®), among other software programs, and provides an example of commercially available tools of the aforementioned type. Other examples of a schematic editor, schematic compiler, and schematic simulator may be found in systems produced by Mentor Graphics of Beaverton, Oreg. and Cadence Design Systems of San Jose, Calif. (successors to Valid Logic Systems, Inc. of Mountain View, Calif., who produced the SCALD station).

VHDL, or VHSIC (Very High Speed Integrated Circuit) Hardware Description Language, is a recently developed, higher level language for describing complex devices. The form of a VHDL or most other Hardware Design Language (HDL) description is described by means of a context-free syntax together with context-dependent syntactic and semantic requirements expressed by narrative rules.

A methodology for deriving a lower-level, physically-implementable description, such as a RTL description of the higher level (e.g. VHDL) description useful for CAD design of the present invention is shown in U.S. Pat. No. 5,222,030, issued Jun. 22, 1993, by Dangelo et al., entitled METHODOLOGY FOR DERIVING EXECUTABLE LOW-LEVEL STRUCTURAL DESCRIPTIONS AND VALID PHYSICAL IMPLEMENTATIONS OF CIRCUITS AND SYSTEMS FROM HIGH-LEVEL SEMANTIC SPECIFICATIONS AND DESCRIPTIONS THEREOF, which is incorporated herein by reference. Additional related descriptions appear in application Ser. No. 08/076,738, filed Jun. 14, 1993, by Rostoker et al., entitled AREA AND POWER ESTIMATION FOR ELECTRONIC DESIGNS FROM HIGH-LEVEL SEMANTIC SPECIFICATIONS AND DESCRIPTION, and application Ser. No. 08/076,729, filed Jun. 14, 1993, by Rostoker et al., entitled CONSTRAINT-DRIVEN PARTITIONING OF ELECTRONIC DESIGNS FROM HIGH-LEVEL SEMANTIC SPECIFICATIONS AND DESCRIPTIONS, both of which are incorporated herein by reference. Traditionally, some form of CAD system is used to develop the placement and routing, or floorplanning, of the microelectronic integrated circuit (IC), whether at high level (i.e. HDL) or lower level (i.e. RTL) or other abstraction.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon or other semiconductor (such as Gallium Arsenide, etc.) wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements, the complexity of the physical design rules, and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements with the advent of the instant invention for triangular transistor structures and triangular, parallelogram, diamond or hexagonal gates, cells of other structures on a die, even larger numbers of circuit elements should be capable of being fabricated on an integrated circuit.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

An exemplary integrated circuit chip is illustrated in FIG. 91 and generally designated by the reference numeral 4000. Although the chip die is shown as a rectangular (near-square) configuration, it may in fact be a non-square die configuration. Actually, hexagonal, parallelogram, rhomboidal, diamond and triangular cells may fit better (tile more completely) into certain non-square die shapes, especially parallelogram, rhomboidal and triangular die. Suitable non-square die are shown in U.S. Pat. No. 5,341,024, issued Aug. 23, 1994, by Rostoker, entitled METHOD OF INCREASING THE LAYOUT EFFICIENCY OF DIES ON A WAFER AND INCREASING THE RATIO OF I/O AREA TO ACTIVE AREA PER DIE; and U.S. Pat. No. 5,300,815, issued Apr. 5, 1994, by Rostoker, entitled TECHNIQUE OF INCREASING BOND PAD DENSITY ON A SEMICONDUCTOR DIE, both of which are incorporated herein by reference. Packaging of such non-square die is shown in U.S. Pat. No. 5,329,157, issued Jul. 12, 1994, by Rostoker, entitled SEMICONDUCTOR PACKAGING TECHNIQUE YIELDING INCREASED INNER LEAD COUNT FOR A GIVEN DIE- RECEIVING AREA, the entire disclosure of which is incorporated herein by reference. CAD layout floorplanning for non-square die is shown in application Ser. No. 07/958,208, filed Oct. 7, 1992, by Rostoker, entitled VARIABLE DIE SHAPE FLOORPLANNING, now U.S. Pat. No. 5,340,772, issued Aug. 23, 1994; application Ser. No. 08/016,864, filed Feb. 10, 1993, by Rostoker, entitled FLOORPLANNING TECHNIQUE USING LOW ASPECT-RATIO PARTITIONING; and application Ser. No. 08/015,947, filed Feb. 10, 1993, by Rostoker, entitled FLOORPLANNING TECHNIQUE USING MULTI-PARTITIONING, all of which are incorporated herein by reference.

The integrated circuit die 4000 includes a semiconductor substrate 4002 on which are formed a number of functional circuit blocks that can have different sizes and shapes. Some blocks are relatively large, such as square blocks 4004 and 4006, rectangular blocks 4008 and 4010, triangular blocks 4012 and 4014, diamond blocks 4016 and 4018, parallelogram blocks 4020, 4021 and 4022, rhomboidal blocks 4024 and 4026, and hexagonal blocks 4028 and 4030. Each of the large blocks 4006, 4010, 4014, 4016, 4021, 4022, 4026 and 4030 are shown in schematic form and as a schematic made up of smaller triangular block segments, as by smaller triangular cells or triangular transistors. Such larger blocks may be made up of a group of other shapes, such as a group of hexes forming block 4029. And older, more traditional larger blocks like 4041 may be made up of smaller square blocks 4042. Also, as other examples, irregular larger block 4005 is shown made up of parallelogram blocks 4007 and irregular larger block 4009 is made up of rhomboidal blocks 4011; while regular larger rectangular block 4013 is made up of rectangles 4015 (each of which is similar to rectangular block 4008) and irregular block 4029 is made up of closely spaced hexagonal blocks 4032.

Such larger blocks may represent the outline of logic or memory functions, such as a central processing unit (CPU) or memory cell (such as RAM, ROM, EPROM) or the like. Alternatively, smaller blocks, such as closely spaced hexes 4032 or widely spaced hexes 4034 as well as closely spaced triangles 4036 and widely spaced triangles 4038 may be used with or instead of the more traditional square or near-square small blocks which may be widely spaced 4040 or closely spaced 4042. Input/output (I/O) pads, such as bond pads, for communicating signals and power onto or off from the die 4000 may also have non-square configurations as shown by triangular I/O pads 4044, hexagonal I/O pads 4046, parallelogram I/O pads 4048, rhomboidal I/O pads 4050, and diamond shaped I/O pads 4052 which uniformly or in combination may be used in conjunction with or to replace the more traditional square or near-square I/O pads 4054. Even with advances in angled or shaped I/O pads as shown in U.S. Pat. No. 5,300,815, issued Apr. 5, 1994, by Rostoker, entitled TECHNIQUE OF INCREASING BOND PAD DENSITY ON A SEMICONDUCTOR DIE (previously noted), herein shown in FIG. 91 at 4056, I/O pads may be selectively replaced with I/O pads of the current invention, as by angled parallelogram I/O pads 4058, angled triangular pads 4060 or angled rhomboidal pads 4062 or the like. Any of these I/O pads may be on the periphery or interior of the die 4000 area and may be used as for electrical contact in wire bonding, Tape Automated Bonding(TAB), Flip chip (see U.S. Pat. No. 5,399,898, issued Mar. 21, 1995, by Rostoker, entitled MULTI-CHIP SEMICONDUCTOR ARRANGEMENTS USING FLIP CHIP DIES, which is incorporated herein by reference) or other connection means known to one of skill in the art. These blocks 4004–4062 can be considered as modules for use in various circuit designs, and may be represented as standard designs in circuit libraries.

The integrated circuit 4000 may therefore comprise multiple larger blocks along with a large number, which can be tens of thousands, hundreds of thousands or even millions or more of small cells such as blocks 4030–4042. Each cell whether separate as with 4030–4042 or combined into larger blocks, such as 4006, 4010, 4014, 4021, 4022, 4030 and 4036 represents a single logic element, such as a gate, or several logic elements that are interconnected in a standardized manner to perform a specific function. Cells that consist of two or more interconnected gates or logic elements are also available as standard modules in circuit libraries.

The cells and other elements of the circuit die 4000 described above are interconnected or routed in accordance with the logical design of the circuit to provide the desired functionality. Although not visible in the drawing, the various elements of the circuit die 4000 are interconnected by electrically conductive lines or traces that are routed, for example, through 90 degree intersecting vertical channels 4066 and horizontal channels 4068 that run between the square cells 4040 or by sixty degree intersecting channels 4070, 4072 and 4074 that run between the triangular cells 4038 and the hexagonal cells 4034 and the like. Alternatively, conductive lines for interconnect may be routed over the top or side of any or a plurality of cells (not shown) instead of or in conjunction with the channeled interconnect method.

The input to the physical design problem is a circuit diagram or specific characteristics (as in the case of an HDL description) and the output is the layout of the circuit. This is accomplished in several stages including partitioning, floor planning, placement, routing and compaction.

Partitioning—A chip may contain several million transistors. Layout of the entire circuit cannot traditionally be space asdue to the limitation of memory space as well as the computation power available. Therefore it is normally partitioned by grouping the components into blocks such as subcircuits and modules. The actual partitioning process considers many factors such as the size of the blocks, number of block and number of interconnections between the blocks.

The output of partitioning is a set of blocks, along with the interconnections required between blocks. The set of interconnections required is commonly referred to as a netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement—This step is concerned with selecting good layout alternatives for each block of the entire chip, as well as between blocks and to the edges. Floor planning is a critical step as it sets up the ground work for a good layout. However it is computationally quite hard. Very often the task of floor plan layout is done by a design engineer using a CAD tool. This is necessary as the major components of an IC are often intended for specific locations on the IC die.

Only for simple layouts can the current layout tools provide a solution without human-engineering direction and intervention. One aspect of the present invention will permit complex problems, including flow plan layout, to be accomplished without regular human intervention.

During placement, the blocks are exactly positioned on the die. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

The 90 degree intersecting vertical and horizontal channels 4066 and 4068 or alternatively the 60 degree intersecting channels 4070, 4072 and 4074 are generally provided between the blocks in order to allow for electrical interconnections. The quality of the placement will not be evident until the routing phase has been completed. A particular placement may lead to an unroutable design. For example, routing may not be possible in the space provided. In that case another iteration of placement is necessary. Sometimes routing is implemented over the entire area, including over some or all of the blocks, and not just over the channels.

To limit the number of iterations of the placement algorithm, an estimate of the required routing space is used during the placement phase. A good routing and circuit performance heavily depend on a good placement algorithm. This is due to the fact that once the position of each block is fixed, very little can be done to improve the routing and overall circuit performance.

Routing—The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Due to the nature of the routing algorithms, complete routing of all connections cannot be guaranteed in many cases. As a result, a technique called "rip up and re-route" is used that removes troublesome connections and re-routes them in a different order. One suitable routing system is disclosed and described in application Ser. No. 08/131,770, by Scepanovic, et al., filed Oct. 4, 1993, entitled TOWARDS OPTIMAL STEINER TREE ROUTING IN THE PRESENCE OF RECTILINEAR OBSTACLES, which is incorporated herein by reference.

Compaction—Compaction is the task of compressing the layout in all directions such that the total area is reduced. By making the chips (each IC die) smaller, wire lengths are reduced which in turn reduces the signal delay between components of the circuit. At the same time a smaller area enables more IC die to be produced on a wafer which in turn reduces the cost of manufacturing. Compaction must ensure that no rules regarding the design and fabrication process are violated.

Very Large Scale Integration (VLSI) physical design is iterative in nature and many steps such as global routing and channel routing are repeated several times to obtain a better layout. In addition, the quality of results obtained in one stage depends on the quality of solution obtained in earlier stages as discussed above. For example, a poor quality placement cannot be fully cured by high quality routing. As a result, earlier steps have extensive influence on the overall quality of the solution.

In this sense, partitioning, floor planning and placement problems play a more important role in determining the area and chip performance in comparison to routing and compaction. Since placement may produce an unroutable layout, the chip might need to be re-placed or re-partitioned before another routing is attempted. The whole design cycle is conventionally repeated several times to accomplish the design objectives. The complexity of each step varies depending on the design constraints as well as the design style used.

The area of the physical design problem to which an aspect of the present invention relates is the placement and routing of the blocks (including cells and I/O pads) and other elements on the integrated circuit 4000 illustrated in FIG. 91. After the circuit partitioning phase, the area occupied by each block (4004–4054 and 4060–4062) can be calculated, and the number of terminals required by each block is known. In addition, the netlists specifying the connections between the blocks are also specified.

In order to complete the layout, it is necessary to arrange the blocks on the layout surface and interconnect their terminals according to the netlist. The arrangement of blocks is done in the placement phase while interconnection is completed in the routing phase. In the placement phase, the blocks are assigned a specific shape and are positioned on a layout surface in such a fashion that no two blocks are overlapping and enough space is left on the layout surface to complete interconnections between the blocks. The blocks are positioned so as to minimize the total area of the layout. In addition, the locations of the terminals on each block are also determined.

Physical Design Algorithms a. Overview

Very Large Scale Integration (VLSI) Integrated Circuit (IC) physical design automation utilizes algorithms and data structures related to the physical design process. A general treatise on this art is presented in a textbook entitled "Algorithms for VLSI Physical Design Automation" by Naveed Sherwani, Kluwer Academic Publishers 1993, incorporated herein by reference.

Depending on the input, placement algorithms can be classified into two major groups, constructive placement and iterative improvement methods. The input to the constructive placement algorithms consists of a set of blocks along with the netlist. The algorithm finds the locations of the blocks. On the other hand, iterative improvement algorithms start with an initial placement. These algorithms modify the initial placement in search of a better placement. The algorithms are applied in a recursive or an iterative manner until no further improvement is possible, or the solution is considered to be satisfactory based on a predetermined criteria.

Iterative algorithms can be divided into three general classifications, simulated annealing, simulated evolution and force directed placement. The simulated annealing algorithm simulates the physical annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description each arrangement of cells will be referred to as a placement. In a practical integrated circuit chip (die), the number of cells can be hundreds of thousands or millions. Thus, the number of possible placements is extremely large.

Iterative algorithms function by generating large numbers of possible placements and comparing them in accordance with some criteria which is generally referred to as fitness. The fitness of a placement can be measured in a number of different ways, for example, overall chip size. A small size is associated with a high fitness and vice versa. Another measure of fitness is the total wire length of the integrated circuit. A high total wire length indicates low fitness and vice versa.

The relative desirability of various placement configurations can alternatively be expressed in terms of cost, which can be considered at the inverse of fitness, with high cost corresponding to low fitness and vice versa.

b. Simulated Annealing

Basic simulated annealing per se is well known in the art and has been successfully used in many phases of VLSI physical design such as circuit partitioning. Simulated annealing is used in placement as an iterative improvement algorithm. Given a placement configuration, a change to that configuration is made by moving a component or interchanging locations of two components. Such interchange can be alternatively expressed as transposition or swapping.

In the case of a simple pairwise interchange algorithm, it is possible that a configuration achieved has a cost higher than that of the optimum, but no interchange can cause further cost reduction. In such a situation, the algorithm is trapped at a local optimum and cannot proceed further. This happens quite often when the algorithm is used in practical applications. Simulated annealing helps to avoid getting stuck at a local optima by occasionally accepting moves that result in a cost increase.

In simulated annealing, all moves that result in a decrease in cost are accepted. Moves that result in an increase in cost are accepted with a probability that decreases over the iterations. The analogy to the actual annealing process is heightened with the use of a parameter called temperature ("T"). This parameter controls the probability of accepting moves that result in increased cost.

More of such moves are accepted at higher values of temperature than at lower values. The algorithm starts with a very high value of temperature that gradually decreases so that moves that increase cost have a progressively lower probability of being accepted. Finally, the temperature reduces to a very low value which requires that only moves that reduce costs are to be accepted. In this way, the algorithm converges to an optimal or near optimal configuration.

In each stage, the placement is shuffled randomly to get a new placement. This random shuffling could be achieved by transposing a cell to a random location, a transposition of two cells, or any other move that can change the wire length or other cost criteria. After the shuffle, the change in cost is evaluated. If there is a decrease in cost, the configuration is accepted. Otherwise, the new configuration is accepted with a probability that depends on the temperature.

The temperature is then lowered using some function which, for example, could be exponential in nature. The process is stopped when the temperature is dropped to a certain level. A number of variations and improvements on the basic simulated annealing algorithm have been developed. An example is described in an article entitled "Timberwolf 3.2 A New Standard Cell Placement and Global Routing Package" by Carl Sechen, et al. IEEE 23rd Designed Automation Conference paper 26.1, especially at pages 432 to 439, and this entire article is incorporated herein by reference.

c. Simulated Evolution

Simulated evolution, which is also known as the genetic algorithm, is analogous to the natural process of mutation of species as they evolve to better adapt to their environment. The algorithm starts with an initial set of placement configurations which is called the population. The initial placement can be generated randomly. The individuals in the population represent a feasible placement to the optimization problem and are actually represented by a string of symbols.

The symbols used in the solution string are called genes. A solution string made up of genes is called a chromosome. A schema is a set of genes that make up a partial solution. The simulated evolution or genetic algorithm is iterated, and each iteration is called a generation. During each iteration, the individual placements of the population are evaluated on the basis of fitness or cost. Two individual placements among the population are selected as parents, with probabilities based on their fitness. The better fitness a placement has, the higher the probability that it will be chosen.

The genetic operators called crossover, mutation and inversion, which are analogous to their counterparts in the evolution process, are applied to the parents to combine genes from each parent to generate a new individual called the offspring or child. The offspring are evaluated, and a new generation is formed by including some of the parents and the offspring on the basis of their fitness in a manner such that the size of the population remains the same. As the tendency is to select high fitness individuals to generate offspring, and the weak individuals are deleted, the next generation tends to have individuals that have good fitness.

The fitness of the entire population improves over the generations. That means that the overall placement quality improves over iterations. At the same time, some low fitness individuals are reproduced from previous generations to maintain diversity even though the probability of doing so is quite low. In this way, it is assured that the algorithm does not get stuck at some local optimum.

The first main operator of the genetic algorithm is crossover, which generates offspring by combining schemata of two individuals at a time. This can be achieved by choosing a random cut point and generating the offspring by combining the left segment of one parent with the right segment of the other. However, after doing so, some cells may be duplicated while other cells are deleted. This problem will be described in detail below.

The amount of crossover is controlled by the crossover rate, which is defined as the ratio of the number of offspring produced by crossing in each generation to the population size. Crossover attempts to create offspring with fitness higher than either parent by combining the best genes from each.

Mutation creates incremental random changes. The most commonly used mutation is pairwise interchange or transposition. This is the process by which new genes that did not exist in the original generation, or have been lost, can be generated.

The mutation rate is defined as the ratio of the number of offspring produced by mutation in each generation to the population size. It must be carefully chosen because while it can introduce more useful genes, most mutations are harmful and reduce fitness. The primary application of mutation is to pull the algorithm out of local optima.

Inversion is an operator that changes the representation of a placement without actually changing the placement itself so that an offspring is more likely to inherit certain schema from one parent.

After the offspring are generated, individual placements for the next generation are chosen based on some criteria. Numerous selection criteria are available, such as total chip size and wire length as described above. In competitive selection, all the parents and offspring compete with each other, and the fittest placements are selected so that the population remains constant. In random selection, the placements for the next generation are randomly selected so that the population remains constant.

The latter criteria is often advantageous considering the fact that by selecting the fittest individuals, the population converges to individuals that share the same genes and the search may not converge to an optimum. However, if the individuals are chosen randomly there is no way to gain improvement from older generation to new generation. By combining both methods, stochastic selection make selections with probabilities based on the fitness of each individual.

d. Force Directed Placement

Force directed placement exploits the similarity between the placement problem and the classical mechanics problem of a system of bodies attached to springs. In this method, the blocks connected to each other by nets are supposed to exert attractive forces on each other. The magnitude of this force is directly proportional to the distance between the blocks. Additional proportionality is achieved by connecting more "springs" between blocks that "talk" to each other more (volume, frequency, etc.) And fewer "springs" where less extensive communication occurs between each block.

According to Hooke's Law, the force exerted due to the stretching of the springs is proportional to the distance between the bodies connected to the spring. If the bodies are allowed to move freely, they would move in the direction of the force until the system achieved equilibrium. The same idea is used for placing the cells. The final configuration of the placement of cells is the one in which the system achieves a solution that is closest to or in actual equilibrium.

A description and disclosure of a system and methodology for developing an integrated circuit cell placement representation using physical design algorithms as discussed above is set out in application Ser. No. 08/229,826, filed Apr. 19, 1994, by Rostoker et al., entitled INTEGRATED CIRCUIT PHYSICAL DESIGN AUTOMATION SYSTEM UTILIZING OPTIMIZATION PROCESS DECOMPOSITION AND PARALLEL PROCESSING, the entire disclosure of which is incorporated herein by reference.

More specifically, in light of the present invention, floorplanning is the process of placing functional devices ("functions," also referred to as modules, elements, blocks, or functional blocks) on a chip (integrated circuit die), and allocating interconnection space among them so as to minimize the actual chip area required to encompass such functions and their interconnections, and to maximize the probability that such interconnections can be routed within that area.

Related to the floorplanning process, and creating a competing need for chip or die area is the amount of input/output (I/O) space required by the functional devices. Bond pads (connection points to the die) and the relatively large driver/receiver circuits and static protection networks required for input and output connections require a significant portion of the perimeter area of in integrated circuit die (chip) and eat into the space available for placing other functional devices.

Prior to the floorplanning process itself, which involves the placement of functions on a chip, the chip's logic must be designed. Logic designers generally employ hierarchical design techniques to determine the appropriate selection and interconnection of logic and/or memory devices which will enable the chip to perform the desired function. These techniques involve describing the chip's functionality at various "levels of abstraction," ranging from the most general function performed by the chip to the precise functions performed by each logic and/or memory element on the chip.

Thus, a logic designer's hierarchy consists of N levels of functions, where N is an integer (N≧1) representing the number of hierarchical levels of functionality in the chip, the first level being the chip itself, and where n is an integer (1≦n≦N) representing the level of any particular function in the hierarchy.

A "parent" function at the (n)th level of the hierarchy is defined as a plurality of $(n+1)^{st}$ level "children" functions, each of which is a "child" function. For example, a microprocessor at the (n)th level might be defined as the parent of the following $(n+1)^{st}$ level children: an ALU, a series of registers, a bus and various other functions (each of which may or may not have a plurality of $(n+2)^{nd}$ level children, and so on).

Each child function which is not also a parent function (i.e., which has no children) is referred to as a "terminal" (or "leaf") function. Each terminal function is connected to at least one other terminal function, such connection commonly being referred to as a "net". A series of nets, each of which defines a plurality of interconnected functions, is commonly referred to as a "net list."

Note that lower levels of the hierarchy are commonly denoted by successively higher numbers. Thus, while level 1 refers to the top (chip) level of the hierarchy, levels 2, 3, and 4 constitute successively "lower" levels of the hierarchy.

Automated techniques for floorplanning ("floorplanners") are known in the prior art and fall into three basic categories: (1) "flat" floorplanners, which attempt to minimize space at only one level (the "level" which is created when the hierarchy is flattened by omitting all but the terminal functions), by placing only terminal functions; (2) "top-automated" floorplanners, which automate the floorplanning process at only the top level by placing only second level functions; and (3) "hierarchical" floorplanners, which automates the process of floorplanning by optimizing placement of functions at many levels (preferably, at all levels).

An example of a hierarchical floorplanner which operates at all levels of hierarchy is taught in U.S. Pat. No. 4,918,614, issued Apr. 17, 1990, to Modarres et.al., and assigned to LSI Logic Corporation of Milpitas, Calif., which is incorporated herein by reference. Further references cited in U.S. Pat. No. 4,918,614 describe various "flat" floorplanners, and floorplanning related techniques.

Modern integrated circuits are generally produced by creating several identical integrated circuit dies at individual "die sites" on a single semiconductor wafer, then scribing (slicing) the wafer to separate (singulate, dice) the dies from one another. Generally, the dies are either rectangular or square. On the other hand, semiconductor wafers are generally round. The prior art die sites are defined by a series of parallel scribe lines which extend chordwise across the wafer, perpendicular to another series of chordwise parallel scribe lines.

Circuits and active elements on the dies are created while the dies are still together (un-singulated) on the wafer by ion deposition, electron beam lithography, plasma etching, mechanical polishing, sputtering, and numerous other methods which are well known to those skilled in the art of semiconductor fabrication. These processes are highly developed and are capable of producing extremely complicated circuits on the dies at a relatively low cost. However, the prior art method of fabricating square or rectangular "die sites" from a semiconductor wafer is impeding the development of complex integrated circuit dies. Problems with the prior art include (1) low wafer-layout-efficiency, $E_w$, and (2) low die-topology-efficiency, $E_D$. Non-square die configurations have solved certain of these problems, as noted previously. However, in a related conception traditionally rectangular arrays of square or rectangular blocks have been developed to fit on the traditionally square die.

Figure 92A:
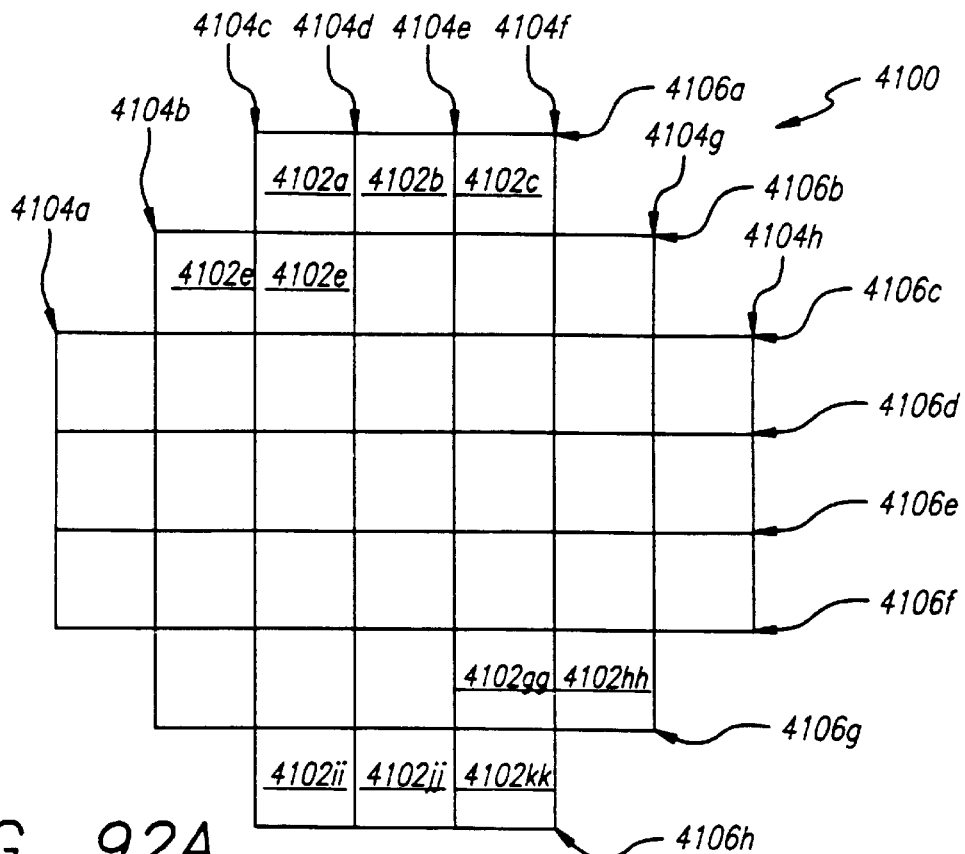
FIG. 92A shows a prior art block of near square or square sub block cells.

FIG. 92A shows a prior art block 4100 of near square or square sub block cells 4102a, 4102b, 4102c–4102ii, 4102jj and 4102kk. The blocks 4102 are separated by vertical lines 4104a–4104h and by horizontal line 4106a–4106h. The lines 4104 and 4106 may act as routing channels in a widely spaced configuration (as like the blocks 4040 FIG. 91 separated by vertical channels 4066 and horizontal channels 4068, respectively or merely as reference lines noting the demarcation of each sub-block 4102 (which may be considered a block in itself).

Figure 92B:
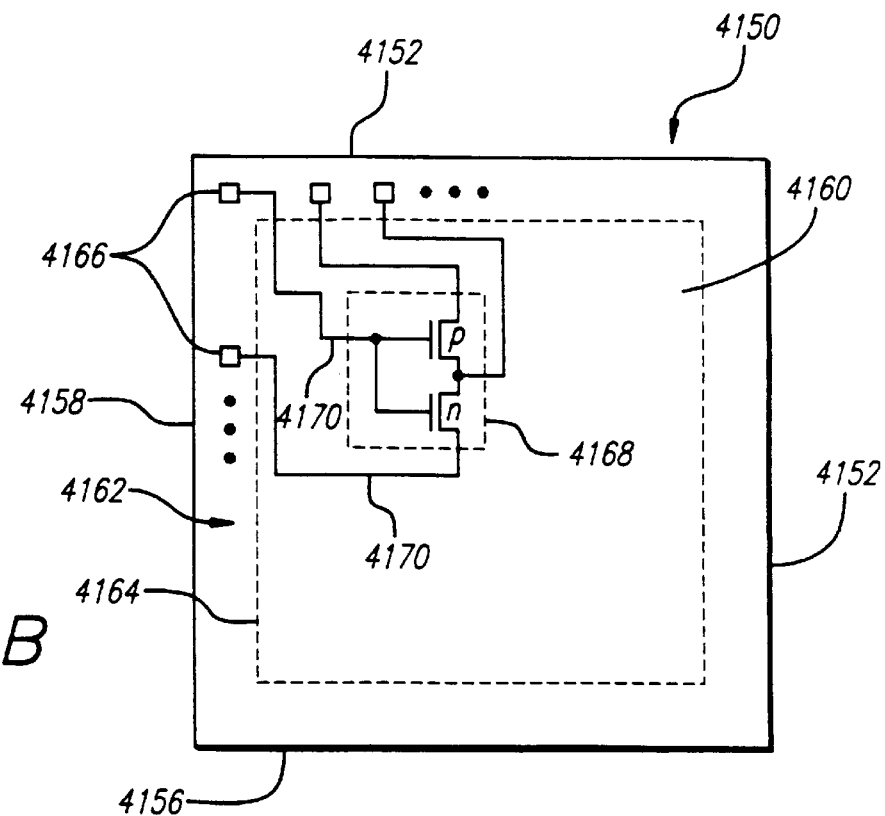
FIG. 92B shows an exemplar prior art square of a near square block (or sub-block) of simple construction.

FIG. 92B shows an exemplar prior art square of near square block (or sub-block) of simple construction generally designated by the number 4150. Block 4150 may represent any square or near square block or sub-block as, for example, shown at 4102 in FIG. 92A or blocks 4040, 4042 or 4004 in FIG. 91. In the case of FIG. 92B, block 4150 is shown having four side edges 4152, 4154, 4156 and 4158 which may be corresponding to horizontal lines 4104 and vertical lines 4106. Within the block 4150 as bounded by edges 4152, 4154, 4156 and 4158 a connection area 4162 is present for terminal points 4166 of an electronic circuit 4168 to connect to terminals (not shown) of other electronic circuits or die I/O pads. The circuit 4168 is connected to terminal points 4166 as by intra-block (or intra-cell) wires 4170. Additional circuits may be present in the interior (or active) area 4160 of the block 4150, while additional potential terminal points are shown in the connection area 4162 as by dots. The interior active area 4160 is separated from the connection area 4162 as by dotted line 4164.

Figure 93A:
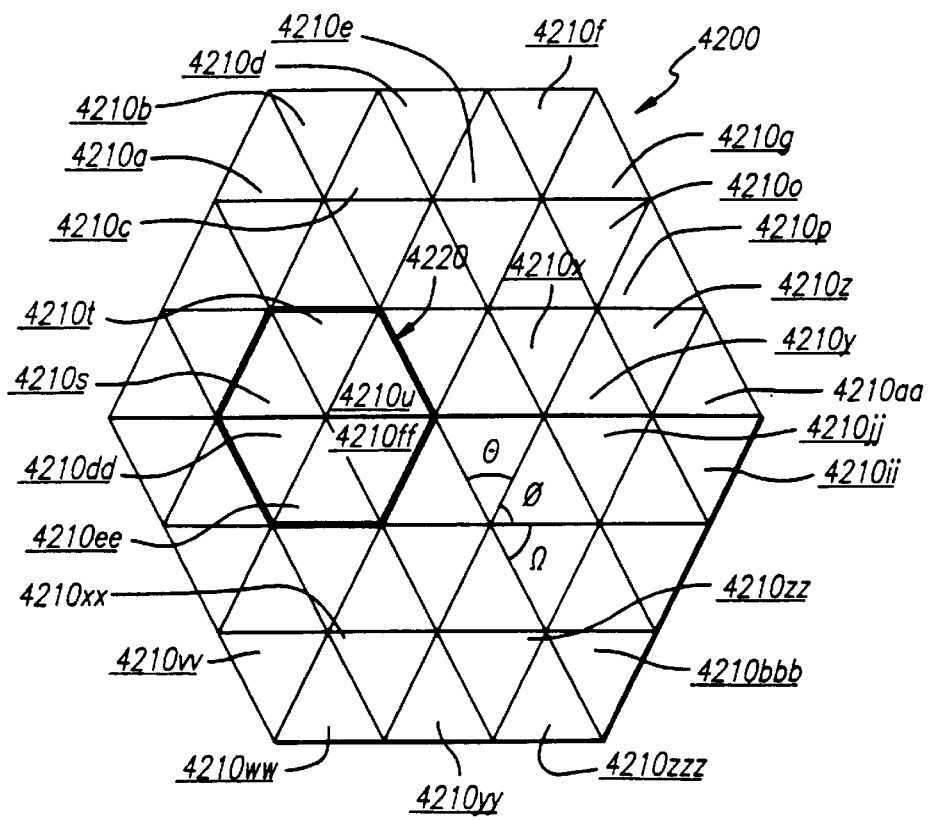
FIG. 93A shows a hexagonal block structure similar to a hex block shown in FIG. 91.

FIG. 93A shows a hexagonal block structure 4200 similar to hex block 4028 of FIG. 91. Hex block 4200 is shown composed of triangular sub-blocks 4210a–4210bbb. Additional internal hexagonal sub-cells comprise the hex block 4200, such as hex sub-block 4220 which is comprised of triangular sub-blocks 4210s, 4210t, 4210u, 4210dd, 4210ee and 4210ff. Alternatively, hex block 4200 could be considered to be composed of rows of rhomboid sub-blocks such as would be comprised of triangle sub-blocks 4210a–4210g or by row of triangle sub-blocks 4210v–4210bbb. Also, hex block 4200 could be considered to be composed of abutting parallelogram sub-blocks (or sub-cells) one of which being comprised of triangular sub-blocks 4210a–4210f and another by 4210g, 4210o, 4210p, 4210z, 4210aa and 4210ll. Further, hex block 4200 may be comprised of larger triangular sub-blocks, such as that comprising triangular sub-blocks 4210x–4210z and 4210jj. Thus, it is shown that hex blocks may be formed by triangle, rhomboid, parallelogram and hex sub-structures; also that parallelogram, rhomboid, hex and triangular blocks may be formed by triangular sub-blocks. Within the hex structure, the lines separating respective sub-blocks intersect at the angles θ, φ and Ω as shown. Within a preferred embodiment of this invention, the intersection angles θ, φ and Ω are 60 degrees.

Figure 93B:
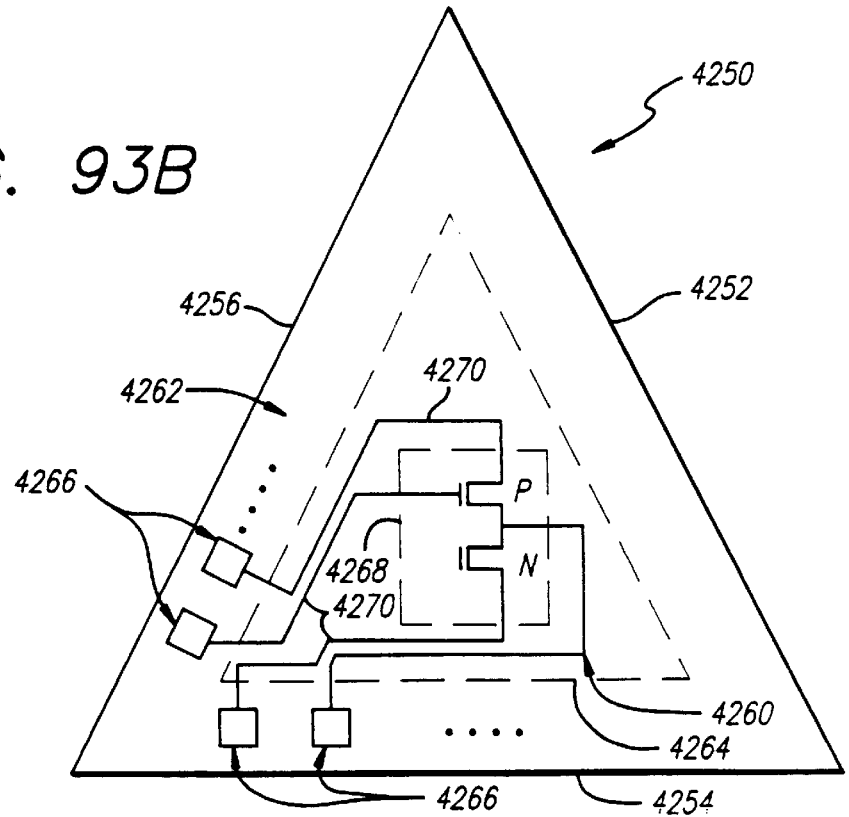
FIG. 93B shows an exemplar triangular block or sub-block.

FIG. 93B shows an exemplar triangular block or sub-block generally designated by the number 4250. Block 4250 is bounded by three side edges 4252, 4254 and 4256 with an interior active area 4260 surrounded by a peripheral connection area 4262, the two areas being separated as by dotted line 4264. An electronic circuit within the dotted line 4268 is shown having electrical connection to terminal points 4266 (with potentially other terminal points shown by dots for other possible electronic circuits within the active area 4260 of the triangular block 4250) as by intra-block (or intra-cell) wires 4270. It should be noted that the circuit diagram shows tradition n-p transistor notation, other types of electronic devices, including the tri-istor disclosed herein, are specifically contemplated as circuit elements which may be designed or fabricated in the active area (4160 or 4260) of a block (4150 or 4250) as shown in FIGS. 92B or 93B respectively. Additionally, even though the electronic circuit area 4268 is shown in a rectangular or near-square shape in FIGS. 92B and 93B, non-square shapes are contemplated— as by a triangular shape for tri-ister components or the like, or hexagonal, triangular, parallelogram, rhomboidal or diamond shapes composed of tri-istors as shown herein.

Figure 94:
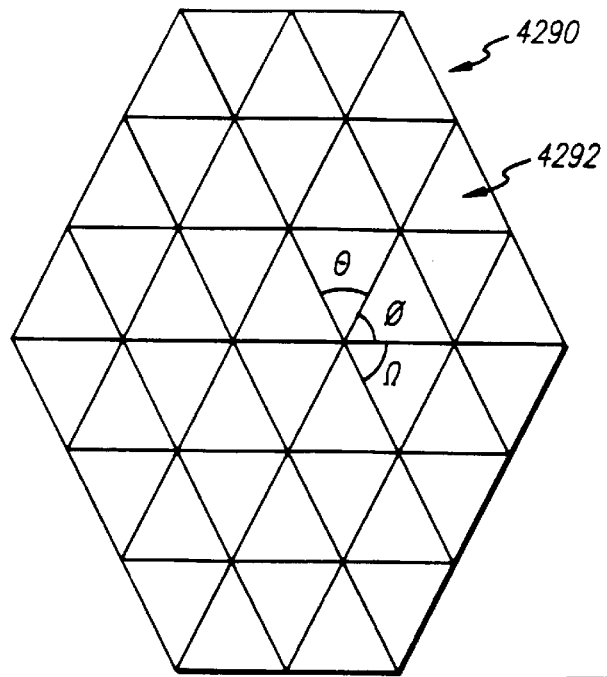
FIG. 94 shows a near-hexagonal block comprised by triangular sub-blocks and having intersection angles θ, φ and Ω of the respective separating lines at 60 degrees.

Similarly to FIG. 93A, FIG. 94 shows a near-hexagonal block 4290 comprised by triangular sub-blocks 4292 and having intersection angles θ, φ and Ω of the respective separating lines at 60 degrees. Many other regular and irregular shapes can be composed of various sub-blocks having 60 degree intersection angles respective edge lines.

Figure 95A:
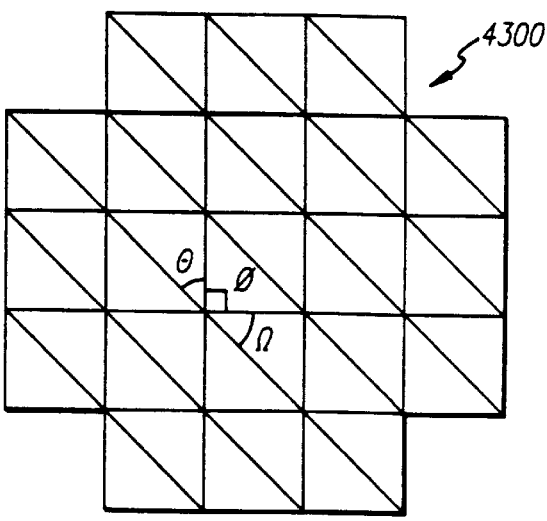
FIG. 95A shows a block composed of triangular sub-blocks, where the sub-block demarcation lines define right-triangles having demarcation line intersection angles θ and Ω of 60 degrees and φ of 90 degrees.

FIG. 95A shows a block 4300 similar to the block 4100 shown in FIG. 92A. Block 4300 is shown composed of triangular sub-blocks, but unlike the sub-blocks shown in FIGS. 93A and 94 primarily in the orientation of the lines which demark each sub-block. The sub-block demarcation lines in FIG. 95A define right-triangles having demarcation line intersection angles θ and Ω of 60 degrees and φ of 90 degrees. Triangular blocks or sub-blocks are also specifically contemplated with edge lines having other intersection angles.

Figure 95B:
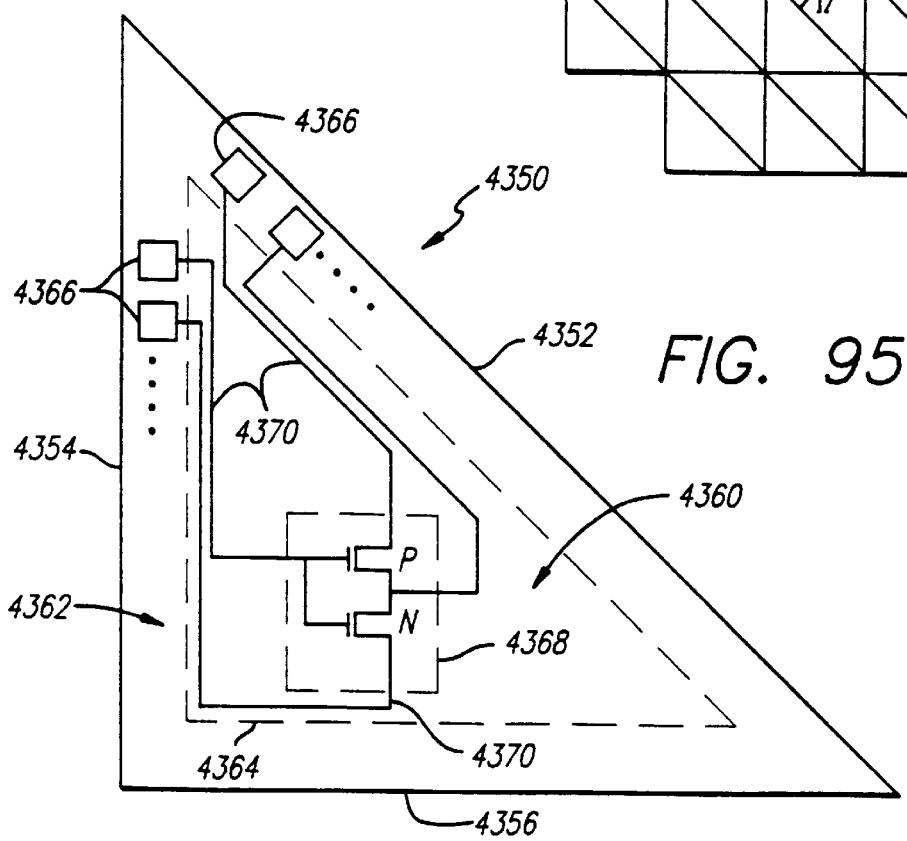
FIG. 95B shows an exemplar triangular block or sub-block.

Similarly to FIGS. 92B and 93B, FIG. 95B shows an exemplar triangular block or sub-block generally designated by the number 4350. Block 4350 is bounded by three side edges 4352, 4354 and 4356 with an interior active area 4360 surrounded by a peripheral connection area 4362, the two areas being separated as by dotted line 4364. An electronic circuit within the dotted line 4368 is shown having electrical connection to terminal points 4366 (with potentially other terminal points shown by dots for other possible electronic circuits within the active area 4360 of the triangular block 4350) as by intra-block (or intra-cell) wires 4370. It should be noted that the circuit diagram shows tradition n-p transistor notation, other types of electronic devices, including the tri-istor disclosed herein, are specifically contemplated as circuit elements which may be designed or fabricated in the active area (4160, 4260 or 4360) of a block (4150, 4250 or 4350) as shown in FIGS. 92B, 93B or 95B respectively. Additionally, even though the electronic circuit area 4368 is shown in a rectangular or near-square shape in FIGS. 92B, 93B and 95B, non-square shapes are contemplated—as by a triangular shape for tri-istor components or the like, or hexagonal, triangular, parallelogram, rhomboidal or diamond shapes composed of tri-istors as shown herein.

FIG. 96A shows a block structure 4620 composed of parallelogram sub-block 4602 (specifically 4602a–4602pp) of a similarity to the blocks 4100, 4200, 4290 and 4300 shown in FIGS. 92A, 93A, 94 and 95A, respectively. And, similarly to FIGS. 92B, 93B and 95B, FIG. 96B shows an exemplar parallelogram block or sub-block generally designated by the number 4650. Block 4650 is bounded by four side edges 4652, 4654, 4656 and 4658 with an interior active area 4660 surrounded by a peripheral connection area 4662, the two areas being separated as by dotted line 4664. An electronic circuit within the dotted line 4668 is shown having electrical connection to terminal points 4666 (with potentially other terminal points shown by dots for other possible electronic circuits within the active area 4660 of the block 4650) as by intra-block (or intra-cell) wires 4670, as similarly shown and described in previously described FIGS. 92B, 93B and 95B. Herein contemplated is the special case parallelogram with shortened sides 4654 and 4658 forming a diamond structured block.

FIG. 97A shows a block structure 4620' (4620 prime) composed of rhomboidal blocks 4602', of a similarity to the blocks 4100, 4200, 4290, 4300 and 4620 shown in FIGS. 92A, 93A, 94, 95A and 96A, respectively. And, similarly especially to FIG. 96B, wherein prime numerals represent like structures having non-prime similar numbers, FIG. 97B shows a detailed schematic of an electronic circuit for the block 4650' which could represent any one of sub-blocks 4602' of FIG. 97A.

Floorplanning

A suitable floorplanning method for such non-square die is disclosed in application Ser. No. 07/958,208, filed Oct. 7, 1992, by Michael D. Rostoker, entitled VARIABLE DIE SHAPE FLOORPLANNING, which is incorporated herein by reference. The floorplanning technique disclosed therein may also be useful for increasing the available I/O area on a die vis-a-vis the active element area, thus increasing the die-topology-efficiency. An example of a hierarchical floorplanner which operates at all levels of hierarchy is taught in U.S. Pat. No. 4,918,614, issued Apr. 17, 1990, to Modarres et.al. (previously noted).

A method of making integrated circuits may include a floorplanning process comprising the steps of:
 a) estimating the area required for the desired functions to be performed by the integrated circuit;
 b) estimating the area for interconnection of functions (routing);
 c) estimating the area required for I/O (e.g., for bond pads);
 d) calculating the ratio of function area to I/O area;
 e) selecting a die shape based on the ratio; and,
 f) laying out the functions and I/O on the die (floorplanning).

The last step involves floorplanning, and also involves placement and routing optimization. A novel method for placement (which may also be used for floorplanning referred to in step (f) above) is described below.

Floorplanning And Placement Optimization

Currently available computer aided design methods may not be optimum for laying out hexagonal shaped cells on a semiconductor wafer or substrate. One aspect of the present invention is a method for optimally placing hexagonal shaped cells on the available area of a wafer. However, the placement algorithm described herein is not limited to hexagonal shaped cells. The placement, floorplanning, and routing algorithms described here are applicable to rectangular cells, and other shapes of cells. In addition, where three layers of metal are available for routing and the routing directions are angularly offset from each other by 60 degrees, a placement method that approaches placement in the manner described herein is more effective at minimizing total wire length because it provides several degrees of freedom in the same directions that routing is available. However, the disclosed algorithm is applicable to a variety of routing approaches, including rectilinear routing, multi-layer routing employing any arbitrary angular displacement between the available directions, and others.

In the past, a designer would typically place large mega-function blocks in the available area of a die, and attempt would be made to see if such a placement could be satisfactorily routed. Typically, this was done several times for different placements of the megafunction blocks, and the best result chosen. There was no assurance that any one of the layouts determined by this partial trial-and-error approach was the best possible solution. The algorithm described herein allows a designer to determine the optimum placement/floorplan from the start, because it is not necessary to start with any blocks placed by trial-and-error. The algorithm is capable of determining the placement for every cell and megafunction block on a die.

The placement method and algorithm described herein may be utilized for design functions commonly referred to as floorplanning, as well as traditional placement. As will be explained more fully below, the placement of relatively large megacells is accomodated by this algorithm. When lower hierarchy levels are reached, megacells will become frozen in a particular location on the available real estate, and the algorithm will continue to process smaller and smaller areas to determine the placement of smaller cells. This algorithm provides dynamic floorplanning optimization.

Figure 29:
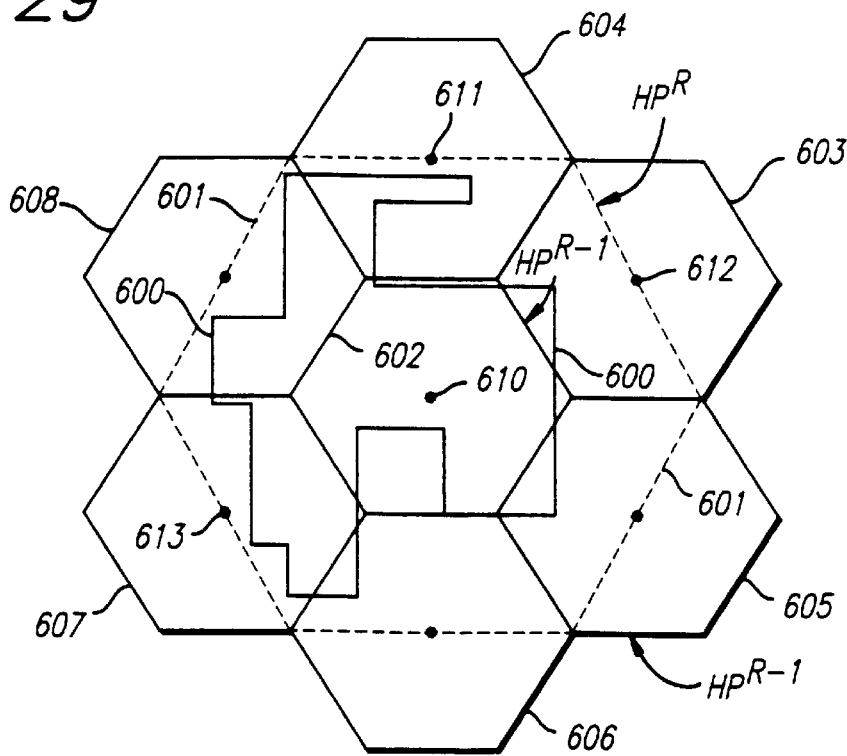
FIG. 29 is a diagram of an area of a chip that is to be laid out using hexagonal architecture which is used to illustrate the operation of a placement algorithm.

The placement of hexagonal shaped cells may typically involve an available area on a chip that is non-rectangular. For example, FIG. 29 shows a non-rectangular area 600 remaining on a chip after other cells or circuits have been laid out. It is desirable to determine the most efficient placement for hexagonal cells constructed in accordance with the present invention. The placement problem may be addressed by using the placement algorithm algorithm described herein. One aspect of the placement problem is the desire to place cells in the available region 600 such that the total wire length of the metal interconnect is the minimum necessary to implement the circuit. This problem may be addressed as involving a hypergraph "H", which is an ordered pair of two sets consisting of the set of cells to be placed on the chip, and the set of nets defining the points that must be interconnected.

$$H=\text{(set of cells, set of nets)}.$$

It is desirable to minimize the total wire length of the interconnect necessary to complete the connections between the cells in the set indicated by the set of nets. This may be stated mathematically as:

$$\text{minimize [total wire length}=\Sigma_{nets}\text{netlength]}$$

A dynamic hierarchical placement algorithm is preferred. In this discussion, "dynamic" means that cells are not fixed in any particular region during the process of optimization. As the placement algorithm proceeds to lower levels subdividing the area under consideration, it should be possible to move a cell from a subdivided area in one area to another subdivided area in a completely different area if it improves the solution, instead of only considerating the subareas that result from the subdivision of a given area. This helps avoid the phenomenum of a local minimum, for example, in a function such as one where the total wirelength is being minimized. This also helps to avoid a local maximum, for example, in a function where the optimization algorithm is attempting to maximize something, such as where it is maximizing an affinity based optimization function. Thus, whether there is a potential problem with a local minimum, or with a local maximum, will depend upon the type of function that is involved.

Figure 30:
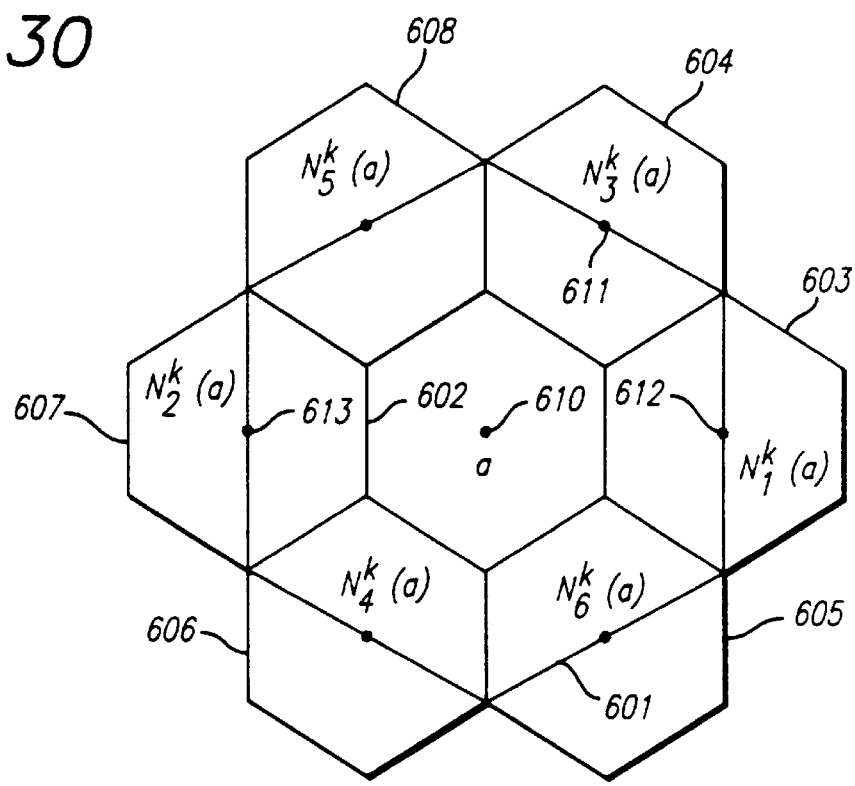
FIG. 30 is a diagram of an area of a chip showing two hierachies of hexagonals used in floor planning to illustrate the operation of a placement algorithm.
Figure 69:
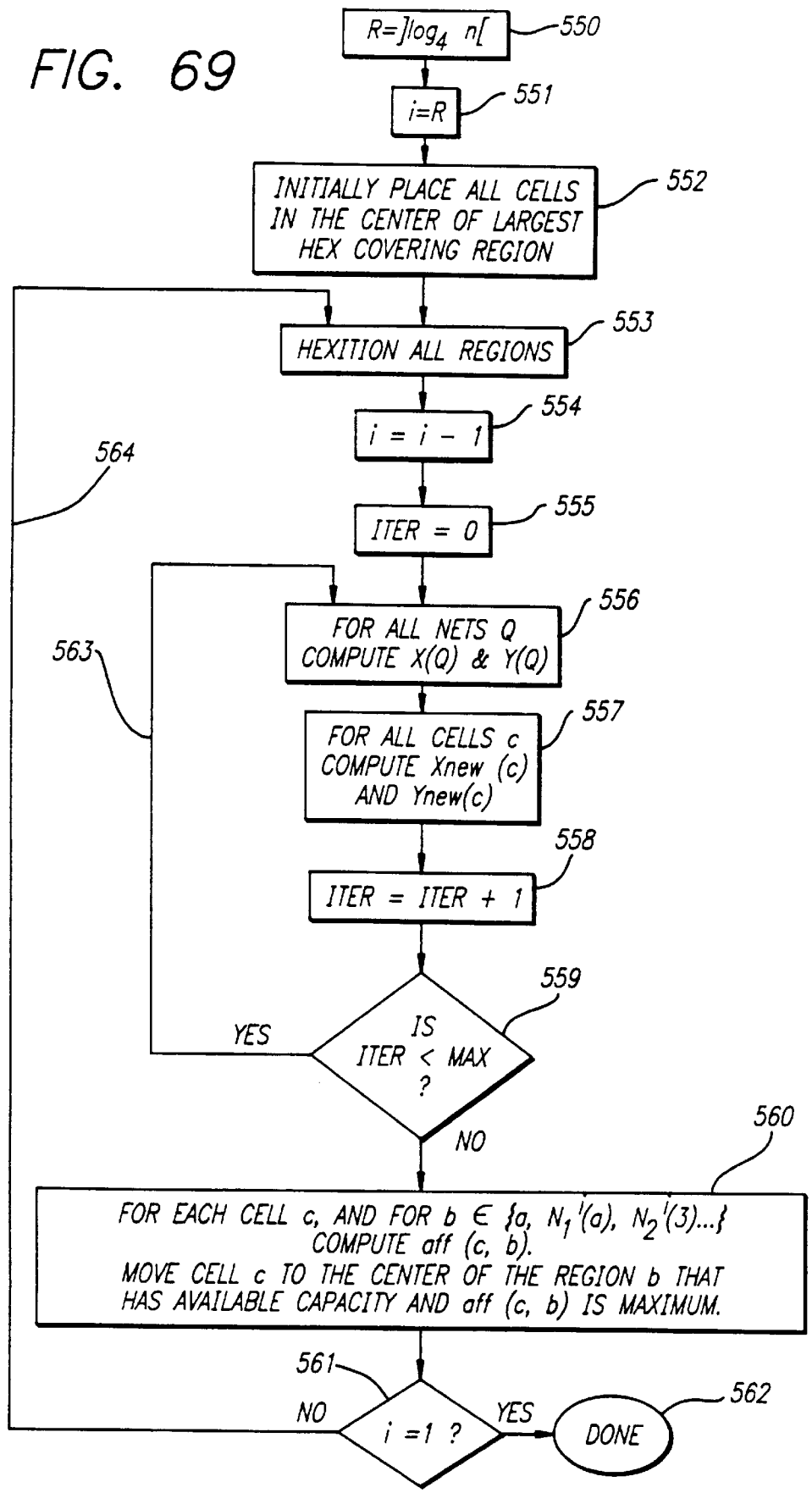
FIG. 69 is a flow chart illustrating a placement algorithm.

FIG. 69 depicts a flow chart for the placement algorithm disclosed herein. The steps in the algorithm may be explained with reference to FIGS. 29 and 30.

The first step 550 in the algorithm is to determine the number of levels of hierarchy, which may be referred to as "R." The number of levels of hierarchy, i.e., "R", may preferrably be computed from the following formula:

$$R=]\log_4 n[$$

where "n" is the number of cells. This equation means that the logarithm of "n" to the base 4 is computed, and "R" is set equal to that value if the answer is an integer, or "R" is set equal to the next largest integer greater than that value if the answer is not exactly an integer. In other words, "R" is an integer preferrably determined by always rounding up. For example, if the number of cells "n" to be placed is 1024, then the log of 1024 to the base four is exactly equal to 5. In this example, R=5. If the number of cells is 1,100, the the value computed for the log of 1,100 to the base 4 will be a number slightly greater than 5. This value is then rounded up to the next interger, so in this case R=6. This step is shown as step 550 in FIG. 69. When "R" is computed in this manner, the algorithm will proceed through levels of hierarchy so that at the last level (i=1) each area under consideration (in this preferred embodiment, the areas are hexagonal shaped) will contain not more than one cell. As will be explained below, other values of "R" may be used, and that will determine approximately how many cells will be assigned to an area at the last level of the hierarchy.

In this algorithm, the region 600 shown in FIG. 29 is partitioned into smaller and smaller hexagonal shaped areas. It is important to note that the cells do not necessarily need to be hexagonal; the hexagonal shaped areas are used to provide the appropriate degrees of freedom because the tri-direction interconnect has the same number of degrees of freedom. Hexagonal partitioning ("HP") of the region 600 is partitioned in levels. The hex is partitioned in levels $HP^i$, where i=1,2,3,4, . . . R−1n, R. This step 553 (see FIG. 69) is referred to as the "hexition" step, and will be explained more fully below. Thus, the variable "i" is set equal to "R" in step 551 to start the algorithm.

The hexition step 553 may also be referred to as building a hex tiling hierarchy. The highest level of the hierarchy (with the largest hexes) is level "R", which may be referred to symbolically as $HP^R$. This level is represented in FIG. 29 as the larger dotted line hex 601. In the first initialization step 552, all cells may be placed in the center of the "R" level hex 601. However, alternative initialization steps may be performed, such as a Gordian initial placement algorithm, or a Chaos initial placement algorithm. Other suitable initial placement algorithms are known in the art. In the algorithm, the variable "i", starting with the hierachical level "R," is decremented by one each iteration through the procedure (in step 554).

ITER is a variable used to keep track of the number of iterations in the loop, and is initially set to zero in step 555 each time the loop 563 (comprising steps 556, 557, 558, and 559) is entered.

In the next step 556, for a given "i" (the first time through will be for hierarchy level $HP^{R-1}$), an initial optimization is performed. In the hexition step 553, the area is partitioned into hexes 602, 603, 604, 605, 606, 607, and 608, etc., that are each half the size of the hex 601 used in the prior hierarchical level $HP^R$. In order to deal with the assignment problem mathematically, a coordinate system is used. Any position in the region 600 may be defined by a unique "x" and "y" coordinate pair where "x" and "y" are orthoginal axes (e.g., "x" corresponds to the horizontal axis and "y" corresponds to the vertical axis). For each net "Q", we compute the "X" and "Y" coordinates of "Q." The "X" coordinate of "Q" may be denoted X(Q), and the "Y" coordinate may be denoted Y(Q). The computation of X(Q) and Y(Q) will be described in more detail below.

For each level "i" of the heirarchy, an initial optimization is performed on level $HP^{i+1}$. For each net "Q", the "x" and "y" coordinates of that net "Q" are computed in step 556. The number of elements of the set (i.e., the number of pins connected in this net) may be denoted |Q|. The "average" of the "x" coordinates and the "average" of the "y" coordinates for a net "Q" gives a "center of gravity" for the net. The elements of the net "Q" may be designated "c". The "x" coordinate for a net "Q" is computed as follows:

$$X(Q) = \frac{1}{|Q|} * \Sigma_{c:c \in Q} X(c)$$

where the "x" coordinates are summed for each "c", where "c" is an element of net "Q".

Similarly, the "y" coordinate for a net "Q" is computed as follows:

$$Y(Q) = \frac{1}{|Q|} * \Sigma_{c:c \in Q} Y(c)$$

This gives the "x" and "y" coordinates for the net "Q", which are denoted "X(Q)" and "Y(Q)".

For each moveable cell, we compute the new "x" and "y" coordinates for the new position of the cell in step 557. If we denote the cell as cell "c", the new "x" coordinate of the cell "c", which may be denoted "$X_{new}(c)$", may be computed as follows:

where Q is the set of connections for this cell, and λ is a convergence or stability parameter that has a preferred value $$X_{new}(c) = (1-\lambda)X_{old}(c) + \frac{\lambda}{\Sigma_{Q:Q \ni c} \frac{1}{|Q|}} * \Sigma_{Q:Q \in c} \frac{1}{|Q|} X(Q)$$

between 0.8 and 1.2. The value of λ may be chosen empirically to have the computation converge. If λ were chosen as 1.0, the computation would be such that the effect would be that the new position of the cell would jump to the center of gravity. A convergence factor λ between 0.5 and 1.5 is less preferred, but may provide satisfactory results in some instances. The "best" value of λ is believed to be design dependent. For example, it may depend upon the relative number of connections that have to be made. In many instances, suitable values for λ will be within the range of 0.5 to 1.0. Values less than 0.5 will converge slowly.

The last factor in the above equation is a weighting factor. In effect, we divide by the number of pins to avoid hot spots.

Similarly, the new "y" coordinate "$Y_{new}(c)$" of the cell may be computed as follows:

$$Y_{new}(c) = (1-\lambda)Y_{old}(c) + \frac{\lambda}{\Sigma_{Q:Q \ni c} \frac{1}{|Q|}} * \Sigma_{Q:Q \in c} \frac{1}{|Q|} Y(Q)$$

These computations should be repeated a number of iterations until the process reaches stabilization. The number of iterations ("MAX") may be selected empirically. In practice, ten to twenty iterations give good results, and ten to fifteen iterations is preferred.

The variable or counter "ITER" is incremented in step 558 each time through the loop 563. In step 559, the algorithm then checks to determine whether the maximum number of desired iterations of the loop 563 have been performed. The variable "MAX" is set equal to the maximum number of desired iterations. Preferred values for "MAX" are in a range between 10 to 20. Additional iterations may be performed, but a diminishing rate of return is encountered. In step 559, "ITER" is compared with "MAX" to determine whether "ITER" is less than "MAX". If so, the flow loops back to step 556. When the desired number of iterations have been performed sufficient to allow the calculations to converge to a result, (at which point "ITER" is not less than "MAX"), the flow proceeds to step 560.

Alternatively, the method could stop at step 559 if the difference between two consecutive values of total wire length are less than a given small value ε. This may be expressed mathematically as follows:

|total wire length$_{ITER}$−total wire length$_{ITER-1}$|<ε

After the new coordinates "$X_{new}(c)$" and "$Y_{new}(c)$" have been computed after several iterations of step 557, an assignment algorithm is performed. In step 560, the "affinity" (which is detailed below) of each cell is computed for each hex to determine where the cell would prefer to be. This involves computation of the affinity of a cell for the center 610 of the hex 602, the affinity of the cell for the center 611 of the hex 604, the affinity of the cell for the center 612 of the hex 603, and so forth for each hex 605, 606, 607 and 608. In this method, an attempt is made to assign each cell to the hex with available space as to which it has the highest affinity. Each hex has a certain capacity or area available for the placement of cells. In some instances, all of the cells that have a maximum affinity for a particular hex will not fit within the area available in the hex. The capacity of the hex is computed, and if a hex reaches its capacity, cells will then be moved or assigned to an adjacent hex as to which the cell has the next highest affinity. The assignment algorithm can be iterated a number of times to try to minimize the total interconnect length. Alternatively, the assignment algorithm can be iterated a number of times to try to maximize the total computed affinity value determined by adding together the affinity value computed for each cell.

In the assignment algorithm, the affinity of a cell is computed relative to the seven next level hexagons for level $HP^i$. This step may be described by referring to FIG. 30. In this illustration, the seven next level hexes are hex 602, hex 603, hex 604, hex 605, hex 606, hex 607 and hex 608. The center "a" of the hex 601 at the previous hierarchical level "i+1" is also the center of the next hierarchical level hex 602 (for the current hierarchical level "i"), and is identified by reference numeral 610. The center 611 of hex 604 for this hierarchical level "i" may be referred to as to $N^i_3(a)$. The center 612 of hex 603 may be referred to as $N^i_1(a)$. Similarly, the center 613 of hex 607 may be referred to as $N^i_2(a)$. This same nomenclature is continued through $N^i_6(a)$ as the designation of the center of the last next level hex 605. The affinity of cell "c" to the seven next level hexagons may be denoted "aff(c,b)." If "b" is an element of the set of these seven possible locations, the affinity of cell "c" to each of the seven next level hexagons may be expressed as:

$$aff(c,b)=(X_{new}(c)-X(a))*(X(b)-X(a))+(Y_{new}(c)-Y(a))*(Y(b)-Y(a))$$

where $X_{new}(c)$ and $Y_{new}(c)$ are computed as set forth above, and "b" is an element of the set: $\{a, N^i_1(a), N^i_2(a), N^i_3(a), N^i_4(a), N^i_5(a), N^i_6(a)\}$. Thus, the above computation is performed seven times for each cell during an iteration. Of course, X(a) is the "x" coordinate of the center 610 of the center hex 602, and Y(a) is the "y" coordinate of the center 610 of the center hex 602. Alternatively, other assignment algorithms may be used.

$N^i_1(a)$ refers to the "neighbor" "N". For each cell c, and for each of the seven "neighbors" on the currect hierarchy $HP^i$, the affinity aff(c,b) is computed in step 560 for the hex in which c is in the center on the prior hierachical level $HP^{i+1}$.

As described above, an attempt is made to assign each cell to a hex with available space as to which the cell has the greatest computed affinity. However, each hex has a certain capacity or area available for the placement of cells. In some instances, all of the cells that have a maximum affinity for a particular hex, for example hex 603, will not fit within the area available in the hex 603. The capacity of each hex is computed, and if a hex reaches its capacity, cells will then be moved or assigned to an adjacent hex as to which the cell has the next highest affinity.

The total length of interconnect wire may be computed at the end of each iteration of the assignment algorithm, and the process is repeated until the total length of interconnect wire does not become shorter as compared to the total length of interconnect wire computed for the prior iteration. Alternatively, the assignment algorithm can be iterated a number of times to try to maximize the total computed affinity value determined by adding together the affinity value "aff(c,b)" computed for each cell.

After the iterations of the assignment algorithm have been completed, "i" is decremented and the procedure proceeds to the next level $HP^{i-1}$ of the heirarchy. Thereafter, each time through the loop 564, "i" is decremented in step 554 and the procedure proceeds to the next level $HP^{R-2}$ of the heirarchy and so forth. The process is repeated for each "i" until i=0. The last level where i=0 may be referred to as level $HP^0$. By the time the last level $HP^0$ is reached, each hex preferrably will contain not more than a single cell, or a "zero," i.e., the cell is empty. Alternatively, the last level $HP^0$ may be chosen (that is, the value of "R" may be selected) so that each hex contains not more than about two or three cells. Useful results may be achieved if "R" is selected so that the last level $HP^0$ results in each hex containing not more than four cells. The last level $HP^0$ will have the smallest hexes. When step 561 is reached on the last hierarchical level, "i" will equal one, and the flow proceeds to step 562.

In the above discussion with reference to step 557, for each "moveable" cell, the new "x" and "y" coordinates are computed. In the beginning, virtually all cells are "moveable" cells. As the algorithm proceeds to lower levels in the hierarchy, the size of the hexes 602 become smaller. When the size of the hexes 602 becomes so small that a particular cell is then "bigger" than the size of the hexes at that level, the cell becomes frozen and is no longer moveable. In this context, "bigger" means that any dimension of the cell is bigger than the size of the hex. For example, the cell overlaps the hex and cannot be made to fit completely within the area of the hex. In this way, even large megacells can be placed with this algorithm, because the large megacells will become frozen when the hex size gets to be too small, and the remainder of the cells will be optimally placed relative to the megacell. However, in the present algorithm, unlike the prior art, the megacell will be in an optimum location relative to the remainder of the components. The megacell will not be moved as the algorithm proceeds to lower levels, but should be optimally located so that the remaining cells can be optimally laid out in an effective floorplan.

Additional disclosure relating to CAD design methods is provided in U.S. Pat. No. 5,222,030, to Carlos Dangelo, et al., the entirety of which is incorporated herein by reference; application Ser. No. 08/229,826, filed Apr. 19, 1994, by Michael D. Rostoker, et al., entitled INTEGRATED CIRCUIT PHYSICAL DESIGN AUTOMATION SYSTEM UTILIZING OPTIMIZATION PROCESS DECOMPOSITION AND PARALLEL PROCESSING, the entirety of which is incorporated herein by reference; and application Ser. No. 08/016,864, filed Feb. 10, 1993, by Michael D. Rostoker, entitled FLOORPLANNING TECHNIQUE USING MULTI-PARTITIONING, the entirety of which is incorporated herein by reference.

Routing

The placement phase involves floor planning and completion of the placement algorithm. On completion of the placement phase of the design, to make the layout functional, all of the interconnections need to be established. This process of establishing the interconnections is called routing. The above placement algorithm provides first order solution to the routing problem, because the cells should be placed in locations to make it easier to successfully route the interconnections. For some chips, it may be sufficient to minimize the total wire length. For high performance chips, it may be desirable to minimize the length of the longest wire in order to minimize the delay in such wire to maximize performance. Routing algorithms may need to consider parameters such as the number of terminals per net, width of nets, different types of nets, restrictions on vias, shape of any routing boundaries, and the number of available routing layers.

A circuit consists of a set of modules (or cells) and a set of nets. Each net specifies a subset of points on the boundary of modules, called terminals. The region that is not occupied by modules can be used for routing. In addition, over-the-cell routing may be available. The solution of a routing problem may consist of connections of terminals of nets by a set of curves (which define wires), where two end points of each curve belong to the same net. In a k-layer routing problem, a curve or a piece of a curve may be assigned to any of the k layers. Vias are assigned at points where a curve changes layers, (assuming no two distinct curves intersect in the same layer. In one embodiment of the present invention, three layers of routing are available (i.e., k=3).

A routing algorithm suitable for implementation as a computer aided design tool is desirable to assist in designing a semiconductor device according to the present invention. A routing algorithm that gives good results with three layers of metal is desirable.

Figure 31:
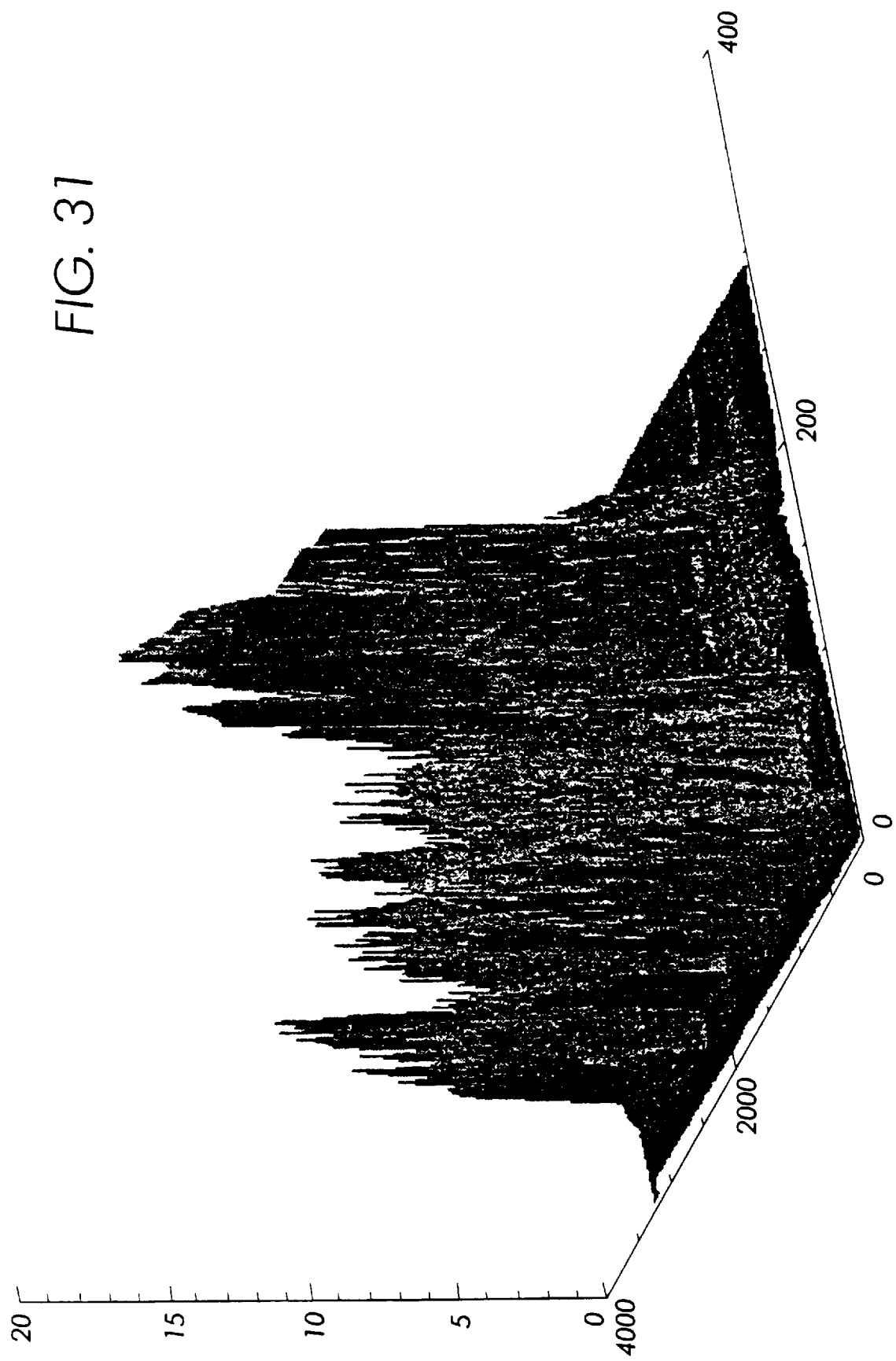
FIG. 31 is a graph depicting routing density of one of the layers of metal in an example of a microelectronic device using two layer rectilinear routing.
Figure 32:
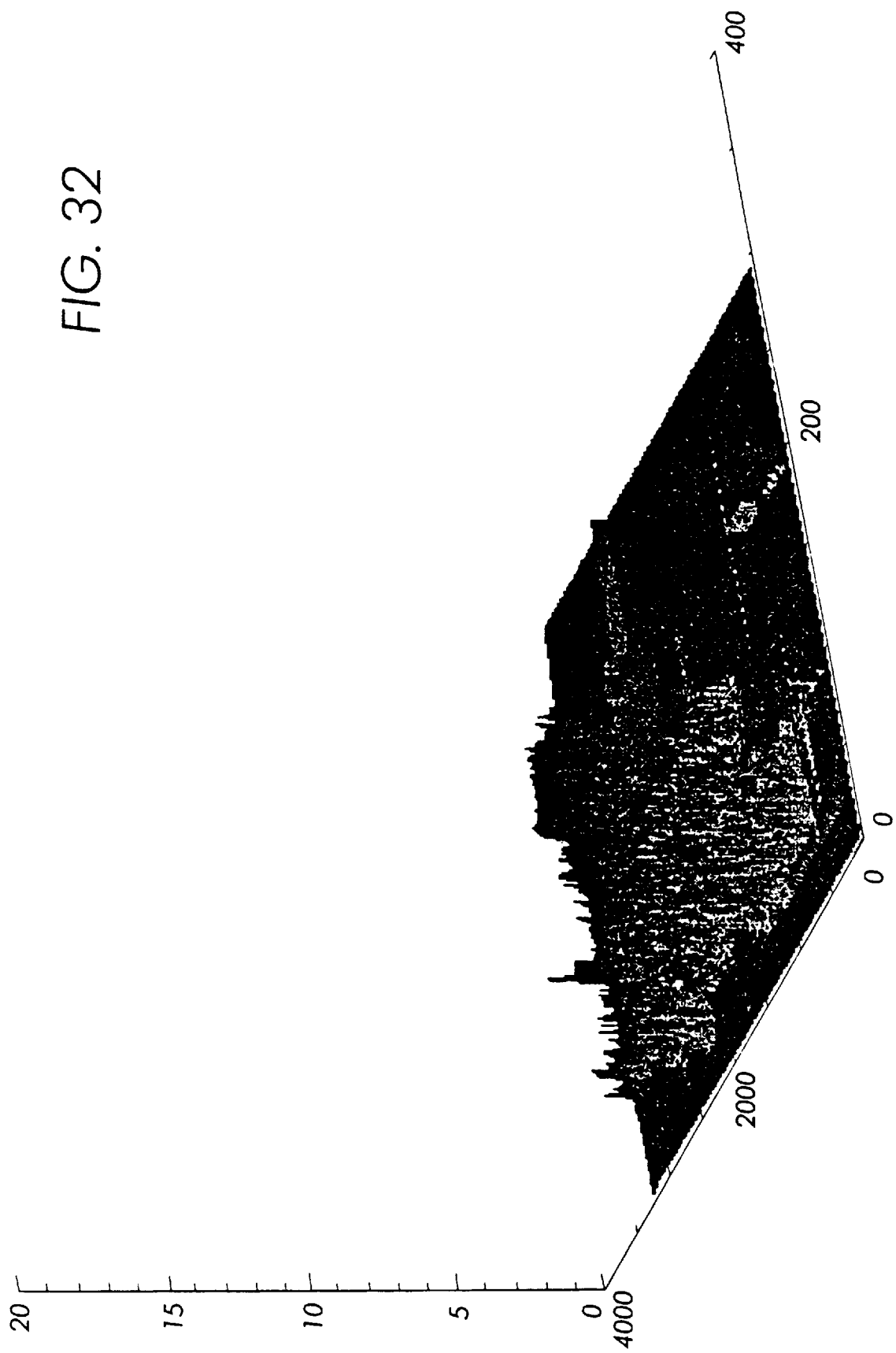
FIG. 32 is a graph depicting routing density of the second layer of metal of the device referred to in connection with FIG. 31.

Conventional routing methods often result in unbalanced routing layers. For example, FIG. 31 and FIG. 32 graphically illustrate routing density for the first metal layer and for the second metal layer, respectively, of an example of a circuit. The density of routing in the first metal layer M1 shown in FIG. 31 is much greater than the density of routing in the second metal layer M2 shown in FIG. 32. In this example, the first metal layer M1 associated with FIG. 31 was used for routing in the vertical direction in a rectangular routing design. The second metal layer M2, the density of which is shown in FIG. 32, was used for routing in the horizontal direction. Any attempt to balance the routing between these two layers of metal would require more interlayer interconnect (i.e., using vias), and it is not possible to punch through the first metal layer and form a via from the substrate to the second metal layer if a wire is present in the first metal layer at the desired location of the via.

Figure 33:
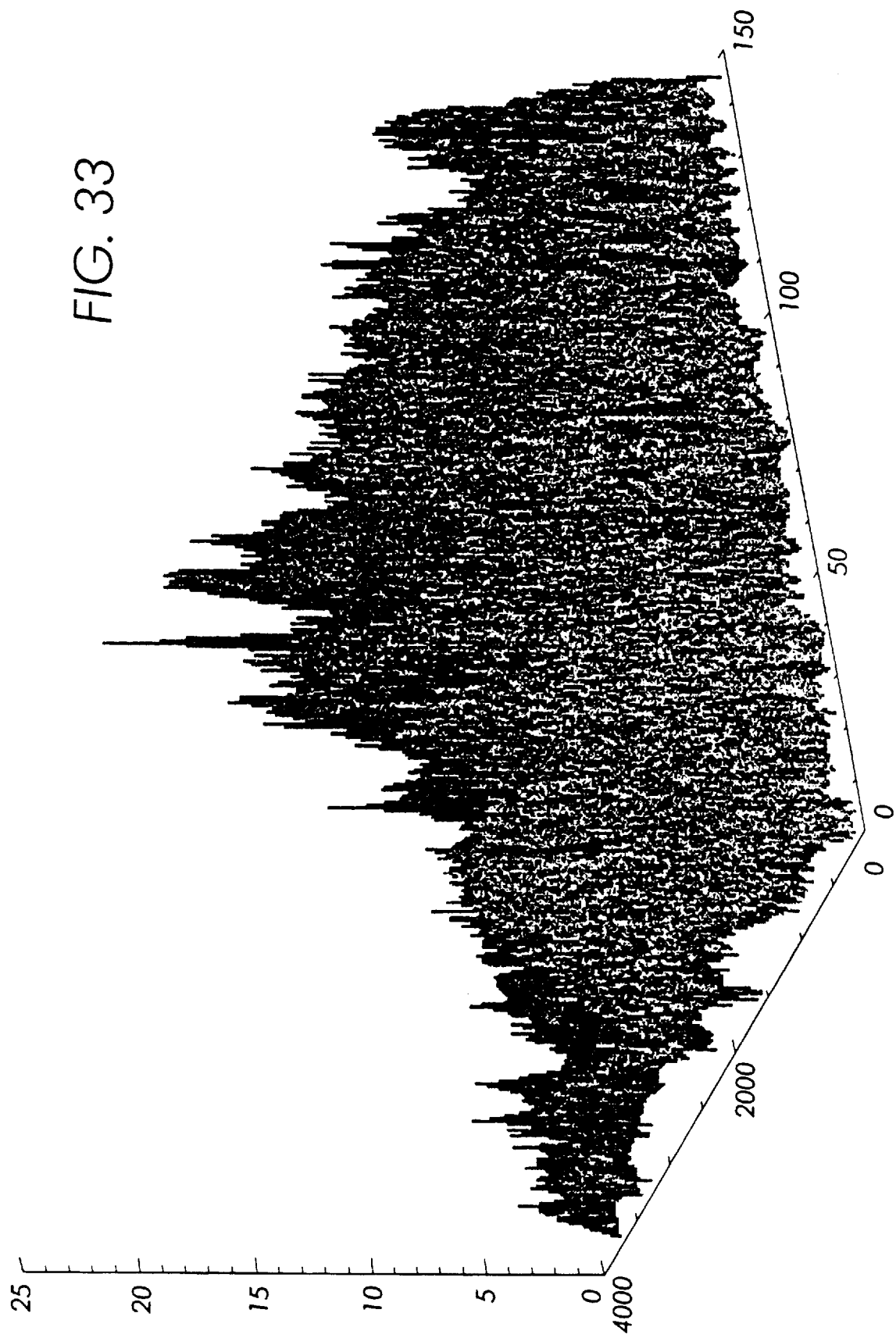
FIG. 33 is a graph depicting routing density of one of the layers of metal in another example of a microelectronic device using two layer rectilinear routing.
Figure 34:
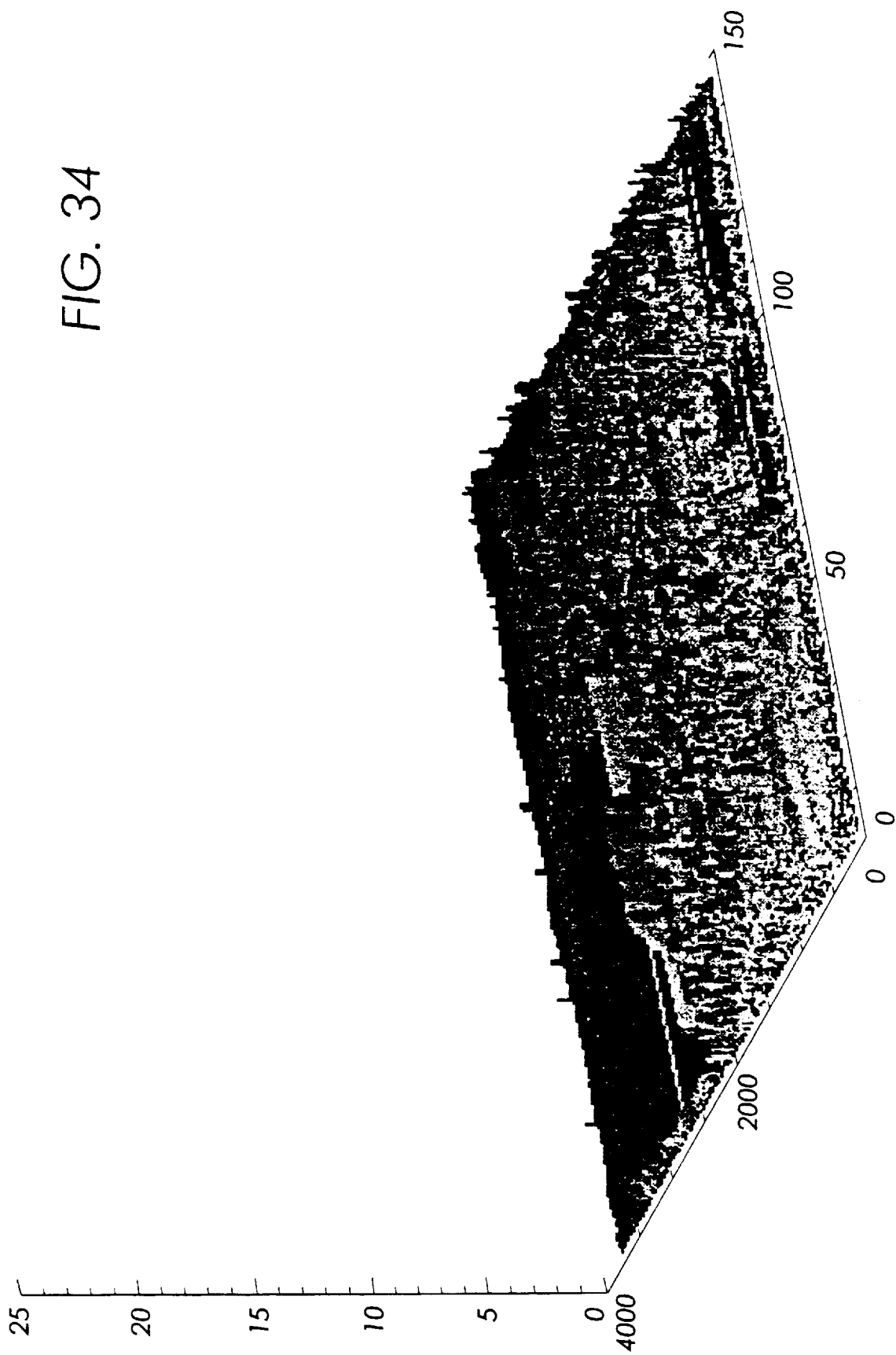
FIG. 34 is a graph depicting routing density of the second layer of metal of the device referred to in connection with FIG. 33.

FIG. 33 and FIG. 34 depict the routing density for another example of a two metal layer design having unbalanced routing. FIG. 33 graphically illustrates the density of routing in the first metal layer in a rectangular two metal layer design. FIG. 34 graphically illustrates the density of routing in the second metal layer in the same rectangular two metal layer design.

The balance of interconnection layers is important. First, an imbalance that results in very dense routing in the first layer of metal may cause so much congestion that it will not be possible to get a wire through, for example to another metal layer, without resorting to an undesirable option such as increasing the size of the chip. Second, photolithography works better when it is performed in a balanced chemical environment. It is desirable to perform a uniform chemical etching of the substrate. If one part of the circuit has a great number or amount of wires as compared to another part of the circuit which has only a few wires, the area with relatively few wires may be etched at a rate different from denser areas of the circuitry. It is sometimes necessary to place unused metal that has no functional purpose in the circuit, referred to as bogus metal, in the area with relatively few wires in order to balance the chemicals. This is sometimes referred to as the lonely wire problem.

Polydirectional non-orthoginal three layer routing of non-resin circuit structures according to the present invention can balance the density of routing in the layers. As used herein, "polydirectional non-orthoginal three layer routing" refers to interconnection using three layers of metal where the direction of routing implemented in each layer of metal is angularly displaced from the direction of routing employed in the other metal layers by an angle less than ninety degrees, but excluding angular displacements of forty-five degrees. "Non-resin circuit structures" is defined to include semiconductor substrates, but the definition excludes circuit boards.

A routing algorithm determines the selection of one of several possible routes which may be used to connect two points in a circuit. Each cell in the design may have one or more pins that must be electrically connected to pins on other cells. Interconnection is typically accomplished by metal wires constructed in one or more of the metal interconnect layers. If pins that are to be interconnected are termed nodes, then the problem may be expressed as starting with a given set of nodes (or nets), and a given set of interconnections between the nodes (or nets), what is an optimum routing to accomplish the desired interconnections. In the following description, nodes are sometimes also referred to as points.

In the past, routing problems have involved two layers, and two possible routing directions, (i.e., vertical or horizontal). Now, the problem must be addressed in the context of three routing layers, and three available routing directions. It is desirable to have a routing algorithm capable of solving tri-directional routing problems in a more optimum fashion.

Figure 70:
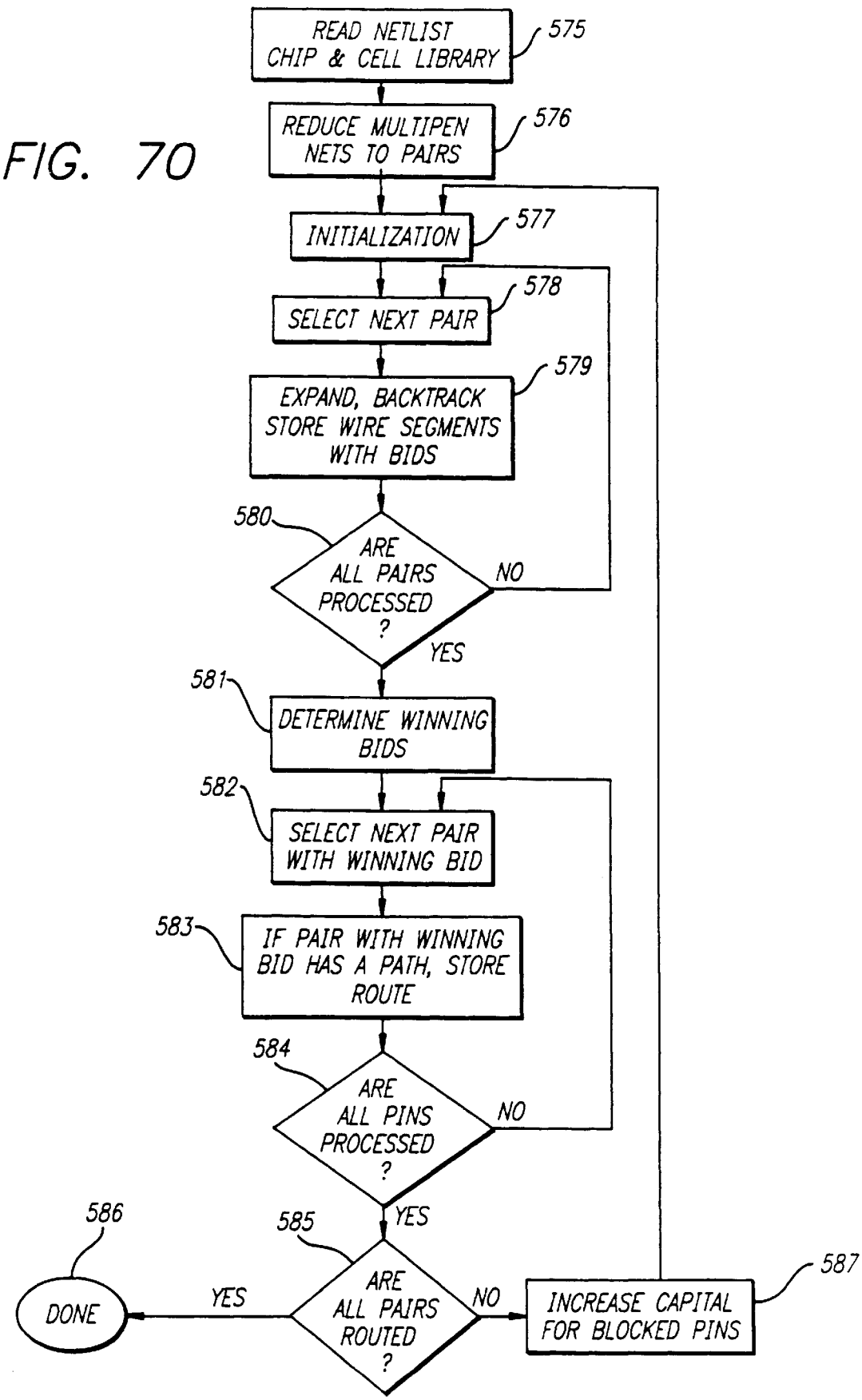
FIG. 70 is a flow chart illustrating a routing algorithm.

A routing algorithm for use in connection with tri-directional routing in accordance with one aspect of the present invention is depicted in the flow chart of FIG. 70. The first step 575 in the procedure is to read into the system the netlist providing the set of nodes to be connected. A chip and cell library is read in as well in step 575.

Some nets or nodes may be multi-pin nets, (which are sometimes referred to as multi-terminal nets). That is, in some nets more than two pins must be interconnected together. The multi-pin nets are first reduced to pairs of pins. The routing algorithm is much more manageable if the net list is first redefined as a set of pairs of pins. Step 576 in FIG. 70 represents the step in which this is performed. Step 576 is shown in more detail in FIG. 71.

In the illustrated routing method, the set of nets is input in step 588. The first time through, a net is initially selected in step 589. In subsequent iterations, the next net will be selected, and so forth, until every net has been processed.

The algorithm looks to see if the net selected is a multi-pin net in step 590. If it is not, nothing needs to be done at this point, and the procedure loops back to step 589, (and the next net is selected). If a net is a multi-pin net, the procedure determines a minimum spanning tree in step 591 (shown in more detail in FIG. 72). After the minimum spanning net has been determined for this net, the procedure checks to determine if all nets have been processed in step 592 shown in FIG. 71. If not, the procedure loops back to step 589. If all nets have been processed, an output set of net pairs is returned in step 593 and flow proceeds to step 577 in FIG. 70.

Figure 71:
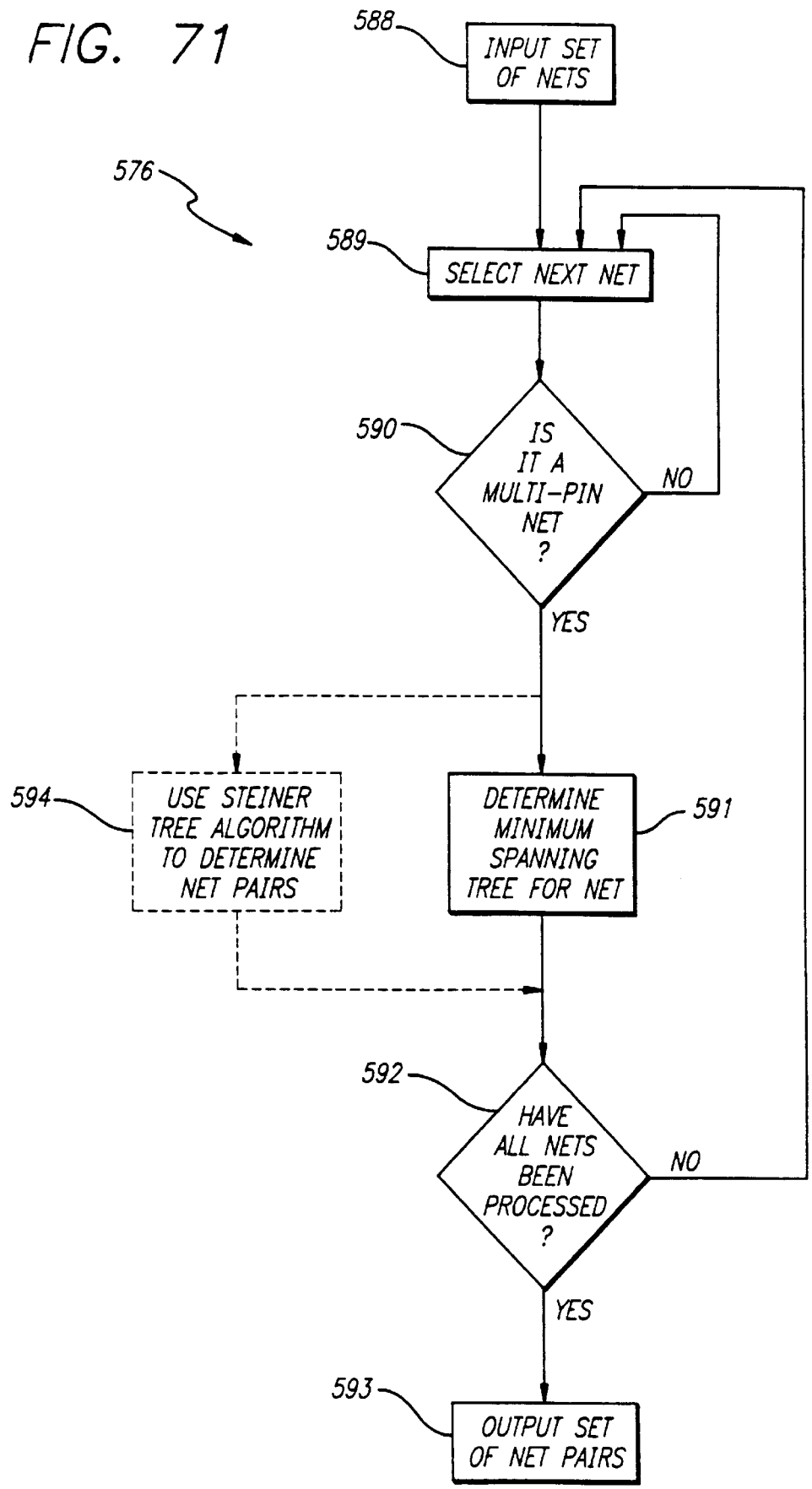
FIG. 71 is a flow chart illustrating a portion of the routing algorithm in more detail.
Figure 72:
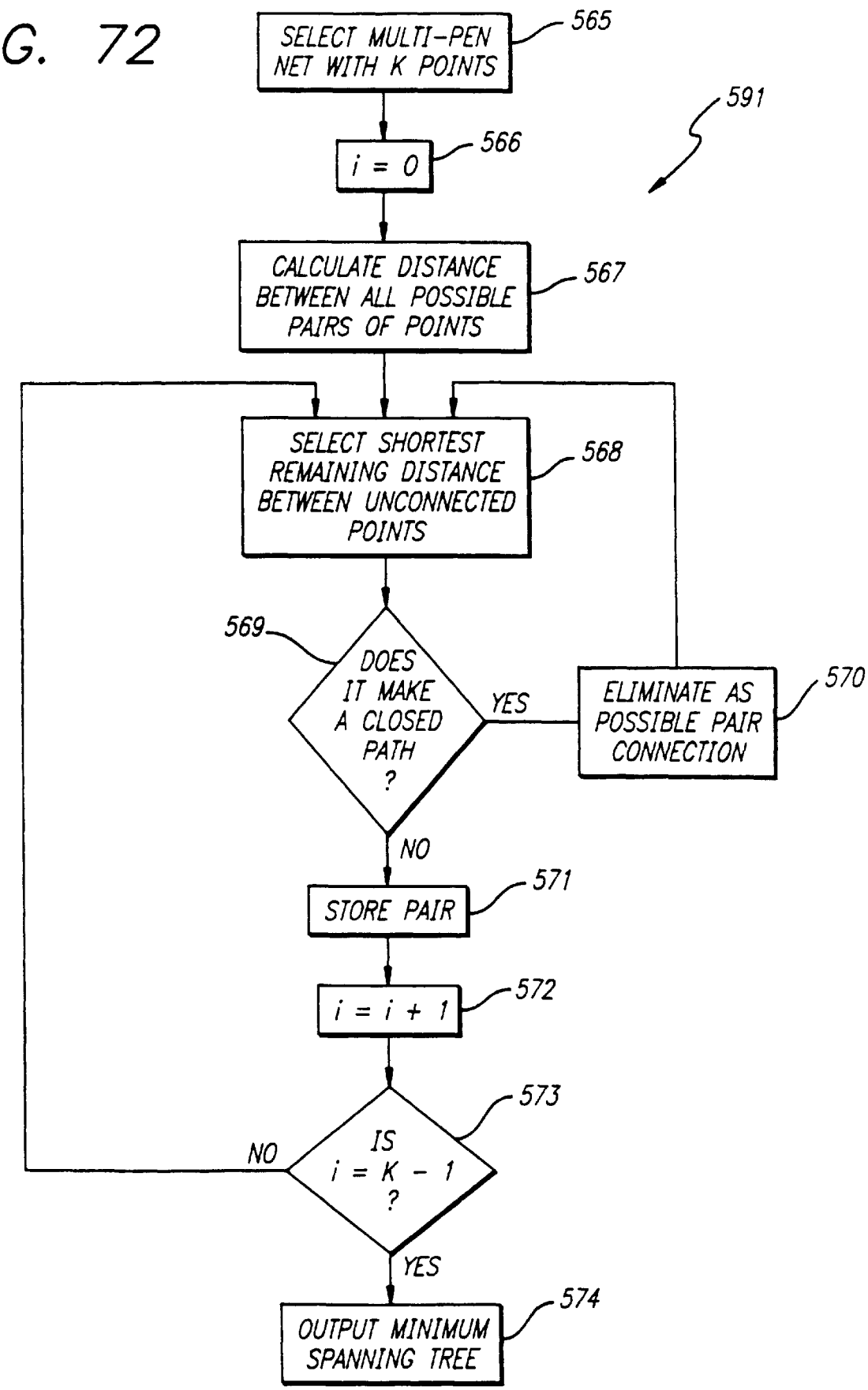
FIG. 72 is a flow chart illustrating a portion of the routing algorithm in more detail.

Step 591 in FIG. 71 is depicted in detail in FIG. 72. In step 565, a multi-pin set of points is selected. A counter "i" is set equal to zero in step 566. The method then includes the step of calculating the distance between every possible pair of points (or pins). These points are sometimes referred to as demand points.

In step 568, the shortest remaining distance between remaining unconnected points is selected. This is examined to make sure it does not form a closed path, i.e., all of the connections form a polygon that closes in some area. If it does, that segment is eliminated as a possible pair connection in step 570, and flow loops back to step 568.

If the selected connection pair does not form a closed path, flow proceeds to step 571 and the pair is stored. In step 572, the counter "i" is incremented. The method includes the step of checking to determine whether "i"=K−1, that is, have all of the points been connected in pairs. If not, the flow loops back to step 568. The loop is repeated until all points are sorted into connected pairs, and flow proceeds to step 574. While this approach does not generate any additional points, (typically called "Steiner points"), it will work in a three directional routing system. In addition, in a three direction routing system, the routing distances tend to be shorter anyway due to the additional degrees of freedom, so there is not as much pressure to further optimize the pairs. Of course, certain "L" points may be created where two points must be connected by routing in two or more directions. In other words, a connection cannot be made in a straight line with the available routing directions.

Multi-pin nets have in the past been reduced to pairs in a rectilinear routing system using Steiner tree algorithms. As shown in FIG. 71, Steiner tree algorithms optionally may be used to further optimize the connection pairs in the alternative optional step 594, if desired. Steiner tree algorithms are discussed in N. Sherwani et al., *Routing In The Third Dimension*, at 81–86 (1995) (and references cited therein)

A Steiner Minimum Tree (SMT) problem can be defined as follows: Given an edge weighted graph G=(V,E) and a subset D ⊆V, select a subset V'⊆V, such that D ⊆V' and V' induces a tree of minimum cost over all such trees. The set D is referred to as the set of demand points and the set V'−D is referred to as Steiner points. It is easy to see that if D=V, then SMT is equivalent to the corresponding minimum spanning tree for this net. On the other hand, if |D|=2 then SMT is equivalent to the single pair shortest path ("SPSP"). Unlike MST and SPSP, SMT and many of its variants are NP-complete. In view of the NP-completeness of the problem, several heuristic algorithms have been developed.

Steiner trees arise in VLSI physical design in routing of multi-terminal nets. Consider the problem of interconnecting two points in a plane using the shortest path. This problem is similar to the routing problem of a two terminal net. If the net has more than two terminals then the problem is to interconnect all the terminals using minimum amount of wire, which corresponds to the minimization of the total cost of edges in the Steiner tree. The global and detailed routing of multi-terminal nets is an important problem in the layout of VLSI circuits. This problem has traditionally been viewed as a Steiner tree problem. Due to their important applications, Steiner trees have been a subject of intensive research.

An underlying grid graph in a rectilinear routing system is the graph defined by the intersections of the horizontal and vertical lines drawn through the demand points. The problem is then to connect terminals of a net using the edges of the underlying grid graph. Steiner tree problems are mostly defined in the Cartesian plan, and edges are typically restricted to be rectilinear. A Steiner tree whose edges are constrained to rectilinear shapes is called a Rectilinear Steiner Tree (RST). A Rectilinear Steiner Minimum Tree (RSMT) is an RST with minimum cost among all RSTs.

Suitable Steiner tree algorithms for three directional routing may be used in alternative step 594. Steiner tree algorithms are disclosed in application Ser. No. 08/131,770, filed Oct. 4, 1993, by Scepanovic, et al., entitled TOWARDS OPTIMAL STEINER TREE ROUTING IN THE PRESENCE OF RECTILINEAR OBSTACLES, the entirety of which is incorporated by reference. Algorithms are further disclosed by P. Chaudhuri, *Routing Multilayer Boards On Steiner Metric*, 1980 IEEE International Symposium On Circuits And Systems Proceedings, at 961–964 (1980), the entirety of which is incorporated by reference, and M. Sarrafzadeh, et al., Hierarchical Steiner tree *Construction in Uniform Orientations*, IEEE Transactions On Computer-Aided Design, Vol. II, No. 9 (September 1992), the entirety of which is incorporated by reference.

Referring to FIG. 70, the routing algorithm continues with an initialization step 577 after the data set has been reduced to a set of pairs. In step 578, the next pair is selected. The possible routes are examined using Lee's algorithm to find a path between the selected pair. The algorithm has an exploration phase and backtrack phase known to those skilled in the art.

A first source point which must be connected to a second demand point is assigned a certain value, or amount of capital, that the first point may "bid" on each segment of a possible connection routes to the second point. Where a path requires metal in more than one layer, each portion of the path that lies in the same layer is a segment. If several possible routes are available, the first point divides the value it has to bid equally among the available segments of the available routes. A third point may, for example, only have one possible route available for connection but it may be a route that conflicts with one or more of the possible routes available to the first point. In other words, if a wire is run from the third point to its desired connection point along the one available route, then it will occupy the same real estate that is in the path of one of the possible routes between the first point and the second point. In this example, the third point bids its entire value on this one route. Because the value bid on the single possible route required for the connection of the third point is greater than the value bid on the conflicting route between the first point and the second point, the third point "out bids" the first point and wins the conflicting real estate. The routing algorithm assigns that route to the third point. An example is shown in FIG. 35.

Figure 35:
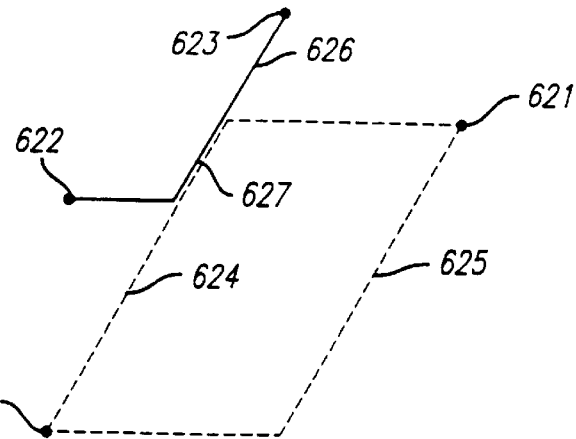
FIG. 35 is a diagram illustrating possible routes available for interconnection of example points to illustrate the operation of a routing algorithm.

A first point 620 shown in FIG. 35 must be connected to a second point 621. More than one possible route is available. A first possible route 624 and a second possible route 625 are shown as dotted lines. Other possible routes may exist, but only two are shown for purposes of discussion in order to simplify this example. A third point 622 must be connected to a fourth point 623. In this example, only one possible route 626 is available. If the wire 626 is put down as shown, then it will occupy a portion 627 of the path of the first possible route 624 between the first point 620 and the second point 621. If the route 626 is used to connect the third point 622 and the fourth point 623, then the route 624 cannot be used to connect the first point 620 and the second point 621, because a short circuit would result.

Although bidding is actually determined by segments, the following example will discuss bidding in a simplified manner. If the first point 620 and the second point 621 have a value of "100" to bid on available routes, a value of "50" would be bid on the first route 624 and a value of "50" would be bid on the second route 625. The third point 622 and the fourth point 623 similarly have a value of "100" to bid on available routes. A value of "100" would be bid on the only available route 626. In view of the fact that the third and fourth points 622 and 623 bid "100" on the route 626 and the first and second points 620 and 621 bid a value of "50" on the route 624, the third and fourth points 622 and 623 will win the auction and be assigned the route 626 by the routing algorithm.

In step 581, the winning bids are determined. Where a path has a winning bid, and the segments add together to form a connection path between the two points, the path is stored in step 583 and the method proceeds to process all of the pins or pairs.

The auction may be repeated a number of iterations. If all pairs are not routed when step 585 is reached, the capital available to be bid on available connections will be increased for those pairs that were blocked, and the procedure repeats by looping back to step 587.

The preferred algorithm is shown in FIG. 70. However, alternatively, an algorithm could loop back from step 587 to step 578 and attempt to hold an auction between remaining blocked pairs. In the example illustrated in FIG. 35, the route 626 is assigned to the third and fourth points 622 and 623 in the first iteration. When the second iteration is performed, the route 626 has already been assigned. Thus, in the second iteration, the route 624 in not available as a possible connection between the first point 620 and the second point 621. In the second iteration, there is now only one possible route 625 available for connection between the first point 620 and the second point 621. In the second iteration of the auction, the first point 620 and the second point 621 have a value of "100" to bid on possible routes. The entire value "100" is bid on the only available route 625. In this iteration, the first and second points 620 and 621 out bid all other competitors (not shown) and are assigned route 625.

The assignment algorithm may refine the bidding process to better optimize routing. In the first round of bidding, a constraint may be imposed upon the bidding to restrict bidding to choices that have a cost in terms of chip area that is less than or equal to a predetermined value. In later iterations, if a solution is not found, the constraints may be relaxed to expand the possible choices to allow bidding upon connections that are longer. This assignment algorithm should settle out with optimum routing locations for interconnection.

Alternatively, greedy and maze routing techniques may be used in a routing algorithm to complete the routing. Additional disclosure of an auction algorithm is shown in D. Bertsekas, *Auction Algorithms For Network Flow Problems: A Tutorial Introduction*, Computational Optimization And Applications, at 7–66 (1992), the entirety of which is incorporated herein by reference.

In an alternative embodiment, four layers on metal may be used. An alternative routing algorithm for four layers of metal is described in E. Katsadas et al., "A Multi-Layer Router Utilizing Over-Cell Areas," *Proceedings of 27th Design Automation Conference*, at 704–708 (1990) and N. Sherwani et al., *Routing In The Third Dimension*, at 15 (1995). This example algorithm completes routing in two steps. A selected group of nets are routed in the between-cell areas using existing channel routing algorithms and the first two routing layers. Then the remaining nets are routed over the entire layout area, between-cell and over-the-cell areas, using a two-dimensional router and the next two routing layers.

Alternatively, two and one-half layers of interconnect may be used for routing. Preferably, the layers of interconnect are metal, but the first half layer may be polysilicon, polysilicide, or metal. Half layer metal is fabricated as the first metal layer. This first layer is referred to as a half layer because it is thinner than normal. Such thin metal layers are cheaper to produce, but are limited in the length that such wires may be fabricated without paying significant performance penalties. Thus, the first half layer of metal is used for local interconnect. This relieves congestion in the other layers of metal. Tri-directional routing is preferably used.

Another alternative embodiment uses three and one-half layers of metal. Yet another embodiment uses four and one-half layers of metal. Four and one-half layers of metal should avoid all routability problems for all but the most dense and complicated circuit designs.

Multiple layers of metal (two and one half layers or more) preferably are laid out using tri-directional routing as described herein. Although such routing arraingements may be advantageously used in connection with a hexagonal cell layout on a semiconductor substrate, the tri-directional routing may also be effectively used in connection with rectangular cells. Multiple metal layer tri-directional routing is not limited to a hexagonal cell layout.

Suitable process technology for producing a very large scale integrated circuit in accordance with the present invention is disclosed in U.S. Pat. No. 5,358,886, the entire disclosure of which is incorporated herein by reference; and in application Ser. No. 08/086,217, filed Jul. 1, 1993, the entire disclosure of which is incorporated herein by reference. For example, 0.35-micron CMOS ASIC technology may provide satisfactory results in practice. Additional disclosure of a flip chip die-to-die configuration is disclosed in application Ser. No. 07/975,185, filed Nov. 12, 1992, by Michael D. Rostoker, the entire disclosure of which is incorporated herein by reference.

Triangular Semiconductor AND Gate

Figure 36:
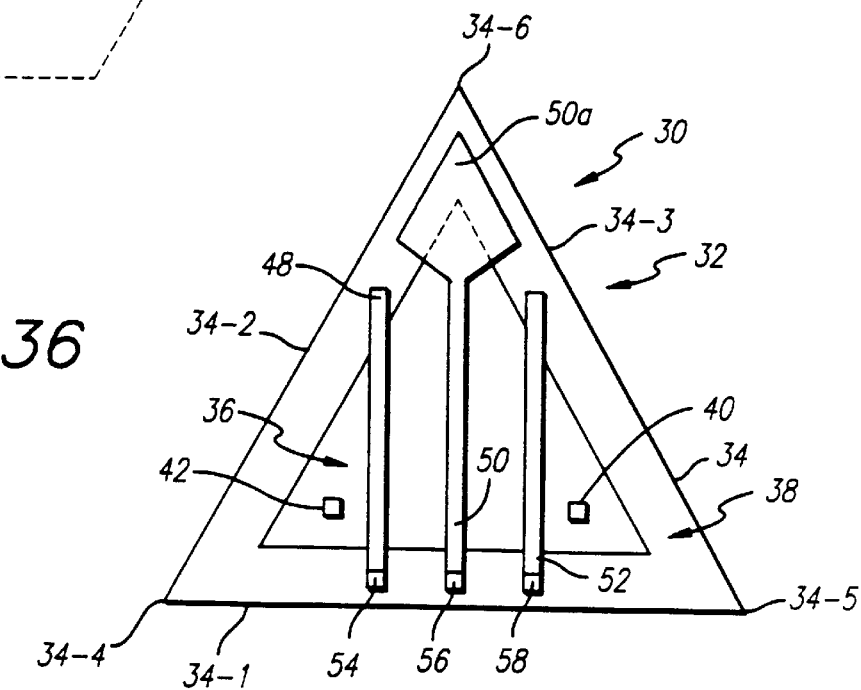
FIG. 36 is a diagram illustrating a microelectronic gate device which is an example of one embodiment of the present invention.

A semiconductor gate device for a microelectronic integrated circuit is designated by the reference numeral 30 and illustrated in FIG. 36. The device 30, in its basic form, provides a logical AND function, but can be adapted to provide a logical NAND, OR, NOR, or other logical function as will be described below.

The gate device 30 is formed on a substrate 32, and has a triangular periphery 34 including first to third edges 34-1, 34-2 and 34-3, and first to third vertices 34-4, 34-5 and 34-6 respectively in the illustrated arrangement. A triangular semiconductor active area 36 is formed within the periphery 34, and an inactive area 38 is defined between the active area 36 and the periphery 34.

The device 30 comprises a first electrically conductive electrode or terminal 40 which functions as a Field-Effect-Transistor (FET) source terminal, and a second electrode or terminal 42 which functions as an FET drain terminal. The terminals 40 and 42 are formed in the active area 36 adjacent to the first and second vertices 34-4 and 34-5 respectively. Although only one each of the terminals 40 and 42 is illustrated in the drawing, it is within the scope of the invention to provide two or more each of the terminals 40 and 42.

The device 30 further comprises first, second and third gates 48, 50 and 52 which are formed between the first and second terminals 40 and 42 respectively as illustrated. The gates 48, 50 and 52 are preferably insulated gates, each including a layer of insulating oxide with a layer of conductive material (metal or doped polysilicon) formed over the oxide in a Metal-Oxide-Semiconductor (MOS) configuration.

First to third gate electrodes or terminals 54, 56 and 58 are formed in the inactive area 38 adjacent to the triangular edge 34-1, and are electrically connected to the gates 48, 50 and 52 respectively. It will be noted that the locations of the gate terminals 54, 56 and 58 are exemplary, and that the gate terminals can be located at different points in the device in accordance with the requirements of a particular design or application.

In order to provide effective source-drain electrical isolation, the opposite end portions of each of the gates 48, 50 and 52 extend into the inactive area 38. The upper end of the gate 56 has the shape of as a solid quadrilateral which extends into the inactive area 38 as indicated at 50a. This is for the purpose of avoiding manufacturing problems which could result if the upper end of the gate 50 extended through the upper vertex of the triangular active area 36. Other layout schemes could be used to achieve this purpose of making the design immune to manufacturing tolerances.

The device 30 shown in FIG. 36 in its most basic form provides a logical AND function. Each gate 48, 50 and 52 controls the electrical conductivity of a respective underlying portion of an FET channel between the terminals 40 and 42 such that each gate 48, 50 and 52 can independently inhibit conduction through the channel. Signals must be applied to all of the gates 54, 56 and 58 which cause the underlying portions of the channel to become enhanced in order to enable conduction through the channel. This is an "all" or "AND" configuration.

Figure 37:
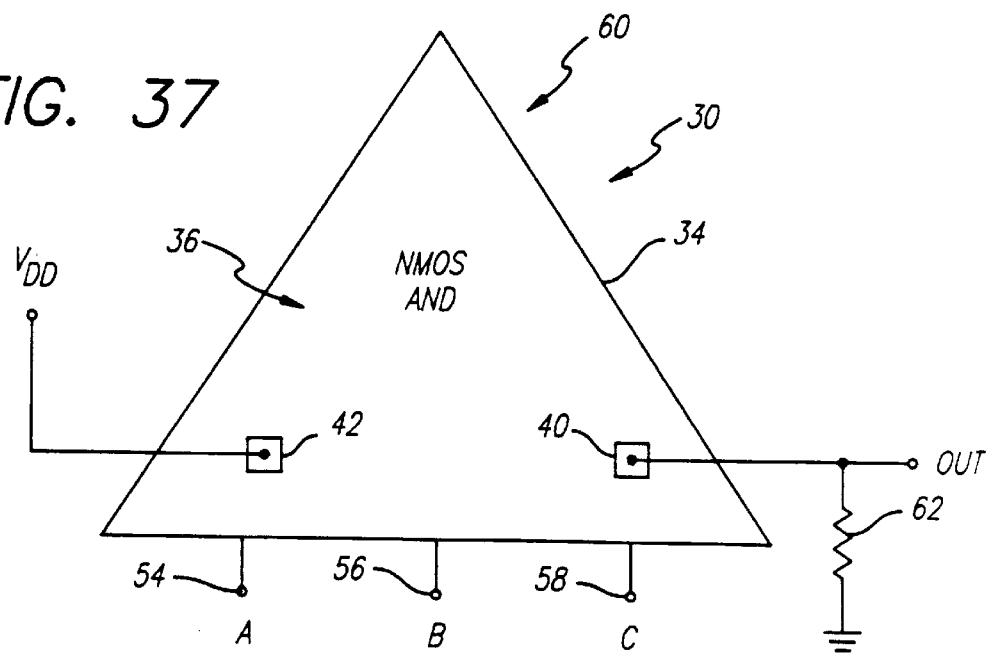
FIG. 37 is an electrical schematic diagram illustrating the present device connected to provide a logical AND function.

An AND gate 60 based on the device 30 is illustrated in FIG. 37. The device 30 is shown in simplified form for clarity of illustration, with only the triangular periphery 34 and terminals 40, 42, 54, 56 and 58 included in the drawing. Input signals A, B and C are applied to the gate terminals 54, 56 and 58 respectively, and an output signal OUT is taken at the source terminal 40.

In the AND gate 60 of FIG. 37, the active area 36 of the device 30 is P-type to provide NMOS FET operation. The drain terminal 42 is connected to an electrical potential $V_{DD}$ which is more positive than ground. The terminal 40 is connected to ground through a pull-down resistor 62.

A logically high signal will be assumed to be substantially equal to $V_{DD}$, and a logically low signal will be assumed to be substantially equal to ground. With any logically low input signal A, B or C applied to the gate terminal 54, 56 or 58 respectively, the device 30 will be turned off and the resistor 62 will pull the output low (to ground).

Since the device 30 provides NMOS operation in the configuration of FIG. 37, positive inputs to all of the gate terminals 54, 56 and 58 will establish a conductive channel between the terminals 40 and 42. The entire channel will be enhanced, thereby connecting the source terminal 40 to the potential $V_{DD}$ through the drain terminal 42 to produce a logically high output. In this manner, the AND gate 60 produces a logically high output when all of the inputs are high, and a logically low output when any of the inputs are low.

Figure 38:
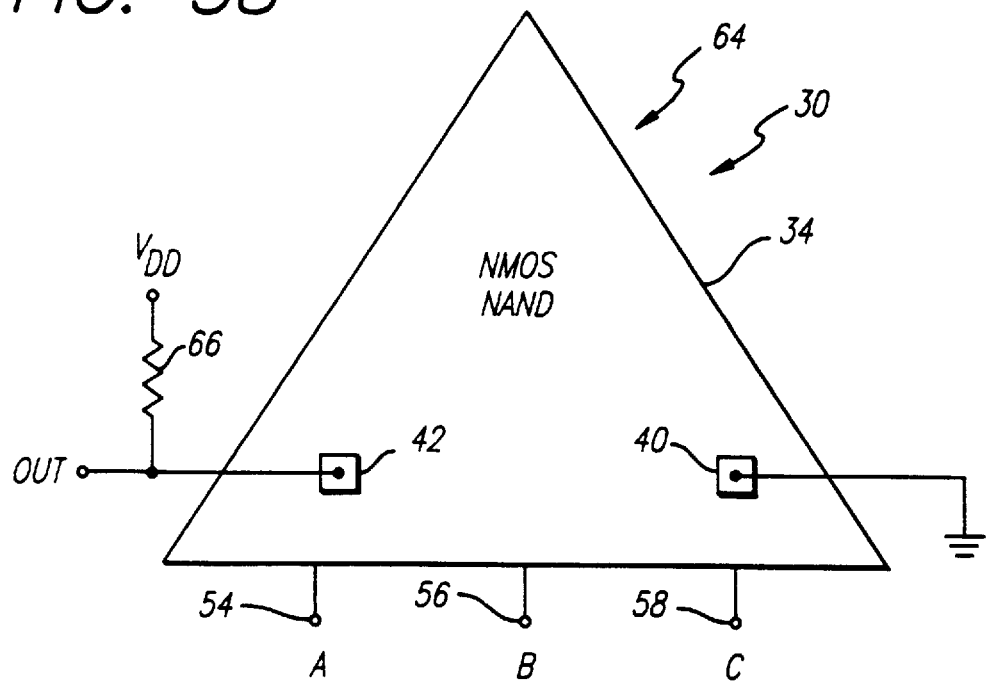
FIG. 38 is an electrical schematic diagram illustrating the gate device connected to provide a logical NAND function.

FIG. 38 illustrates the device 30 connected in circuit to function as a NAND gate 64. In this case also, the active area 36 of the device 30 is P-type to provide NMOS operation. The source terminal 40 is connected to ground, and the drain terminal 42 is connected to VD, through a pull-up resistor 66. The output signal OUT appears at the drain terminal 42.

When any of the inputs are low, the device 30 is turned off and the output will be pulled to $V_{DD}$ by the pull-up resistor 66 to produce a logically high output. If all of the inputs are high, a conductive channel will be established between the terminals 40 and 42 to connect the output to ground and produce a logically low output. In this manner, the output signal OUT will be high if any of the inputs are low, and low if all of the inputs are high to produce the NAND function.

Figure 39:
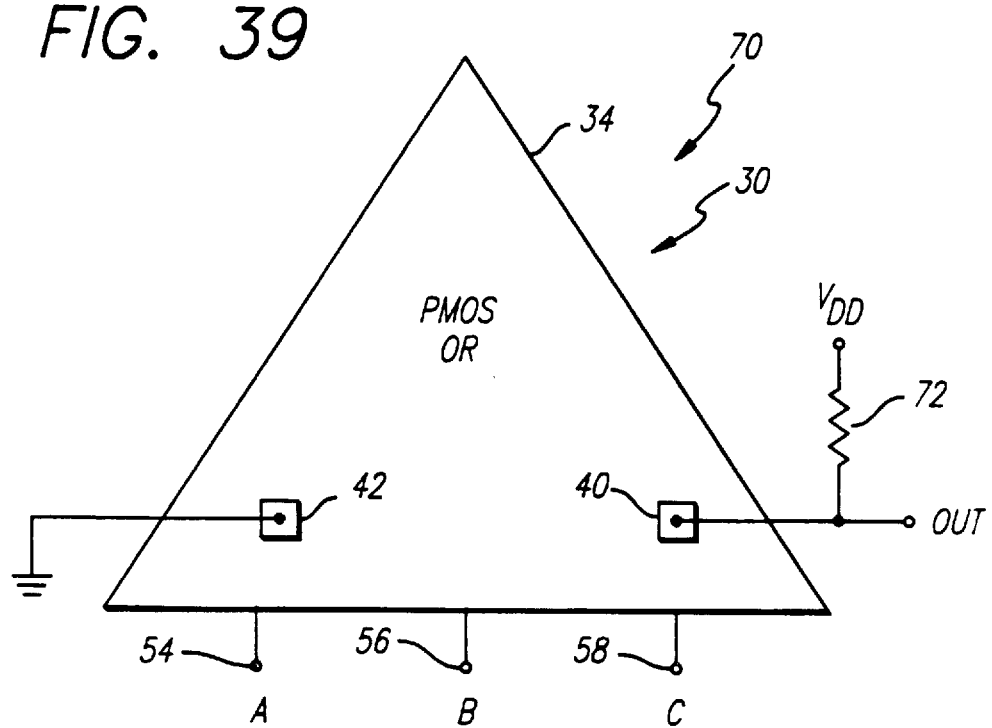
FIG. 39 is an electrical schematic diagram illustrating the gate device connected to provide a logical OR function

An OR gate 70 incorporating the device 30 is illustrated in FIG. 39. In the OR gate configuration, the active area 36 is N-type to provide PMOS FET operation, and the drain terminal 42 is connected to ground. The source terminal 40 is connected to $V_{DD}$ through a pull-up resistor 72, and the output is taken at the source terminal 40.

Due to the PMOS configuration of the device 30 in the OR gate 70, all of the input signals A, B or C must be logically low to establish a conductive channel between the terminals 40 and 42. This connects the output to ground. Thus, all low inputs will produce a low output. When any of the inputs is high, the device 30 is turned off, and the output is pulled high by the pull-up resistor 72. Thus, the desired OR function is provided.

Figure 40:
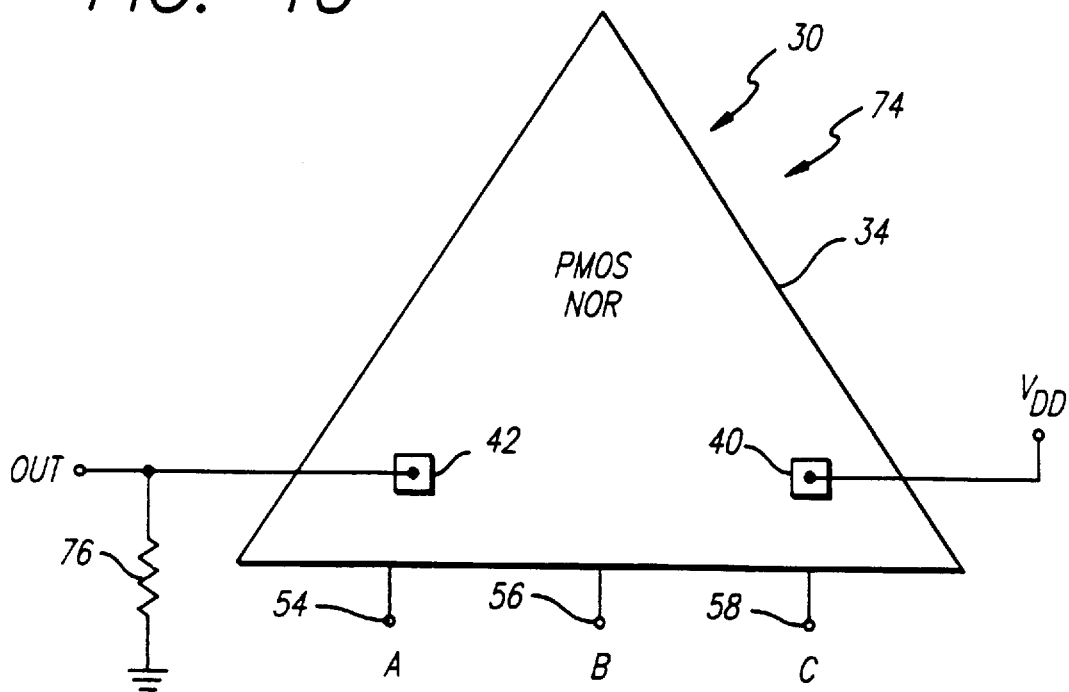
FIG. 40 is an electrical schematic diagram illustrating the gate device connected to provide a logical NOR function.

A NOR gate 74 incorporating the device 30 is illustrated in FIG. 40, in which the active area 36 is N-type to provide PMOS operation. The source terminal 40 is connected to $V_{DD}$, whereas the terminal 42 is connected to ground through a pull-down resistor 76. The output is taken at the terminals 42.

All low inputs will establish a conductive channel between the terminals 40 and 42, thereby connecting the output to $V_{DD}$ and producing a high output. When any of the inputs are high, the device 30 is turned off and the output is pulled to ground by the resistor 76. Thus, the NOR configuration is provided, in which any high input produces a low output, and the output is high in response to all inputs being low.

The device 30 is illustrated as having three inputs, which is ideally suited to the triangular device shape. However, it is within the scope of the invention to provide a gate device having one or two inputs. A device with one input can be used as a buffer or an inverter.

The device 30 can be configured without modification to operate as if it had one or two, rather than three inputs. For example, if it is desired to operate the AND gate 60 of FIG. 37 with only two inputs, the gate terminal 58 can be connected to $V_{DD}$ and the two inputs applied to the gate terminals 54 and 56. The OR gate 70 of FIG. 39 can be adapted to provide a two input configuration by connecting the gate terminal 58 to ground and applying the two inputs to the gate terminals 54 and 56.

It is also within the scope of the invention to modify the device 30 to have only one or two inputs by physically omitting one or two of the gates 48, 50 and 52 and respective terminals 54, 56 and 58.

Figure 41:
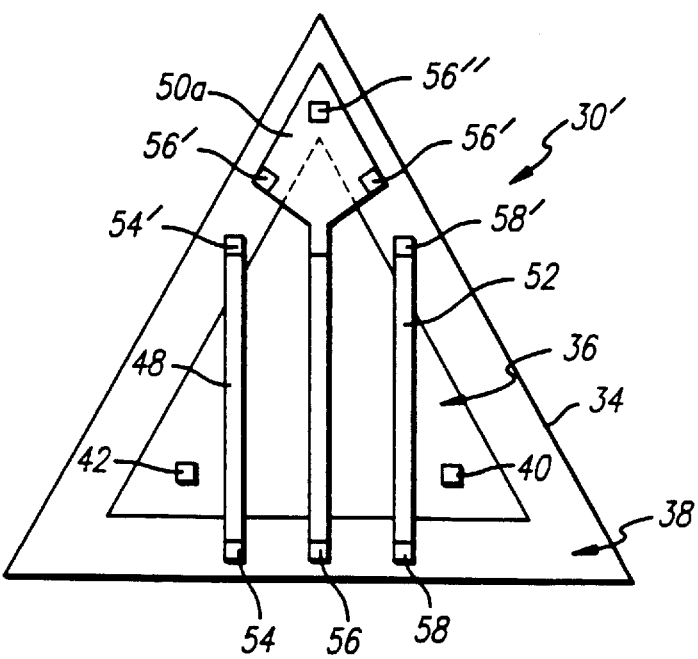
FIG. 41 is a diagram illustrating the gate device with alternative gate connections.

FIG. 41 illustrates alternative locations for the gate terminals 54, 56 and 58 in a modified device 30'. Rather than providing all of the gate terminals 54, 56 and 58 adjacent to the lower edge of the triangle, it is within the scope of the invention to provide gate terminals 54', 56' and 58' at the upper end portions of the gates 48, 50 and 52 respectively.

It is also within the scope of the invention to provide a gate terminal 56" adjacent to the upper vertex of the quadrilateral 50a. In general, the gate terminals can be formed at any desired location as long as they electrically interconnect with the gates.

Figure 42:
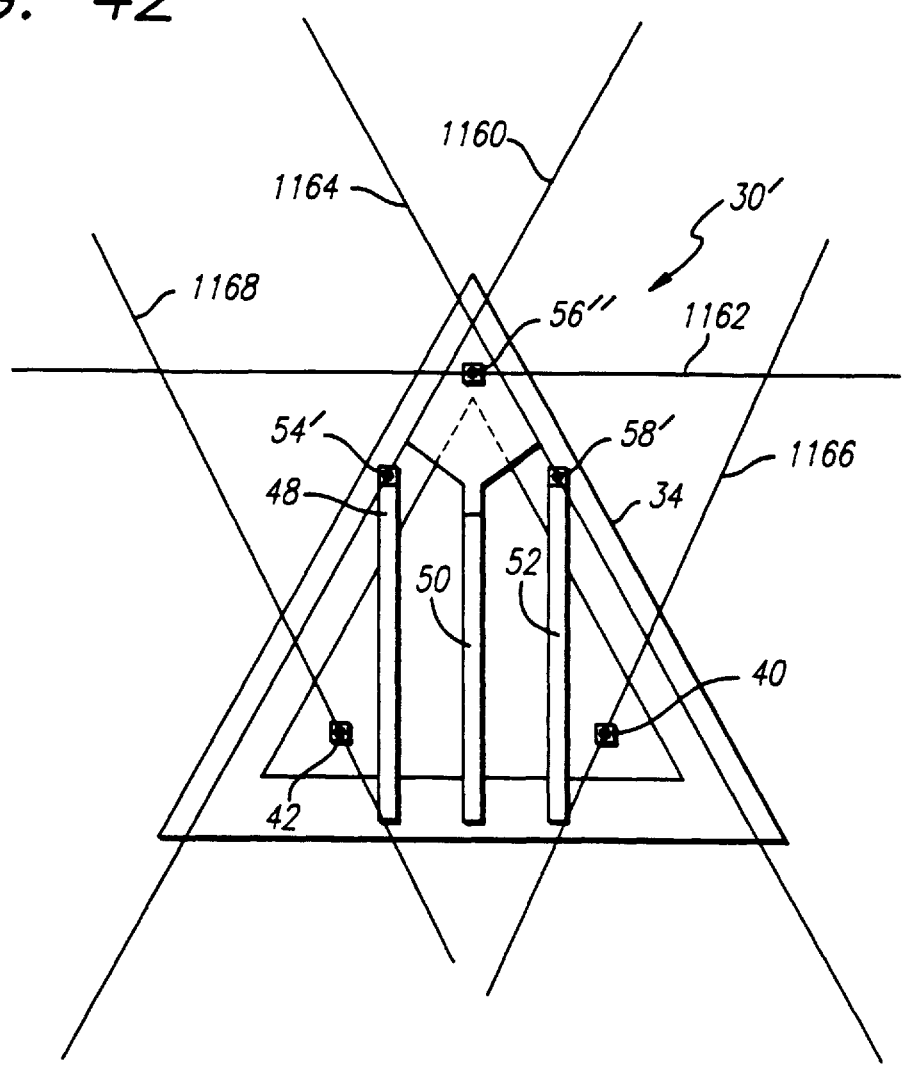
FIG. 42 is a diagram illustrating one device as connected using the three direction routing according to one aspect of the present invention.

An example of the device 30 as being interconnected using the hexagonal routing arrangement of the present invention is illustrated in FIG. 42. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30.

In the illustrated example, a conductor 1160 which extends in the direction $e_2$ is provided for interconnecting the gate terminal 54' for the input A. A conductor 1162 which extends in the direction $e_1$ is provided for interconnecting the gate terminal 56" for the input B, whereas a conductor 1164 which extends in the direction $e_3$ is provided for interconnecting the gate terminal 58, for the input C.

Conductors 1166 and 1168 which extend in the directions $e_2$ and $e_3$ are provided for interconnecting the source terminal 40 and drain terminal 42 respectively.

The conductors 1160, 1162 and 1164 are preferably provided in three separate wiring layers respectively. The conductors 1166 and 1168 are preferably provided in another wiring layer or conductive plane.

Figure 43:
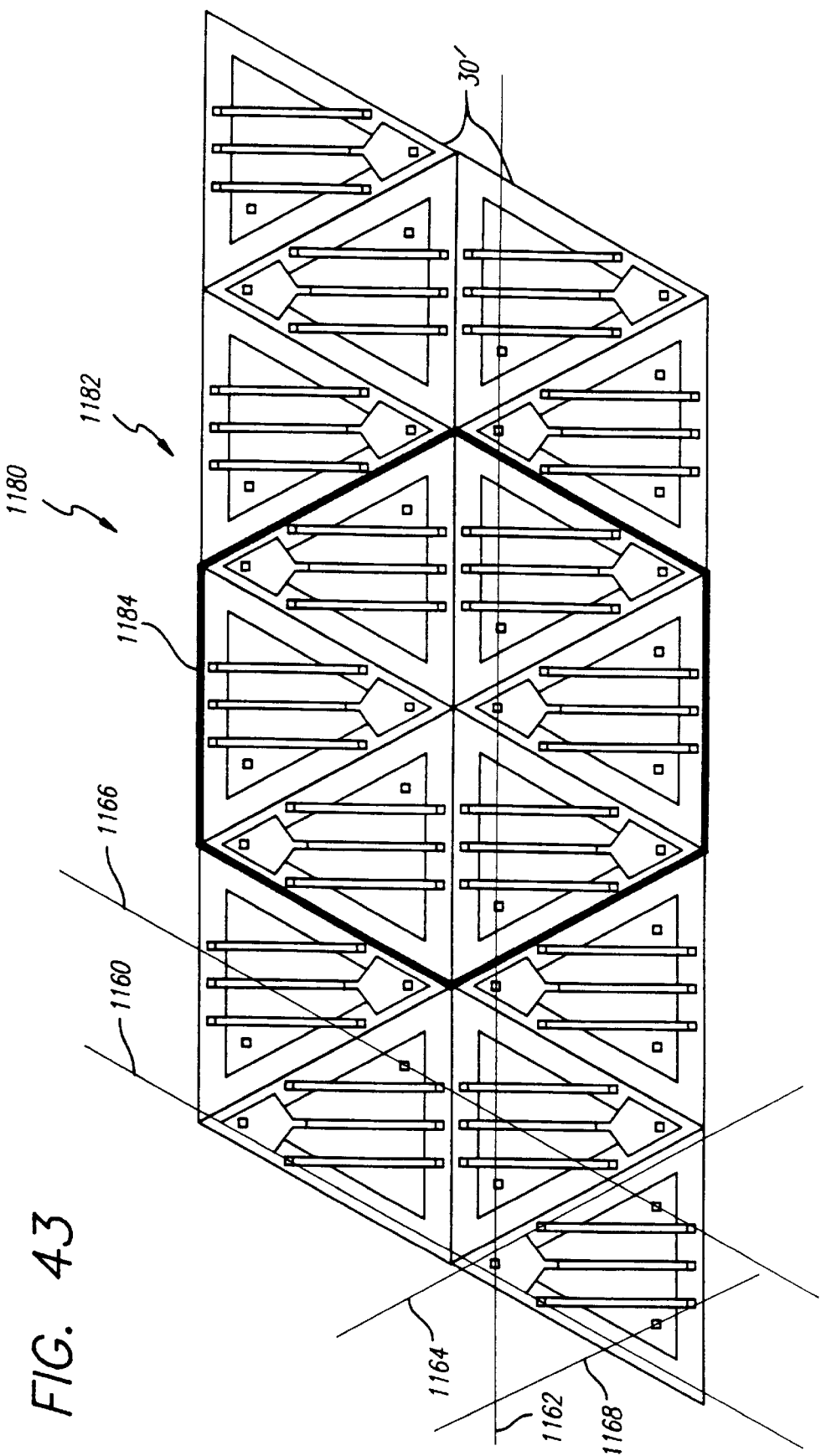
FIG. 43 is a diagram illustrating a microelectronic integrated circuit including a plurality of the present gate devices in a closely packed triangular arrangement.

FIG. 43 illustrates a microelectronic integrated circuit 1180 according to the present invention comprising a semiconductor substrate 1182 on which a plurality of the devices 30' are formed in a closely packed triangular arrangement. Further shown are a few illustrative examples of interconnection of the devices using the conductors 1160, 1162, 1164, 1166 and 1168 which extend in the three directions described with reference to FIG. 42.

It will be noted that six closely packed devices 30 define a hexagonal shape having a periphery 1184. This relationship can be used within the scope of the invention to provide unit cells having hexagonal shapes defined by closely packed triangles, with internal structures similar to or different from that those which are explicitly described and illustrated. In such an arrangement, the hexagon can be considered to be the basic building block.

It will be understood from the above description that the present gate device geometry and three direction interconnect arrangement substantially reduce the total wirelength interconnect congestion of the integrated circuit by providing three routing directions, rather than two as in the prior art. The three routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

Figure 44:
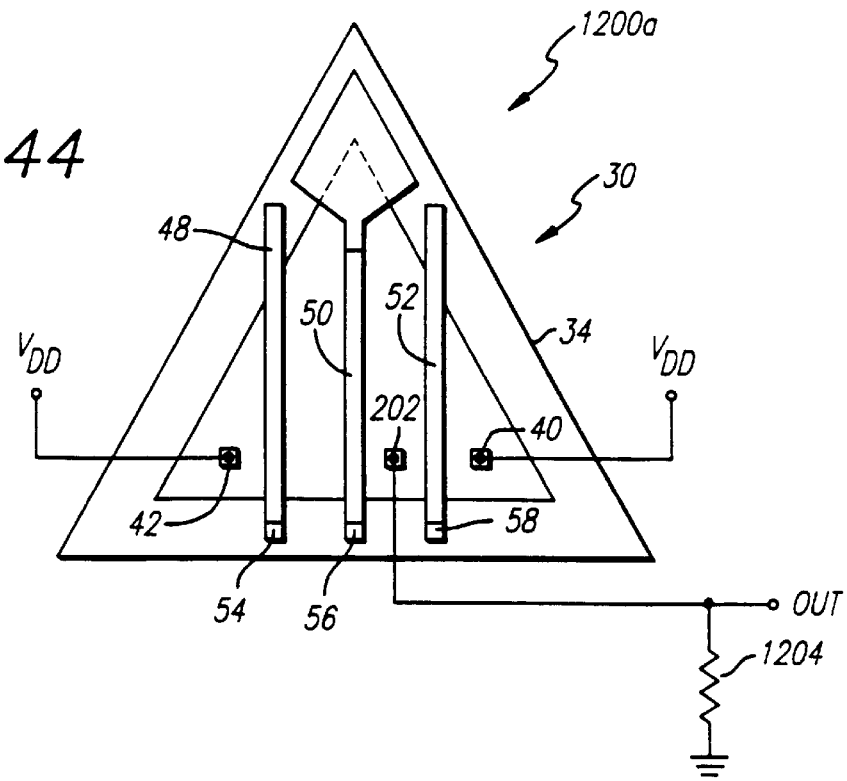
FIG. 44 is a diagram illustrating the gate device connected to provide a logical AND/OR function.
Figure 45:
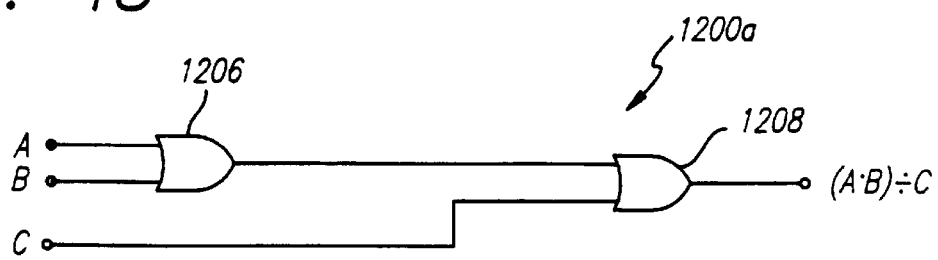
FIG. 45 is a schematic diagram illustrating the logical functionality of the device connected as shown in FIG. 44.
Figure 46:
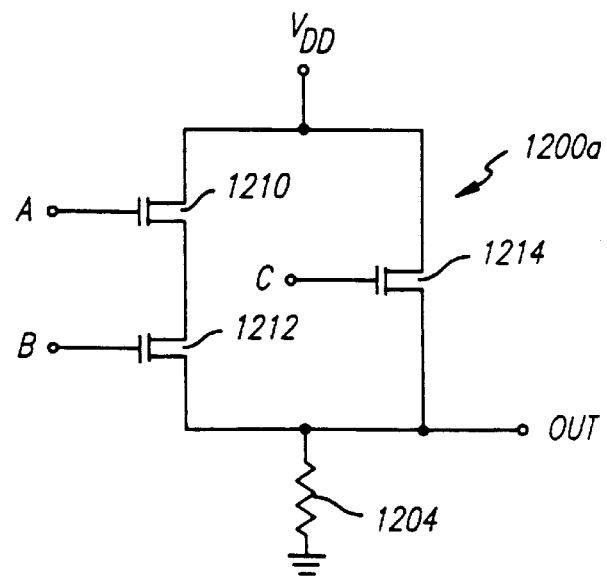
FIG. 46 is a schematic diagram illustrating how individual field effect transistors of the device are connected as shown in FIG. 44.

FIG. 44, FIG. 45, and FIG. 46 illustrate how the device 30 can be modified to provide a different logical function. In an AND/OR gate 1200a, a third terminal 1202 is formed between the gates 50 and 52.

In the gate 1200a, the first and second terminals 40 and 42 are connected to $V_{DD}$ to constitute drain terminals, and the output signal OUT appears at the third terminal 1202 which functions as a source terminal and is connected to ground through a pull-down resistor 1204.

The gate 1200a provides the logical function (A·B)+C. As illustrated in the equivalent circuit diagram of FIG. 45, the inputs A and B are applied to inputs of an AND gate 1206, the output of which is applied to an input of an OR gate 1208. The input C is applied to another input of the OR gate 1208, whereby the output of the OR gate 1208 is (A·B)+C.

The gates 48 and 50 are both disposed between the terminals 42 and 1202, and high inputs must be applied to both respective gate terminals 54 and 56 to enhance the entire portion of the channel between the terminals 42 and 1202 to connect the terminal 1202 to $V_{DD}$ via the terminal 42 and produce a high output signal OUT.

However, only the gate 52 is disposed between the terminals 40 and 1202, such that a high signal applied to the gate terminal 58 alone is sufficient to connect the terminal 1202 to $V_{DD}$ via the terminal 40.

In this manner, the output of the gate 1200a will be logically high if the inputs A and B are both high, and/or the input C is logically high, and the output of the gate 1200a will be logically low if either of the inputs A and B are low, and the input C is low.

The gate 1200a is illustrated in the form of equivalent FET transistors in FIG. 46. The functionality of an FET 1210 is provided by the second terminal 42 and the first gate 48 as shown in FIG. 44. The functionality of an FET 1212 is provided by the second terminal 42 and second gate 50, whereas the functionality of an FET 1214 is provided by the first terminal 40 and the third gate 52.

Similar operation can be obtained by providing the third terminal between the gates 48 and 50. The principle is that by providing an output terminal between two of the gates and connecting the first and second terminals 40 and 41 to $V_{DD}$, a high input signal applied to one of the gates can produce a high output, whereas high input signals applied to the other two gates are alternatively required to produce a high output.

It will be noted that reversal of source and drain connections to provide alternative logic functions is possible for all embodiments of the invention as described above.

Space in the present triangular AND gate device is used most efficiently in the illustrated configuration, in which the terminals 40 and 42 are disposed adjacent to the vertices of the triangle and the gate terminals 48, 50 and 52 are disposed adjacent to the edges of the triangular periphery 34. However, the present invention is not so limited, and it is possible to locate the terminals adjacent to the edges, and locate the gate terminals adjacent to the vertices of the triangular periphery 34. Other arrangements of the terminals, although not explicitly illustrated, are possible within the scope of the invention.

Figure 47:
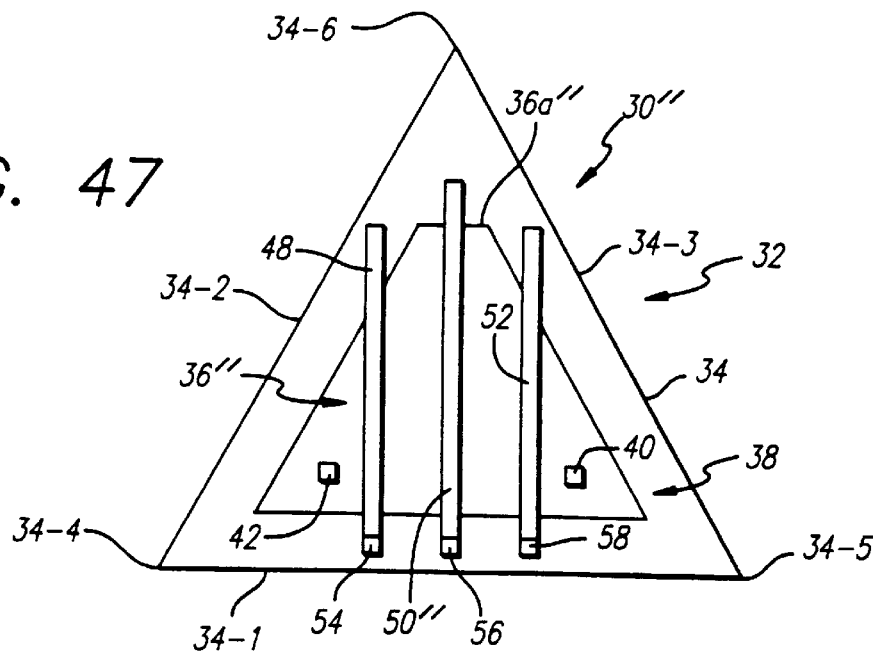
FIG. 47 is a diagram illustrating the gate device as having a modified gate configuration.

Another modification of the present gate device is illustrated in FIG. 47, and designated as 30". As described above, manufacturing problems can be encountered if the upper end of the gate 50 extends through the upper vertex of the triangular active area 36. FIG. 47 illustrates an alternative method of overcoming this problem, in which the upper vertex of the active area 36" is truncated to form a horizontal edge 36a", and the upper portion of the gate 50 extends perpendicularly through the edge 36a".

Triangular CMOS NAND Gate Device

Figure 48:
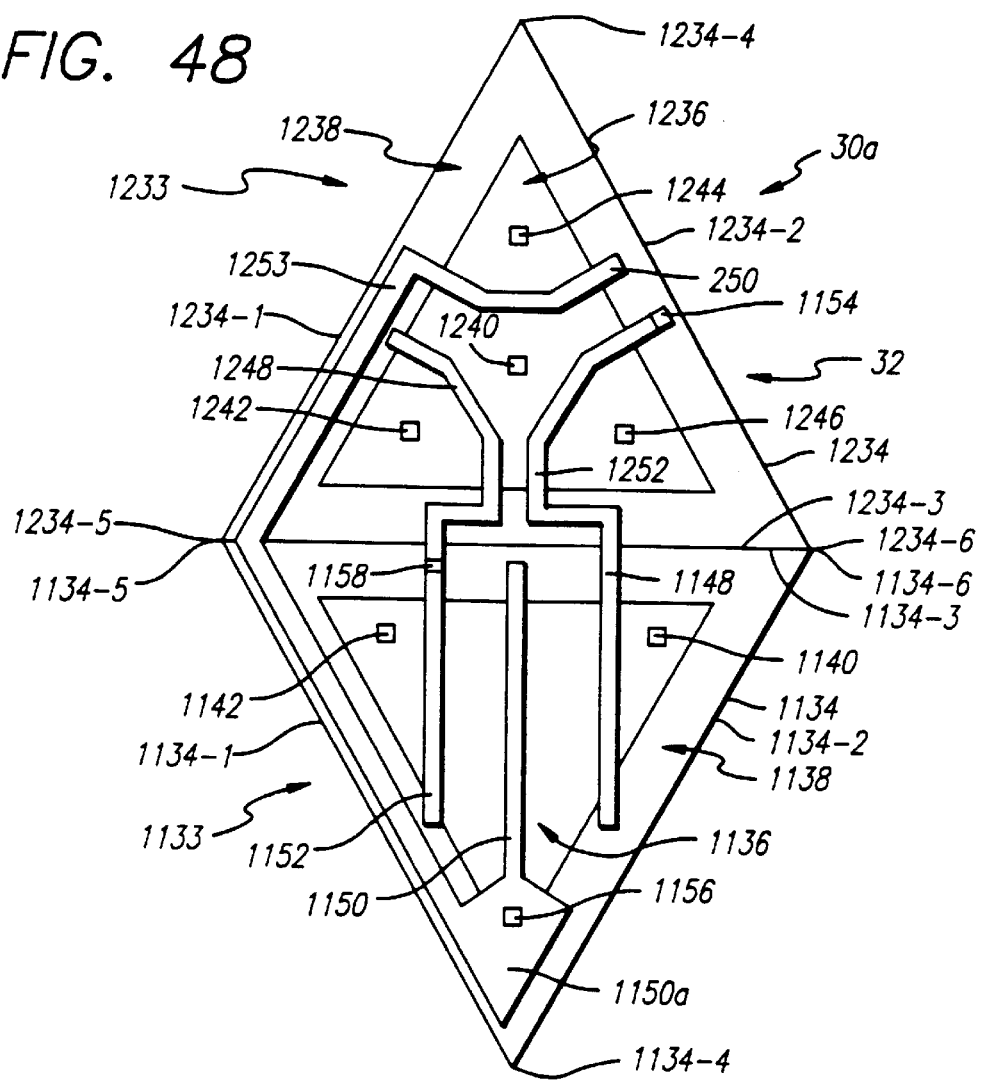
FIG. 48 is a diagram illustrating a microelectronic gate device which is an example of one embodiment of the present invention.

A semiconductor CMOS gate device for a microelectronic integrated circuit is designated by the reference numeral 30a and illustrated in FIG. 48. The illustrated device 30a, in its basic form shown in this example, provides a logical NAND function, but can be adapted to provide a logical AND, NOR, OR or other logical function as will be described below.

Referring to FIG. 48, the gate device 30a is formed on a substrate 32, and includes a logical "ALL" element 1331 having a triangular periphery 1134 including first to third edges 1134-1, 1134-2 and 1134-3, and first to third vertices 1134-4, 1135-6 and 1135-7 respectively in the illustrated arrangement. A triangular semiconductor active area 1136 is formed within the periphery 1134, and an inactive area 1138 is defined between the active area 1136 and the periphery 1134.

The ALL element 1133 comprises an electrically conductive electrode or terminal 1140 which is formed in the active area 1136 adjacent to the vertex 1134-6 and functions as a Field-Effect-Transistor (FET) source terminal. Another electrode or terminal 1142 is formed in the active area 1136 adjacent to the vertex 1134-5 and functions as an FET drain terminal.

The ALL element 1133 further comprises gates 1148, 1150 and 1152 that are formed between the terminals 1140 and 1142. The gates 1148, 1150 and 1152 are preferably insulated gates, each including a layer of insulating oxide with a layer of conductive metal formed over the oxide in a Metal-Oxide-Semiconductor (MOS) configuration.

In order to provide effective source-drain electrical isolation, the opposite end portions of each of the gates 1148, 1150 and 1152 extend into the inactive area 1138. The lower end of the gate 1150 has the shape of a solid quadrilateral which extends into the inactive area 1138 as indicated at 1150a. This is for the purpose of avoiding manufacturing problems which could result if the lower end of the gate 1150 extended through the lower vertex of the triangular active area 1136. Other layout schemes could be used to achieve this purpose of making the design immune to manufacturing tolerances.

The ALL element 1133 in its most basic form provides a logical AND function. The terminal 1140 functions as a source terminal, whereas the terminal 1142 functions as a drain terminal of a field effect transistor, with a channel being defined between the terminals 1140 and 1142.

Each gate 1148, 1150 and 1152 controls the electrical conductivity of a respective underlying portion of the channel such that each gate 1148, 1150 and 1152 can independently inhibit conduction through the channel. Signals must be applied to all of the gates 1148, 1150 and 1152 which cause the underlying portions of the channel to become enhanced in order to enable conduction through the channel. This is an "ALL" or "AND" configuration.

The device 30a further includes an "ANY" element 1233 having a triangular periphery 234 including first to third edges 1234-1, 1234-2 and 1234-3, first to third vertices 1234-4, 1234-5 and 1234-6 respectively in the illustrated arrangement, and an active area 1236. An inactive area 1238 is defined between the active area 1236 and the periphery 1234.

The ANY element 1233 comprises a central electrically conductive electrode or terminal 1240 which functions as a source terminal, and electrodes or terminals 1242, 1244 and 1246 which are formed in the active area 1236 adjacent to the vertices 1234-5, 1234-4 and 1234-6 respectively.

The terminals 1242, 1244 and 1246 function as FET drain terminals, and are preferably interconnected for operation. Although one each of the terminals 1242, 1244 and 1246 are illustrated in the drawing, it is within the scope of the invention to provide two or more of each of the terminals 1242, 1244 and 1246.

The ANY element 1233 further comprises gates 1248, 1250 and 1252 that are formed between the terminals 1242, 1244 and 1246 respectively and the central terminal 1240. The gates 1248, 1250 and 1252 are preferably insulated gates, each including a layer of insulating oxide with a layer of conductive metal formed over the oxide in a MOS configuration.

In order to provide effective source-drain electrical isolation, the opposite end portions of each of the gates 1248, 1250 and 1252 extend into the inactive area 1238.

The ANY element 1233 in its most basic form provides a logical OR function. Each drain terminal 1242, 1244 and 1246 and respective gate 1248, 1250 and 1252 forms a field effect transistor in combination with the common source terminal 1240 such that each transistor can independently establish a conduction channel between its drain and the source. This is an "ANY" or "OR" configuration.

The device 30a has a CMOS configuration, with one of the elements 1133, 1233 having a first conductivity type, and the other of the elements 1133, 1233 having a second conductivity type which is opposite to the first conductivity type.

More specifically, one of the elements 1133, 1233 will be N-channel (NMOS), and the other of the elements 1133, 1233 will be P-channel (PMOS). One of the elements 1133, 1233 will act as a pull-up element for the output of the device 30a, whereas the other of the elements 1133, 1233 will act as a pull-down element.

In order to minimize the area required on the substrate 32 by the device 30a, the elements 1133, 1233 are preferably closely packed, with the peripheries 1134 and 1234 having a common edge. As illustrated, the edge 1134-3 of the element 1133 is common with the edge 1234-3 of the element 1233 such that the device has a quadrilateral or "diamond" shape.

The gates 1152, 1248 and 1148, 1252 are integrally formed, and extend across the inactive areas 1138 and 1238. An electrical conductor 1253 extends through the inactive areas 1138 and 1238 adjacent to the edges 1134-1 and 1234-1 of the elements 1133 and 1233 respectively, and connects the gate 1150 to the gate 1250. The gates 1248, 1250 and 1252 of the ANY element 1233 are thereby electrically connected to the gates 1152, 1150 and 1148 of the ALL element 1133 respectively.

A gate terminal 1154 which constitutes a common input terminal the gates 1148 and 1252 is formed in the inactive area 1238 of the ALL element 1233 adjacent to the edge 1234-2. A gate terminal 1156 which constitutes a common input terminal for the gates 1150 and 1250 is formed in the inactive area 1138 of the ALL element adjacent to the vertex 1134-4. A gate terminal 1158 which constitutes a common input terminal for the gates 1152 and 1248 is formed in the inactive area 1138 adjacent to the edge 1134-3.

It will be noted that the locations of the gate terminals 1154, 1156 and 1158 are exemplary, and that the gate terminals can be located at different points in the device in accordance with the requirements of a particular design or application.

The inputs of the ALL element 1133 and the ANY element 1233 are thereby respectively interconnected. As will be described below, the outputs of the ALL element 1133 and the ANY element 1233 are also interconnected to provide a desired functionality.

Figure 49:
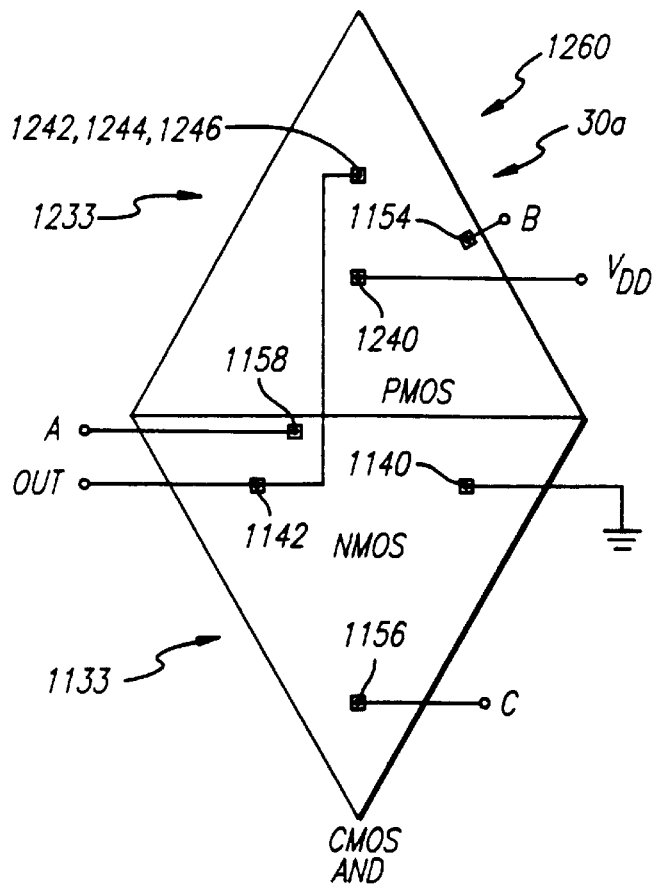
FIG. 49 is an electrical schematic diagram illustrating the present device connected to provide a logical NAND function.

A CMOS NAND gate 1260 based on the device 30a is illustrated in FIG. 49. The device 30a is shown in simplified form for clarity of illustration, with only the triangular peripheries of the elements 1133 and 1233 and their terminals included in the drawing. The terminals 1242 and 1246 are not explicitly illustrated, and are assumed to be electrically connected to the terminal 1244.

Input signals A, B and C are applied to the gate terminals 1158, 1154 and 1156 respectively. A logically high signal or potential will be assumed to be substantially equal to $V_{DD}$, and a logically low signal will be assumed to be substantially equal to ground, with $V_{DD}$ being more positive than ground.

The active area 1236 of the ANY element 1233 is N-type to provide PMOS operation. The central terminal 1240 is connected to $V_{DD}$, whereas an output signal OUT is taken at the interconnected drain terminals 1242, 1244 and 1246.

Any low input will establish a conductive channel between the terminals 1242, 1244 and 1246 and the central terminal 1240, thereby connecting the output to $V_{DD}$ and producing a high output signal OUT. When all of the inputs are high, the ANY element 1233 is turned off and the terminals 1242, 1244 and 1246 float.

The ANY element 1233 thereby functions as a pull-up element of the CMOS NAND gate 1260, in which any low input produces a high output.

The active area 1136 of the ALL element 1133 is P-type to provide NMOS operation. The source terminal 1140 is connected to ground, and the drain terminal 1142 is connected to the terminals 1242, 1244 and 1246 of the ANY element 1233 to provide a common output.

When any of the inputs are low, the ALL element 1133 is turned off and the terminal 1142 will float. If all of the inputs are high, a conductive channel will be established between the terminals 1140 and 1142 to connect the output to ground and produce a logically low output.

The ANY element 1133 therefore functions as a pull-down element of the CMOS NAND gate 1260, such that any low input produces a high output, and the output is low in response to all inputs being high.

Figure 50:
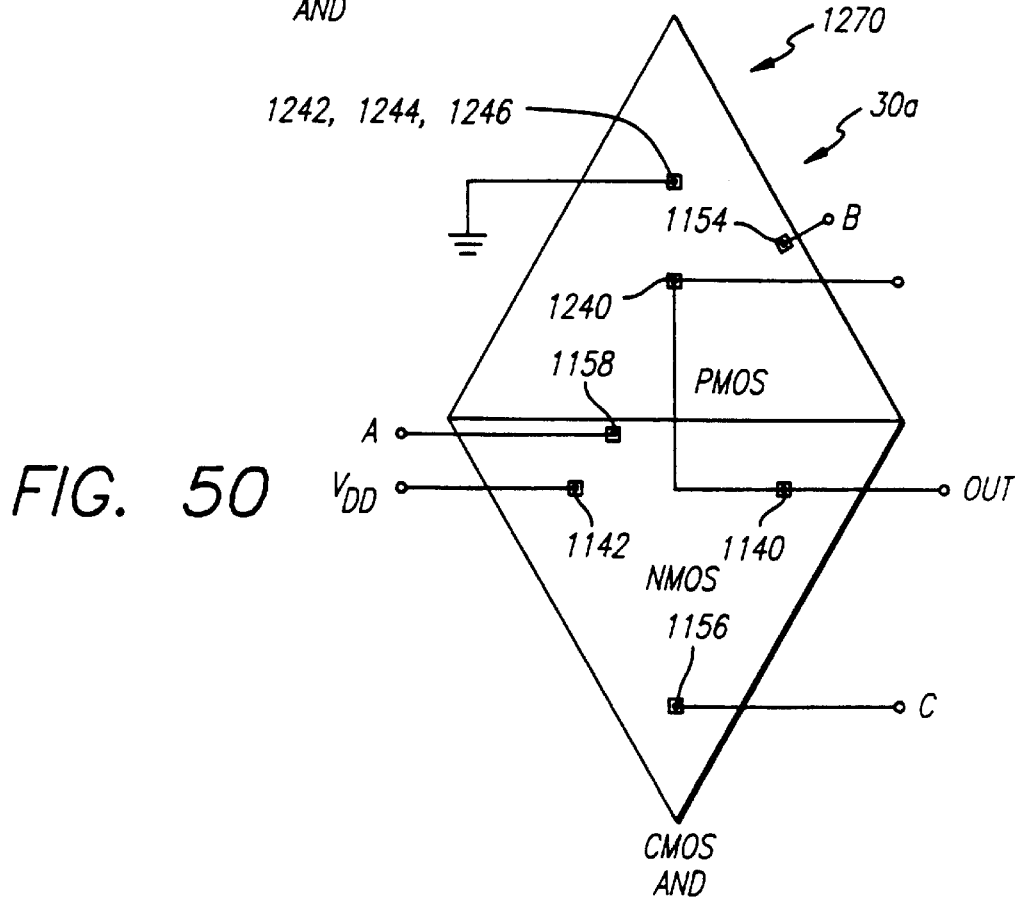
FIG. 50 is an electrical schematic diagram illustrating the gate device connected to provide a logical AND function.

A CMOS AND gate 1270 incorporating the device 30a is illustrated in FIG. 50. The active area 1236 of the ANY element 1233 is N-type to provide PMOS FET operation, and the terminals 1242, 1244 and 1246 are connected to ground. The output signal OUT appears at the central terminal 1240.

Due to the PMOS configuration of the ANY element 1233 in the AND gate 1270, a logically low input signal A, B or C will establish a conductive channel between the terminals 1242, 1244 and 1246 respectively and the central terminal 1240. This connects the output to ground. When all of the inputs are high, the ANY element 1233 is turned off, and the terminal 1240 floats.

Thus, any low input will produce a low output, and the ANY element 1233 acts as a pull-down element of the CMOS AND gate 1270.

The active area 1136 of the ALL element 1133 is P-type to provide NMOS FET operation. The drain terminal 1142 is connected to $V_{DD}$, and the terminal 1140 is connected to the terminal 1240 of the ANY element 1233 to provide a common output OUT.

With any logically low input signal A, B and C applied to the gate terminal 1154, 1156 or 1158 respectively, the ALL element 1133 will be turned off and the terminal 1140 will float.

Since the ALL element 1133 provides NMOS operation in the configuration of FIG. 50, positive inputs to all of the gate terminals 1154, 1156 and 1158 will establish a conductive channel between the terminals 1140 and 1242. The entire channel will be enhanced, thereby connecting the source terminal 1140 to the potential $V_{DD}$ through the drain terminal 1142 to produce a logically high output.

In this manner, the ALL element 1133 acts as a pull-up element of the AND gate 1270, such that the gate 1270 produces a logically high output when all of the inputs are high, and a logically low output when any of the inputs are low.

Figure 51:
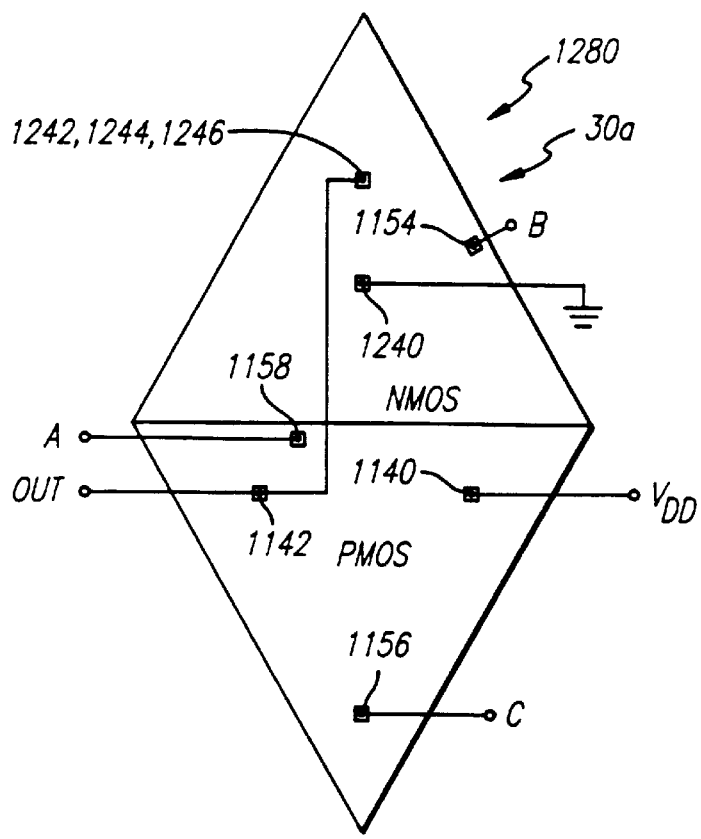
FIG. 51 is an electrical schematic diagram illustrating the gate device connected to provide a logical NOR function.

A NOR gate 1280 incorporating the device 30a is illustrated in FIG. 51, in which the active area 1236 of the ANY element 1233 is P-type to provide NMOS operation. The central terminal 1240 is connected to ground, and the terminals 1242, 1244 and 1246 are connected to provide an output.

When all of the inputs are low, the ANY element 1233 is turned off and the terminals 1242, 1244 and 1246 will float. If any of the inputs is high, a conductive channel will be established between the respective terminals 1242, 1244 and 1246 and the central terminal 1240 to connect the terminals 1242, 1244 and 1246 and thereby the output to ground to produce a logically low output.

In this manner, the ANY element 1233 acts as a pull-down element of the CMOS NOR gate 1280, with the output OUT being low if any or all inputs are high.

The active area 1136 of the ALL element 1133 is N-type to provide PMOS operation. The source terminal 1140 is connected to $V_{DD}$, whereas the drain terminal 1142 is connected to the output OUT.

All low inputs will establish a conductive channel between the terminals 1140 and 1142, thereby connecting the output to $V_{DD}$ and producing a high output. When any of the inputs are high, the ALL element 1133 is turned off and the terminal 1142 floats.

Thus, the NOR configuration is provided, in which the ALL element 1133 acts as a pull-up element, any high input produces a low output, and the output is high in response to all inputs being low.

Figure 52:
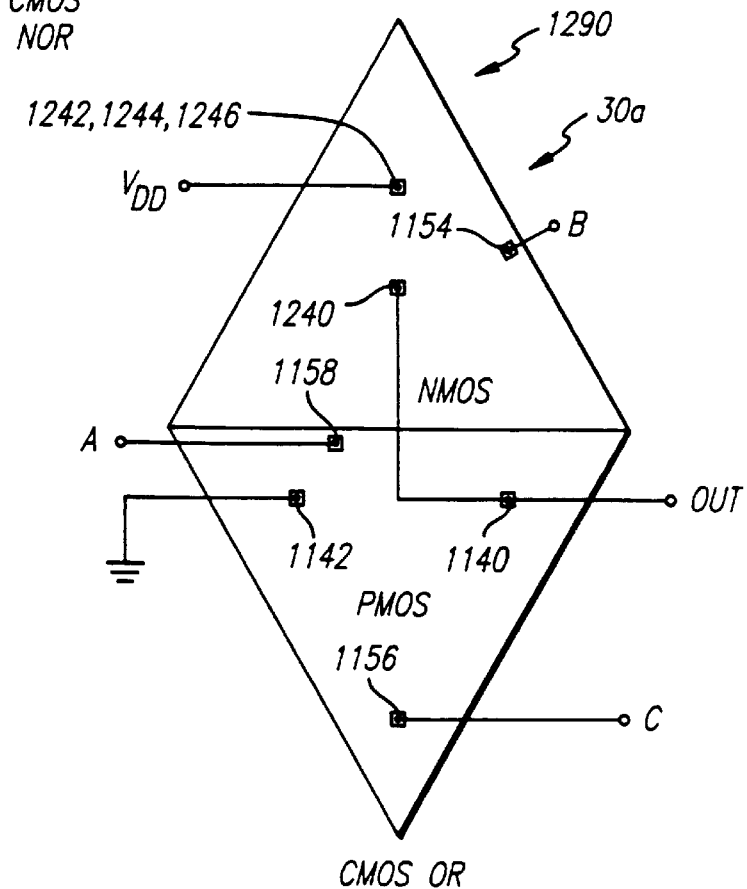
FIG. 52 is an electrical schematic diagram illustrating the gate device connected to provide a logical OR function.

A CMOS OR gate 1290 based on the device 30a is illustrated in FIG. 52. The active area 1236 of the ANY element 1233 is P-type to provide NMOS FET operation. The terminals 1242, 1244 and 1246 are connected to $V_{DD}$, whereas the terminal 40 is connected to provide an output.

With all logically low input signals applied to the gate terminals 1254, 1256 and 1258 respectively, the ANY element 1233 will be turned off and the terminals 1242, 1244 and 1266 will float.

Since the device 30a provides NMOS operation in the configuration of FIG. 52, a positive input to any of the gate terminals 1254, 1256 and 1258 will establish a conductive channel between the terminals 1242, 1244 and 1246 respectively and the central terminal 1240. Any one of these channels will connect the central terminal 1240 to the potential $V_{DD}$ to produce a logically high output.

In this manner, the ANY element 1233 acts as a pull-up element of the OR gate 1290, and the output OUT is logically high when any or all of the inputs is high.

The active area 1136 of the ANY element 1133 is N-type to provide PMOS FET operation. The drain terminal 1142 is connected to ground, and the source terminal 1140 is connected to provide an output.

Due to the PMOS configuration of the ALL element 1133 in the OR gate 1290, all of the input signals must be logically low to establish a conductive channel between the terminals 1140 and 1142. This connects the output to ground.

Thus, the ANY element 1133 acts as a pull-down element in the CMOS OR gate 1290, and all low inputs will produce a low output.

The device 30a is illustrated as having three inputs, which is ideally suited to the hexagonal device shape. However, it is within the scope of the invention to provide a gate device having one or two inputs. A device with one input can be used as a buffer or an inverter.

The device 30a can be configured without modification to operate as if it had one or two, rather than three inputs. For example, if it is desired to operate the NAND gate 1260 of FIG. 49 with only two inputs, the gate terminal 1158 can be connected to $V_{DD}$ and the two inputs applied to the gate terminals 1154 and 1156. The NOR gate of FIG. 51 can be adapted to provide a two input configuration by connecting the gate terminal 1158 to ground and applying the two inputs to the gate terminals 1154 and 1156.

It is also within the scope of the invention to modify the device 30a to have only one or two inputs by physically omitting one or two of the gates 1148, 1150 and 1152 and respective terminals 1142, 1144, 1146 and 1154, 1156, 1158.

In the illustrated example, the terminals 1242, 1244, 1246 and 1142 are interconnected internally as illustrated in FIG. 49. Conductors 1330a, 1336 and 1338 which extend in the $e_1$ direction (see FIG. 8) are provided for connection of the terminals 1240, 1244 and 1140 respectively. Conductors 1332, 1334 and 1340 which extend in the directions $e_1$, $e_2$ and $e_3$ are provided for connection of the terminals 1158, 1156 and 1154 respectively. The conductors 1332, 1334 and 1340, which carry the input signals, are preferably formed in different conductor layers.

Figure 53:
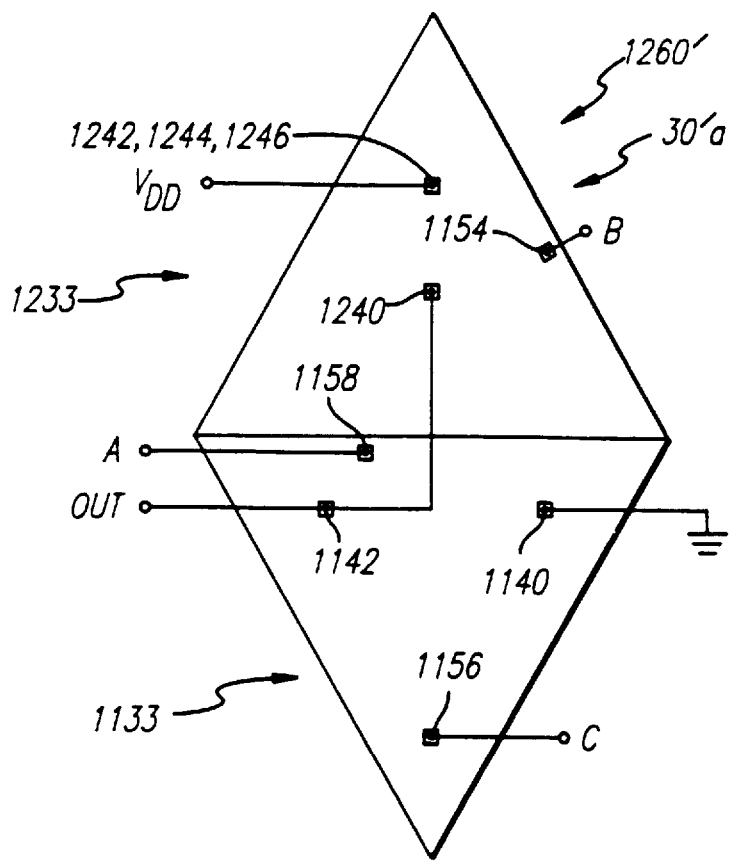
FIG. 53 is a diagram illustrating the gate device connected to provide a logical NAND function with reversed source and drain connections.

For example, FIG. 53 illustrates a modified CMOS NAND gate 1260' based on a device 30a' which differs from the NAND gate 1260 of FIG. 49 in that the source and drain terminals of the ANY element 1233 are reversed relative to each other.

In this embodiment of the invention, the terminals 1242, 1244 and 1246 constitute sources and are connected to $V_{DD}$, whereas the center terminal 1240 constitutes the drain and is connected to the output in parallel with the terminal 1142 of the ALL element 1133.

Although not explicitly illustrated, this modification is equally applicable to all other embodiments of the invention.

Figure 54:
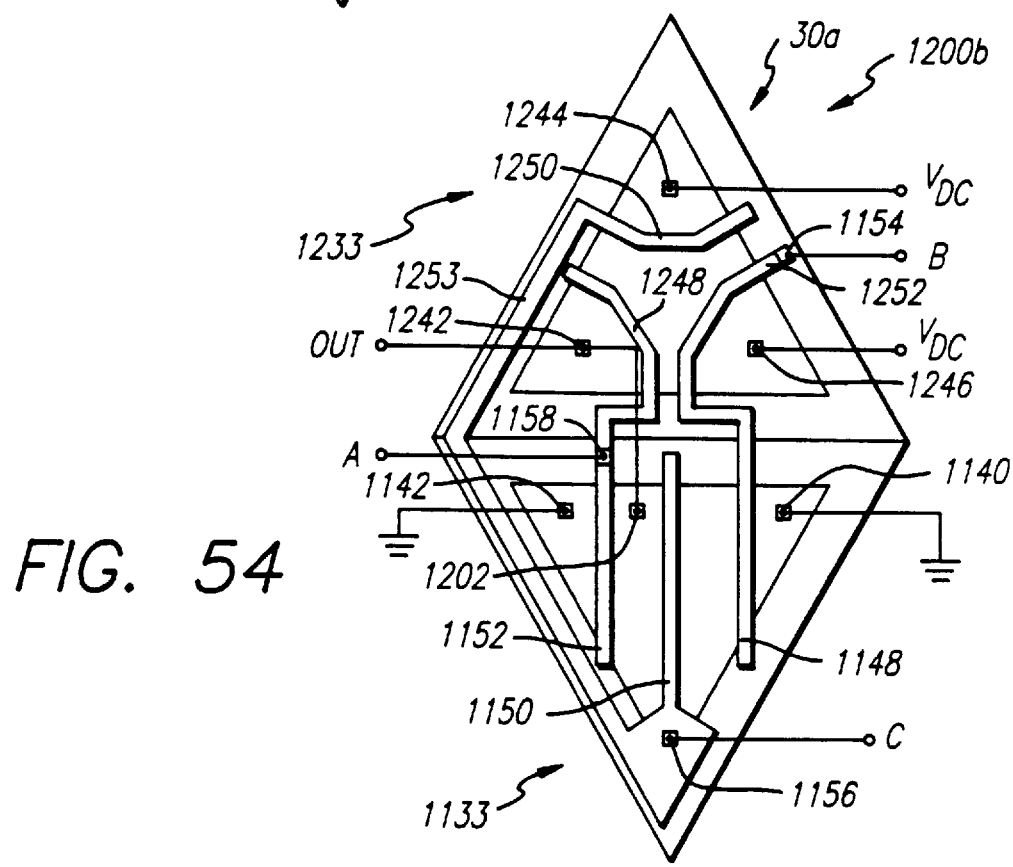
FIG. 54 is a diagram illustrating the gate device connected to provide a logical AND/OR function.
Figure 55:
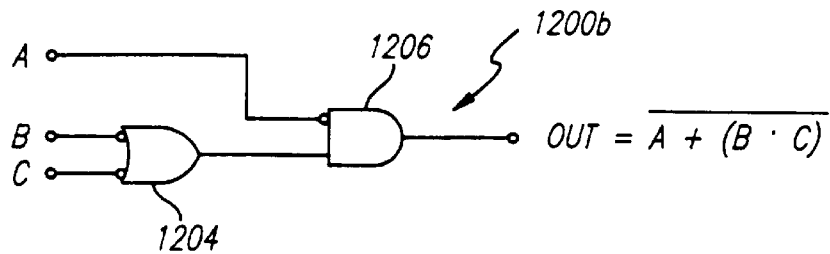
FIG. 55 is a functional circuit diagram of the gate device of FIG. 54.
Figure 56:
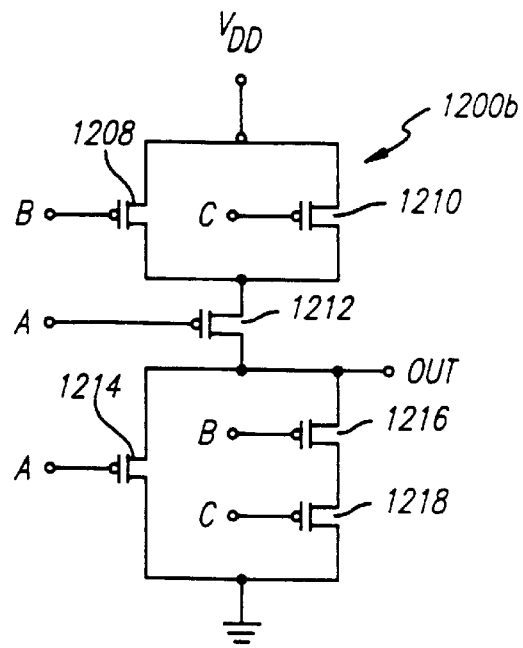
FIG. 56 is a schematic diagram illustrating the gate device of FIG. 54 as being represented by field-effect transistors.

FIGS. 54, 55 and 56 illustrate how the connections of the device 30a can be changed to provide a different logical function. In an AND/OR gate 1200b, the central terminal 1240 of the ANY element 1233 is not used, and can be physically omitted if desired. The ANY element 1233 is PMOS, whereas the ALL element 1133 is NMOS. The terminals 1244 and 1246 of the are connected to $V_{DD}$, and the output signal OUT appears at the terminal 1242. The terminals 1140 and 1142 of the ALL element 1133 are connected to ground. An additional terminal 1202 is provided between the gates 1150 and 1152.

The gate 1200b provides the logical function $$A+(B*\bar{C})$$

As illustrated in the equivalent circuit diagram of FIG. 55, the inputs B and C are applied to inverting inputs of an OR gate 1204, the output of which is applied to a non-inverting input of an AND gate 1206. The input A is applied to an inverting input of the AND gate 1206, whereby the output of the AND gate 1206 is $$A+(B*\bar{C})$$

Referring to FIG. 54, the ANY element 1233 functions as the pull-up element of the gate 1200b. Since the gate 1248 is in front of the terminal 1242, a logically low signal A must be applied to the gate terminal 1158 to enhance the channel under the gate 1248 and connect the terminal 1242 to either the gate 1250 or the gate 1252. This provides the functionality of the AND gate 1206.

Since both terminals 1244 and 1246 are connected to $V_{DD}$, a logically low signal B or C applied to the gate terminal 1154 or 1156 will enhance the channel under the gate 1250 and 1252 respectively and establish a conductive path from $V_{DD}$ to the gate 1248.

Thus, the output OUT will be pulled high if the input A and either of the inputs B and C are low. If the input A or either of the inputs B and C is high, no conductive path will be established between $V_{DD}$ and the output at the terminal 1242, and the terminal 1242 will float.

The ALL element 1133 functions as the pull-down element of the gate 1200b. Since the gate 1152 is disposed between the grounded terminal 1142 and the terminal 1202 which is connected to the output, a high signal A applied to the gate 1152 will enhance the channel under the gate 1152 and connect the output terminal 1202 to the terminal 1142 and thereby to ground. This provides the functionality of the AND gate 1206.

Since both gates 1148 and 1150 are disposed between the terminal 1140 and the terminal 1202, high signals B and C must be applied to both gates 1148 and 1150 to connect the terminal 1202 to the terminal 1140 and thereby to ground. This provides the functionality of the OR gate 1204.

Thus, the output OUT will be pulled low if the input A and/or both inputs B and C are high, and the terminal 1202 will float if the input A and either of the inputs B and C are low.

FIG. 56 illustrates the gate 1200b as represented by equivalent field-effect transistors. PMOS transistors 1208, 1210 and 1212 represent the portions of the gate 1200b corresponding to functionality provided by the gates 1252, 1250 and 1248 and respectively. NMOS transistors 1214, 1216 and 1218 represent the portions of the gate 1200b corresponding to functionality provided by the gates 1152, 1148 and 1150 respectively.

Triangular OR Gate Device

Figure 57:
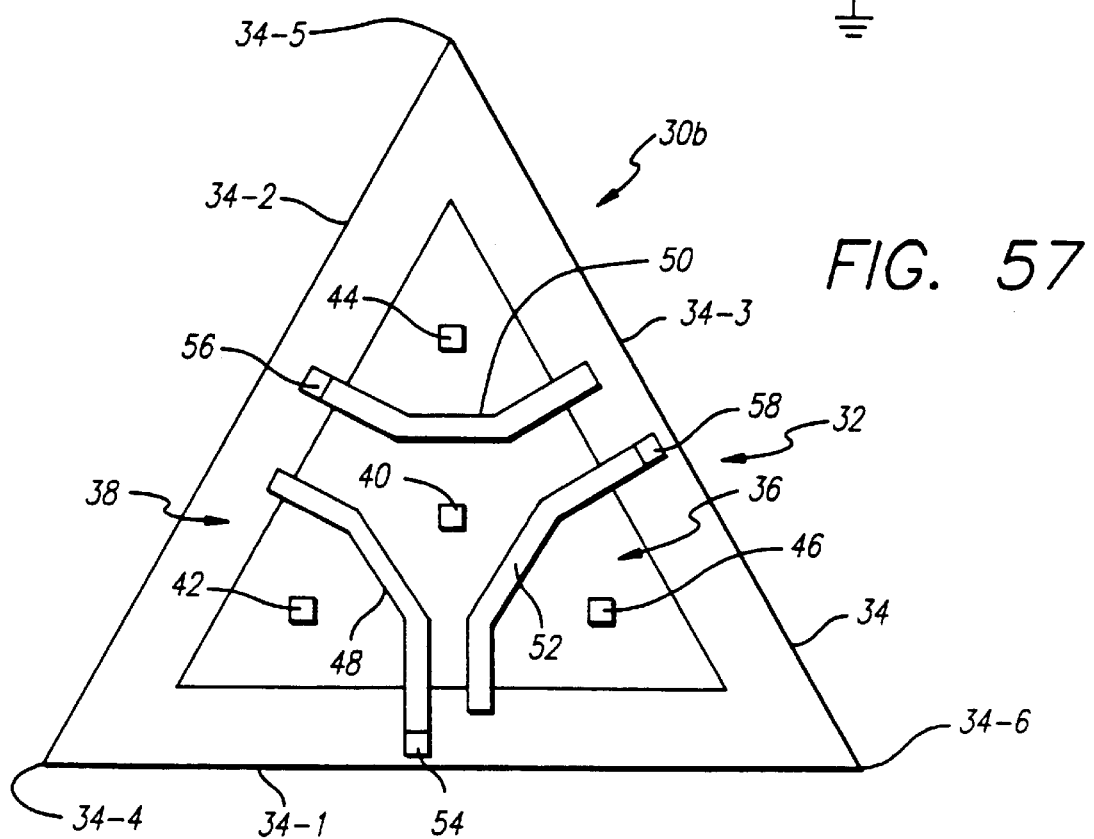
FIG. 57 is a diagram illustrating a microelectronic gate device embodying the present invention.

A semiconductor gate device for a microelectronic integrated circuit is designated by the reference numeral 30b and illustrated in FIG. 57. The device 30b, in its basic form shown in this example, provides a logical OR function, but can be adapted to provide a logical NOR, AND, NAND or other logical function as will be described below.

The gate device 30b is formed on a substrate 32, and has a triangular periphery 34 including first to third edges 34-1, 34-2 and 34-3, and first to third vertices 34-4, 34-5 and 34-6 respectively in the illustrated arrangement. A triangular semiconductor active area 36 is formed within the periphery 34, and an inactive area 38 is defined between the active area 36 and the periphery 34.

The device 30b comprises a central electrically conductive electrode or terminal 40 which functions as a Field-Effect-Transistor (FET) source terminal, and first, second and third electrodes or terminals 42, 44 and 46 respectively that are formed in the active area 36 adjacent to the first, second and third vertices 34-4, 34-5 and 34-6 respectively.

The terminals 42, 44 and 46 function as FET drain terminals, and are preferably interconnected for operation. Although one each of the terminals 42, 44 and 46 is illustrated in the drawing, it is within the scope of the invention to provide two or more each of the terminals 42, 44 and 46.

The device 30b further comprises first, second and third gates 48, 50 and 52 that are formed between the first, second and third terminals 42, 44 and 46 respectively and the central terminal 40. The gates 48, 50 and 52 are preferably insulated gates, each including a layer of insulating oxide with a layer of conductive material (metal or doped polysilicon) formed over the oxide in a Metal-Oxide-Semiconductor (MOS) configuration. First to third gate electrodes or terminals 54, 56 and 58 are formed in the inactive area 38 adjacent to the triangular edges 34-1, 34-2 and 34-3, and are electrically connected to the gates 48, 50 and 52 respectively. It will be noted that the locations of the gate terminals 54, 56 and 58 are exemplary, and that the gate terminals can be located at different points in the device in accordance with the requirements of a particular design or application.

In order to provide effective source-drain electrical isolation, the opposite end portions of each of the gates 48, 50 and 52 extend into the inactive area 38.

The device 30b, in its most basic form illustrated in this example, provides a logical OR function. Each drain terminal 42, 44 and 46 and respective gate 48, 50 and 52 forms a field effect transistor in combination with the common source terminal 40 such that each transistor can independently establish a conduction channel between its drain and the source. This is an "any" or "OR" configuration.

Figure 58:
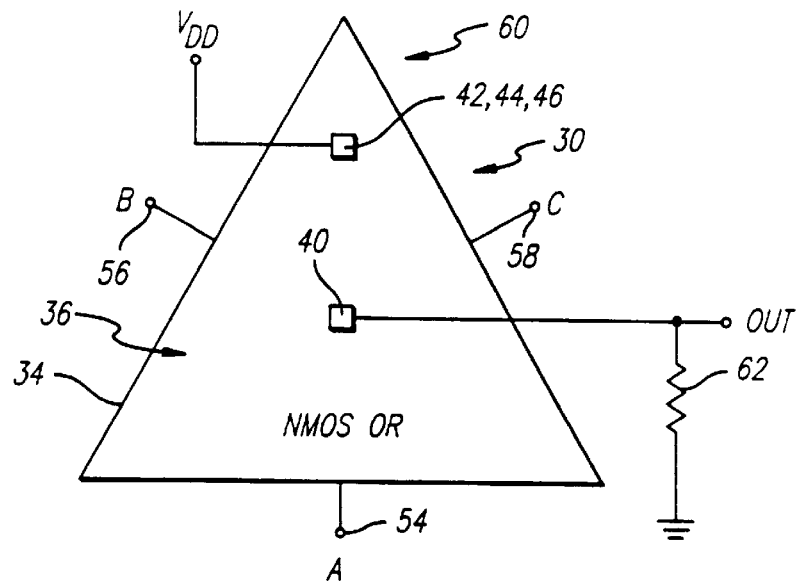
FIG. 58 is an electrical schematic diagram illustrating the present device connected to provide a logical OR function.

An OR gate 60 based on the device 30b is illustrated in FIG. 58. The device 30b is shown in simplified form for clarity of illustration, with only the triangular periphery 34 and terminals 40, 44, 54, 56 and 58 included in the drawing.

The terminals 42 and 46 are not explicitly illustrated, and are assumed to be electrically connected to the terminal 44. Input signals A, B and C are applied to the gate terminals 54, 56 and 58 respectively, and an output signal OUT is taken at the central or source terminal 40.

In the OR gate 60 of FIG. 58, the active area 36 of the device 30*b* is P-type to provide NMOS FET operation. The terminals 42, 44 and 46 are connected to an electrical potential $V_{DD}$ which is more positive than ground. The terminal 40 is connected to ground through a pull-down resistor 62.

A logically high signal will be assumed to be substantially equal to $V_{DD}$, and a logically low signal will be assumed to be substantially equal to ground. With all logically low input signals A, B and C applied to the gate terminals 54, 56 and 58 respectively, the device 30*b* will be turned off and the resistor 62 will pull the output low (to ground).

Since the device 30*b* provides NMOS operation in the configuration of FIG. 58, a positive input to any of the gate terminals 54, 56 and 58 will establish a conductive channel between the terminals 42, 44 and 46 respectively and the central terminal 40. Any one of these channels will connect the central terminal 40 to the potential $V_{DD}$ to produce a logically high output. In this manner, the OR gate 60 produces a logically high output when any or all of the inputs is high.

Figure 59:
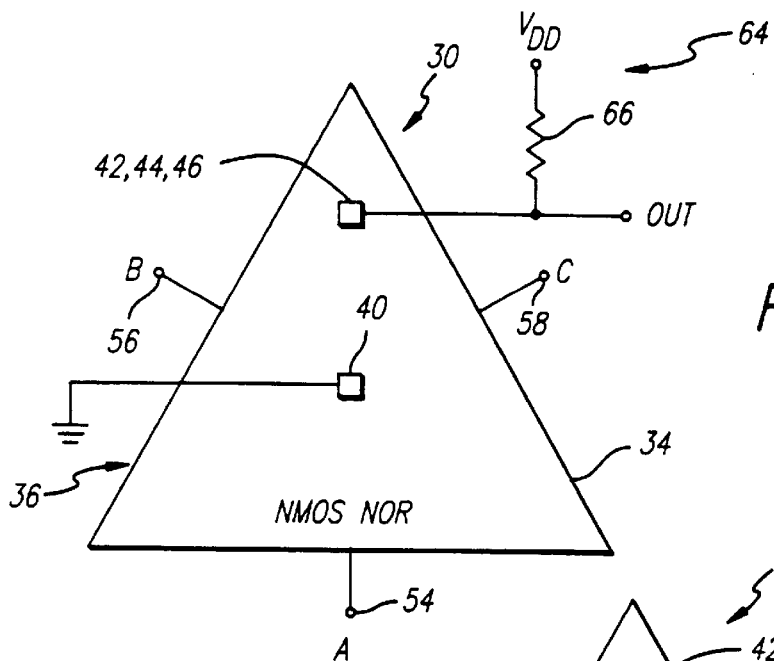
FIG. 59 is an electrical schematic diagram illustrating the gate device connected to provide a logical NOR function.

FIG. 59 illustrates the device 30*b* connected in circuit to function as a NOR gate 64. In this case also, the active area 36 of the device 30*b* is P-type to provide NMOS operation. The central terminal 40 is connected to ground, and the terminals 42, 44 and 46 are connected to $V_{DD}$ through a pull-up resistor 66. The output signal OUT appears at the terminals 42, 44 and 46.

When all of the inputs are low, the device 30*b* is turned off and the output will be pulled to $V_{DD}$ by the pull-up resistor 66 to produce a logically high output. If any of the inputs is high, a conductive channel will be established between the respective terminals 42, 44 and 46 and the central terminal 40 to connect the terminals 42, 44 and 46 and thereby the output to ground to produce a logically low output. In this manner, the output signal OUT will be high if all inputs are low, and low if any or all inputs are high to produce the NOR function.

Figure 60:
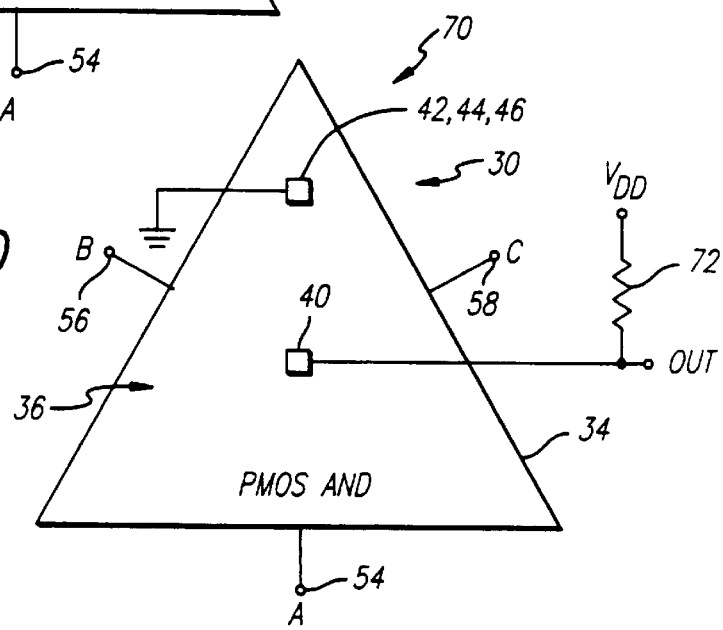
FIG. 60 is an electrical schematic diagram illustrating the gate device connected to provide a logical AND function.

An AND gate 70 incorporating the device 30*b* is illustrated in FIG. 60. In the AND gate configuration, the active area 36 is N-type to provide PMOS FET operation, and the terminals 42, 44 and 46 are connected to ground. The central terminal 40 is connected to $V_{DD}$ through a pull-up resistor 72, and the output is taken at the terminal 40.

Due to the PMOS configuration of the device 30*b* in the AND gate 70, a logically low input signal applied to input points A, B or C will establish a conductive channel between the terminals 42, 44 and 46 respectively and the central terminal 40. This connects the output to ground. Thus, any low input will produce a low output.

When all of the inputs are high, the device 30*b* is turned off, and the output is pulled high by the pull-up resistor 72. Thus, the desired AND function is provided.

Figure 61:
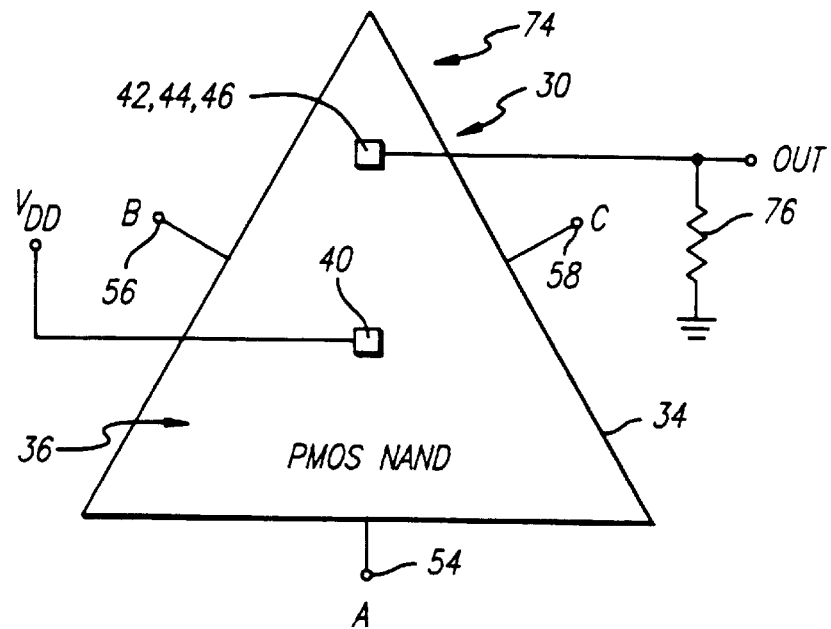
FIG. 61 is an electrical schematic diagram illustrating the gate device connected to provide a logical NAND function.

A NAND gate 74 incorporating the device 30*b* is illustrated in FIG. 61, in which the active area 36 is N-type to provide PMOS operation. The central terminal 40 is connected to $V_{DD}$, whereas the terminals 42, 44 and 46 are connected to ground through a pull-down resistor 76. The output is taken at the terminals 42, 44 and 46.

Any low input will establish a conductive channel between the terminals 42, 44 and 46 and the central terminal 40, thereby connecting the output to $V_{DD}$ and producing a high output. When all of the inputs are high, the device 30*b* is turned off and the output is pulled to ground by the resistor 76. Thus, the NAND configuration is provided, in which any low input produces a high output, and the output is low in response to all inputs being high.

The device 30*b* is illustrated as having three inputs, which is ideally suited to the triangular device shape. However, it is within the scope of the invention to provide a gate device having one or two inputs. A device with one input can be used as a buffer or an inverter.

The device 30*b* can be configured without modification to operate as if it had one or two, rather than three inputs. For example, if it is desired to operate the OR gate 60 of FIG. 58 with only two inputs, the gate terminal 58 can be grounded and the two inputs applied to the gate terminals 54 and 56. The AND gate 70 of FIG. 60 can be adapted to provide a two input configuration by connecting the gate terminal 58 to $V_{DD}$ and applying the two inputs to the gate terminals 54 and 56.

It is also within the scope of the invention to modify the device 30*b* to have only one or two inputs by physically omitting one or two of the gates 48, 50 and 52 and respective terminals 42,44,46 and 54,56,58.

Figure 62:
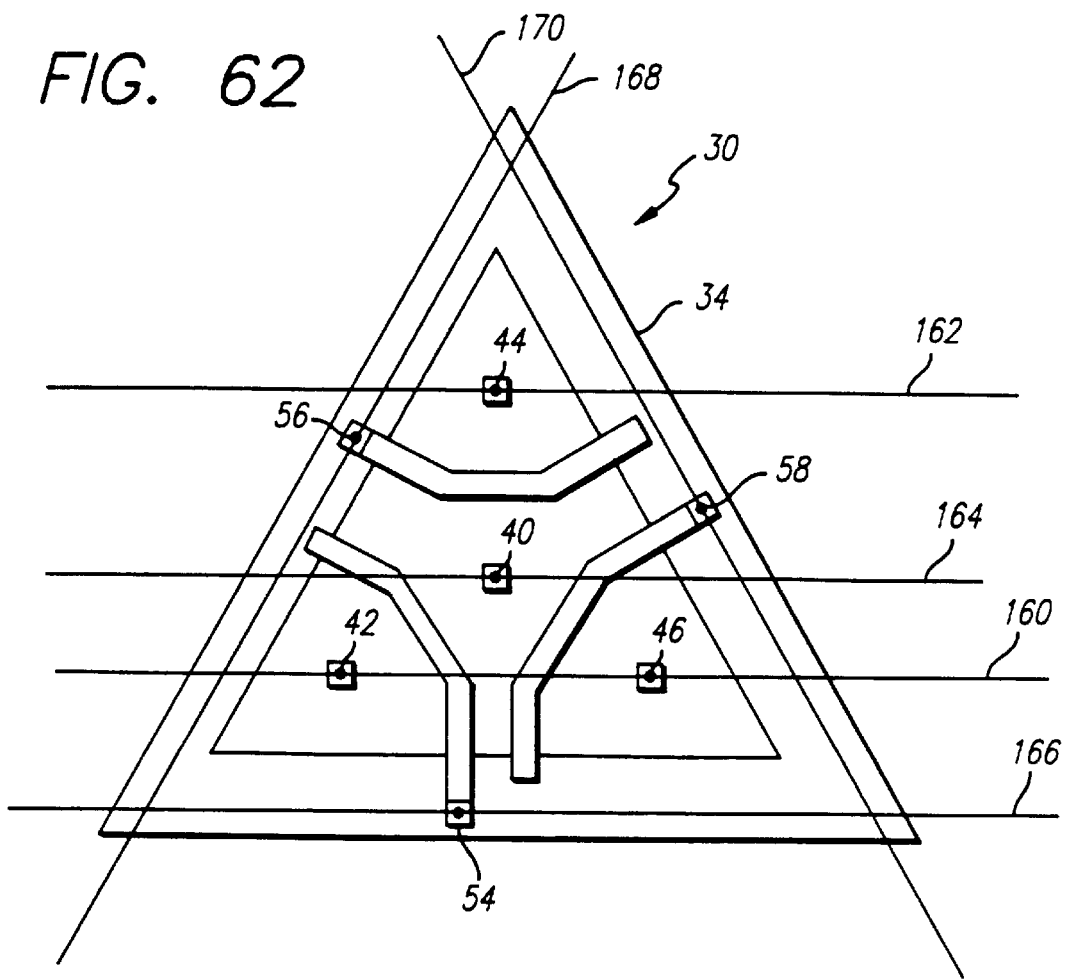
FIG. 62 is a diagram illustrating one device as connected using the three direction routing of FIG. 8.

An example of the device 30*b* as being interconnected using the hexagonal routing arrangement of FIG. 8 is illustrated in FIG. 62. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30*b*.

In the illustrated example shown in FIG. 62, a conductor 1160 which extends in the direction $e_1$ (see FIG. 8) is provided for interconnecting the terminals 42 and 46. Conductors 1162 and 1164 which also extend in the direction $e_1$ are provided for interconnection of the central terminals 44 and 40 respectively.

A conductor 1166 which extends in the direction $e_1$ is provided for interconnection of the gate terminal 54 for the input A. A conductor 1168 which extends in the direction $e_2$ provides interconnection of the gate terminal 56 for the input B, whereas a conductor 1170 which extends in the direction $e_3$ provides interconnection of the gate terminal 58 for the input C.

The conductors 1166, 1168 and 1170 are preferably provided in three separate wiring layers respectively. The conductors 1160, 1162 and 1164 are preferably provided in another wiring layer or conductive plane.

The invention is not limited to the particular arrangement of conductors illustrated in FIG. 62. For example, the conductors 1160, 1162 and 1164 can also extend in three directions which are rotated by 60° relative to each other. In such an arrangement, the conductor 1160 can extend in the direction $e_1$ together with the conductor 1166, the conductor 1162 can extend in the direction $e_2$ together with the conductor 1168, and the conductor 1164 can extend in the direction $e_3$ together with the conductor 1170.

Figure 63:
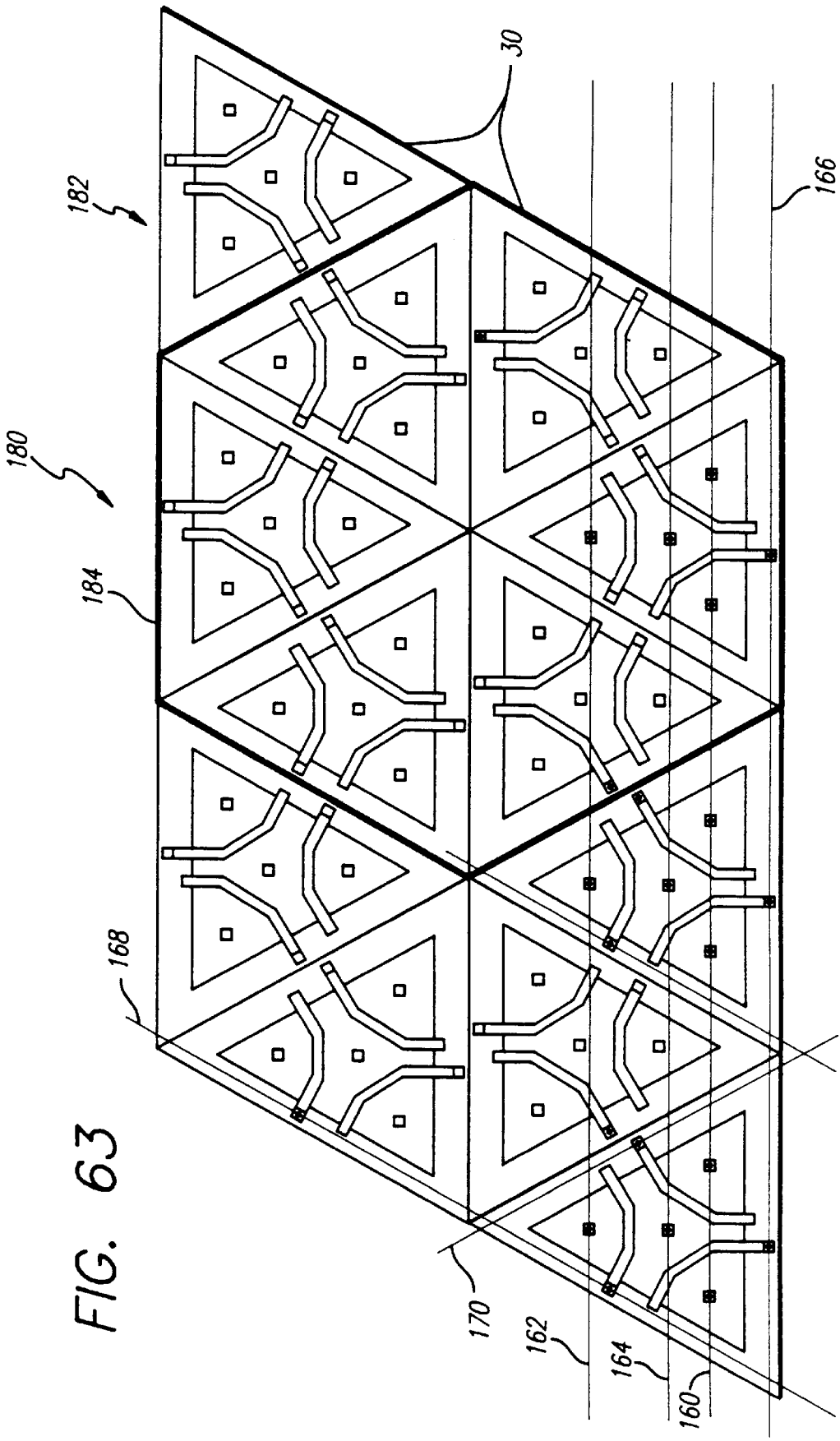
FIG. 63 is a diagram illustrating a microelectronic integrated circuit including a plurality of the present gate devices in a closely packed triangular arrangement.

FIG. 63 illustrates a microelectronic integrated circuit 1180 according to the present invention comprising a semiconductor substrate 1182 on which a plurality of the devices 30*b* are formed in a closely packed triangular arrangement. Further shown are a few illustrative examples of interconnection of the devices using the conductors 1160, 1162, 1164, 1166, 1168 and 1170 which extend in the three directions $e_1$, $e_2$ and $e_3$.

It will be noted that six closely packed devices 30*b* define a hexagonal shape having a periphery 1184. This relationship can be used within the scope of the invention to provide unit cells having hexagonal shapes defined by closely packed triangles, with internal structures similar to or different from that those which are explicitly described and illustrated. In such an arrangement, the hexagon can be considered to be the basic building block.

Figure 64:
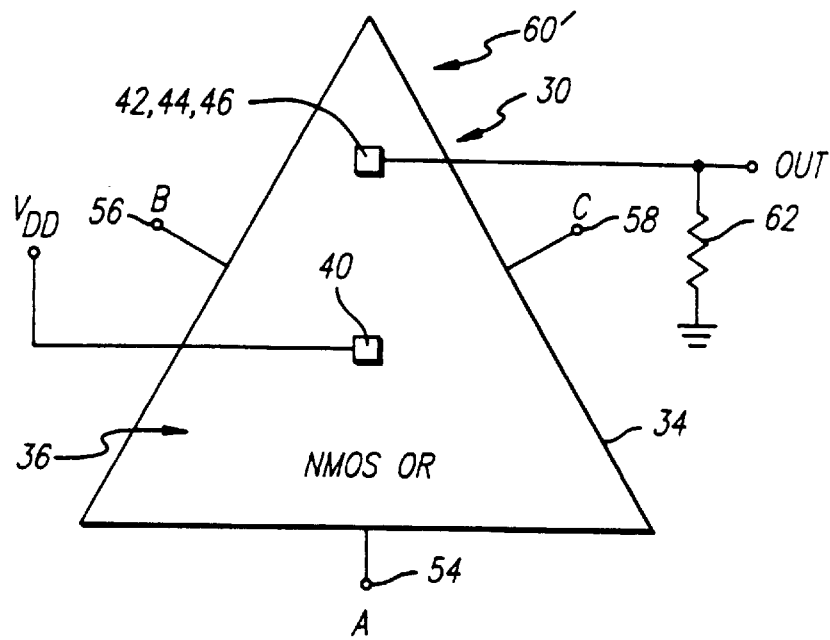
FIG. 64 is a diagram illustrating the gate device connected to provide a logical OR function with source and drain connections reversed.

FIG. 64 illustrates a modified OR gate 60' based on the device 30b which differs from the OR gate 60 of FIG. 58 in that the source and drain terminals of the device 30b are reversed relative to each other.

In this embodiment of the invention, the terminals 42, 44 and 46 constitute sources and are connected to provide the output across the pull-down resistor 62, whereas the center terminal 40 constitutes the drain and is connected to $V_{DD}$.

The operation of the OR gate 60' is otherwise similar to that of the OR gate 60. Although not explicitly illustrated, this modification is equally applicable to all other embodiments of the invention.

Figure 65:
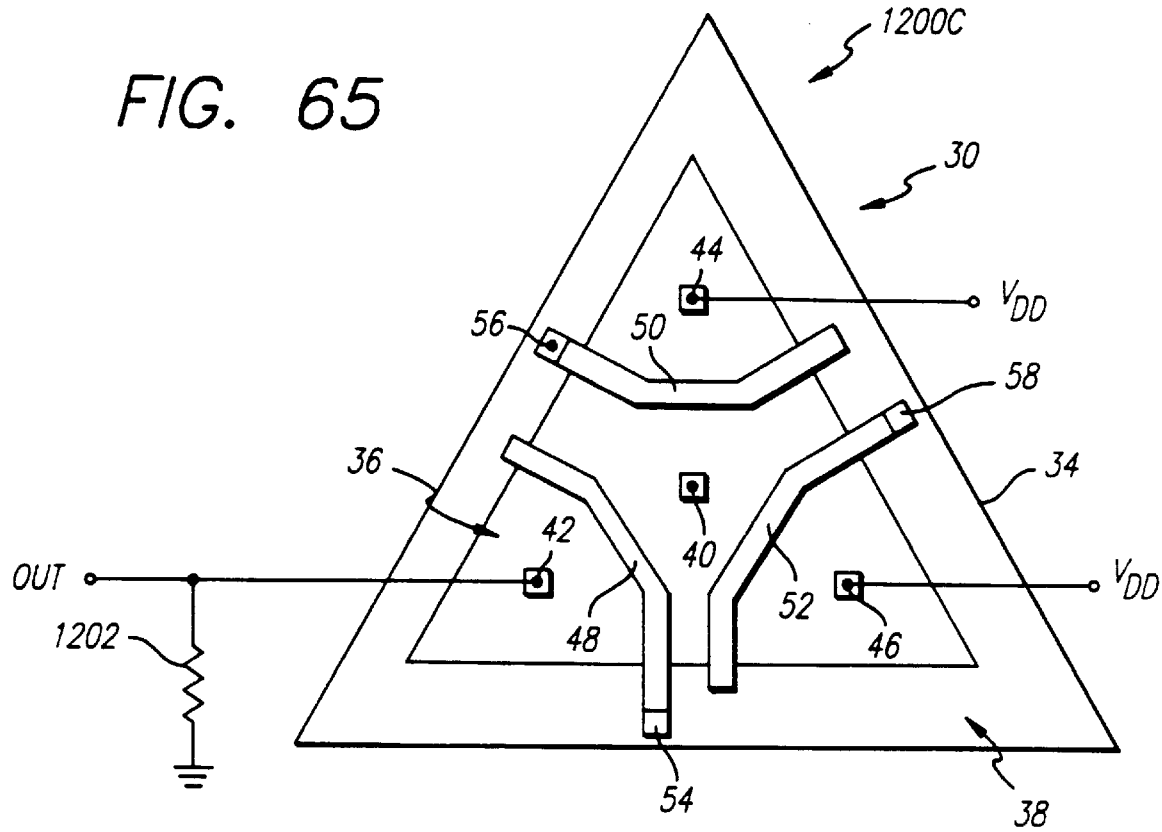
FIG. 65 is a diagram illustrating the gate device connected to provide a logical AND/OR function.
Figure 66:
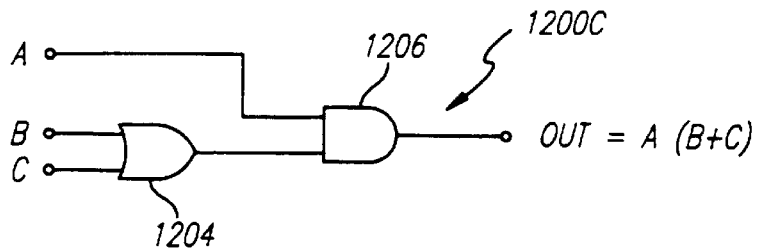
FIG. 66 is a schematic diagram illustrating the logical functionality of the device connected as shown in FIG. 65.
Figure 67:
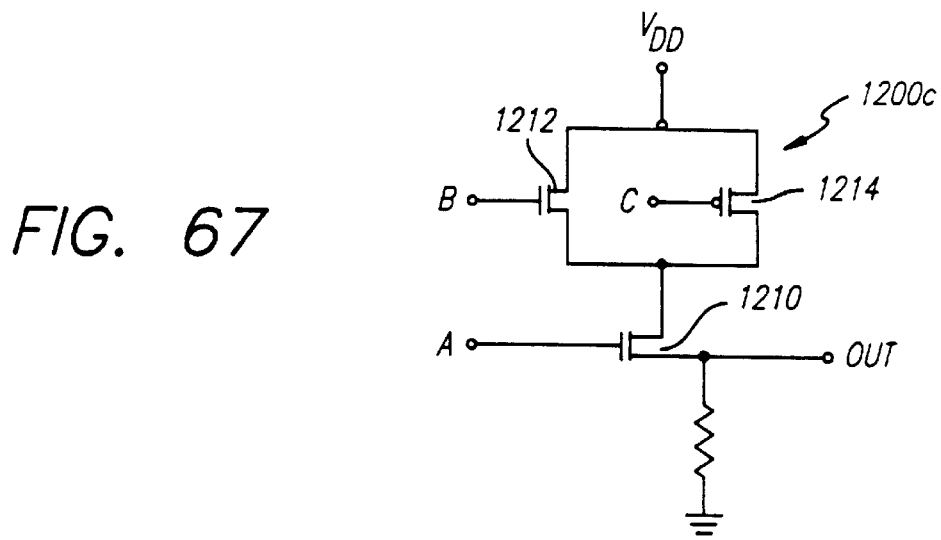
FIG. 67 is a schematic diagram illustrating how individual field effect transistors of the device are connected as shown in FIG. 65.

FIGS. 65, 66 and 67 illustrate how the connections of the device 30b can be changed to provide a different logical function. In an AND/OR gate 1200c, the central terminal 40 of the device 30b is not used, and can be physically omitted if desired.

In the gate 1200c, the second and third terminals 44 and 46 are connected to $V_{DD}$, and the output signal OUT appears at the first terminal 42 which is connected to ground through a pull-down resistor 1202.

The gate 1200c provides the logical function A(B+C). As illustrated in the equivalent circuit diagram of FIG. 66, the inputs B and C are applied to inputs of an OR gate 1204, the output of which is applied to an input of an AND gate 1206. The input A is applied to another input of the AND gate 1206, whereby the output of the AND gate 1206 is A(B+C).

Since the first gate 48 is disposed in front of the first terminal 42 which provides the output OUT, a high input must be applied to the first gate terminal 54 to enhance the channel under the gate 48 to allow current to flow to the first terminal 42 from any other part of the device 30b. This provides the function of the AND gate 1206 of FIG. 66.

Since both the second and third terminals 44 and 46 are connected to $V_{DD}$, enhancement of either of the channels under the second and third gates 50 and 52 will establish a conductive path between $V_{DD}$ and the first gate 48. Thus, a logically high signal applied to either of the second and third gate terminals 56 and 58 will connect $V_{DD}$ to the gate 48. This provides the function of the OR gate 1204 of FIG. 66.

In this manner, the output of the gate 1200c will be logically high if the input A and either of the inputs B or C is logically high, and the output of the gate 1200c will be logically low if the input A is low and/or if both of the inputs B and C are low.

The gate 1200c is illustrated in the form of equivalent FET transistors in FIG. 67. The functionality of an FET 1210 is provided by the first terminal 42 and the first gate 48 as shown in FIG. 65. The functionality of an FET 1212 is provided by the second terminal 44 and second gate 50, whereas the functionality of an FET 1214 is provided by the third terminal 46 and third gate 52.

Similar operation can be obtained by using the second terminal 44 or the third terminal 46 as the output terminal, and connecting the other terminals to $V_{DD}$. The principle is that by connecting one of the terminals to the output, the respective gate can block current flow from both of the other terminals, whereas the other two gates can block current flow only from their own respective terminals.

Figure 68:
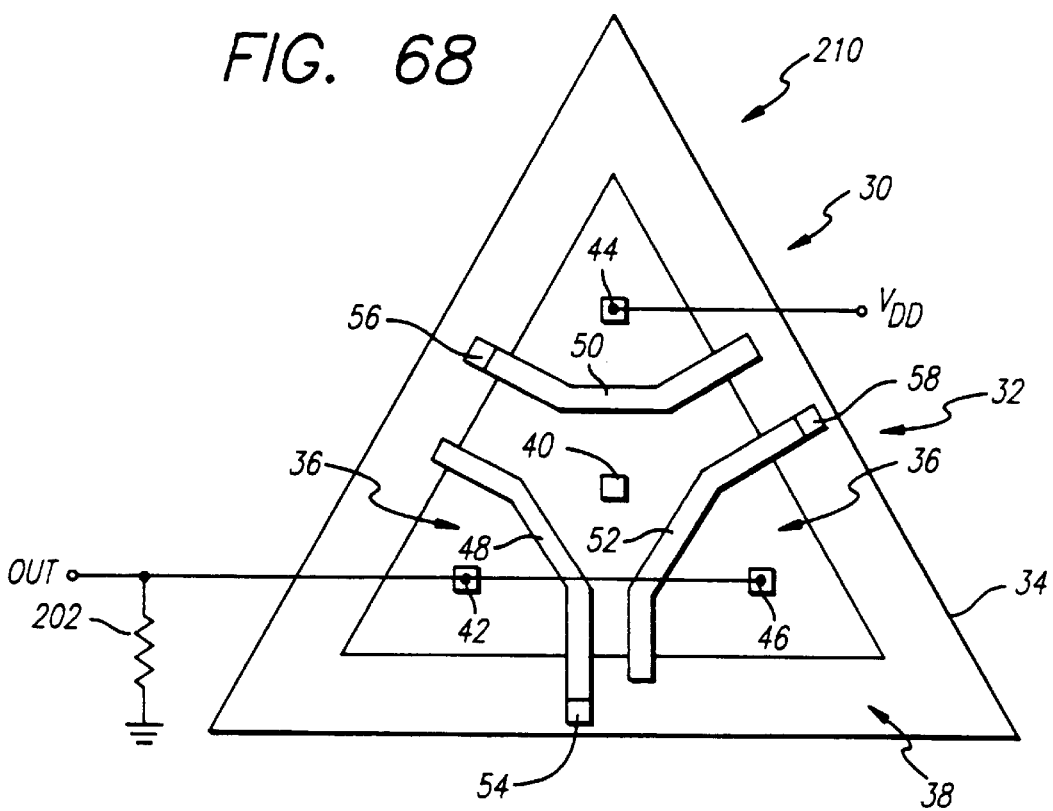
FIG. 68 is a diagram illustrating a modification of the arrangement illustrated in FIG. 65.

It is further within the scope of the invention to connect two terminals to the output as illustrated in FIG. 68. In a gate 1210, the first terminal 42 and the third terminal 46 are connected to the output, whereas the second terminal 44 is connected to $V_{DD}$.

The gate 1210 provides the logical function B(A+C), because the second gate 50 can block current flow from $V_{DD}$ to the output, whereas either of the gates 48 and 52 can establish a conductive path between the second gate 50 and the output.

Space in the present triangular OR gate device is used most efficiently in the illustrated configuration, in which the terminals are disposed adjacent to the apices of the triangle and the gate terminals are disposed adjacent to the edges of the triangle.

However, the present invention is not so limited, and it is possible to locate the terminals adjacent to the edges, and locate the gate terminals adjacent to the apices of the triangle. Other arrangements of the terminals, although not explicitly illustrated, are possible within the scope of the invention.

Alternative Embodiments Of Hexagonal Architecture

A preferred method of fabricating a microelectronic structure (such as an integrated circuit) in accordance with a combination of preferred tri-directional routing and hexagonal cell layout generally comprises superimposing a pattern of closely packed hexagons on a semiconductor substrate, and forming a plurality of microelectronic cells having terminals on the substrate. Selected terminals are interconnected in a predetermined manner with a plurality of first, second and third electrical conductors that extend in first, second and third different directions respectively. The first, second and third electrical conductors extend in directions parallel to the direction of lines that pass through points defined by centers of the hexagons, and extend perpendicular to edges of the hexagons. While this is a preferred embodiment, it should be appreciated that the routing directions may be arbitrarily oriented with respect to the layout of the hexagonal shaped cells, these two aspects of the architecture being capable of existing independently of each other.

In this manner, the electrical conductors extend in three directions that are angularly displaced from each other by 60°. However, an alternative embodiment may include an implementation having a plurality of conductors that extend in a plurality of directions that form an acute angle relative to each other.

In accordance with one aspect of the present invention, the centers of the hexagons 2030 as indicated at 2032 represent potential interconnect points for terminals of the cells. Electrical conductors for interconnecting the points 2032 extend in three directions that make angles of 60° relative to each other.

As will be described in detail below, the conductors that extend in the three directions can be formed in three different layers, or alternatively the conductors that extend in two or three of the directions can be formed in a single layer as long as they do not cross.

Figure 73:
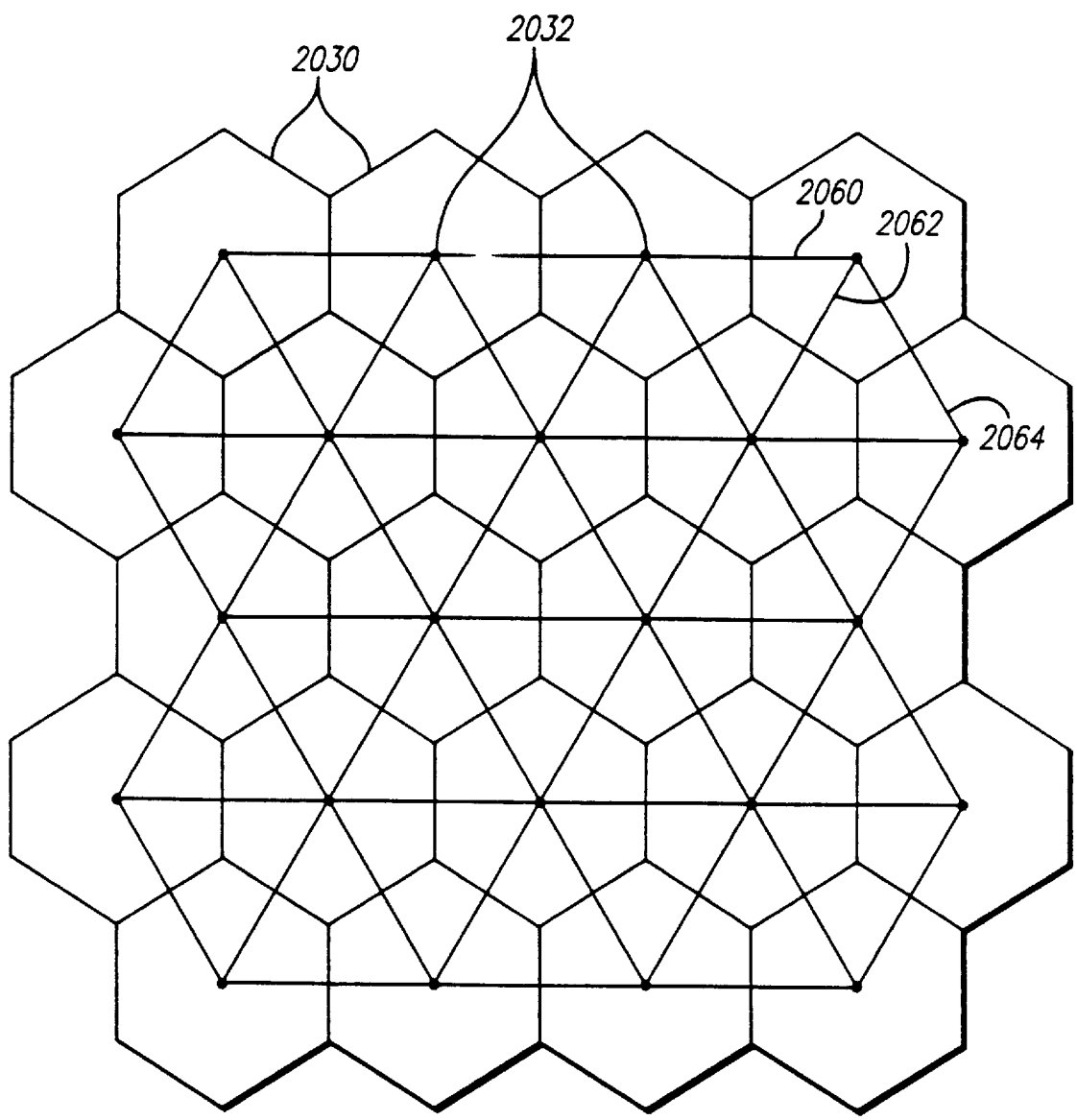
FIG. 73 is a diagram illustrating a combination of three direction routing with hexagonal geometry cells.

FIG. 73 illustrates a combination of a preferred tri-directional routing (having three layers of interconnect extending in three different directions angularly displaced from each other by 60 degrees) with closely packed hexagonal shaped cells. The centers of the hexagons 2030 or points 2032 are illustrated as all being potentially interconnected by possible paths 2060 for conductors extending in the direction $e_1$, possible paths 2062 for conductors extending in the direction $e_2$ and possible paths 2064 for conductors extending in the direction $e_3$.

Figure 74:
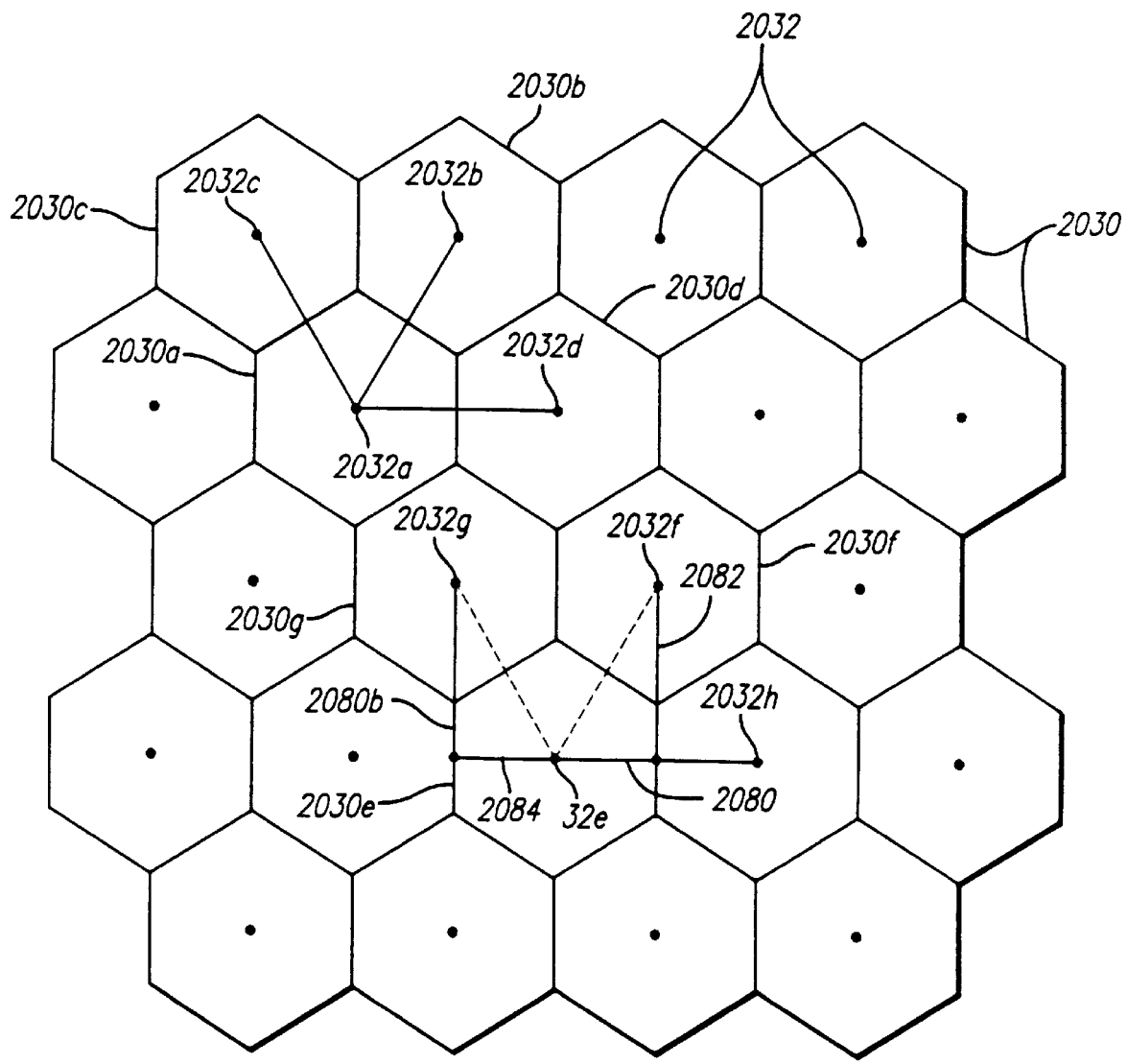
FIG. 74 is a diagram illustrating how a routing arrangement in accordance with one aspect of the present inventions may produce substantially 100% adjacent equidistant connectivity of cells.

FIG. 74 illustrates another desirable property of the present hexagonal routing arrangement in that it provides substantially 100% equidistant connectivity between adjacent cells (assuming the pins to be connected are substantially centered, or similarly located), and it provides three degrees of freedom for routing between neighboring cells.

As shown in the drawing, the distances between a center 2032a of a hexagon 2030a and centers 2032b, 2032c and 2032d of hexagons 2030b, 2030c and 2030d that are adjacent to the hexagon 2030a are all equal to one in X-Y coordinates, or 2ε. Although not explicitly illustrated, the distances between the center 2032a and the centers of the other hexagons 2030 that are adjacent to the hexagon 2030a are also one.

In this manner, the centers of all hexagons 2030 that are adjacent to a particular hexagon 2030 are all equidistant from the center of the particular hexagon 2030, and the adjacent equidistant connectivity in this example is substantially 100%.

In contrast, using conventional rectilinear routing as applied to the hexagonal cell arrangement of FIG. 74, the distance from a center 2032e of a hexagon 2030e to a center 2032h of an adjacent hexagon 2030h is one. However, the center 2032e must be connected to centers 2032f and 2032g of hexagons 2030f and 2030g by rectilinear conductors 2080, 2082 and 2084, 2086 respectively, each of the paths having a length of $0.5+\sqrt{3}/2=1.37$ which is greater than one.

Figure 75:
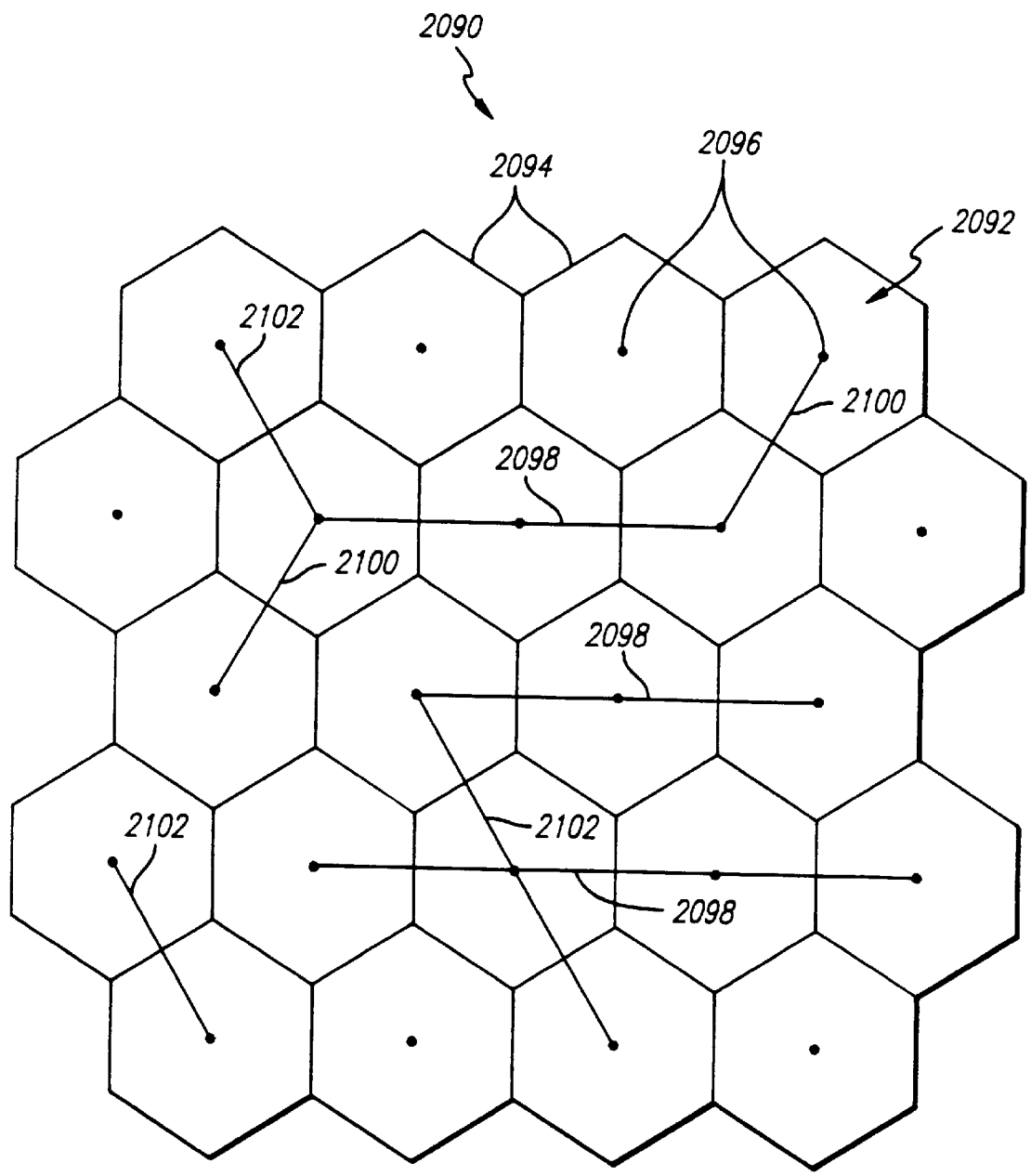
FIG. 75 is a diagram illustrating a microelectronic integrated circuit according to one aspect of the present inventions in which electrical conductors extending in three directions are formed in a single layer.

FIG. 75 illustrates an alternative embodiment, in which electrical conductors extending in three directions for interconnecting terminal points are all provided in one routing layer. In this configuration, it is necessary that the conductors extending in different directions do not cross each other, as this would cause the crossing conductors to be shorted together.

In the illustrated example, cells have hexagonal shapes that correspond to the hexagons themselves, and each cell (hexagon) has one terminal corresponding to its center or point.

More specifically, a microelectronic structure, preferably an integrated circuit as indicated at 2090, comprises a substrate 2092 on which are formed hexagonal microelectronic cells 2094 having centers that (in this example) constitute terminals 2096 for interconnection with other cells 2094. The terminals 2096 of selected cells are interconnected in a predetermined manner based on the netlist of the circuit 2090 by first electrical conductors 2098 that extend in the direction $e_1$ as described with reference to FIG. 8, second electrical conductors 2100 that extend in the direction $e_2$ and third electrical conductors 2102 that extend in the direction $e_3$.

It will be noted that no two conductors extending in different directions cross each other in this example. If two conductors extending in different directions are connected to a particular terminal 2096, the conductors are connected to each other.

The conductors 2098, 2100 and 2102 can be formed on the same layer providing a single layer interconnect for the cells 2094, or alternatively the conductor layer can be electrically insulated by providing an insulating layer between the interconnect and the cells. For example, the cells 2094 can be formed directly on the substrate 2092, and an electrically insulating layer (not shown) of, for example, silicon dioxide, can be formed over the substrate 2092 and the cells 2094. The conductors 2098, 2100 and 2102 may be then formed in a single layer over the insulating layer.

If the conductor layer is insulated from the cell layer, the conductors 2098, 2100 and 2102 may be connected to the terminals 2096 by electrically conductive feedthroughs or vias that extend through holes (not shown) in the insulating layer.

Alternatively, a plurality of metal layers may be provided, where each single layer may include interconnections in a plurality of directions angularly displaced from each other by 60 degrees.

Figure 76:
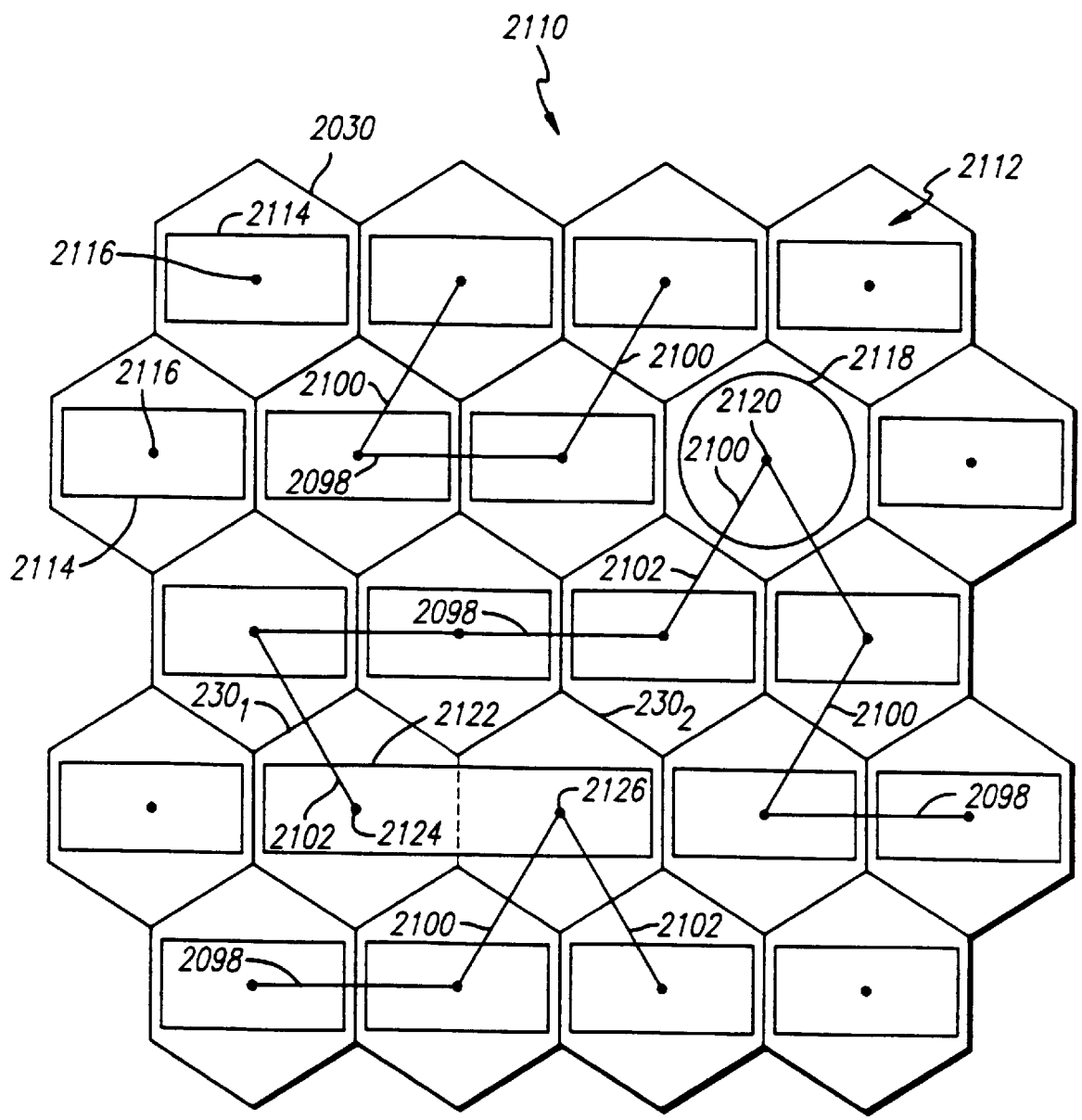
FIG. 76 is a diagram illustrating how microelectronic cells of different shapes and sizes can be accommodated using a tri-directional routing arrangement.

Whereas the cells 2094 of FIG. 75 have the same hexagonal shape as the hexagons 2030 of FIG. 8, FIG. 76 illustrates an embodiment of the invention in which the cells have shapes that are different from the hexagons 2030. In this case, the hexagons 2030 are not an actual part of the integrated circuit, but are superimposed on the circuit in an imaginary pattern to define the points and directions for the hexagonal routing conductors.

As viewed in FIG. 76, an integrated circuit 2110 comprises a substrate 2112 on which a plurality of cells are formed. Each of the cells is formed within a single hexagon 2030, or within a cluster of adjacent hexagons 2030.

As shown, the circuit 2110 comprises a plurality of rectangular cells 2114 having terminals 2116 disposed at the centers of respective hexagons 2030. Each cell 2114 is formed within a single hexagon 2030 and has a single terminal 2116.

Further illustrated is a circular cell 2118 having a center 2120. The cell 2118 is preferably inscribed in the respective hexagon 2030 to maximize the size of the cell 2118, but may be smaller if desired.

The integrated circuit 2110 further comprises a rectangular cell 2122 that is disposed within a cluster consisting of two adjacent hexagons 2030$_1$ and 2030$_2$. The cell 2122 has two terminals 2124 and 2126 located at the centers of the hexagons 2030$_1$ and 2030$_2$ respectively.

In general, as will be described in detail below, cells having terminals that are interconnected in accordance with the present hexagonal routing arrangement can have any shape, and can be formed in clusters comprising any number of adjacent hexagons 2030.

The terminals 2116, 2120, 2124 and 2126 are interconnected in a desired manner by the electrical conductors 2098, 2100 and 2102 extending in the directions $e_1$, $e_2$ and $e_3$ respectively as illustrated and described with reference to FIG. 75.

Figure 77:
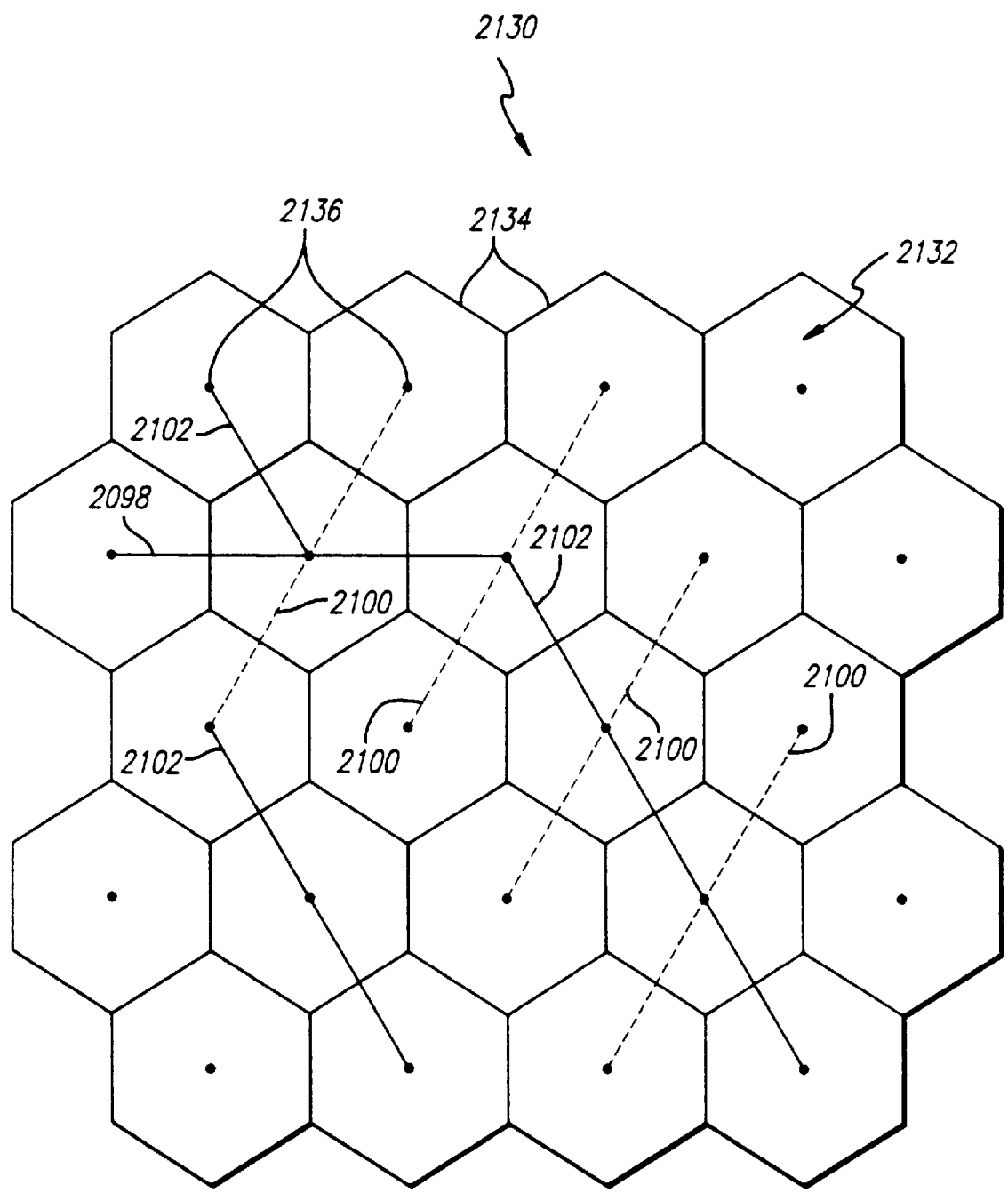
FIG. 77 is similar to FIG. 75, but illustrates an arrangement in which electrical conductors extend in two directions in one routing layer, whereas electrical conductors extend in a third direction in a second routing layer.

FIG. 77 illustrates another embodiment of the invention in which the electrical conductors extending in two directions are formed in a first layer, whereas the electrical conductors extending in the third direction are formed in a second layer that is electrically insulated from the first layer.

An integrated circuit 2130 comprises a substrate 2132 on which are formed a plurality of hexagonal shaped cells 2134 having terminals 2136. It will be noted, however, that the invention is not so limited, and that the cells 2134 can have other shapes and can occupy more than one hexagon as described with reference to FIG. 76.

In this case, the electrical conductors 2098 that extend in the direction $e_1$ and the conductors 2102 that extend in the direction $e_3$ are formed in a first layer, whereas the conductors 2100 that extend in the direction $e_2$ are formed in the second layer. An electrically insulating layer that separates the two conductor layers, as well as an optional insulating layer that separates the conductor layers from the cells 2134 on the substrate 2132, are not explicitly illustrated.

Any conductors 2098 and 2102 that are both connected to a particular terminal 2136 are thereby connected to each other. However, intermediate portions of conductors 2098, 2100 and 2102 that extend over particular terminals 2136 may or may not be connected to these terminals. If such a conductor is formed in a layer that is insulated from the cell layer and connection is desired, such can be provided by a feedthrough as described above.

Figure 78:
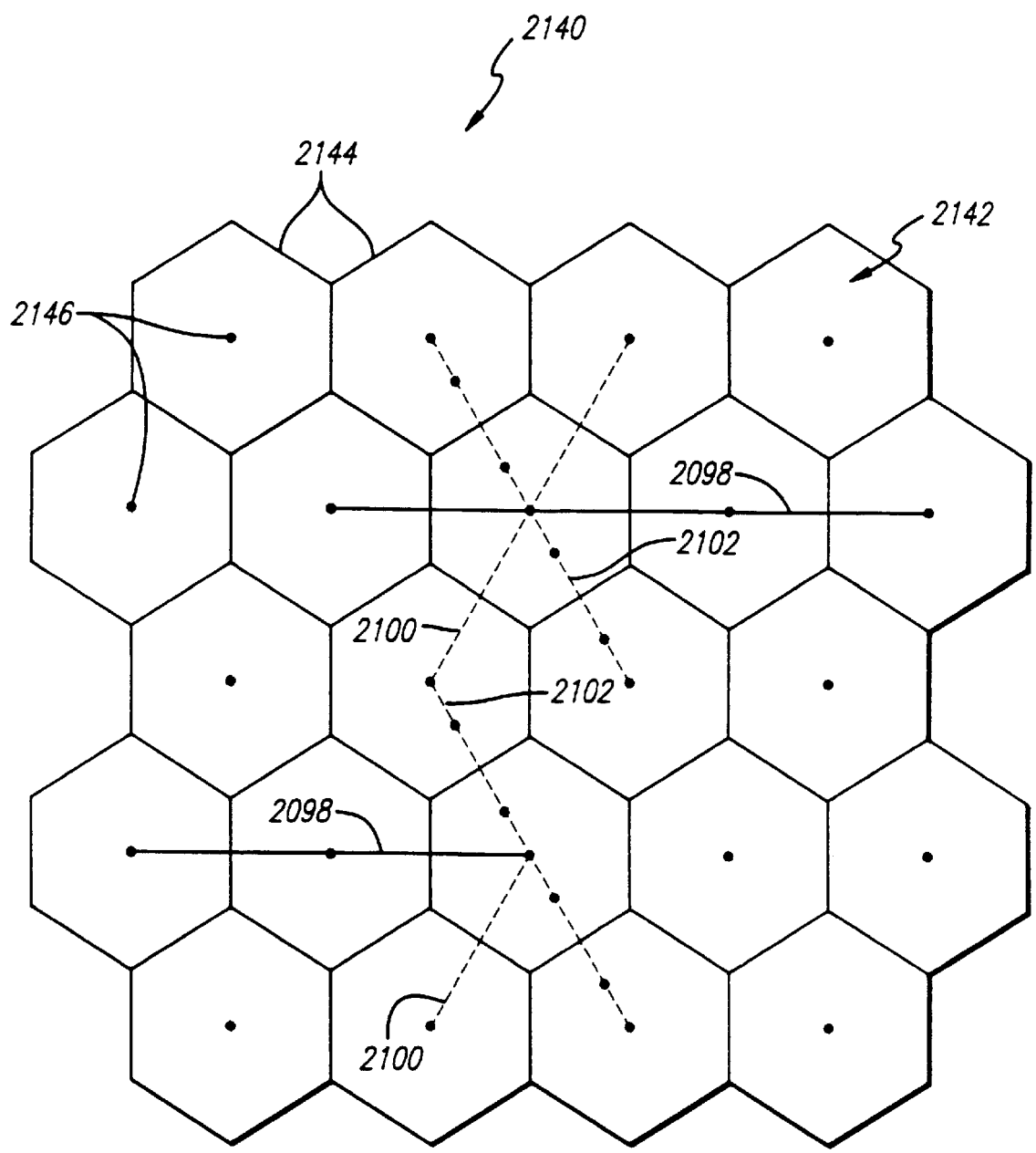
FIG. 78 is a diagram illustrating electrical conductors extending in three directions in three routing layers respectively.

FIG. 78 illustrates another embodiment in which the electrical conductors extending in the three directions are formed in three layers respectively that are electrically insulated from each other. An integrated circuit 2140 comprises a substrate 2142 having hexagonal cells 2144 having terminals 2146 are formed. Desired terminals 2146 are interconnected by the conductors 2098, 2100 and 2102, intermediate portions of which may or may not be connected to underlying terminals 2146 by feedthroughs as described above.

In the embodiment of FIG. 78, one of the layers of conductors 2098, 2100 and 2102 can be formed on the cell layer, or all of the conductor layers can be insulated from the cell layer.

Figure 79:
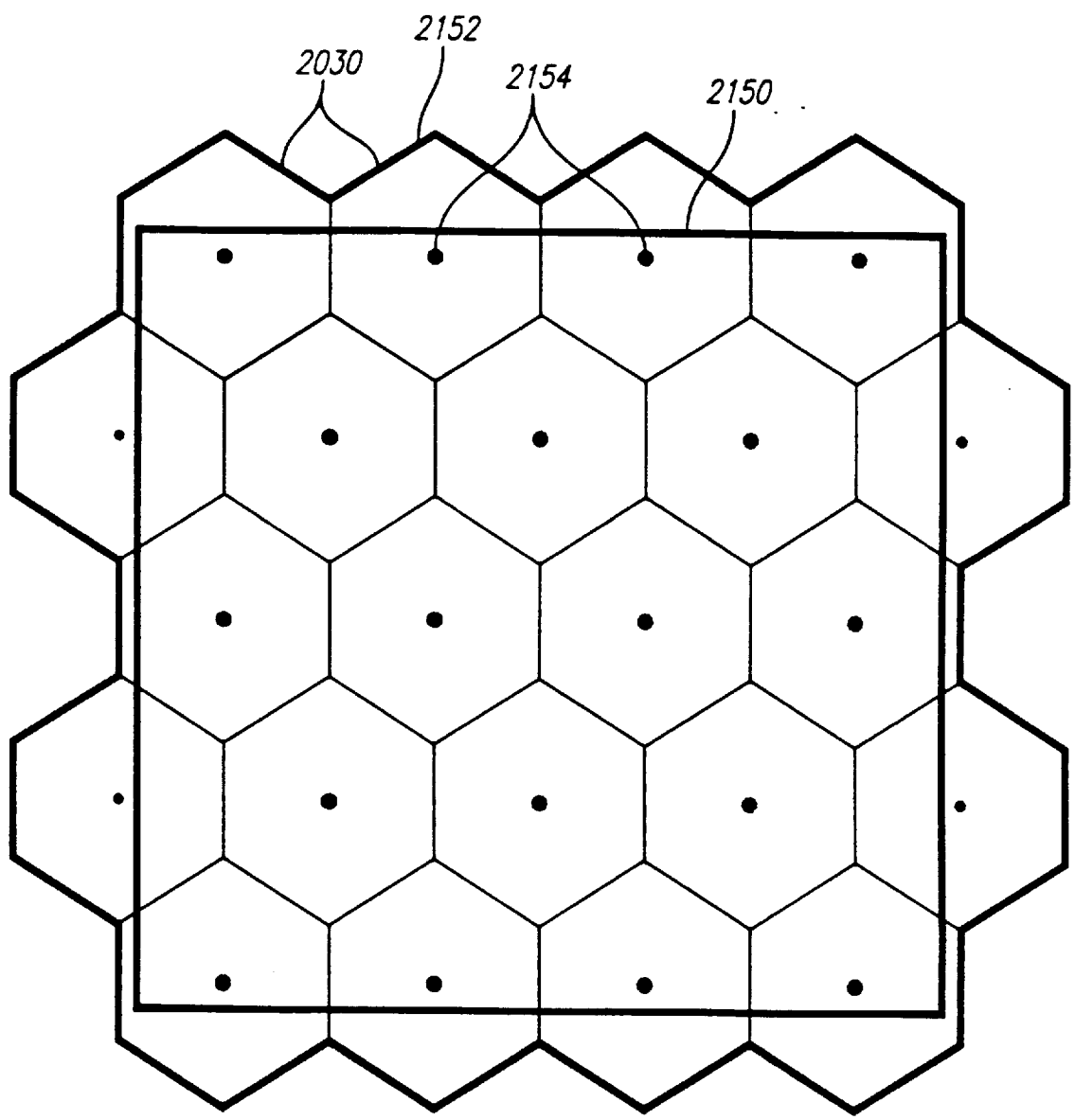
FIG. 79 is a diagram illustrating a square shaped cell formed in a cluster of hexagons superimposed on a substrate in order to provide a plurality of terminals available for routing.

As described above with reference to FIG. 76, a cell of any shape can be formed within a cluster of any number of adjacent hexagons 2030. As illustrated in FIG. 79, a square cell 2150 is formed within a cluster 2152 (as indicated in bold line) consisting of 22 adjacent hexagons 2030. The cell has 18 terminals 2154 located at centers of the corresponding hexagons.

Another advantageous feature of the present hexagonal routing arrangement is that cells of various shapes can be more closely approximated by clusters of hexagons than by rectangular shapes as in the prior art.

Figure 80:
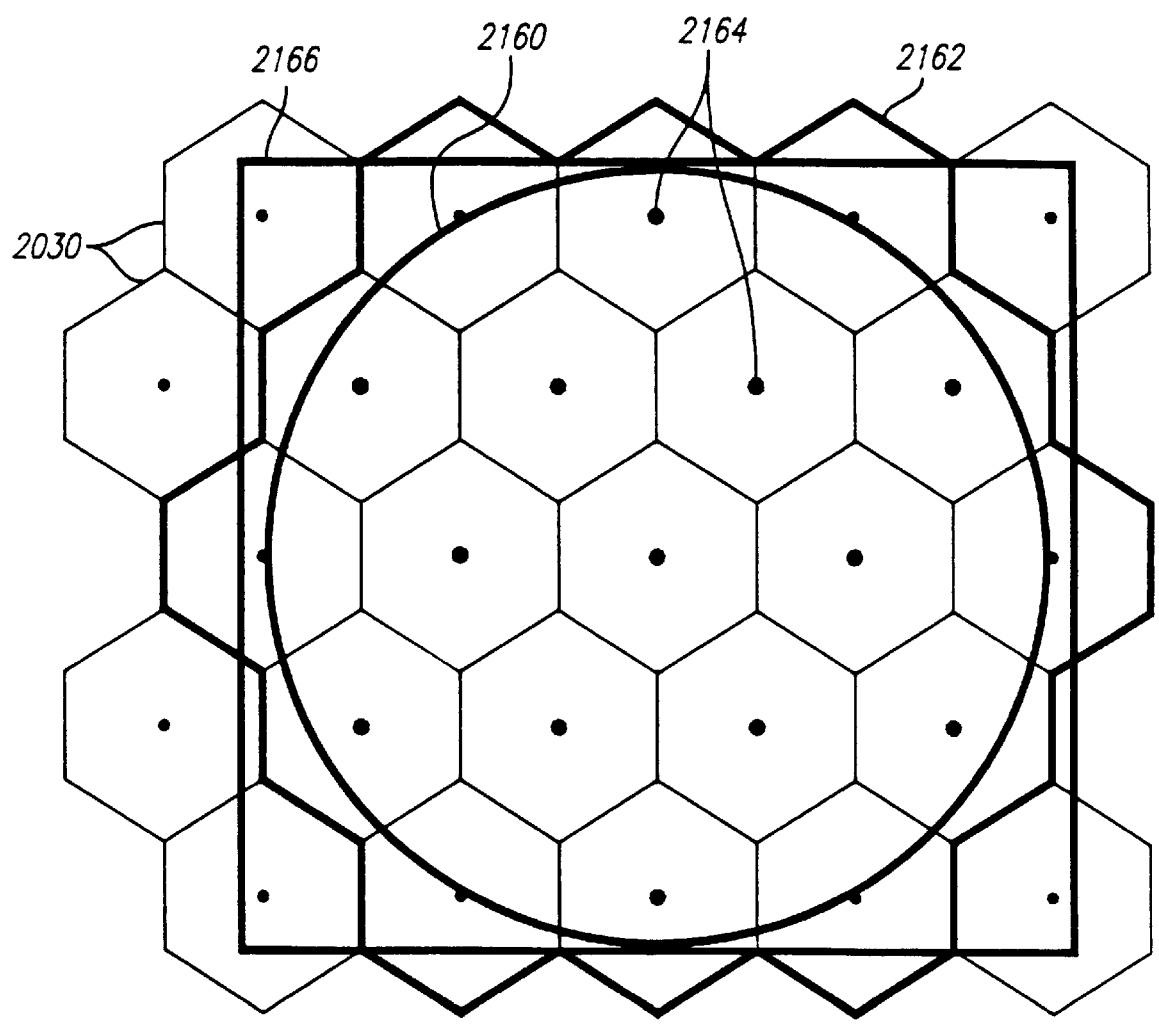
FIG. 80 is similar to FIG. 79, but illustrates a circular shaped cell.

FIG. 80 illustrates a circular cell 2160 that is formed within a cluster 2162 of 19 adjacent hexagons 2030 and has 13 terminals 2164. Further illustrated is a square 2166 that circumscribes the cell 2160 to show how the shape of the hexagonal cluster 2162 conforms more closely to the cell 2160 than does the square 2166.

Figure 81:
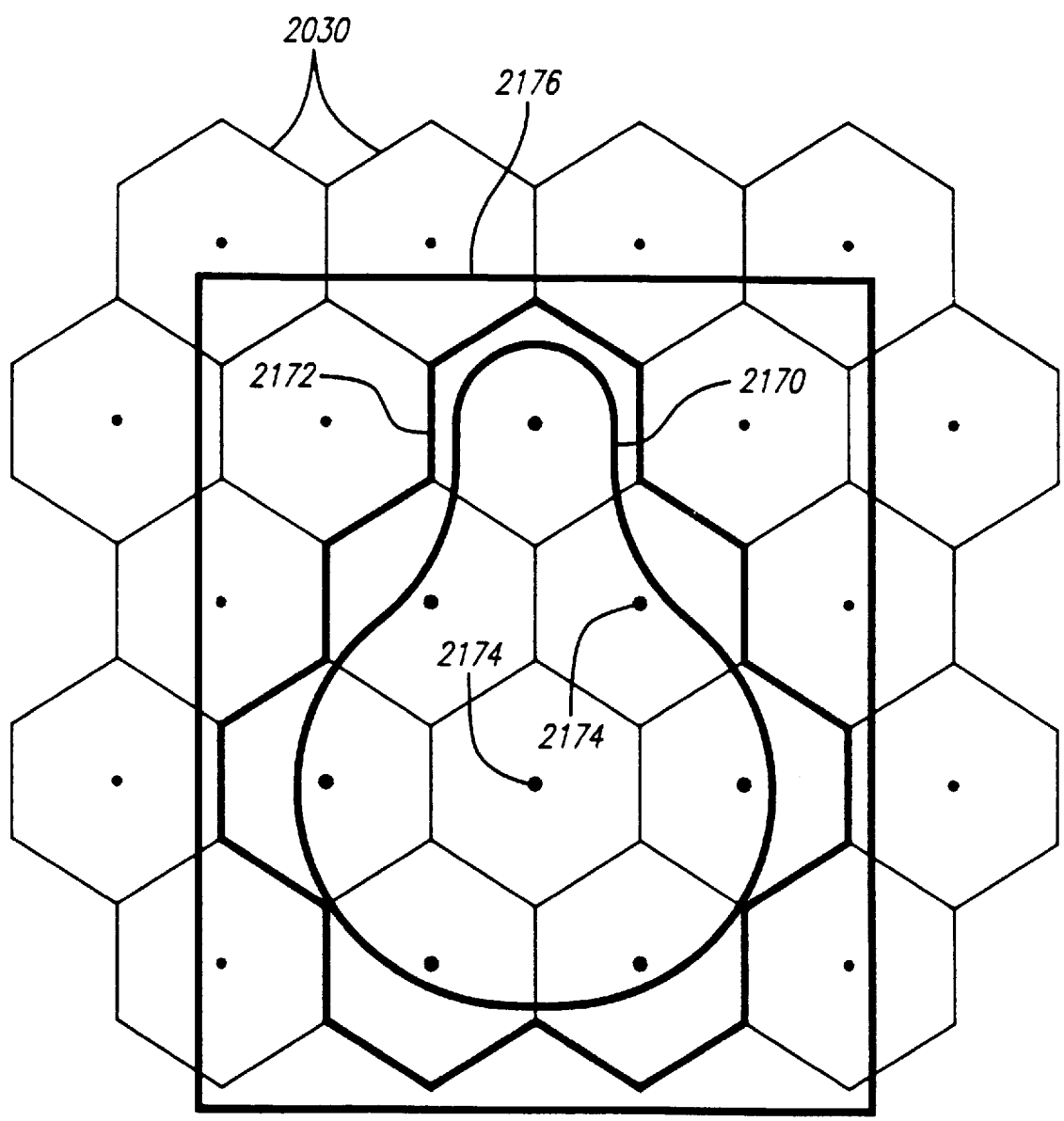
FIG. 81 is also similar to FIG. 79, but illustrates a cell having an arbitrary irregular shape.

FIG. 81 illustrates an irregular, generally gourd-shaped circular cell 2170 that is formed within a cluster 2172 of 8 adjacent hexagons 2030 and has 8 terminals 2174. Further illustrated is a rectangle 2176 that circumscribes the cell 2170 to show how the shape of the hexagonal cluster 2172 conforms more closely to the cell 2170 than does the rectangle 2176.

Figure 82:
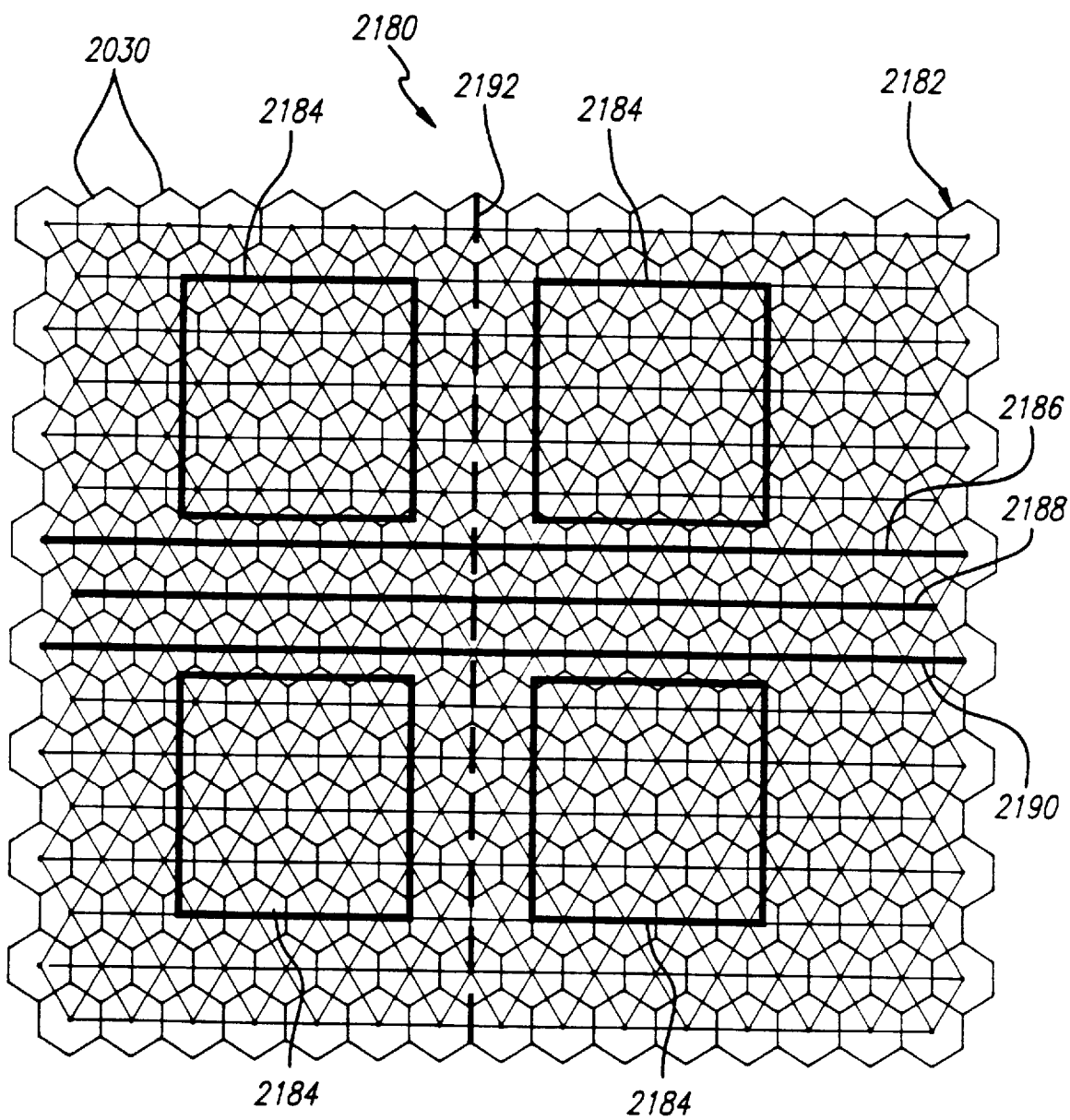
FIG. 82 is a diagram illustrating a microelectronic integrated circuit comprising a plurality of cells, and electrical conductors extending between the cells in two directions.

FIG. 82 illustrates an integrated circuit 2180 comprising a substrate 2182 on which are formed a plurality of cells 2184 similar to the cell 2150 of FIG. 79. Each cell 2184 is formed within a cluster comprising a plurality of hexagons 2030. Although not explicitly illustrated, terminals of the cells 2184 are preferably interconnected by electrical conductors extending in the three directions as described above.

The integrated circuit 2180 further comprises at least one, in the illustrated example three, electrical conductors 2186, 2188 and 2190 that extend in the direction $e_1$ through the centers of hexagons 2030 that are spaced between the upper and lower cells 2184. The conductors 2186, 2188 and 2190 may constitute, for example, power, ground and clock signal connections, and are connected, although not explicitly illustrated, to terminals in the cells 2184 by conductors extending in the directions $e_2$ and $e_3$.

The conductors 2186, 2188 and 2190 may be formed in the same layer as the other conductors in the $e_1$ layer, or may alternatively be formed over the cell in another layer that is electrically insulated from both the $e_1$ layer and the cell. It is further within the scope of the invention to provide one or more of the conductors 2186, 2188 and 2190 in the $e_1$ layer, and one or more of the other conductors 2186, 2188 and 2190 in another layer.

Although one aspect of the present invention specifically relates to providing a hexagonal routing arrangement including conductors extending in three directions that are rotated by 60° from each other, one embodiment of the invention does not preclude adding one or more conductors in additional layers. In this regard, FIG. 82 further illustrates an additional electrical conductor 2192 that extends between the left and right cells 2184 perpendicular to the direction $e_1$. The conductor 2192 is formed in a fourth layer that is electrically insulated from the other three layers in order to prevent shorting the other conductors together.

Figure 83:
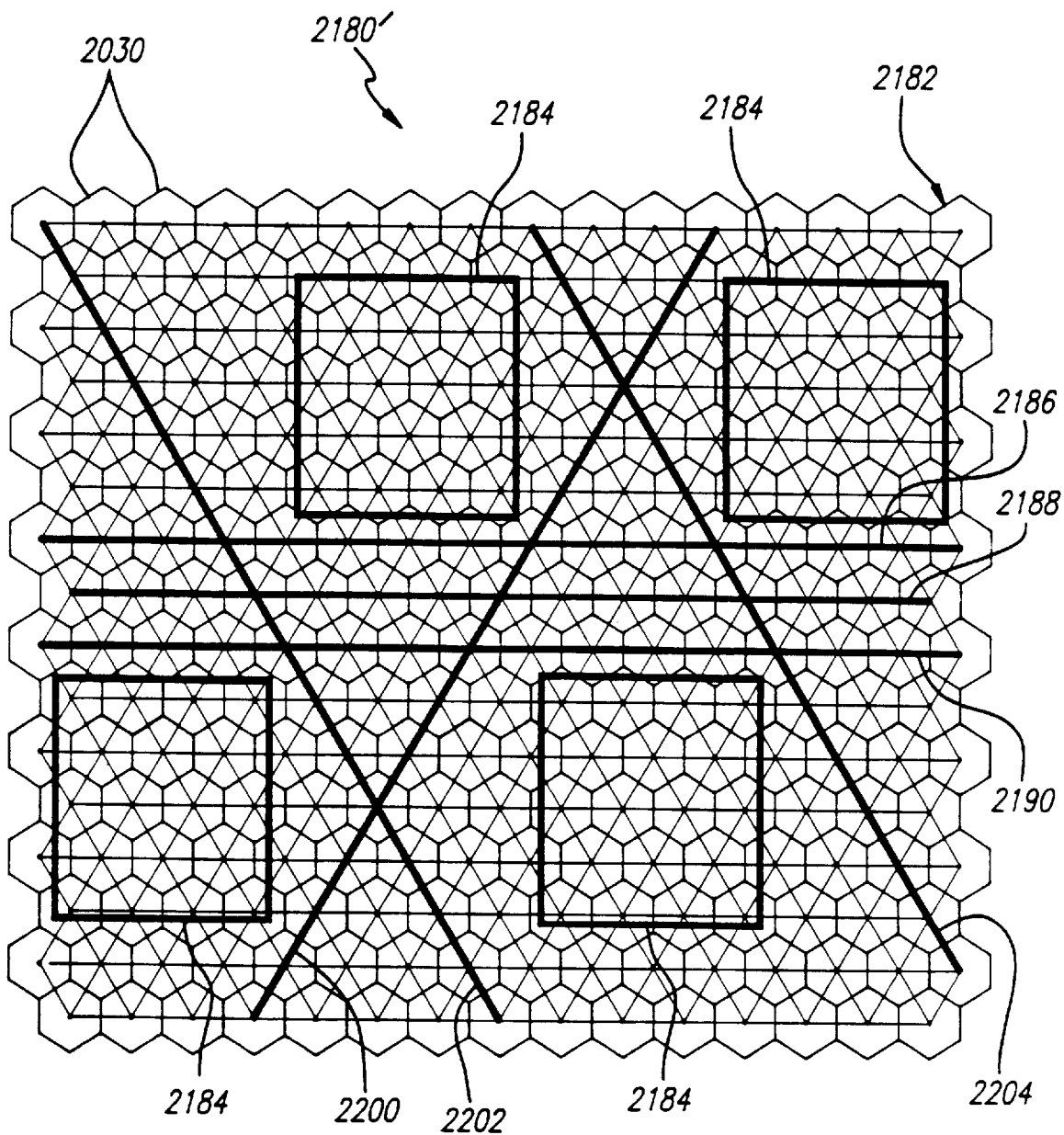
FIG. 83 is similar to FIG. 82, but illustrates electrical conductors extending in three directions between the cells.

FIG. 83 illustrates another integrated circuit 2180' embodying the present invention which is similar to the circuit 2180 of FIG. 82, and in which like elements are designated by the same reference numerals. In the circuit 2180', the upper and lower cells 2184 are staggered in the direction $e_1$ to enable a conductor 2200 that extends in the $e_2$ direction and conductors 2202 and 2204 that extend in the $e_3$ direction to be provided between the cells 2184 as illustrated. The conductors 2200, 2202 and 2204 can be provided in the same layers as the other conductors extending in the respective directions, or can be formed in separate layers and insulated from the other layers.

FIGS. 79, 80 and 81 illustrate how various cells having any essentially arbitrary shape can be provided within a hexagonal architecture. FIGS. 85 to 88 illustrate how megacells can be advantageously defined by clusters of hexagonal shaped cells. In the illustrated example, the megacells have serrated edges that tile well such that adjacent cells fit together exactly, thereby eliminating spaces between adjacent megacells and enabling substantially 100% utilization of space by the cells on the substrate.

Figure 84:
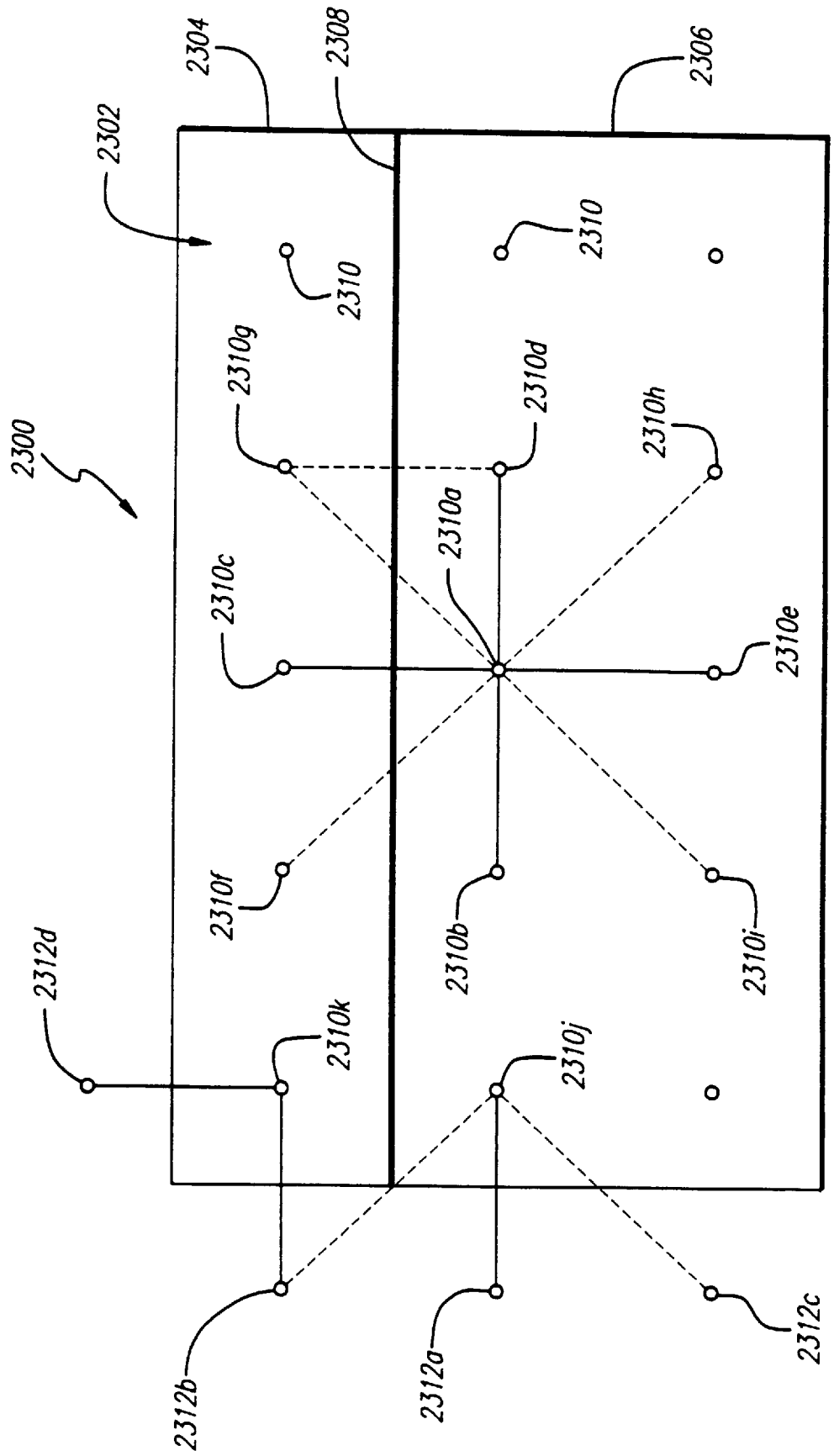
FIG. 84 is a diagram illustrating adjacency relationships in a prior art microelectronic integrated circuit arrangement.

For purposes of comparison, FIG. 84 illustrates a prior art integrated circuit 2300 including a substrate 2302 on which are formed first and second rectangular cells 2304 and 2306, respectively, that share a common edge or border 2308. The cells 2304 and 2306 are formed in a conventional rectangular arrangement and include interconnect pins or terminals 2310.

The rectilinear distances from an exemplary terminal 2310a to rectangularly adjacent terminals 2310b, 2310c, 2310d and 2310e are equal. However, the rectilinear distances from the terminal 2310a to diagonally adjacent terminals 2310f, 2310g, 2310h and 2310i are longer than the distances from the terminal 2310a to the rectangularly adjacent terminals 2310b, 2310c, 2310d and 2310e.

Assuming that the vertical and horizontal spacings between the terminals 2310 are equal, the rectilinear distances from the terminal 2310a to the diagonally adjacent terminals 2310f, 2310g, 2310h and 2310i will be twice as long as the rectilinear distances between the terminal 2310a to rectangularly adjacent terminals 2310b, 2310c, 2310d and 2310e.

For this reason, the adjacent equidistant connectivity of terminals in the illustrated prior art rectilinear arrangement is 50%. This ratio may be lower for connections to external terminals. For example, the rectilinear distances from a terminal 2310j at an edge of the circuit 2300 to diagonally adjacent external pins or terminals 2312b and 2312c is twice as long as to a rectangularly adjacent external terminal 2312a, such that the adjacent equidistant connectivity is 33.3%. It will be noted, however, that the distances from a terminal 2310k at a corner of the circuit 2300 to rectangularly adjacent external terminals 2312b and 2312d on the adjacent edges that share the corner are equal.

In addition, the rectilinear distances between each terminal and its diagonally adjacent terminals is twice as long as between the terminal and its rectangularly adjacent terminals. If three directional routing were applied to the arrangement of FIG. 84 such that diagonally adjacent terminals were connected by diagonal interconnects extending at 45° angles to the rectilinear directions, the lengths of the diagonal interconnects would be √2=1.41 times longer than rectilinear interconnects between rectangularly adjacent terminals.

Figure 85:
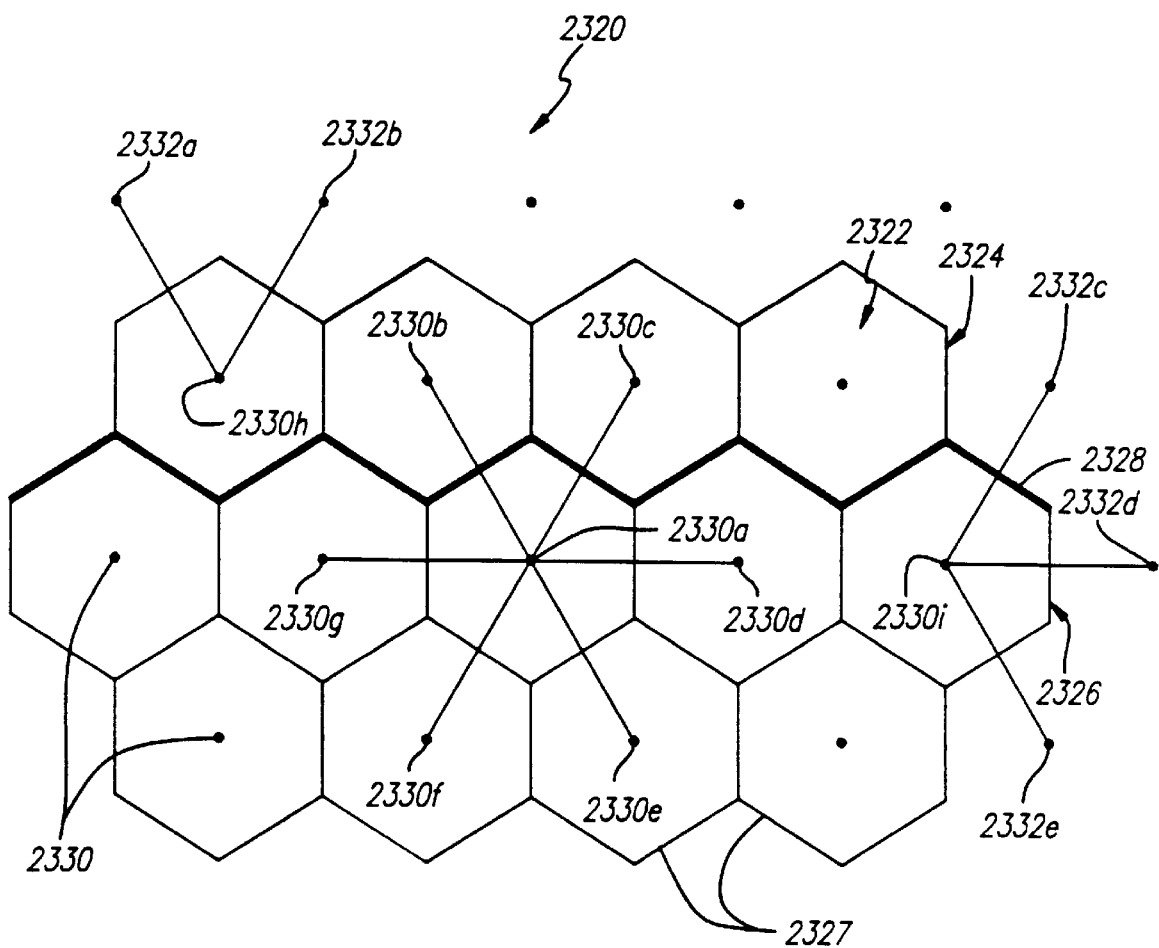
FIG. 85 is similar to FIG. 85, but illustrates adjacency relationships in a microelectronic integrated circuit arrangement using hexagonal shaped cells.

FIG. 85 illustrates an integrated circuit 2320 according to an alternative embodiment of the present invention including a substrate 2322 on which are formed first and second cells 2324 and 2326 respectively that are defined by clusters of hexagons 2327 and share a common edge or border 2328 having a serrated shape. The cells 2324 and 2326 include interconnect pins or terminals 2330 that are located in the illustrated example at the centers of the hexagons 2327.

The distances from a terminal 2330a to all of the six adjacent terminals 2330b, 2330c, 2330d, 2330e, 2330f and 2330g are equal in this example, providing 100% equidistant connectivity. Since each terminal 2330 has adjacent equidistant connectivity to six terminals, as compared to four terminals in the prior art arrangement of FIG. 84, in this example using a hexagonal cell arrangement, an increase of 50% is provided in adjacent equidistant connectivity over the illustrated prior art example.

The 100% adjacent equidistant connectivity in accordance this embodiment may also be valid for connections to external pins or terminals in some instances. As illustrated, the distances between a terminal 2330h and two adjacent external terminals 2332a and 2332b above the upper edge of the cell 2324 are equal. Similarly, the distances between a terminal 2330i and external terminals 2332c, 2332d and 2332e adjacent to the right edge of the cells 2324 and 2326 are equal.

Figure 86:
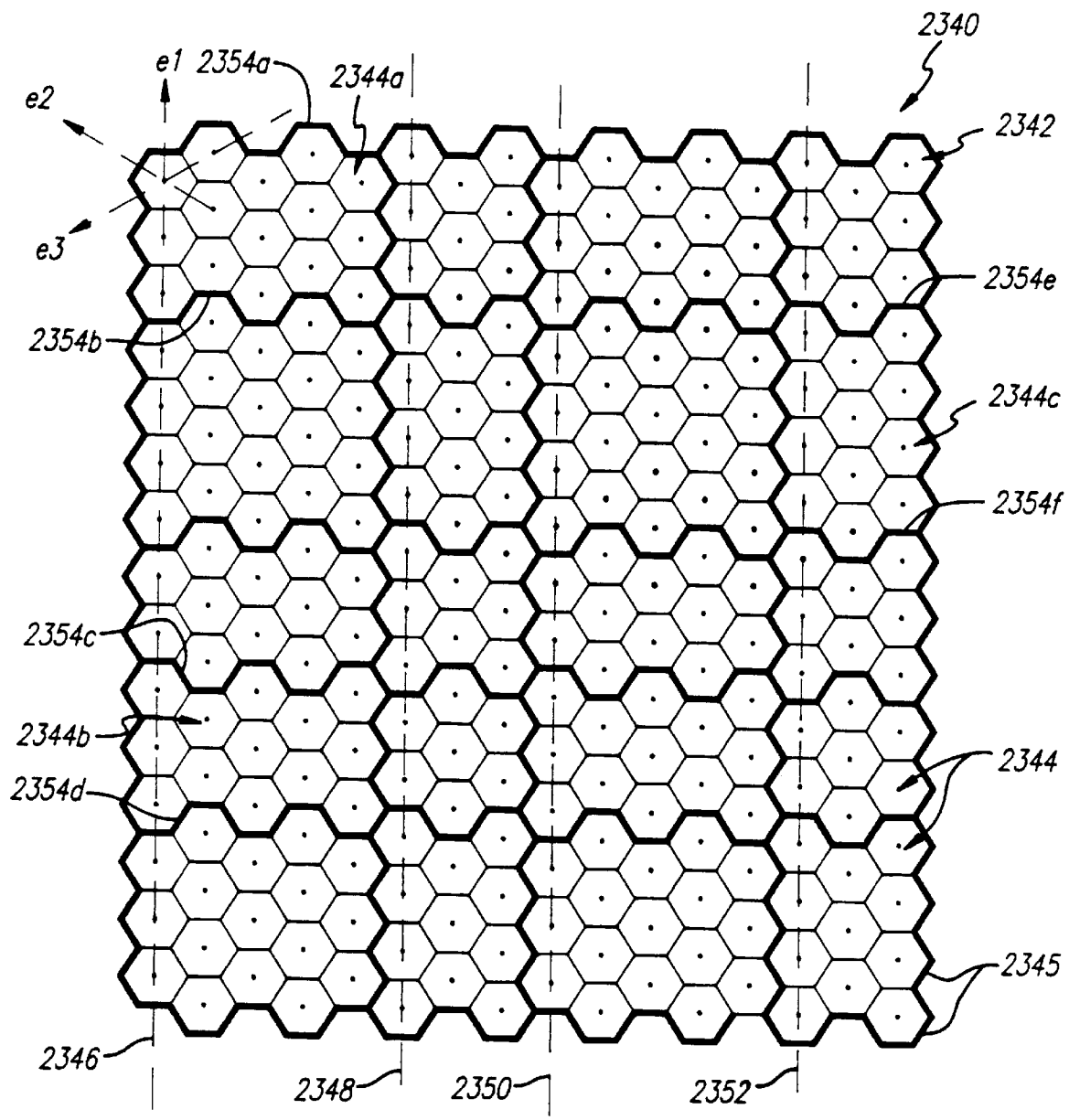
FIG. 86 is a diagram illustrating a microelectronic integrated circuit comprising cells defined by clusters of hexagons, with each cell having four serrated edges.

FIG. 86 shows how hexagonal shaped cells may form generally rectangular megacells in accordance with the illustrated example having serrated edges defined by edges of hexagons.

The arrangement of FIG. 86 is advantageous for an application in which cells are arranged in columns, such that the cells in each column have the same width. The three directional coordinate has been rotated counterclockwise by 90° from the orientation of FIG. 8 such that the $e_1$ direction is vertical.

As illustrated in FIG. 86, an integrated circuit 2340 comprises a substrate 2342 on which are formed a plurality of microelectronic cells 2344, each being defined by clusters of hexagons 2345. The cells 2344 fit together perfectly such that adjacent serrated edges thereof are congruent, enabling 100% utilization of space on the substrate with 100% adjacent equidistant connectivity between terminals.

The example of FIG. 86 includes four columns of cells 2344, although this is merely exemplary. The columns can have equal width, or different widths as illustrated. The $e_1$ direction is parallel to the column direction, thereby enabling power and ground busses to be easily connected to all of the cells in a particular column as indicated by lines 2346, 2348, 2350 and 2352.

In order to fit together congruently, adjacent edges of cells should have opposite "geometric sense". For the purpose of the present disclosure, the term "geometric sense" is defined to mean that a serrated edge with one geometric sense, e.g. male, has a shape that is conjugate to a serrated edge with the opposite geometric sense, e.g. female. In colloquial terms, the male edge has "zigs" where the female edge has "zags", and vice-versa.

Using the line 2346 as a reference, for example, upper and lower edges 2354a and 2354b of a cell 2344a are defined as having "female" and "male" geometric sense because the line 2346 passes through concave and convex portions of the edges 2354a and 2354b respectively.

A cell 2344b has upper and lower male edges 2354c and 2354d because the line 2346 passes through convex portions thereof. An exemplary cell 2344c having male and female upper and lower edges 2354e and 2354f through which the line 2352 passes respectively is also illustrated.

The male and female edges differ from each other only in that they are shifted horizontally by one cell pitch (S=√3/2= 0.87) relative to each other. In order for two cells to be vertically adjacent and joined at congruent edges, their congruent edges must have opposite geometric sense. The same relation is true in the orthogonal direction. In general, a cell 2344 with four serrated edges can have $2^4=16$ combinations of edges.

Although an arrangement is illustrated in FIG. 86 in which the $e_1$ direction is vertical to enable power and ground routing parallel to the column direction, it is of course within the scope of the illustrated embodiment to rotate the coordinate system by 90° so that the $e_1$ direction is horizontal and runs parallel to the row direction. This would enable cells to be arranged in rows, rather than in columns as illustrated.

If cells are arranged in columns, they may have equal widths (within each column) and can have equal or unequal heights. If cells are arranged in rows, they may have equal heights and can have equal or unequal widths.

An advantageous configuration using one aspect of the present invention is one in which the cells are closely packed on the substrate with 100% space utilization, and the routing interconnects are provided in three layers that are electrically insulated from each other and from the cells on the substrate. However, the invention is not necessarily limited to this or any of the exemplary configurations that are explicitly described and illustrated.

Figure 87:
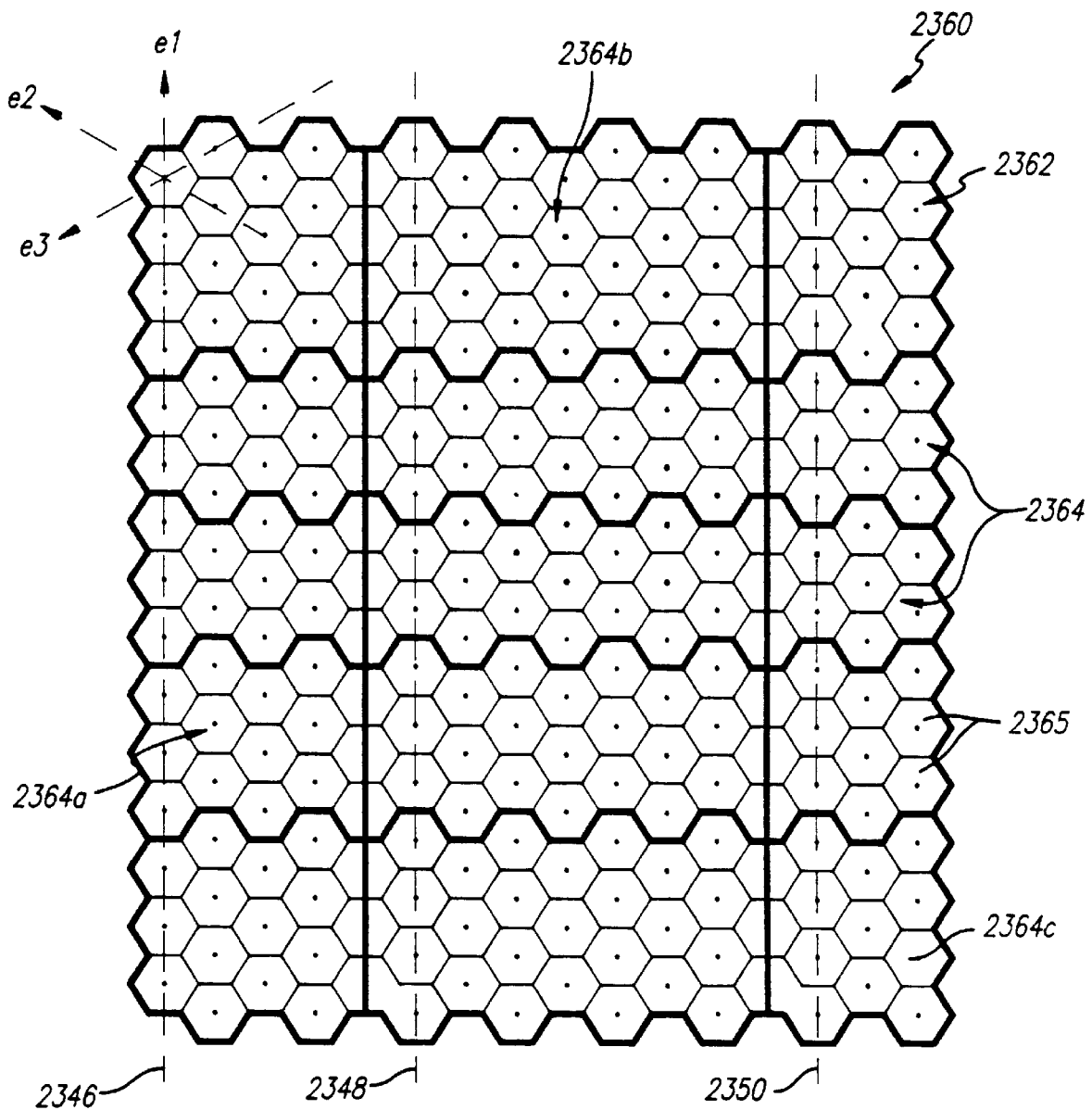
FIG. 87 is similar to FIG. 86, but illustrates cells having two serrated edges and one or two straight edges.

It is not necessary for all of the edges of a cell to be serrated and defined by edges of hexagons. FIG. 87 illustrates an integrated circuit 2360 comprising a substrate 2362 on which are formed cells 2364 having upper and lower serrated edges as described above with reference to FIG. 86. However, the cells 2364 have at least one vertical edge that is straight and not defined by edges of hexagons 2365. For example, a cell 2364a has a serrated left edge and a straight right edge, a cell 2364b has straight right and left edges and a cell 2364c has a straight left edge and a serrated right edge.

The number of possible edge configurations for the cells of FIG. 87 is $2^2=4$ for cells 2364 having two straight edges, and $2^3=8$ for cells 2364 having one straight edge.

Figure 88:
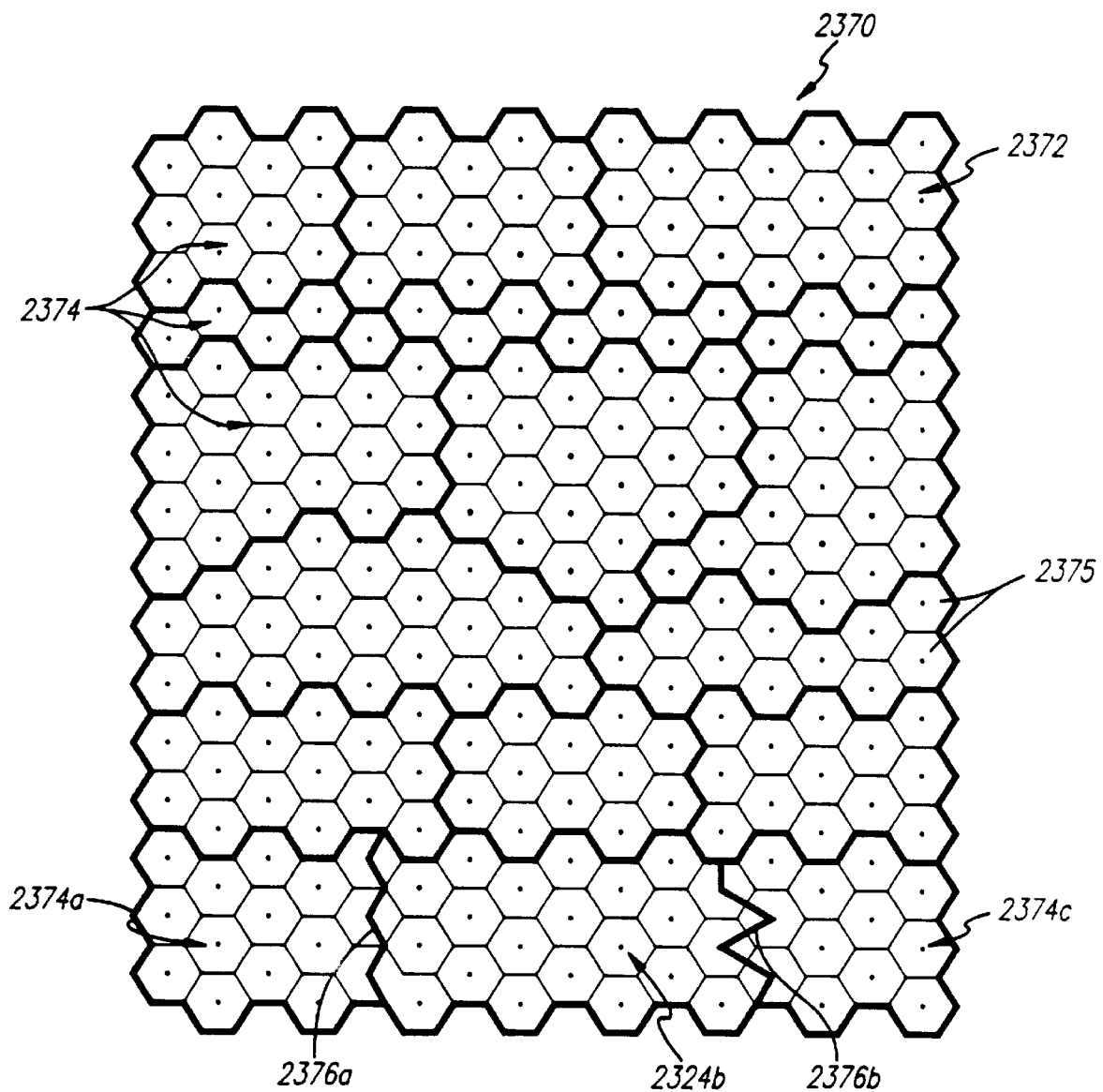
FIG. 88 is also similar to FIG. 86, but illustrates cells having irregular shapes with serrated edges.

It is further not necessary for a cell to have any regular shape. FIG. 88 illustrates an integrated circuit 2370 comprising a substrate 2372 having cells 2374 formed thereon that have highly irregular shapes. The cells 2374 are illustrated as being closely packed to provide 100% space utilization, although the scope of the invention includes providing spaces and/or routing tracks between cells.

Most of the illustrated cells 2374 have all of their edges defined by edges of hexagons. However, the circuit 2370 further comprises a cell 2374a having a right edge 2376a that is not defined by edges of hexagons 2375 and is not straight. The right edge 2376a of the cell 2374a is congruent with the left edge of a cell 2374b, which has an irregular right edge 2376b that is congruent with the left edge of a cell 2374c.

The freeform cell capability of FIG. 88 can be advantageously utilized in an application where a cell can be designed with a given functionality but have a shape that is variable within specified parameters. If, for example, an initial placement of regularly shaped cells produces an unroutable design with irregularly shaped gaps therein, the freeform design can be employed to generate cells that can fill the gaps and provide the required functionality and routability.

Figure 89:
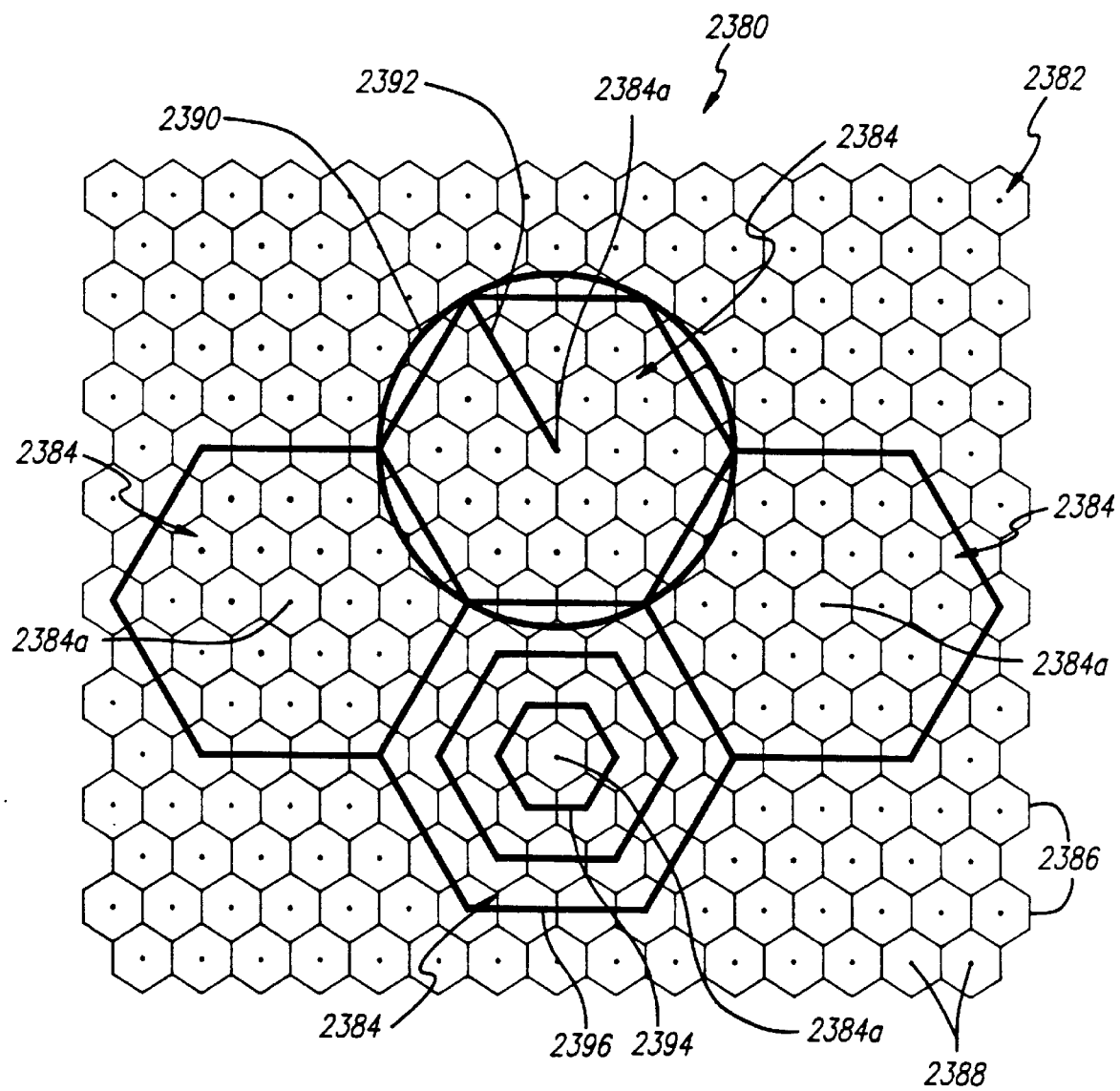
FIG. 89 is a diagram illustrating closely packed hexagonal cells with terminals at centers of smaller hexagons disposed inside the cells.

FIG. 89 illustrates another integrated circuit 2380 which comprises a substrate 2382 having a plurality of closely packed cells 2384 formed thereon. The cells 2384 are hexagonal in shape and have centers 2384a.

A three directional routing grid for the cells 2384 may be provided by superimposing a pattern of smaller hexagons 2386 having centers 2388 on the substrate 2382, where in this example the centers 2388 define locations for terminals of the cells 2384. In this example, the pattern of small hexagons 2388 is aligned with the cells 2384 such that the centers 2384a of the cells 2384 are coincident with centers 2388 of the hexagons 2386.

The small hexagons 2386 have dimensions that are integral fractions of selected dimensions of the cells 2384. In the illustrated example, a circle 2390 that circumscribes one of the cells 2384 has a radius 2392 that is three times the distance between the centers 2388 of adjacent hexagons 2386. However, the sizes of the cells 2384 can be related to the sizes of the hexagons 2388 in different ways. For example, cells 2394 and 2396 are illustrated that are circumscribed by circles (not shown) having radii that are equal to one and two times the distance between the centers 2388 of the small hexagons respectively. The size relationship between the cells 2384 and the hexagons 2386 can also be defined by ratios of edge lengths, inscribed circles and other dimensions in various combinations.

To facilitate the design of an integrated circuit, it is advantageous to provide a library including sets of cells having the same functionality but different shapes. This enables a cell having the required functionality to be placed in slots of different shapes on a substrate.

Figure 90:
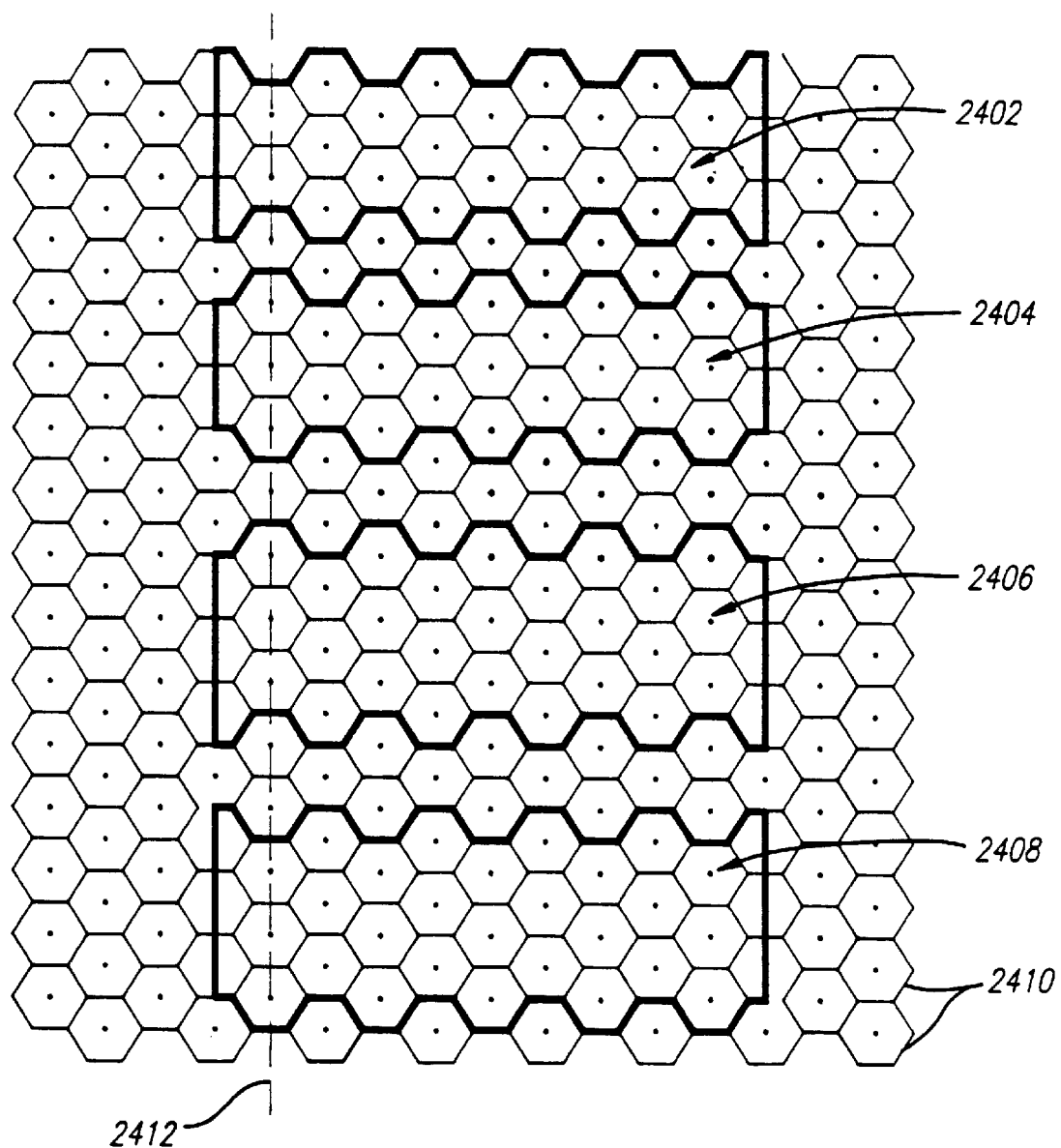
FIG. 90 is a diagram illustrating a set of functionally similar cells having different edge shapes.

Such a set 2400 is illustrated in FIG. 90, and comprises four cells 2402, 2404, 2406 and 2408 having the same predetermined functionality. The cells 2402, 2404, 2406 and 2408 are generally rectangular in shape, and each have upper and lower serrated edges defined by edges of a superimposed pattern of hexagons 2410, and straight left and right edges. It will be noted that the cells 2402, 2404, 2406 and 2408 are defined by different numbers of hexagons, and are not exactly the same size.

The cell 2402 has female upper and lower edges as defined by a line 2412. The cell 2404 has male upper and lower edges. The cell 2406 has a male upper edge and a lower female edge, whereas the cell 2408 has a female upper edge and a male lower edge. The cells 2402 and 2404 are defined by a first number of hexagons, whereas the cells 2406 and 2408 are defined by a second number of hexagons that is different from the first number.

Since the cells 2402, 2404, 2406 and 2408 have only two serrated edges, the set comprises $2^2=4$ cells. A set of generally rectangular cells having four serrated edges would consist of $2^4=16$ cells.

In the above description, the terms "rectangular routing," "rectilinear routing," and "hexagonal routing" have been used interchangeably.

Alternative Floorplanning Methods

Figure 98:
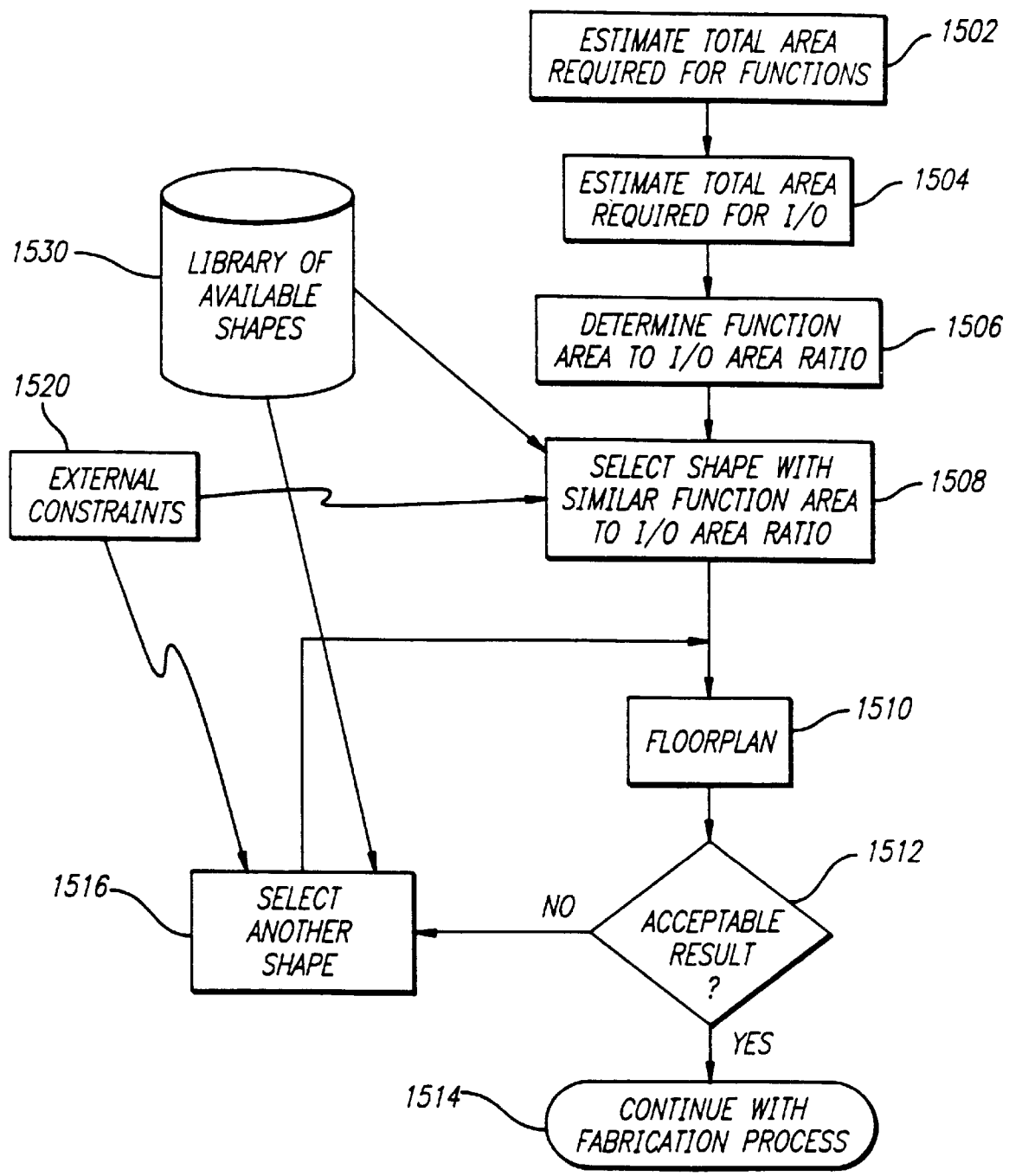
FIG. 98 is a flow chart depicting a process by which floorplanning may be performed.

FIG. 98 is a flow diagram showing a process by which floor planning may be accomplished. The input to the process is a circuit design to be laid out on an integrated circuit which has a number of functions and a number of I/O points, for which the respective areas required may be estimated. In a first step 1504, the total area required for all functions (adjusted to allow some space for interconnections therebetween) in the design is estimated. In a next step 1504, the total I/O area required by the design is estimated In a next step 1506, a function area to I/O area ratio is determined. A next step 1508 compares this ratio to function area to I/O area ratios for shapes in a library of available shapes (such shapes may include parallelograms, trapezoids, greatly elongated rectangles, triangles, etc., as well as "normal" rectangular and square shapes), selects a shape with a similar ratio, and sizes it to have a suitably large functional area. In this example, variable size dies are assumed. If only fixed-size shapes are available, then this becomes an additional constraint in the selection process, i.e., the selected shape must be large enough to contain the laid out circuit.) Optionally, this step may take into consideration externally imposed constraints, such as package shape, known circuit topology, etc., whereby the choice may be weighted towards a particular selection. In a next step 1510, a flat or hierarchical floorplanning process (e.g., U.S. Pat. No. 4,918,614, to Modarres et al., with modifications as necessary) is completed. Upon completion of the floorplanning process (1510), the results of the process are examined (1512). If the process (1510) was successful and the results are acceptable (all external constraints 1520 are met) then the resultant layout is used for further processing 1514 of the integrated circuit. If not, then another step 1516 re-examines the available shapes in the library 1530 and selects another shape, then repeats the floorplanning process 1510.

External constraints 1520 may be provided by the user to limit the choices of shapes or to bias the choice towards a particular shape selection. This may be driven by a pre-selection of an IC package which will only accept certain die shapes or a pre-selection of a die which will only accept certain cell or array shapes. Another type of external constraint may derive from known circuit characteristics. For example, digital multipliers consist mostly of a sum-of-products adder array which naturally tends to take on a parallelogram shape. In this case, it may be desirable to weight the choice of cell shape, array shape, or die shape towards a similarly shaped parallelogram array or die, or toward some other compatible shape.

A method of floorplanning with low aspect ratio partitioning may be advantageously employed in connection with the present inventions. As part of laying out non-square cells or arrays (functional blocks), on a die, it becomes apparent that most die are often square or nearly square. A square has a 1:1 aspect ratio. It may require some effort to place hexagonal, triangular, trapezoidal, or other non-square functional blocks in what starts out as a square area. Hence, as part of the floorplanning process, partitioning proceeds with the goal of creating low aspect ratio areas (sub-partitions) for placing these low aspect-ratio functional blocks. In general, functions are easier to place in an area which is more geometrically "regular".

It becomes evident that when a single partitioning line is made on a square die (which has an aspect ratio of 1:1) that the resulting two subpartitions of the square have aspect ratios which are higher than that of the square die. For example, if the square die is divided exactly in half, partitions result which have an aspect ratio of 2:1. (It should be noted that for the purposes of this discussion, all aspect ratios are defined as the greater dimension divided by the lesser dimension. Therefore an object which might otherwise be considered to have an aspect ratio of 0.5:1 is still described as having an aspect ratio of 2:1.) These resultant partitions, being elongated, are much like the case of a high aspect ratio "certain non-square" die. In other words, low aspect-ratio partitioning is not limited to "certain non-square" dies. (The moment you partition at all, a low aspect ratio die or area exhibits high aspect ratio sub-partitions which require partitioning).

"Aspect-ratio", however is a term which is ordinarily associated with rectangular objects. A more general approach is required to fit this partitioning scheme to non-rectangular cells or arrays.

An area may be considered to have its lowest aspect ration when it has a low periphery to area ratio. For example, a rectangle 4 units in length by 1 unit in width has an area of 4 square units and a periphery to area ratio of 10 units divided by 4 square units, or 8.5/unit. A square having the same area has a periphery to area ratio of 8.5/unit. In general, the more "elongated" (or the less geometrically "regular") an area becomes, the greater its periphery to area ratio. This same principle may be applied to triangles, or to any other shape. For example, a right triangle having a 4 unit side on one side of the right angle and a 1 unit side on the other side of the right angle has an area of 2 square units. Its periphery to area ratio is approximately 4.561/unit. However, an isosceles right triangle, also having an area of 2 square units, but having a 2 unit side on each side of the right angle, has a periphery to area ratio of 3.414/unit. Clearly, the first triangle is more "elongated" than the isosceles right triangle, and consequently has a higher periphery to area ratio.

While choosing a cell shape with a high periphery to area ratio is desirable where large number I/O interconnections are expected, the resultant irregular or elongated area of the cell should be partitioned to yield sub-partitions having the smallest periphery to area ratios possible for floorplanning purposes.

Figure 99:
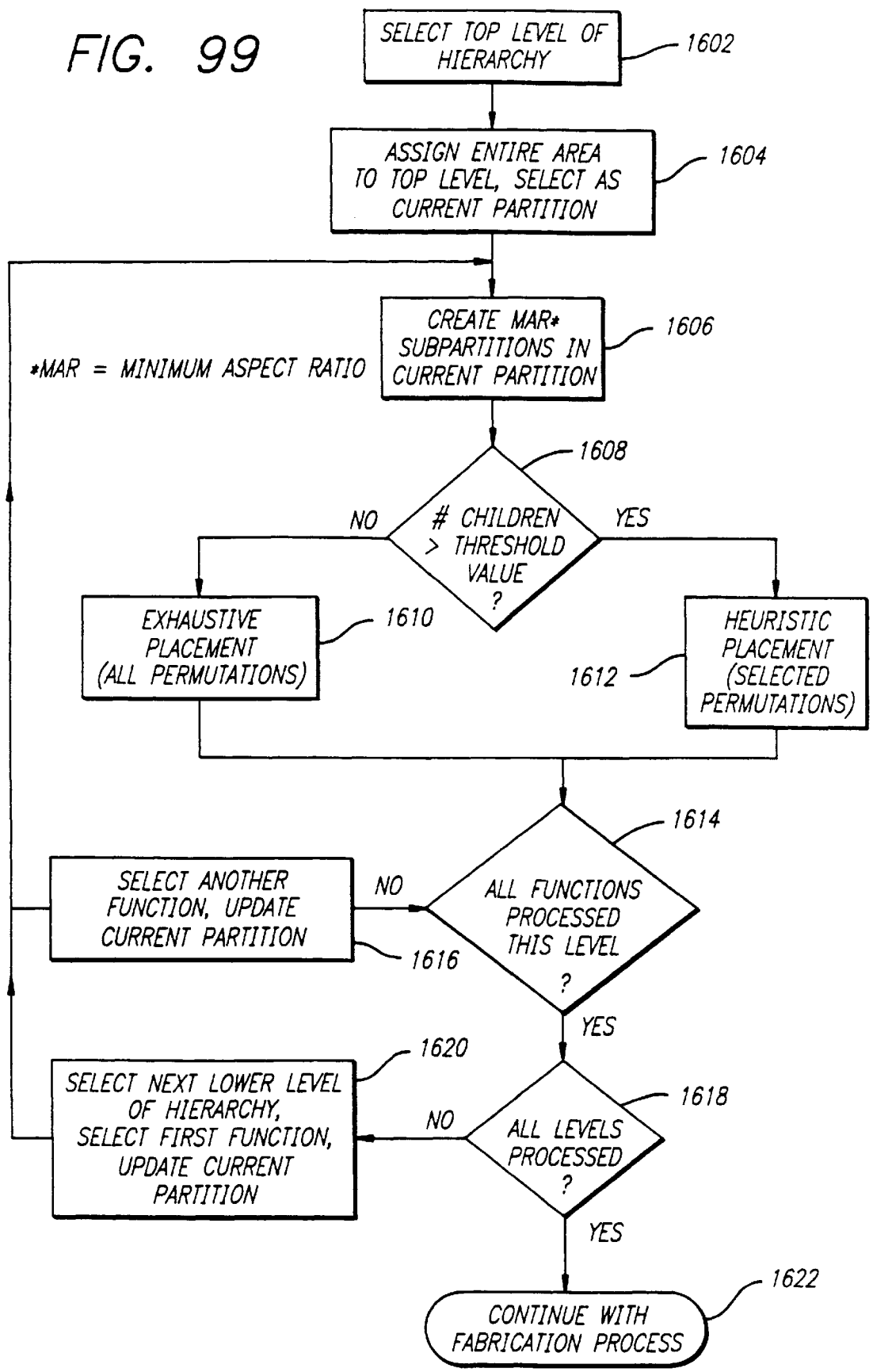
FIG. 99 is a flow chart showing a process of floorplanning incorporating partitioning for minimum aspect ratio sub-partitions.

FIG. 99 is a flow diagram showing the process of floorplanning incorporating partitioning for minimum aspect ratio sub-partitions. For this example, a hierarchical process similar to U.S. Pat. No. 4,918,614, to Modarres et al. (hereinafter sometimes referred to as "Modarres") is used. In a first step 1602 the top level of a hierarchical design is selected. In a next step 1604, all of the area in question is allocated to the top level (design), and is selected as the current partition. The only function in the top level (the entire design) is selected as the current function. Recall that a design consists of a hierarchy of levels, each level consisting of one or more parent functions each of which may have one or more child functions. Each child function may be the parent of still another child function at the next hierarchical level. If a function has no children, then it is a terminal function. The lowest level of the hierarchy has only terminal functions, although terminal functions may occur at any level of a hierarchy. Note again that the top level of the hierarchy has only one function (i.e., the entire design), whereas lower levels of the hierarchy will likely have more functions.

A next step 1606 creates minimum aspect ratio (MAR) sub-partitions within the current partition by selecting one or more partitioning line placement(s) which yield sub-partitions which have the lowest periphery to area ratio(s) possible.

As in Modarres, a pre-defined threshold value is used in a next step 1608 to determine whether heuristic or exhaustive placement is to be used. If the number of child functions of the currently selected function in this level is small enough (smaller than or equal to the threshold value) then an exhaustive placement process 1610 is used. If the number of child functions is great enough (greater than the threshold value) that exhaustive placement would require evaluation of too many permutations, then a heuristic placement process 1612, as described in Modarres or as described hereinabove, is used. Both of these placement processes (1610 and 1612), attempt to optimize distribution of functions to partitions by seeking a minimum partition cost factor (PCF), either of the type described in Modarres, or of the type described hereinabove.

A next step 1614 determines whether all functions in this level have been processed (i.e., have been sub-partitioned and had their child functions allocated to the subpartitions). If not, a next step 1610 selects another function (as yet un-processed) at this level as the current function, selects the area allocated to the newly selected function as the current partition, and goes back to the sub-partitioning step 1606.

If all of the functions at this level have been processed, a next step 1618 determines whether all levels of the hierarchy have been processed. If not, a next step 1620 selects the next lower level in the hierarchy, selects a function at that level as the current function, and selects the area occupied by that function as the current function, and returns to the sub-partitioning step. If all levels have been processed, then step 1618 continues with the fabrication process 1622.

If the subpartitioning process 1606 is used to create more than two sub-partitions, then multi-partitioned floorplanning results, requiring multi-partition partition cost factors, as described hereinabove. In some cases, especially on highly elongated shapes, it may be desirable to use multi-partitioning to produce sub-partitions with lower aspect ratios. It may also be advantageous to change the number of sub-partitions created depending upon the number, relative size or connectedness of functions to be placed. All of these techniques may be utilized.

Hexagonal Vias

Figure 131:
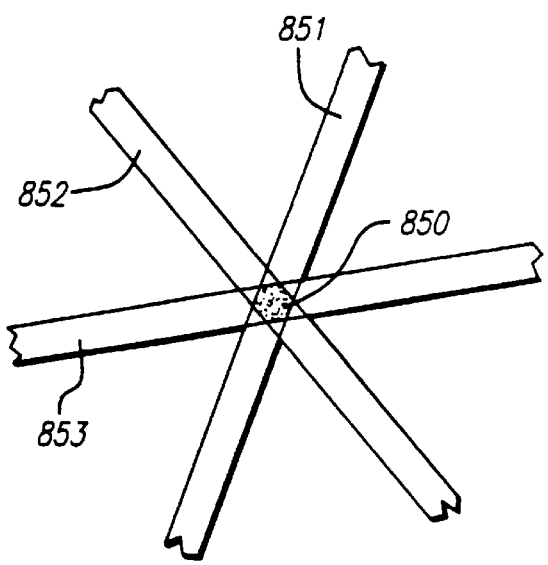
FIG. 131 shows a top view of three wire, each of which is in one of three layers of metal, and the wires are to be connected by a hexagonal shaped via.

FIG. 131 shows a top view of three wires 851, 852 and 853, each of which is in one of three layers of metal, and the wires are to be connected by a via 850. A first wire 851 is in the first layer of metal M1. A second wire 852 is in the second layer of metal M2. A third wire 853 is in the third layer of metal M3. Because the wires 851, 852 and 853 are in different metal layers (which are insulated from each other), to establish an electrical connection between them a via 850 must be cut through the intervening insulating layers.

In the tri-directional routing described herein, when three wires cross in this manner, the via 850 will have a hexagonal shape as shown in FIG. 131. The hexagonal shape of the via 850 provides advantages. Certain failure modes of vias are believed to relate to the area to periphery ratio of the via. A hexagonal shaped via 850 has a more favorable ratio than a square or rectangular shaped via.

More specifically, as the periphery to internal area ratio increases, as a hex ratio is larger than a square or rectangle, the performance and controllability of vias, especially for filled vias which form electrical contacts which are often stacked to connect multiple layers, are increased. Additionally, as the corners of any such via, or especially a filled via contact, become more obtuse, better properties (including avoidance or minimization of corner effects of electrical fields, lower likelihood of corner cracking and greater stacking alignment capability) results.

Thus, as hexagonal shapes for vias as shown in FIG. 131 have advantages over well known square or rectangular vias, the invention includes shapes having more obtuse angles and higher peiphery to area ratios than a square, including pentagonal, hexagonal, septagonal, octagonal and other 5+ sides regular shapes as well as circular (i.e. made by the intersection of a large number of possible lines), or oval shaped and rounded-corner regular shaped vias and filled vias and contacts, all hereby included in the term "hexagonal shape" of the via or contact.

Digital Systems

It is contemplated that the method and apparatus of the present invention may be utilized in system level products comprising single chip modules (SCM) often including other electrical components (such as capacitors, resistors, inductors, etc.); multi-chip modules (MCM) having at least two integrated circuit die in the same or separate packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications (such as PBX, telephone switching, voice mail, auto attendant, network controllers, video teleconferencing, digital data transmission (such as token ring, Ethernet, ATM or the like), and subsystems or subassemblies for inclusion or attachment to more complex system level products.

It is contemplated and within the scope of the present invention that a very large scale (VLSI) integrated circuit die may have a plurality of functional core blocks at different locations on the die, and that one or more of the functional core blocks of the die may be constructed in accordance with the present invention. The die clock may be adjusted for the slowest functional core block so as to maintain maximum die operating speed consistent with reliability and data integrity, while the clock speed may be increased (e.g. doubled) for functional blocks constructed in accordance with the present invention.

It is also contemplated that the present invention may be utilized in a large digital system requiring synchronous or asynchronous operation at a maximum reliable clock speed. Different subsystems of this system may be located at diverse locations. An advantage of the present invention is that the a digital system may always run at maximum speed for all operating conditions without having to derate the system components for slow speed circuits because certain integrated circuits are not constructed in accordance with the present invention.

The present invention may be implemented in a system in that the system or a component of the system may incorporate microelectronic integrated circuits which include in whole or in part one or more of the structures described herein or made by one or more of the methods described herein.

The present invention may be utilized to design or fabricate integrated circuits incorporated into digital systems, and for taking full advantage of the speed and computational power of the integrated circuits utilized in a digital system which are implemented in semiconductor die. As used herein, a digital system may include analog circuits and other non-digital components. A digital system may comprise single chip modules (SCM) including other electrical components; multi-chip modules (MCM) having a plurality of integrated circuits, with or without other electrical components; board level products (BLP) such as those having multiple integrated circuits on printed wiring board(s) (PWB); and box level products (BLP) integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles such as airplanes, trains, automobiles, helicopters, rockets, missiles, boats, submarines, and the like; subsystems utilized in such vehicles (such as GPS navigation, navigational displays and controllers, hazard avoidance such as radar and sonar, fly by wire control, and digital engine control and monitoring); entertainment systems (such as television and radio, digital cameras, audio and video recorders, compact disc players, digital tape, and the like); and communications (such as telephones including portable and cellular, PBX, telephone switching systems, voice mail, auto attendant, network controllers, video teleconferencing, digital data transmission such as token ring, Ethernet, ATM, or and like).

Reducing the size of semiconductor devices based upon the disclosed architecture and improving the speed of circuits otherwise limited by prior art rectilinear architecture and routing methods. The performance of the integrated circuits comprising parts of a digital system which utilize the disclosed architecture will allow the design engineers to implement a design based upon improved "worst-case" device parameters than was heretofore required to insure reliability of conventional rectilinear device designs over all operating conditions. This may be especially significant in high speed systems or computation intensive systems, such as digital data compression and communications systems, and the like.

The present invention may be effectively utilized in a complex digital system. A plurality of semiconductor integrated circuits, one or more of which are constructed in whole or in part in accordance with the present invention, are incorporated into a digital system. It is expected that integrated circuits having rectilinear architecture will be the slowest and must be operated at a slower system clock (lower frequency). Other integrated circuits of the system will not be limited in operating speed when those integrated circuits are inherently faster than the other integrated circuits because they are constructed in accordance with the present invention.

The present invention may be utilized to improve the range of reliable operation of an integrated circuit by implementing the circuit design in an integrated circuit having a more reliable architecture improving the speed or reducing crosstalk in applications in which the integrated circuit may operate. Of course, matching of compatible integrated circuits that must operate together so that all critical circuits incorporate the preferred architecture of the present invention is desirable.

When a system requires a certain operating speed, the critical integrated circuits may be constructed in accordance with the present invention so as to realize a maximum performance, or minimum size, for the system. When the integrated circuits of the system are much faster than necessary for desired operation, integrated circuits constructed in accordance with the present invention may be incorporated to improve yields, to reduce cost, or improve reliability of the system.

Figure 100:
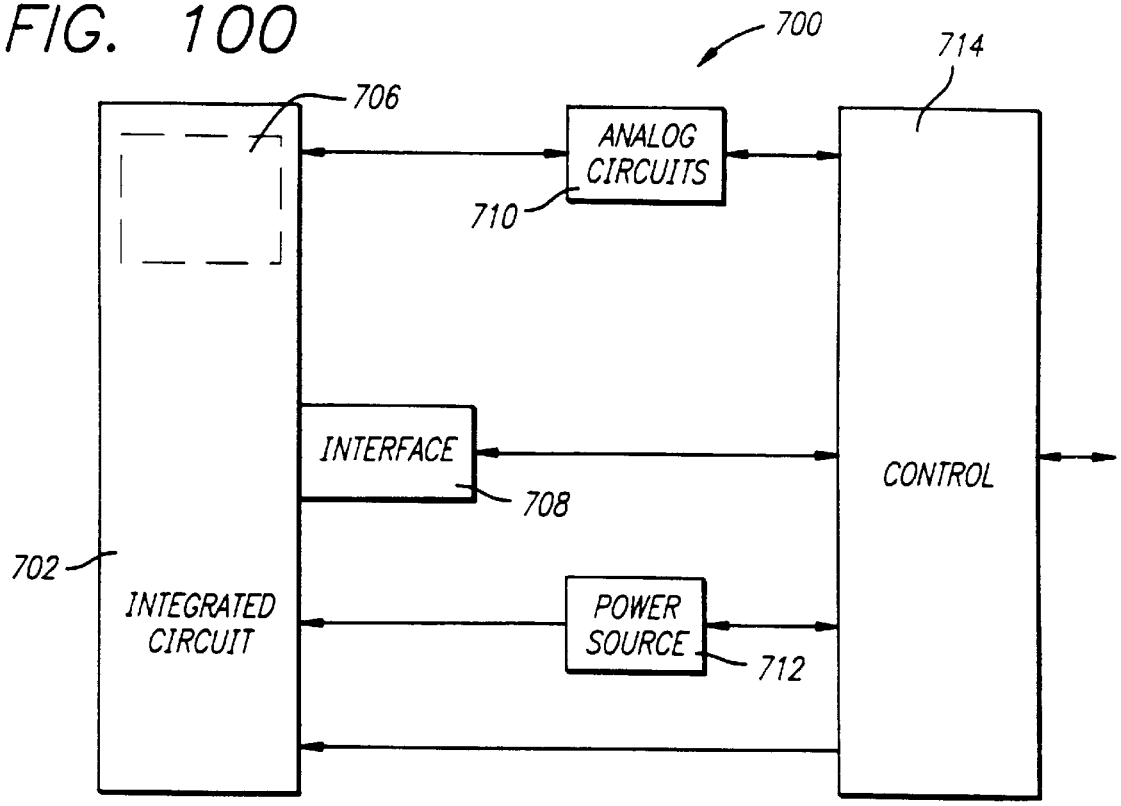
FIG. 100 is a schematic block diagram of an integrated circuit and system which may incorporate the present invention.

Referring now to FIG. 100, a schematic block diagram of an integrated circuit system incorporating the present invention is illustrated. An integrated circuit system, generally represented by the numeral 700, may comprise a data interface unit 708, a control unit 714, a power source 712, analog circuits 710, and other system components (not illustrated) that connect to an integrated circuit 702 incorporating the present invention. The integrated circuit 702 has at least an area or cell 706 incorporating hexagonal architecture or tri-directional routing in accordance with the present invention.

Figure 101:
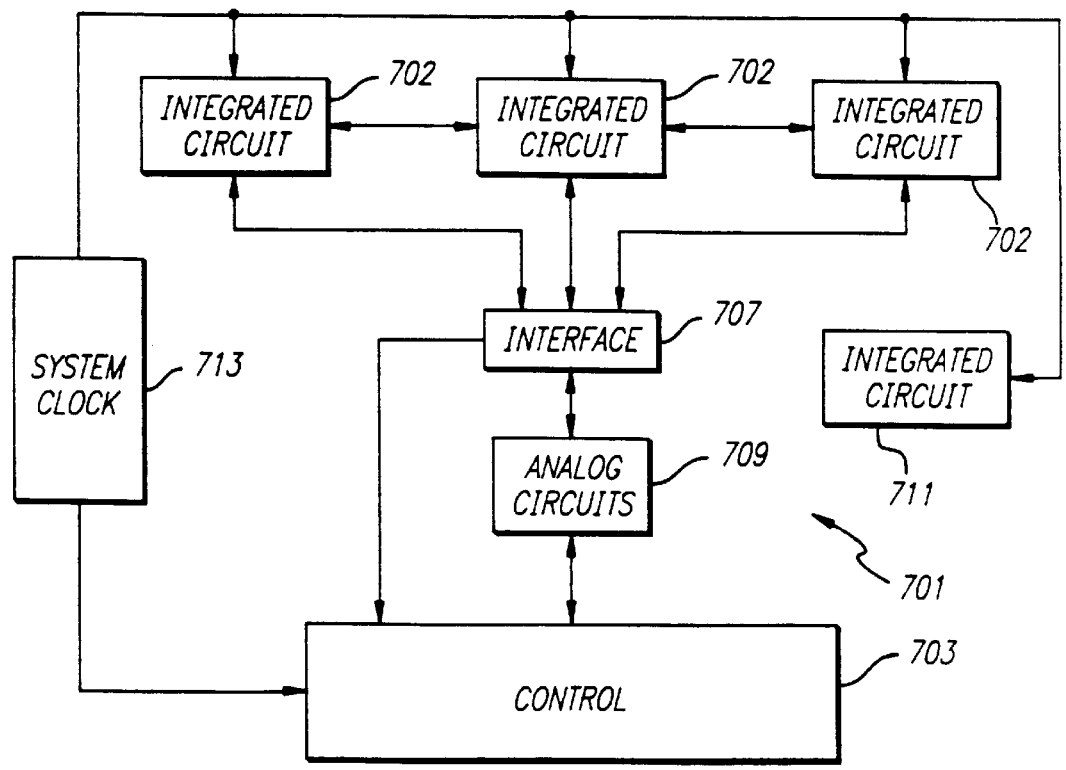
FIG. 101 is a schematic block diagram of a digital system incorporating the present invention.

Referring now to FIG. 101, a schematic block diagram of a digital system according to the present invention is illustrated. The digital system 701 is comprised of a plurality of integrated circuits 702, a system clock 713, interface circuits 707, and a control unit 703. The digital system 701 may optionally include analog circuits 709, it being understood that the term "digital system" is intended to refer to systems that have digital elements, but does not require that all elements of the system be digital. The integrated circuits 702 are interconnected, typically, to perform functions such as, for example, computation, memory, digital video compression, digital signal processing, forward error correction, navigation and guidance, or other complex digital monitoring, control or computational functions. Although not shown, the digital system may have connections to external elements, such as input-output, display, peripherial, and other components, as well as other systems.

Integrated circuits 702 utilize structures constructed in accordance with the present invention. Integrated circuit 711 does not necessarily incorporate the architecture of the present invention, because not all of the integrated circuits may be critical to the operation of the system nor have too low an operating speed that may pose a problem.

The control unit 703 may be, for example, a programmable logic array (PLA), application specific integrated circuit (ASIC), microprocessor and program, or the like. If necessary, the system clock 713 may be set at a relatively low system clock frequency for a slower or performance limited integrated circuit 711, and clock doubler circuits or the like may be incorporated into integrated circuits 702 to provide higher clock speeds for faster chips 702 to take advantage of features of the present invention.

Figure 102:
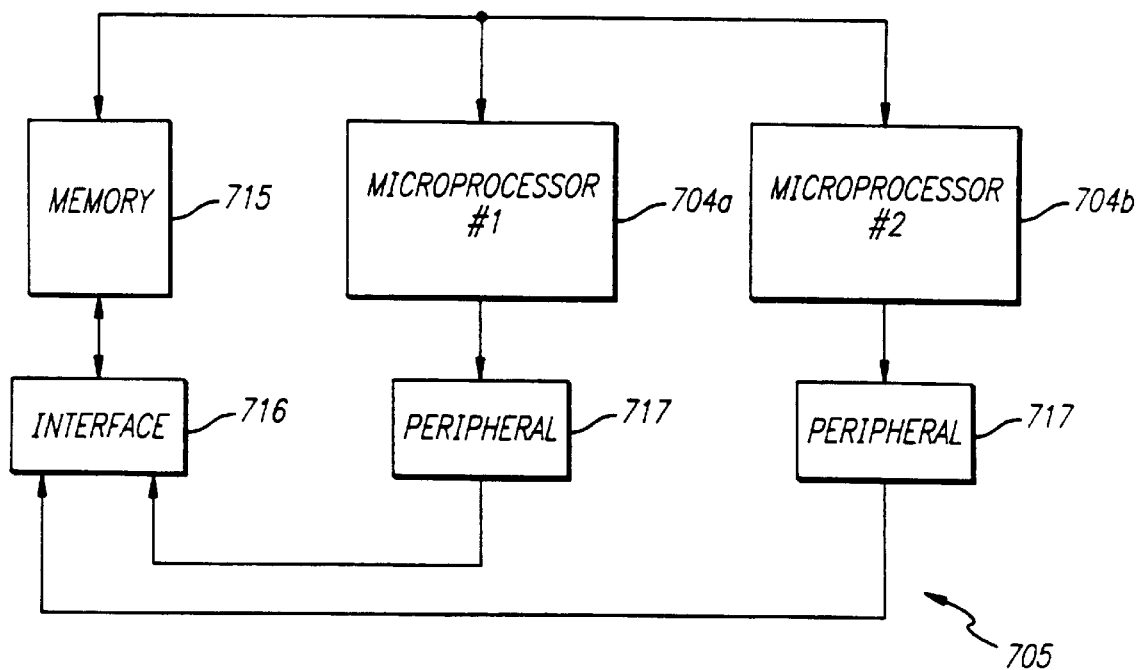
FIG. 102 is a schematic block diagram of a multiprocessor computer system.

Referring now to FIG. 102, a schematic diagram of a multiprocessor computer system incorporating the present invention is illustrated. The digital system 705 has more than one microprocessor 704a and 704b, and the microprocessors 704a and 704b may be identical but it is not required. A memory 715, interface 716, and perpherial devices 717 are also shown. The microprocessors 704a and 704b may be interconnected, typically, to perform high speed parallel computation.

The microprocessors 704a and 704b may include at least portions of integrated circuits incorporating the present invention. The memory 715 may also include at least portions of integrated circuits incorporating the present invention. Not all of the integrated circuits may be critical to the operation of the system nor does a low operating speed for every integrated circuit necessarily pose a problem, and thus it may not be necessary to construct all such circuits in accordance with the present invention.

Figure 103:
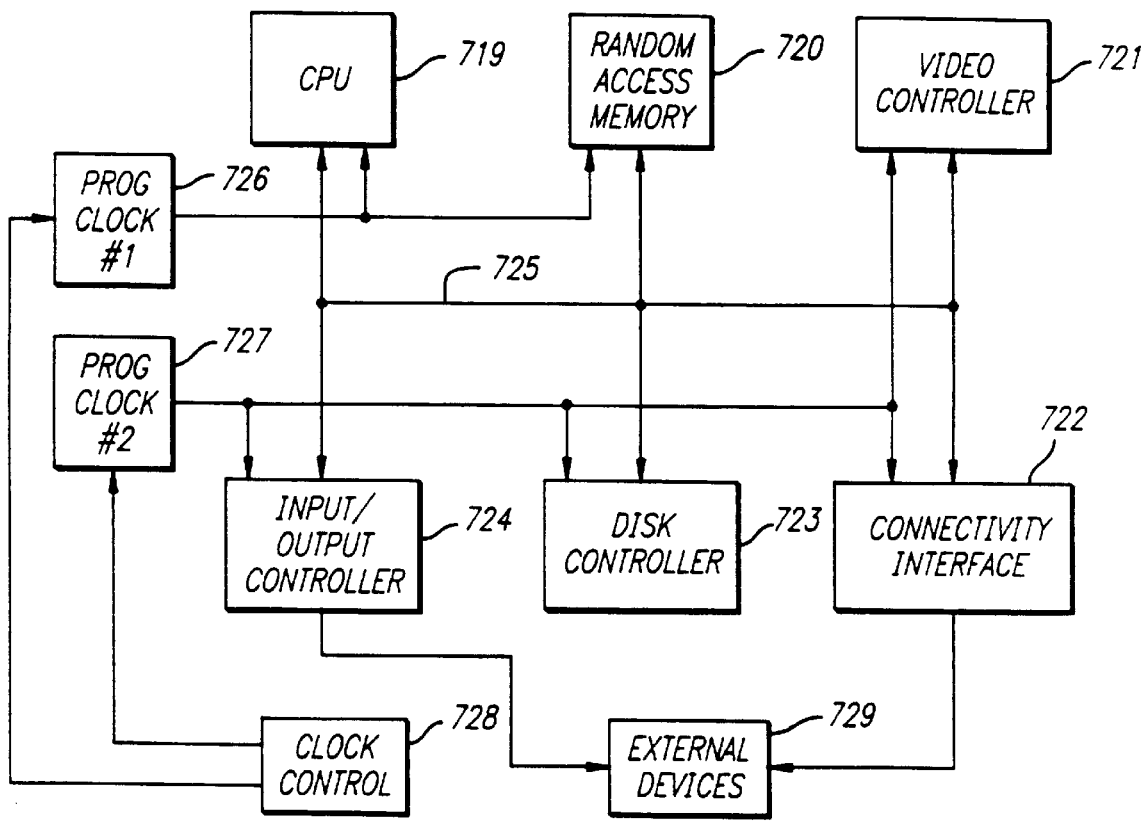
FIG. 103 is a schematic block diagram of a complex digital computer system incorporating the present invention.

Referring to FIG. 103, a schematic block diagram of a complex digital computer system is illustrated. The digital computer system 718 comprises a central processing unit ("CPU") 719 which operates in conjunction with the following subsystems: random access memory ("RAM") 720, video controller 721, connectivity interface 722, disk controller 723, and input/output controller 724. The aforementioned subsystems are interconnected with each other and the CPU 719 by a bus system 725.

The system 718 may utilize programmable clocks 726 and 727. The first clock 726 is utilized with the CPU 719 and RAM 720. In the illustrated example, the second clock 727 is utilized with the video controller 721, connectivity interface 722, disk controller 723, and input/output controller 724. The first clock 726 may run at a faster speed than the second clock 727. Multiple system clocks running at different speeds with or without phase lock synchronization therebetween may be employed. Higher speed system clocks may be desirable to take advantage of higher performance available from devices such as the CPU 719 and the RAM 720 constructed in accordance with the present invention.

The first clock 726 and the second clock 727 may be programmed by clock control 728 to run the system 718 at maximum reliable operating speeds consistent with the improved subsystem performance which may be available as a result of employing circuits 719 and 720 constructed in accordance with the present invention. Various external devices 729 may be connected to the input/output controller 724 or the connectivity interface 722.

Figure 104:
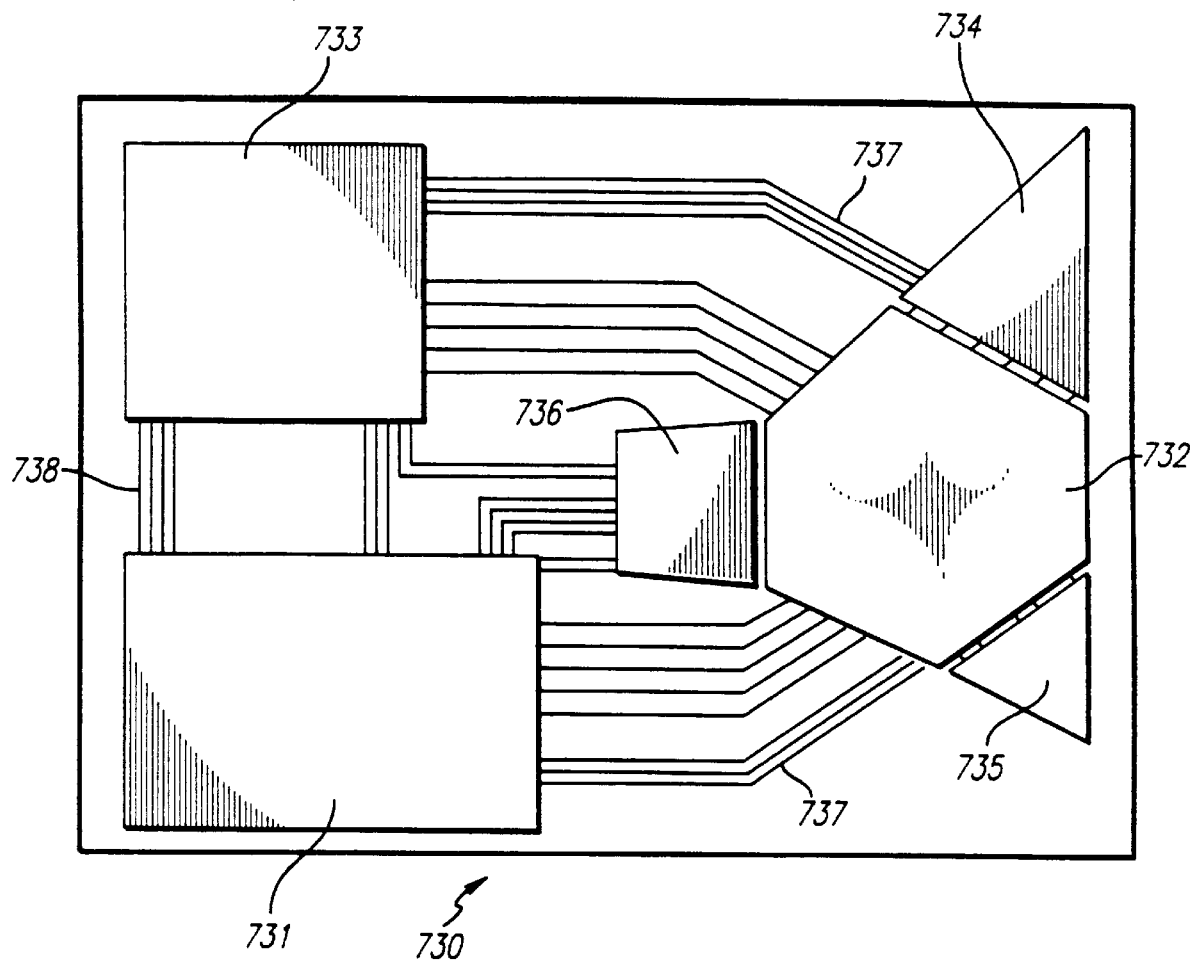
FIG. 104 is a schematic block diagram of a large scale integrated circuit utilizing the present invention.

Referring now to FIG. 104, a schematic block diagram of a large scale integrated circuit according to the present invention is illustrated. The large scale integrated circuit 730 is comprised of a functional logic core 731, a hexagonal memory array 732, a first triangular megafunction cell 734, a second triangular megafunction cell 735, a rectilinear cell 736, and other circuits 733. The integrated circuit 730 may utilize hexagonal, triangular, parallelogram, or diamond shaped cells or may use tri-directional routing in three metal layers for interconnections on the die, or may use both. In the illustrated example, tri-directional routing 737 is used in the area of the chip 730 surrounding the hexagonal array 732 and triangular cells 734, 735. Rectilinear routing 738 may be used in the area of the chip 730 surrounding the core 731 and circuit 733, particularly if the density of the interconnections is low in that area or the blocks 731 and 733 interconnect in a way that makes rectilinear routing satisfactory or advantageous. Typical applications for the large scale integrated circuit 730 may be single package computer and control systems, digital signal processing engines, data compression engines, forward error correction engines, and the like.

Figure 105:
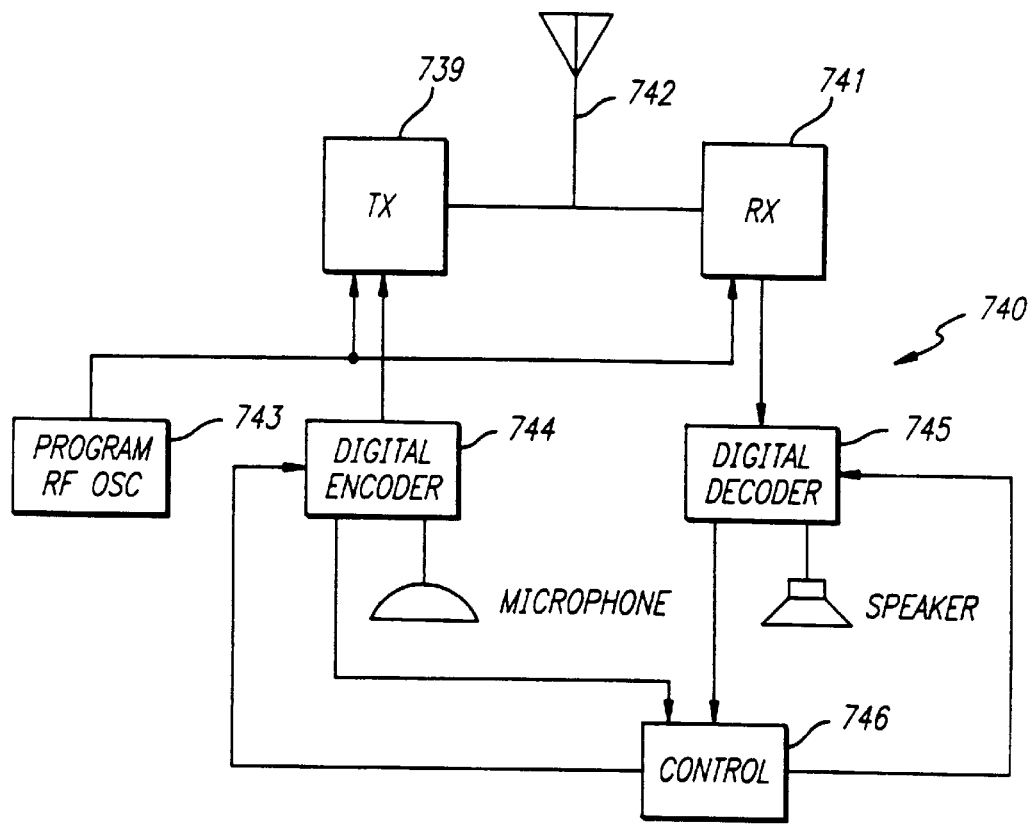
FIG. 105 is a schematic block diagram of a digital cellular telephone which may incorporate embodiments of the present invention.

Referring to FIG. 105, a schematic block diagram of a digital cellular telephone system is illustrated. The digital cellular telephone system 740 comprises a transmitter 739, receiver 741, antenna 742, programmable radio frequency oscillator 743, digital encoder 744, digital decoder 745, and a control unit 746. The digital encoder 744 and decoder 745 may have mostly common circuits, but are illustrated separately for clarity. Included on at least one of the encoder 744 and decoder 745 integrated circuits comprising the digital logic is at least one integrated circuit (not illustrated) incorporating the present invention. In addition, the control unit 746 may include an integrated circuit (not illustrated) incorporating the present invention.

Digital communications, both video and audio, requires manipulation of analog signals into digital signals representative of the respective analog signals. The digital signal information is compressed in order to reduce the information bandwidth requirements of the digital telephone system 740, as is well known to those skilled in digital communications. The present invention allow optimal performance of the digital information processing logic in a digital communication system such as a cellular telephone, direct broadcast satellite television and the like.

Figure 106:
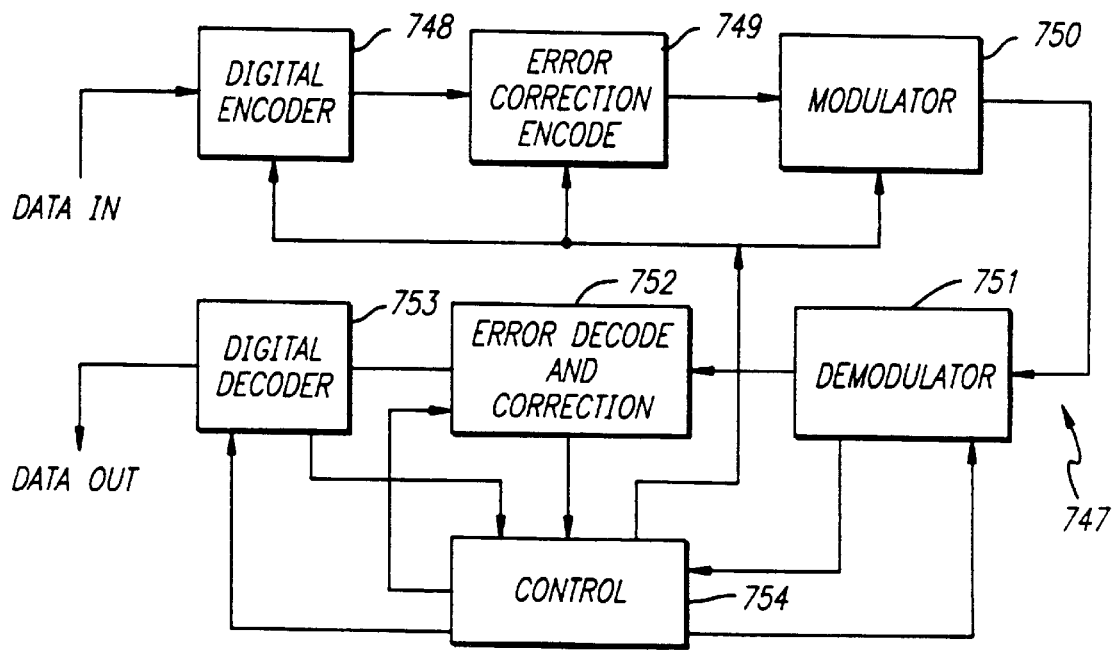
FIG. 106 is a schematic block diagram of a digital home entertainment system utilizing the present invention.

Referring to FIG. 106, a schematic block diagram of a digital entertainment system such as a digital television, CD video and audio, and direct broadcast satellite is illustrated.

The digital entertainment system 747 is becoming more prevalent and is creating new entertainment for both the consumer and provider. Use of real time high resolution video and multiple channel stereo audio requires that the digital circuits have very high data throughput. The greater the resolution of the information being displayed the faster the digital circuits must operate. Very fast digital circuits have a cost premium, this restricting the demand of such systems with the consumer. The present invention allows less expensive digital circuits to perform the necessary digital logic functions required of the new digital entertainment systems without having to pay a premium. In addition, these digital circuits may operate more than was heretofore possible.

The entertainment system 747 may comprise a digital encoder 748, error correction encoder 749, and modulator 750 at the transmission end of the system 747. The reception end of the system 747 may comprise a demodulator 751, error decode and correction 752, and digital decoder 753. A control unit 754 controls the reception end and the transmission end of the system 747.

The present inventions are thus applicable to any digital technology which includes integrated circuits in a digital system, or different functional core blocks of a very large scale intergated circuit. Examples of digital systems that may benefit from the architecture and methods of the present inventions have been briefly described by way of example, and not by way of limitation. The spirit and intent of the present inventions is to improve the operating speed capability and reliability of, and to reduce the size of, all digital systems from a single semiconductor integrated circuit die to a complex multiple box computing system.

As stated above, it will be understood that the terms "source" and "drain" which have been used in the above description in relation to field effect transistors merely define opposite ends of a channel region which is controlled by a voltage applied to a gate. The source and drain are interchangeable in that current may flow into either one and out of the other. Therefore, the terms "source" and "drain", and the relative polarities of voltages applied thereto, which may be described in the examples illustrated in the present specification, are arbitrary and reversible within the scope of the invention, and are not to be considered as limiting the invention to one or the other of the possible configurations or polarities.

The embodiments of the present inventions described herein have been given only as examples in order to illustrate the disclosed inventions. Persons skilled in the art, after having the benefit of the disclosure set forth herein, will appreciate that modifications may be made in the examples described and illustrated herein without departing from the scope of the present inventions. The inventions are not intended to be limited to the examples shown and described. The scope of the inventions are defined by the scope of the properly construed claims appended to this patent.

What is claimed is:

1. A method of polydirectional non-orthogonal three layer routing of semiconductor structures, comprising the steps of:

fabricating hexagonal transistor semiconductor structures on a semiconductor substrate;

fabricating electrical interconnections of the transistor semiconductor structures extending in a first direction using a first layer of metal;

fabricating electrical interconnections of the transistor semiconductor structures extending in a second direction using a second layer of metal, the second direction being angularly displaced from the first direction non-orthogonally and at an angle greater than 45 degrees; and, fabricating electrical interconnections of the transistor semiconductor structures extending in a third direction using a third layer of metal, the third direction being angularly displaced from the second direction non-orthogonally and at an angle greater than 45 degrees, the third direction being angularly displaced from the first direction non-orthogonally and at an angle greater than 45 degrees.

2. The method according to claim 1, wherein:

the step of fabricating transistor semiconductor structures on a semiconductor substrate comprises the step of fabricating transistor semiconductor structures forming closely packed hexagonal shaped cells.

3. The method according to claim 1, wherein:

the step of fabricating transistor semiconductor structures on a semiconductor substrate comprises the step of fabricating transistor semiconductor structures forming rectangular shaped cells.

4. The method according to claim 1, wherein:

the step of fabricating transistor semiconductor structures on a semiconductor substrate comprises the step of fabricating transistor semiconductor structures forming closely packed triangular shaped cells.

5. The method according to claim 1, wherein:

the step of fabricating transistor semiconductor structures on a semiconductor substrate comprises the step of fabricating transistor semiconductor structures forming closely packed diamond shaped cells.

6. A method of polydirectional non-orthogonal three layer routing of semiconductor structures, comprising the steps of:

fabricating hexagonal transistor semiconductor structures on a semiconductor substrate;

fabricating electrical interconnections of the transistor semiconductor structures extending in a first direction using a first layer of metal;

fabricating electrical interconnections of the transistor semiconductor structures extending in a second direction using a second layer of metal, the second direction being angularly displaced from the first direction at an angle of about 60 degrees; and, fabricating electrical interconnections of the transistor semiconductor structures extending in a third direction using a third layer of metal, the third direction being angularly displaced from the second direction at an angle of about 60 degrees, the third direction being angularly displaced from the first direction at an angle of about 60 degrees.

7. The method according to claim 6, wherein:

the step of fabricating transistor semiconductor structures on a semiconductor substrate comprises the step of fabricating transistor semiconductor structures forming closely packed hexagonal shaped cells.

8. The method according to claim 6, wherein:

the step of fabricating transistor semiconductor structures on a semiconductor substrate comprises the step of fabricating transistor semiconductor structures forming rectangular shaped cells.

9. The method according to claim 6, wherein:

the step of fabricating transistor semiconductor structures on a semiconductor substrate comprises the step of fabricating transistor semiconductor structures forming closely packed triangular shaped cells.

10. The method according to claim 6, wherein:

the step of fabricating transistor semiconductor structures on a semiconductor substrate comprises the step of fabricating transistor semiconductor structures forming closely packed diamond shaped cells.

11. An integrated circuit device comprising:

a semiconductor substrate;

hexagonal transistor semiconductor structures on said semiconductor substrate;

a first layer of metal, said first layer of metal having electrical interconnections of the transistor semiconductor structures extending in a first direction;

a second layer of metal, said second layer of metal having electrical interconnections of the transistor semiconductor structures extending in a second direction, the second direction being angularly displaced from the first direction non-orthogonally and at an angle greater than 45 degrees; and, a third layer of metal, said third layer of metal having electrical interconnections of the transistor semiconductor structures extending in a third direction, the third direction being angularly displaced from the second direction non-orthogonally and at an angle greater than 45 degrees, the third direction being angularly displaced from the first direction non-orthogonally and at an angle greater than 45 degrees.

12. An integrated circuit device comprising:

a semiconductor substrate;

hexagonal transistor semiconductor structures on said semiconductor substrate;

a first layer of metal, said first layer of metal having electrical interconnections of the transistor semiconductor structures extending in a first direction;

a second layer of metal, said second layer of metal having electrical interconnections of the transistor semiconductor structures extending in a second direction, the second direction being angularly displaced from the first direction at an angle of about 60 degrees; and a third layer of metal, said third layer of metal having electrical interconnections of the transistor semiconductor structures extending in a third direction, the third direction being angularly displaced from the second direction at an angle of about 60 degrees, the first direction being angularly displaced from the first direction at an angle of about 60 degrees.

* * * * *